(12) United States Patent
Yamaguchi et al.

(10) Patent No.: US 9,383,645 B2
(45) Date of Patent: Jul. 5, 2016

(54) PATTERN FORMING METHOD, ACTINIC RAY-SENSITIVE OR RADIATION-SENSITIVE RESIN COMPOSITION, ACTINIC RAY-SENSITIVE OR RADIATION-SENSITIVE FILM, MANUFACTURING METHOD OF ELECTRONIC DEVICE, AND ELECTRONIC DEVICE

(71) Applicant: FUJIFILM Corporation, Minato-ku, Tokyo (JP)

(72) Inventors: Shuhei Yamaguchi, Haibara-gun (JP); Hidenori Takahashi, Haibara-gun (JP); Kei Yamamoto, Haibara-gun (JP); Fumihiro Yoshino, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/272,034

(22) Filed: May 7, 2014

(65) Prior Publication Data

US 2014/0242505 A1 Aug. 28, 2014

Related U.S. Application Data

(63) Continuation of application No. PCT/JP2012/079587, filed on Nov. 8, 2012.

(30) Foreign Application Priority Data

Nov. 9, 2011 (JP) ................................. 2011-245745

(51) Int. Cl.
*G03F 7/039* (2006.01)
*G03F 7/32* (2006.01)
*G03F 7/038* (2006.01)
*G03F 7/004* (2006.01)
*G03F 7/11* (2006.01)
*G03F 7/20* (2006.01)

(52) U.S. Cl.
CPC .............. *G03F 7/038* (2013.01); *G03F 7/0045* (2013.01); *G03F 7/0046* (2013.01); *G03F 7/0397* (2013.01); *G03F 7/11* (2013.01); *G03F 7/2041* (2013.01); *G03F 7/325* (2013.01)

(58) Field of Classification Search
CPC ....... G03F 7/004; G03F 7/039; G03F 7/0392; G03F 7/0397; G03F 7/20; G03F 7/2041; G03F 7/30; G03F 7/32; G03F 7/325
USPC ........................ 430/270.1, 326, 910, 921, 925
See application file for complete search history.

(56) References Cited

U.S. PATENT DOCUMENTS

| 5,665,518 A | * | 9/1997 | Maeda et al. ............. 430/270.1 |
| 5,866,304 A | * | 2/1999 | Nakano et al. ............ 430/325 |
| 8,911,930 B2 | | 12/2014 | Enomoto et al. |
| 2007/0099112 A1 | * | 5/2007 | Kobayashi et al. ........ 430/270.1 |
| 2008/0187860 A1 | | 8/2008 | Tsubaki et al. |
| 2008/0318171 A1 | * | 12/2008 | Tsubaki .................... 430/326 |
| 2011/0045413 A1 | | 2/2011 | Tsubaki |
| 2011/0229832 A1 | * | 9/2011 | Kamimura et al. ........ 430/325 |
| 2011/0262865 A1 | * | 10/2011 | Nishimura et al. ........ 430/285.1 |
| 2011/0311914 A1 | | 12/2011 | Kamimura et al. |
| 2012/0003591 A1 | * | 1/2012 | Enomoto et al. .......... 430/325 |
| 2012/0009529 A1 | | 1/2012 | Hatakeyama |
| 2012/0052449 A1 | * | 3/2012 | Kato et al. ................. 430/325 |
| 2012/0077131 A1 | | 3/2012 | Enomoto et al. |
| 2012/0315449 A1 | | 12/2012 | Tsubaki et al. |
| 2012/0322007 A1 | | 12/2012 | Kato et al. |
| 2013/0011785 A1 | | 1/2013 | Kato et al. |
| 2013/0323653 A1 | | 12/2013 | Sakakibara et al. |

FOREIGN PATENT DOCUMENTS

| JP | 04-039665 A | 2/1992 |
| JP | 05-265212 A | 10/1993 |

(Continued)

OTHER PUBLICATIONS

Machine translation of JP 2011-123469, published on Jun. 23, 2011.*
H. Gokan, et al., "Dry Etch Resistance of Organic Materials", J. Electrochem. Soc.: Solid-State Science and Technology, Jan. 1983, pp. 143-146, vol. 130, No. 1.
International Search Report for PCT/JP2012/079587, dated Dec. 11, 2012 , 3 pages.
Written Opinion of PCT/JP2012/079587, dated Nov. 29, 2012, 6 pages.

(Continued)

*Primary Examiner* — Anca Eoff
(74) *Attorney, Agent, or Firm* — Sughrue Mion, PLLC

(57) ABSTRACT

A pattern forming method including: (i) a process of forming a film using an actinic ray-sensitive or radiation-sensitive resin composition containing a Resin (P) including a non-acid-decomposable Repeating Unit (b1) represented by a following General Formula (b1) and a repeating unit including a group capable of being decomposed by acid and generating a polar group, and a Compound (B) capable of generating an acid through irradiation of actinic rays or irradiation; (ii) a process of exposing the film using actinic rays or radiation with a wavelength of equal to or less than 200 nm; and (iii) a process of developing the exposed film using a developer including an organic solvent containing a hetero atom and carbon atoms having 7 or more carbon atoms to forming a negative tone pattern.

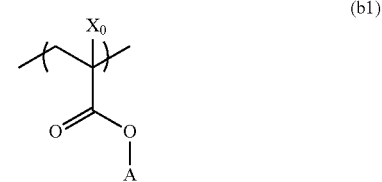

(b1)

29 Claims, No Drawings

(56) References Cited

FOREIGN PATENT DOCUMENTS

| | | |
|---|---|---|
| JP | 2008-281980 A | 11/2008 |
| JP | 2008-292975 A | 12/2008 |
| JP | 2009-025708 A | 2/2009 |
| JP | 2010-197619 A | 9/2010 |
| JP | 2011-123469 A | 6/2011 |
| JP | 2011-191753 A | 9/2011 |
| JP | 2011-197587 A | 10/2011 |
| JP | 2011-221509 A | 11/2011 |
| JP | 2012-032807 A | 2/2012 |
| JP | 5035466 B1 | 9/2012 |
| TW | 201115269 A | 5/2011 |
| WO | 2008/153109 A1 | 12/2008 |
| WO | WO 2010/061977 | * 6/2010 |
| WO | WO 2010/140709 | * 12/2010 |

OTHER PUBLICATIONS

Office Action dated Nov. 18, 2014, issued in corresponding JP Application No. 2011-245745 (18 pages in English and Japanese).
Office Action mailed Jun. 9, 2015 in corresponding Japanese Application No. 2011-245745.
Office Action dated Dec. 25, 2015, from the Intellectual Property Office of Taiwan in counterpart TW Application No. 101141454.
Office Action dated Mar. 3, 2016, issued by the Korean Intellectual Property Office in corresponding Korean Application No. 10-2014-7012003.

* cited by examiner

PATTERN FORMING METHOD, ACTINIC RAY-SENSITIVE OR RADIATION-SENSITIVE RESIN COMPOSITION, ACTINIC RAY-SENSITIVE OR RADIATION-SENSITIVE FILM, MANUFACTURING METHOD OF ELECTRONIC DEVICE, AND ELECTRONIC DEVICE

BACKGROUND OF THE INVENTION

1. Field of the Invention

The present invention relates to a pattern forming method, an actinic ray-sensitive or radiation-sensitive resin composition used therefor, an actinic ray-sensitive or radiation-sensitive film, a manufacturing method of an electronic device, and an electronic device. In more detail, the present invention relates to a pattern forming method favorable in a manufacturing process for a semiconductor such as an IC, a manufacturing process for a circuit substrate such as liquid crystal and thermal heads, and a lithography process of other photofabrications, an actinic ray-sensitive or radiation-sensitive resin composition used in the pattern forming method, an actinic ray-sensitive or radiation-sensitive film, a manufacturing method of an electronic device, and an electronic device. In particular, the present invention relates to a pattern forming method favorable in exposure with an ArF exposure apparatus, an ArF liquid immersion type projection exposure apparatus, and an EUV exposure apparatus with ultraviolet rays with a wavelength of equal to or less than 200 nm as the light source, an actinic ray-sensitive or radiation-sensitive resin composition used in the pattern forming method, an actinic ray-sensitive or radiation-sensitive film, a manufacturing method of an electronic device, and an electronic device.

2. Description of the Related Art

Since the development of a resist for a KrF excimer laser (248 nm), a pattern forming method using chemical amplification has been used so as to compensate for sensitivity reduction caused by light absorption. By way of an example, in a positive type chemical amplification method, first, a photoacid generator included in the exposed portion is decomposed by irradiation with light to generate an acid. Further, an alkali-insoluble group contained in a photosensitive composition is converted into an alkali-soluble group by the catalytic action of the generated acid in a PEB (Post Exposure Bake) process or the like. Subsequently, development is carried out using, for example, an alkali solution. Thus, the exposed portion is removed to obtain a desired pattern.

For the method, various kinds of alkali developers have been proposed. For example, a water-based alkali developer with 2.38% by mass of TMAH (tetramethylammonium hydroxide aqueous solution) is typically used as the alkali developer.

In order to miniaturize a semiconductor element, there is a trend toward a shorter wavelength of the exposure light source and a higher numerical aperture (higher NA) of the projection lens and at the present time, an exposure machine using, as its light source, an ArF excimer laser having a wavelength at 193 nm is being developed. A method of filling a high refractive-index liquid (hereinafter may be referred to as a "liquid for liquid immersion") between the projection lens and the sample (that is, a liquid immersion method) has been proposed as a technique for further enhancing the resolution. In addition, EUV lithography of performing the exposure to ultraviolet light at an even shorter wavelength (13.5 nm) has also been proposed. In a process with an ArF excimer laser as the light source, acrylic resins with no aromatic rings have been garnering attention in order to ensure transparency, and for example, a resin in which acrylic acid and an alicyclic alkyl ester are introduced into the constituent units within the resin or the like has been proposed (for example, refer to JP1992-39665A (JP-H04-39665A) and JP1993-265212A (JP-H05-265212A)).

However, the reality is that it is extremely difficult to find an appropriate combination of a resist composition, a developer, and a rinsing solution, and the like required to form a pattern with excellent overall properties.

In recent years, pattern forming methods using a developer including an organic solvent have also been developed (for example, refer to JP2008-292975A and JP2010-197619A). For example, a pattern forming method including a process of applying a resist composition for which solubility with respect to an alkali developer increases and the solubility with respect to an organic solvent developer decreases on a substrate through the irradiation of actinic rays or radiation, an exposure process, and a process of developing using an organic solvent developer is disclosed in JP2008-292975A. According to such a method, it is possible to stably form a high-precision detailed pattern.

However, with the pattern forming method described above, there is a need for further improvements in the roughness properties, evenness of local pattern dimensions, and exposure latitude, and there is also a concern that latent dry etching resistance from the viewpoint of Ohnishi parameters (for example, refer to J. Electrochem Soc 143,130 (1983) H. Gokan, S. Esho and Y. Ohnishi) is low.

SUMMARY OF THE INVENTION

An object of the present invention is to provide a pattern forming method with excellent roughness properties such as the line width roughness, evenness of local pattern dimensions, and exposure latitude while the pattern portion formed through developing has favorable dry etching resistance, an actinic ray-sensitive or radiation-sensitive resin composition used in the pattern forming method, an actinic ray-sensitive or radiation-sensitive film, a manufacturing method of an electronic device, and an electronic device.

The present invention has the following configuration in one form, by which the problem described above is solved.

[1] A pattern forming method including: (i) a process of forming a film using an actinic ray-sensitive or radiation-sensitive resin composition containing a Resin (P) including a non-acid-decomposable Repeating Unit (b1) represented by the following General Formula (b1) and a repeating unit including a group capable of being decomposed by acid and generating a polar group, and a Compound (B) capable of generating an acid through irradiation of actinic rays or irradiation; (ii) a process of exposing the film using actinic rays or radiation with a wavelength of equal to or less than 200 nm; and (iii) a process of developing the exposed film using a developer including an organic solvent containing a hetero atom and carbon atoms having 7 or more carbon atoms to form a negative tone pattern.

[Chem. 1]

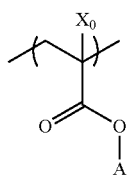
(b1)

In the formula, A represents an alicyclic hydrocarbon group (may include a substituent) including no oxygen atoms, and $X_0$ represents a hydrogen atom or an alkyl group.

[2] The pattern forming method according to [1], wherein the Resin (P) contains equal to or greater than 50 mol % of the repeating unit including a group capable of being decomposed by acid and generating a polar group.

[3] The pattern forming method according to [1] or [2], wherein in the Repeating Unit (b1), A is an alicyclic hydrocarbon group (may include a substituent) consisting of carbon atoms and hydrogen atoms or an alicyclic hydrocarbon group (may include a substituent) consisting of carbon atoms, hydrogen atoms, and nitrogen atoms.

[4] The pattern forming method according to any one of [1] to [3], wherein in the Repeating Unit (b1), A is an alicyclic hydrocarbon group (may include a substituent) consisting of carbon atoms and hydrogen atoms.

[5] The pattern forming method according to any one of [1] to [4], wherein the Repeating Unit (b1) satisfies 0<X<3.5 when the numbers of each atom included in the unit are substituted into the following formula.

$X$=(total of the number of atoms configuring the Repeating Unit ($b1$))/{(number of carbon atoms)−(number of atoms that are neither carbon atoms nor hydrogen atoms)}

[6] The pattern forming method according to any one of [1] to [5], wherein Compound (B) is a compound capable of generating an organic acid represented by the following General Formulae (III) or (IV) through irradiation of actinic rays or radiation.

[Chem. 2]

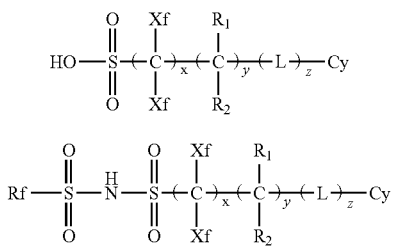

In General Formulae (III) and (IV),

Xf's respectively independently represent a fluorine atom or an alkyl group substituted with at least one fluorine atom.

$R_1$ and $R_2$ respectively independently represent a hydrogen atom, a fluorine atom, or an alkyl group. In a case where y≥2, each of $R_1$ and $R_2$ may be the same or different from one another.

L's respectively independently represent a divalent linking group. In a case where z≥2, each L may be the same or different from one another.

Cy represents a cyclic organic group.

Rf is a group including a fluorine atom.

x represents an integer from 1 to 20.

y represents an integer from 0 to 10.

z represents an integer from 0 to 10.

[7] The pattern forming method according to any one of [1] to [6], wherein the actinic ray-sensitive or radiation-sensitive resin composition further contains a basic compound in which the basicity decreases through the irradiation of actinic rays or radiation or an ammonium salt compound in which the basicity decreases through the irradiation of actinic rays or radiation.

[8] The pattern forming method according to any one of [1] to [7], wherein the actinic ray-sensitive or radiation-sensitive resin composition further contains a hydrophobic resin containing at least either of a fluorine atom or a silicon atom.

[9] The pattern forming method according to any one of [1] to [8], wherein the exposure in the process (ii) is immersion exposure.

[10] An actinic ray-sensitive or radiation-sensitive resin composition used for the pattern forming method according to any one of [1] to [9] containing a Resin (P) including a non-acid-decomposable Repeating Unit (b1) represented by General Formula (b1) described above, a repeating unit including a group capable of being decomposed by acid and generating a polar group, and a Compound (B) capable of generating an acid through irradiation of actinic rays or irradiation.

[11] An actinic ray-sensitive or radiation-sensitive film formed using the actinic ray-sensitive or radiation-sensitive resin composition according to [10].

[12] A manufacturing method of an electronic device including the pattern forming method of any one of [1] to [9].

[13] An electronic device manufactured by the manufacturing method of the electronic device according to [12].

According to the present invention, it is possible to provide a pattern forming method with excellent roughness properties such as the line width roughness, evenness of local pattern dimensions, and exposure latitude while the pattern portion formed through developing has favorable dry etching resistance, an actinic ray-sensitive or radiation-sensitive resin composition used in the pattern forming method, an actinic ray-sensitive or radiation-sensitive film, a manufacturing method of an electronic device, and an electronic device.

DESCRIPTION OF THE PREFERRED EMBODIMENTS

Hereinafter, the embodiments of the present invention will be described in detail.

In the description of a group (atomic group) in the present specification, when the group (atomic group) is described without specifying whether the group (atomic group) is substituted or unsubstituted, the group includes both a group (atomic group) having no substituents and a group (atomic group) having substituents. For example, "an alkyl group" includes not only an alkyl group which has no substituents (an unsubstituted alkyl group) but also an alkyl group which has substituents (a substituted alkyl group).

In the present specification, the term "actinic rays" or "radiation" refers to, for example, a bright line spectrum of a mercury lamp, far ultraviolet rays represented by an excimer laser, extreme ultraviolet rays (EUV light), X-rays, an electron beam (EB), or the like. Further, the term light as used herein means actinic rays or radiation.

In addition, "exposure" in the present specification includes, unless otherwise specified, not only exposure by a mercury lamp, far ultraviolet rays represented by an excimer laser, extreme ultraviolet rays, X-rays, EUV light and the like, but also exposure of a drawing by particle rays such as an electron beam or an ion beam.

Hereinbelow, the actinic ray-sensitive or radiation-sensitive resin composition that can be used in the present invention will be described.

Furthermore, the present invention also relates to the actinic ray-sensitive or radiation-sensitive resin composition as described later.

The actinic ray-sensitive or radiation-sensitive resin composition according to the present invention is used for negative type development (development in which the solubility in a developer decreases upon exposure, and thus, the exposed portion remains as a pattern and the non-exposed portion is removed). That is, the actinic ray-sensitive or radiation-sensitive resin composition according to the present invention can be used as an actinic ray-sensitive or radiation-sensitive resin composition for organic solvent development, that is used for development using a developer including an organic solvent. Here, the use for an organic solvent development means a use for the process of development using at least a developer including an organic solvent.

The actinic ray-sensitive or radiation-sensitive resin composition of the present invention is typically a resist composition, and is preferably a negative tone resist composition (that is, a resist composition for organic solvent development) from the viewpoint of obtaining particularly superior effects. In addition, the composition according to the present invention is typically a chemically amplified resist composition.

The pattern forming method of the present invention includes (i) a process of forming a film using an actinic ray-sensitive or radiation-sensitive resin composition containing a Resin (P) including a non-acid-decomposable Repeating Unit (b1) represented by the following General Formula (b1) and a repeating unit including a group capable of being decomposed by acid and generating a polar group, and a Compound (B) capable of generating an acid through irradiation of actinic rays or irradiation; (ii) a process of exposing the film using actinic rays or radiation with a wavelength of equal to or less than 200 nm; and (iii) a process of developing the exposed film using a developer including an organic solvent containing at least one hetero atom and carbon atoms having 7 or more carbon atoms to form a negative tone pattern.

First, the actinic ray-sensitive or radiation-sensitive resin composition that can be used in the pattern forming method of the present invention will be described.

<Actinic Ray-Sensitive or Radiation-Sensitive Resin Composition>

[1] Resin (P) Including Repeating Unit (b1) and Repeating Unit Capable of being Decomposed by Acid and Generating Carboxyl Group Resin (P) of the present invention contains the non-acid-decomposable Repeating Unit (b1) represented by the following General Formula (b1). Here, the repeating unit being non-acid-decomposable means that the repeating unit is not reactive or has an extremely small reaction to the action of acid in the process in which the composition of the present invention is ordinarily used, and essentially does not include a group contributing to image formation through acid.

[Chem. 3]

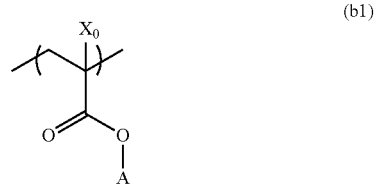

In the formula, A represents an alicyclic hydrocarbon group (may include a substituent) including no oxygen atoms, and $X_0$ represents a hydrogen atom or an alkyl group.

The alicyclic structure of the alicyclic hydrocarbon group as A may be a monocyclic structure or a polycyclic structure. As a monocyclic structure, for example, a monocyclic structure with 3 to 12 carbon atoms is preferable, and specific examples thereof include cyclopropyl, cyclobutyl, cyclopentyl, cyclohexyl, cyclobutyl, cyclooctyl, cyclododecanoyl, cyclopentenyl, cyclohexenyl, cyclooctadienyl, and the like. As a polycyclic structure, for example, a polycyclic structure with 7 to 12 carbon atoms is preferable, and specific examples thereof include bicyclo[4.3.0]nonanyl, decahydronaphthalenylmethyl, tricyclo[5.2.1.0(2,6)]decanyl, bornyl, isobornyl, norbornyl, adamantyl, noradamantyl, 1,7,7-trimethyltricyclo[2.2.1.0$^{2,6}$]heptanyl, 3,7,7-trimethylbicyclo[4.1.0]heptanoyl, and the like, and in particular, cyclopropyl, cyclopentyl, cyclohexyl, cyclooctyl, norbornyl, adamantyl, noradamantyl, and the like are preferable.

The alicyclic structure according to an embodiment preferably has a polycyclic structure.

The alicyclic hydrocarbon group that may include a substituent as A may include a hetero atom other than an oxygen atom.

A according to an embodiment is preferably an alicyclic hydrocarbon group (may include a substituent) consisting of carbon atoms and hydrogen atoms or an alicyclic hydrocarbon group (may include a substituent) consisting of carbon atoms, hydrogen atoms, and nitrogen atoms, and is preferably an alicyclic hydrocarbon group (may include a substituent) consisting of carbon atoms and hydrogen atoms.

Further, examples of the substituent that the alicyclic hydrocarbon group as A may include an alkyl group, an alkenyl group, an alkynyl group, a phenyl group, a cyano group, and the like.

Examples of the alkyl group represented by $X_0$ include a methyl group, an ethyl group, a propyl group, and the like. The alkyl group as $X_0$ may include a substituent, and examples of the substituent include a halogen atom, a hydroxy group, and the like.

According to an embodiment of the present invention, in a case where the numbers of atoms included in Repeating Unit (b1) represented by General Formula (b1) described above are substituted into the following formula, it is preferable that $0<X<3.5$ be satisfied, and it is even more preferable that $0<X<3.1$ be satisfied. In a case where X is in such a range, the dry etching resistance of the pattern portion can be maintained favorably.

$X$=(total of the number of atoms configuring the Repeating Unit $(b1)$)/{(number of carbon atoms)−(number of atoms that are neither carbon atoms nor hydrogen atoms)}

Resin (P) may include one type of Repeating Unit (b1) or may include two or more types thereof. The content ratio of Repeating Unit (b1) is preferably 5 to 90 mol % with respect to all repeating units in Resin (P), 10 to 80 mol % is more preferable, 20 to 70 mol % is even more preferable, and 20 to 50 mol % is particularly preferable.

While a specific example of Repeating Unit (b1) is shown below, the present invention is not limited thereto. The $X_0$ in the following formula is the same as the $X_0$ in General Formula (b1).

[Chem. 4]

Other than Repeating Unit (b1) described above, Resin (P) includes a repeating unit including a group capable of being decomposed by acid and generating a polar group (hereinafter referred to as an "acid-decomposable group").

The polar group is not particularly limited as long as it is a group hardly soluble or insoluble in the developer including an organic solvent, however, an acidic group such as a carboxyl group, a sulfonate group (a group which dissociates in an aqueous solution of 2.38% by mass of tetramethylammonium hydroxide, which is used as a conventional developer of a resist), an alcoholic hydroxyl group, or the like, may be included.

Here, an alcoholic hydroxyl group refers to a hydroxyl group bonded to a hydrocarbon group and a hydroxyl group that is a hydroxyl group other than being directly bonded to an aromatic ring (phenolic hydroxyl group), and excludes a hydroxyl group of an aliphatic alcohol in which the α-position is substituted with an electron-withdrawing group such as a fluorine atom as (for example, a fluorinated alcohol group (hexafluoroisopropanol group or the like)). As the alcoholic hydroxyl group, a hydroxyl group of which pKa is greater than or equal to 12 and less than or equal to 20 is preferable.

The group preferable as the acid-decomposable group is a group substituted with a group in which a hydrogen atom of the group such as this is detached by acid.

As the group detached by acid, for example, —$C(R_{36})(R_{37})(R_{38})$, —$C(R_{36})(R_{37})(OR_{39})$, —$C(R_{01})(R_{02})(OR_{39})$, or the like, may be included.

In the above general formula, $R_{36}$ to $R_{39}$ respectively independently represent an alkyl group, a cycloalkyl group, an aryl group, an aralkyl group, or an alkenyl group. $R_{36}$ and $R_{37}$ may be bonded to each other to form a ring.

$R_{01}$ and $R_{02}$ respectively independently represent a hydrogen atom, an alkyl group, a cycloalkyl group, an aryl group, an aralkyl group, or an alkenyl group.

The alkyl group of $R_{36}$ to $R_{39}$, $R_{01}$, and $R_{02}$ is preferably an alkyl group having 1 to 8 carbon atoms, and examples thereof include a methyl group, an ethyl group, a propyl group, an n-butyl group, a sec-butyl group, a hexyl group, an octyl group, and the like.

The cycloalkyl group of $R_{36}$ to $R_{39}$, $R_{01}$ and $R_{02}$ may be a monocyclic type or a polycyclic type. As the monocyclic type, a cycloalkyl group having 3 to 8 carbon atoms is preferable and, for example, a cyclopropyl group, a cyclobutyl group, a cyclopentyl group, a cyclohexyl group, a cyclooctyl group, or the like, may be included. The polycyclic type cycloalkyl group is preferably a cycloalkyl group having 6 to 20 carbon atoms, and examples thereof include an adamantyl group, a norbornyl group, an isobornyl group, a camphanyl group, a dicyclopentyl group, an α-pinanyl group, a tricyclodecanyl group, a tetracyclododecyl group, an androstanyl group, and the like. In addition, at least one of the carbon atoms in the cycloalkyl group may be substituted with a hetero atom such as an oxygen atom.

The aryl group of $R_{36}$ to $R_{39}$, $R_{01}$ and $R_{02}$ is preferably an aryl group having 6 to 10 carbon atoms and, for example, a phenyl group, a naphthyl group, an anthryl group, or the like may be included.

The aralkyl group of $R_{36}$ to $R_{39}$, $R_{01}$ and $R_{02}$ is preferably an aralkyl group having 7 to 12 carbon atoms and, for example, a benzyl group, a phenethyl group, a naphthylmethyl group, or the like, may be included.

The alkenyl group of $R_{36}$ to $R_{39}$, $R_{01}$ and $R_{02}$ is preferably an alkenyl group having 2 to 8 carbon atoms and, for example, a vinyl group, an allyl group, a butenyl group, a cyclohexenyl group, or the like, may be included.

As the ring formed by $R_{36}$ and $R_{37}$ being bonded, a cycloalkyl group (monocyclic or polycyclic) is preferable. As the cycloalkyl group, a monocyclic cycloalkyl group such as a cyclopentyl group or a cyclohexyl group, or a polycyclic cycloalkyl group such as a norbornyl group, a tetracyclodecanyl group, a tetracyclododecanyl group or an adamantyl group is preferable. A monocylic cycloalkyl group having 5 or 6 carbon atoms is more preferable, and a monocylic cycloalkyl group having 5 carbon atoms is particularly preferable.

Resin (P) preferably includes the repeating unit represented by the following General Formula (I) as a repeating unit including an acid-decomposable group.

[Chem. 5]

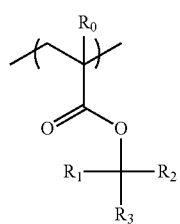

(I)

In the formula, $R_0$ represents a hydrogen atom, an alkyl group, a cyano group, or a halogen atom.

$R_1$ to $R_3$ respectively independently represent an alkyl group (linear or branched) or a cycloalkyl group (monocyclic or polycyclic).

Two out of $R_1$ to $R_3$ may be bonded to form a ring (monocyclic or polycyclic).

The alkyl group of $R_0$ may have a substituent, and as the substituent, for example, a hydroxyl group or a halogen atom (preferably, a fluorine atom) may be included.

The alkyl group of $R_0$ is preferably an alkyl group having 1 to 4 carbon atoms, and a methyl group, an ethyl group, a propyl group, a hydroxymethyl group, a trifluoromethyl group or the like may be included, however, a methyl group is preferable.

$R_0$ is preferably a hydrogen atom or a methyl group.

The alkyl group of $R_1$ to $R_3$ is preferably an alkyl group having 1 to 4 carbon atoms such as a methyl group, an ethyl group, an n-propyl group, an isopropyl group, an n-butyl group, an isobutyl group or a t-butyl group.

The cycloalkyl group of $R_1$ to $R_3$ is preferably a monocyclic cycloalkyl group such as a cyclopentyl group or a cyclohexyl group, or a polycyclic cycloalkyl group such as a norbornyl group, a tetracyclodecanyl group, a tetracyclododecanyl group or an adamantyl group.

As a ring formed by two out of $R_1$ to $R_3$ being bonded, a monocyclic hydrocarbon ring such as a cyclopentane ring or a cyclohexane ring, or a polycyclic hydrocarbon ring such as a norbornane ring, a cyclotetradecane ring, a tetracyclododecane ring, or an adamantane ring is preferable. A monocyclic hydrocarbon ring with 5 or 6 carbon atoms is particularly preferable.

$R_1$ to $R_3$ are preferably respectively independently a chained alkyl group, and more preferably a linear or branched alkyl group with 1 to 4 carbon atoms.

Each group described above may include a substituent, and examples of the substituent include an alkyl group (1 to 4 carbon atoms), a cycloalkyl group (3 to 8 carbon atoms), a halogen atom (for example, a fluorine atom), an alkoxy group (1 to 4 carbon atoms), a carboxyl group, an alkoxycarbonyl group (2 to 6 carbon atoms), and the like, and 8 or fewer carbon atoms is preferable. Among those, from the viewpoint of further improvement in the dissolution contrast in a developer containing an organic solvent before and after acid-decomposition, a substituent having no hetero atom such as an oxygen atom, a nitrogen atom, and a sulfur atom is more preferred (for example, more preferably, it is not an alkyl group or the like substituted with a hydroxyl group), a group consisting of only a hydrogen atom and a carbon atom is still more preferred, and a linear or branched alkyl group, or a cycloalkyl group is particularly preferred.

Resin (P) is able to perform micro-adjustment of one or both of the reactivity and the developability by including two or more types of the repeating unit represented by General Formula (I) described above, allowing easy optimization of various properties.

While preferable specific examples of the repeating unit including an acid-decomposable group are shown below, the present invention is not limited thereto.

In the specific examples, Rx and $Xa_1$ represent a hydrogen atom, $CH_3$, $CF_3$, or $CH_2OH$. Each of Rxa and Rxb represents an alkyl group having 1 to 4 carbon atoms. Z represents a substituent and if present in plural number, plural numbers of Z may be the same as or different from each other. p represents 0 or a positive integer. Specific examples and preferable examples of Z are the same as the specific examples and preferable examples of the substituents that $R_1$ to $R_3$ may further include.

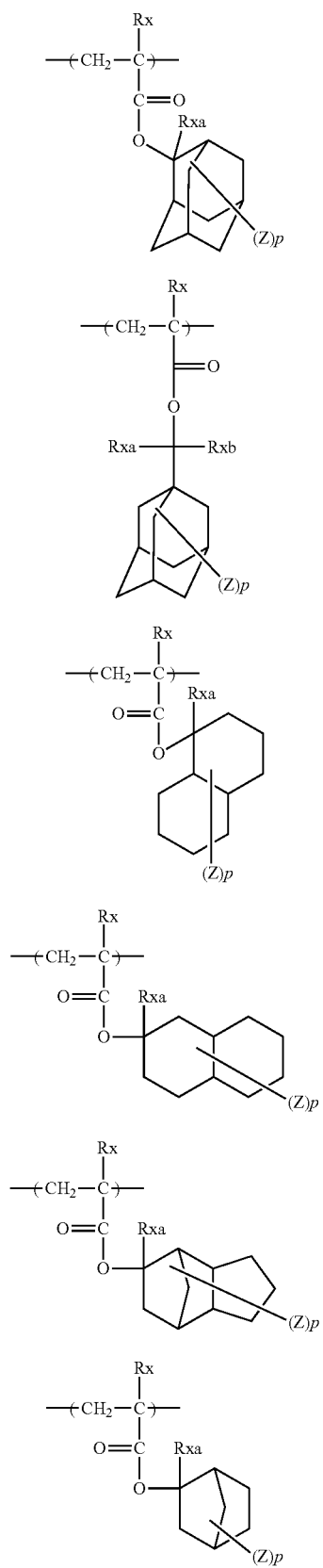
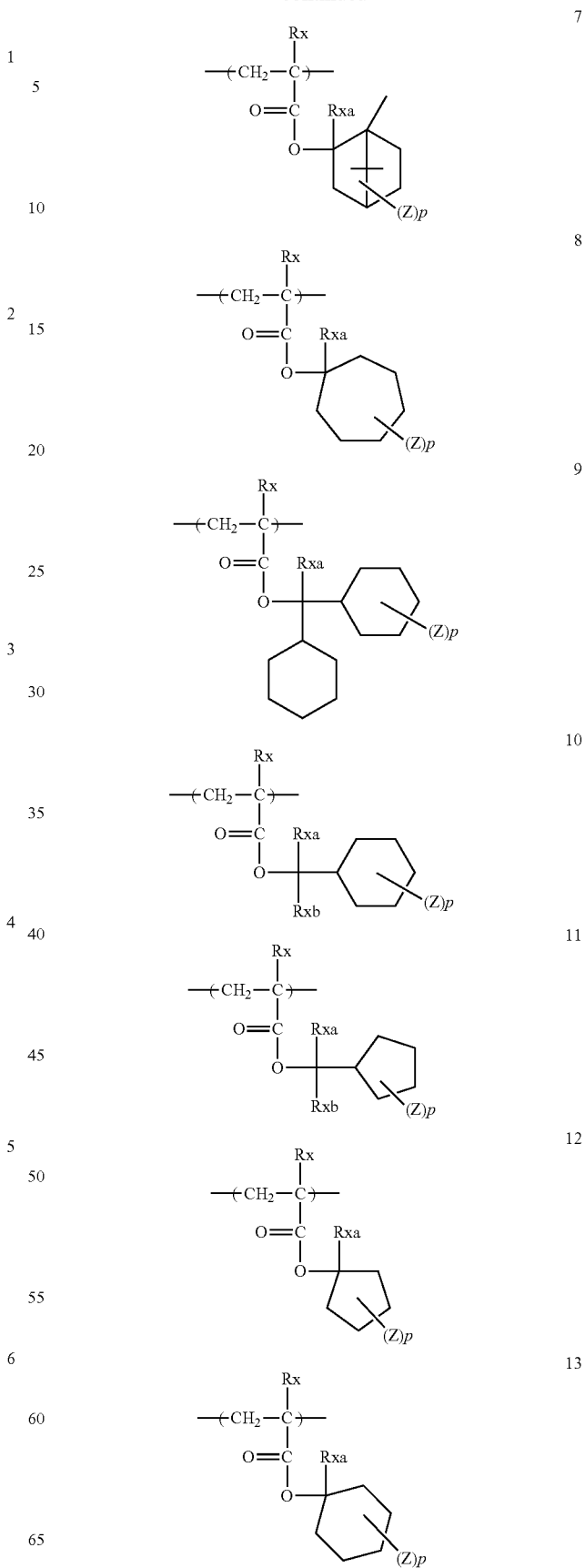

14
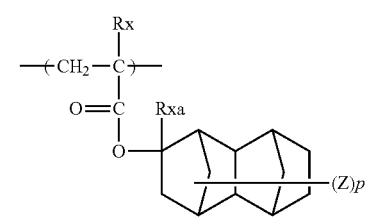
15
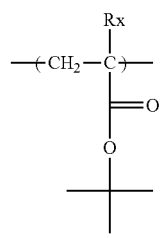
16
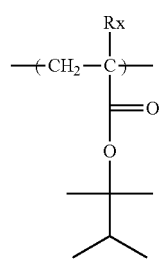
17
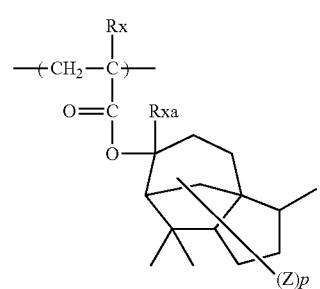
18
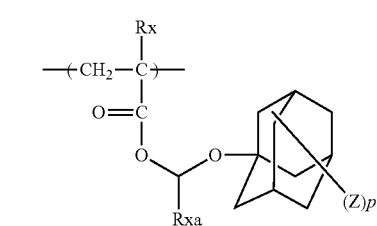
19
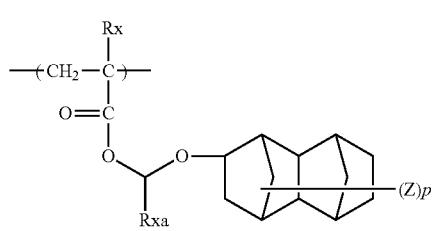
20
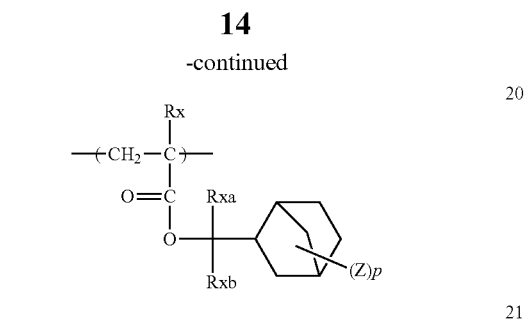
21
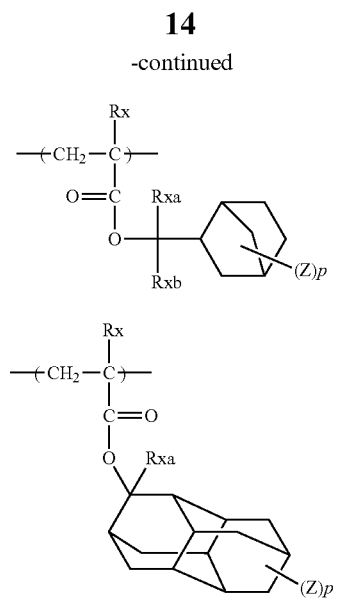
22
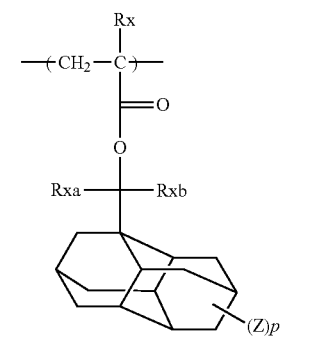
23
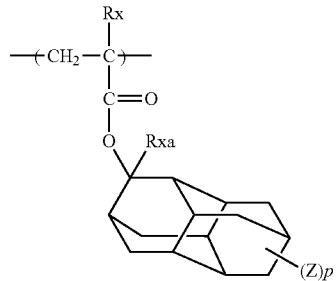
24
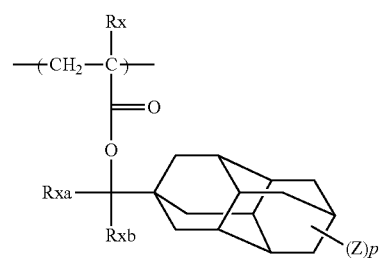
25
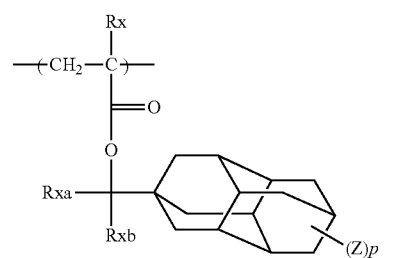

-continued
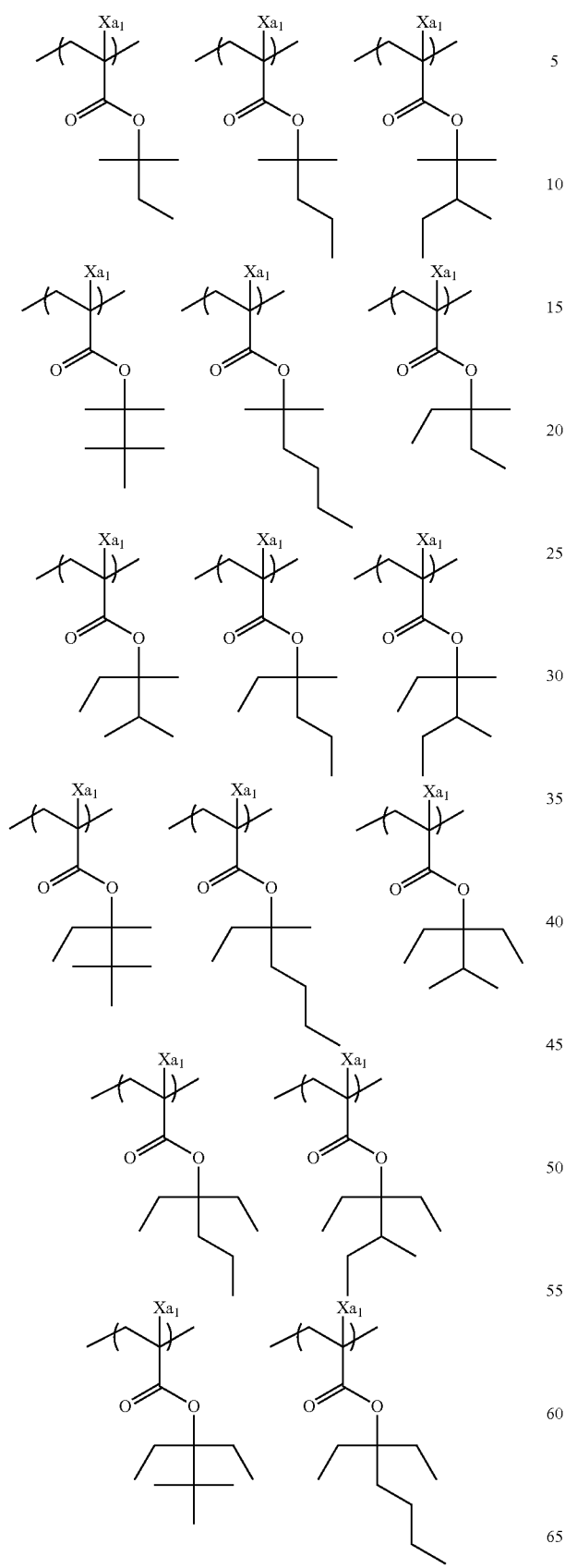
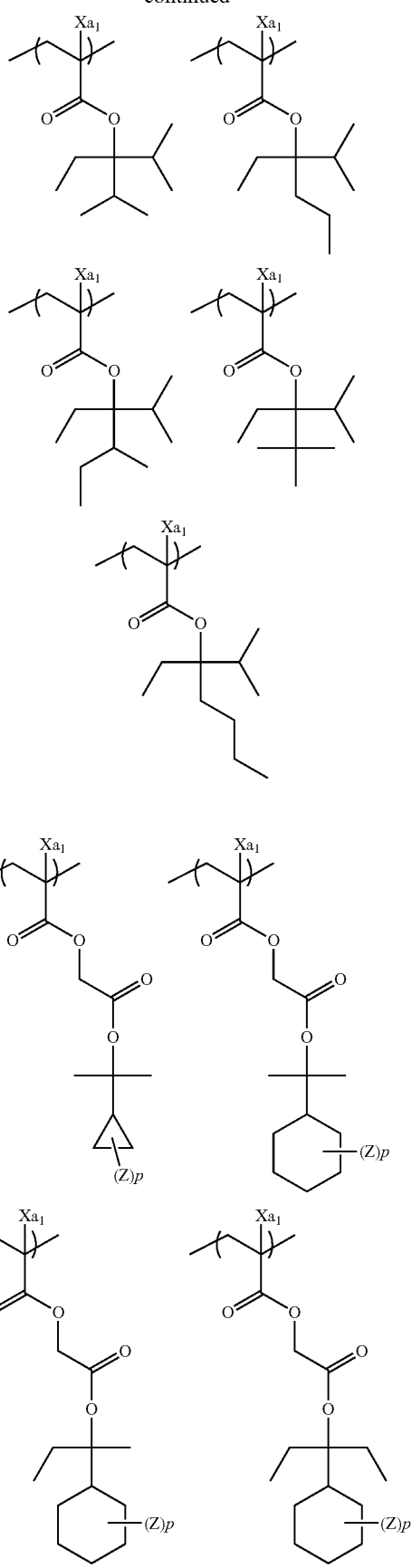
[Chem. 8]

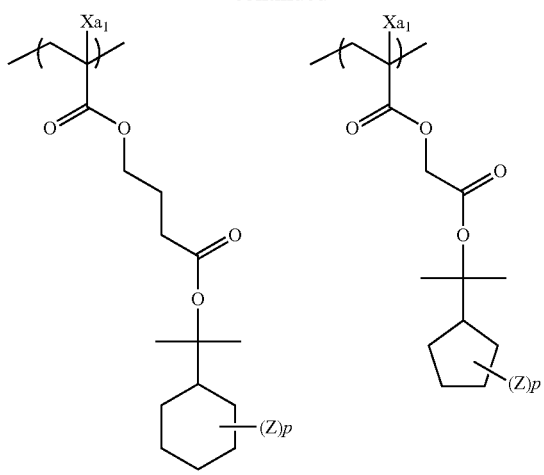
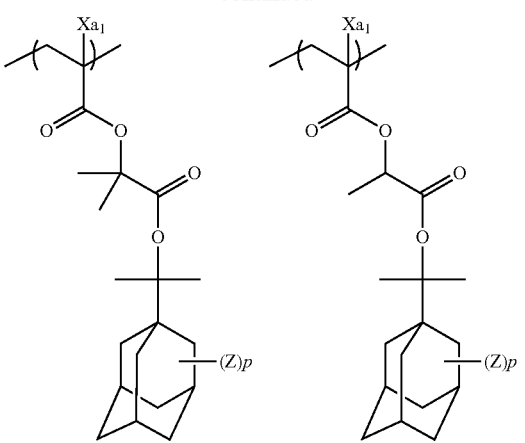
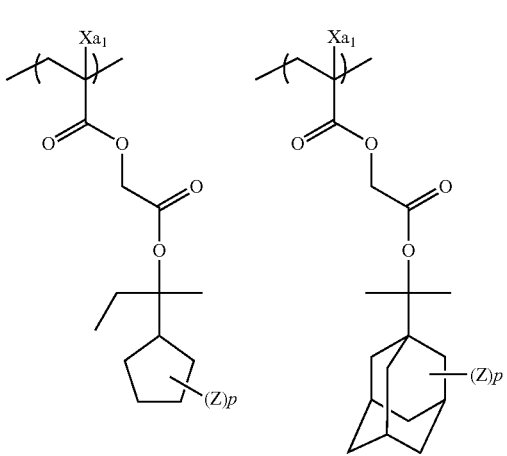
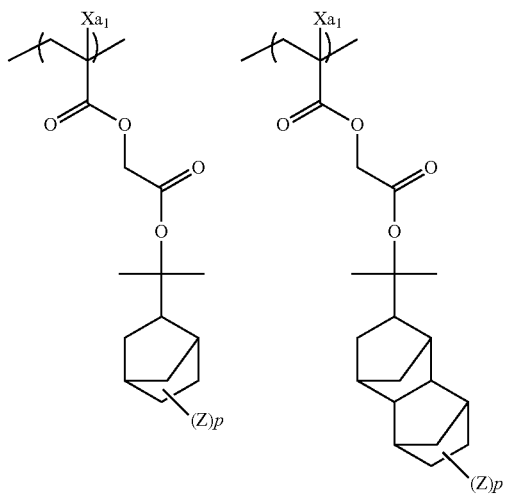
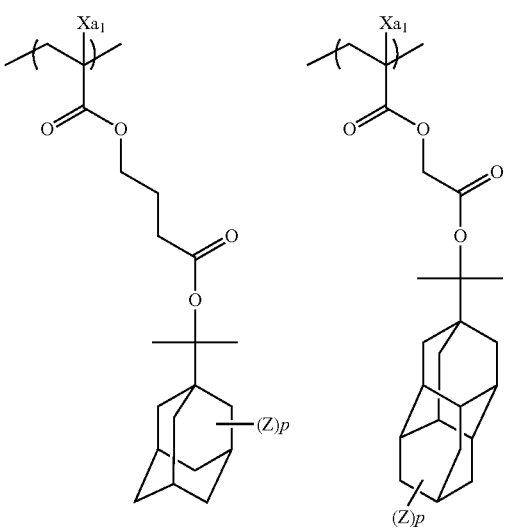
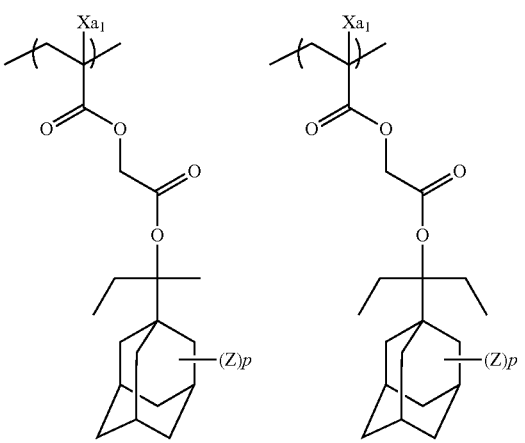

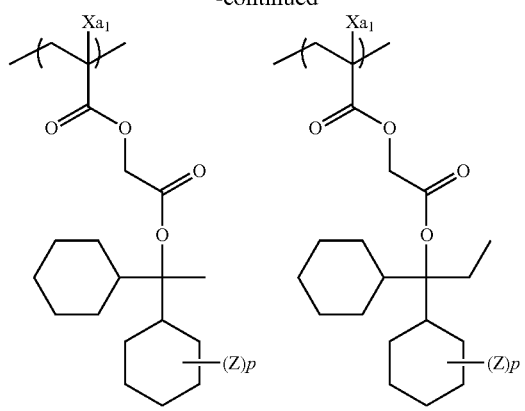
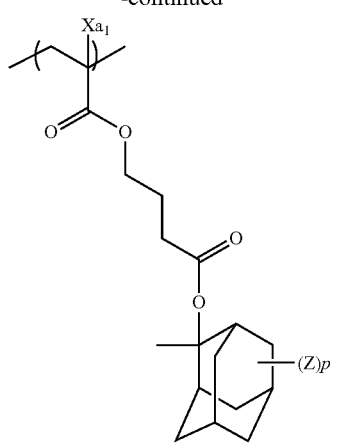
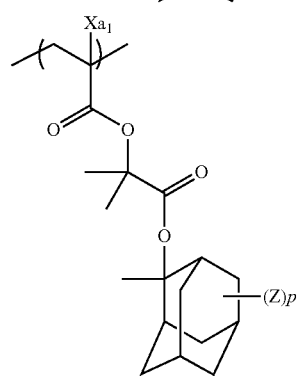
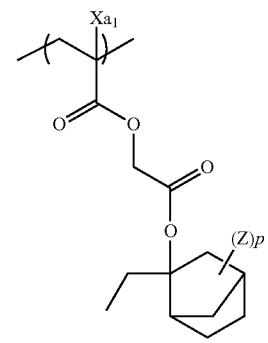
[Chem. 9]
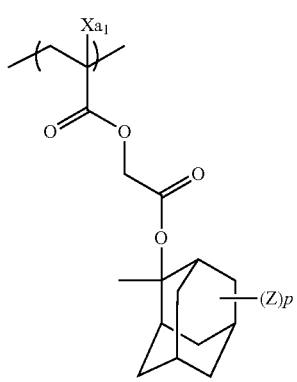
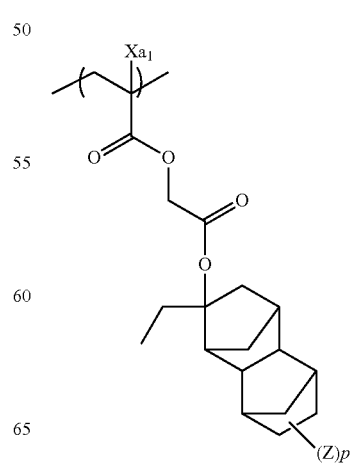

-continued

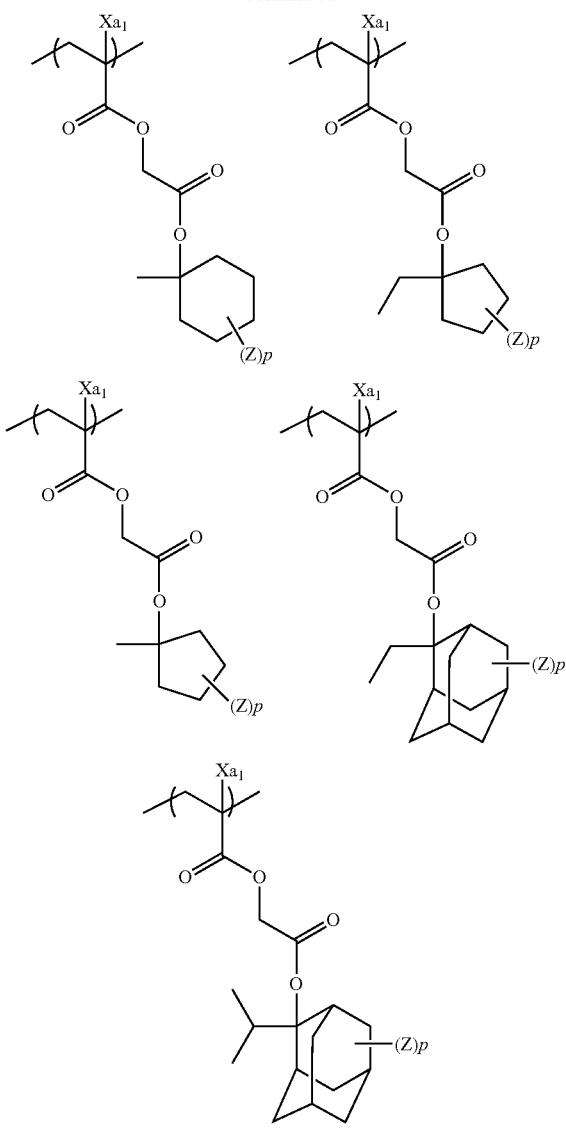

Further, according to an embodiment of the present invention, the repeating unit represented by General Formula (I) is preferably one of the repeating units represented by the following General Formulae (2-1), (2-2), (2-3), and (2-4). In the following specific examples, $Xa_1$ represents a hydrogen atom, $CH_3$, $CF_3$, or $CH_2OH$.

[Chem. 10]

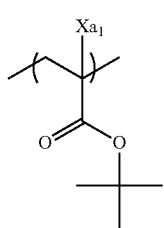
(2-1)

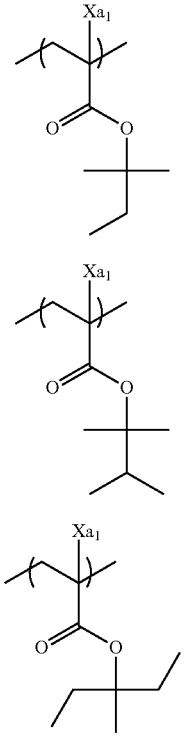

The content ratio (the total in a case where a plurality of types are contained) of the repeating unit of Resin (P) including an acid-decomposable group is preferably equal to or greater than 20 mol % and equal to or less than 80 mol % with respect to all repeating units within Resin (P), and equal to or greater than 50 mol % and equal to or less than 80 mol % is more preferable.

In particular, making the content ratio of the repeating unit including an acid-decomposable group be equal to or greater than 50 mol % is preferable so that the dissolution contrast of the exposed portion and the unexposed portion can be increased and pattern forming with excellent roughness properties such as the line width roughness is possible.

While Resin (P) ordinarily preferably does not contain a repeating unit having a lactone structure from the viewpoint of dry etching resistance, according to an embodiment of the present invention, a repeating unit having a lactone structure may be contained.

As a repeating unit having a lactone structure, the repeating unit represented by the following General Formula (AII) is preferable.

[Chem. 11]

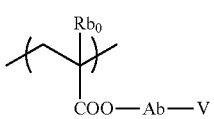
(AII)

In General Formula (AII), $Rb_0$ represents a hydrogen atom, a halogen atom, or an alkyl group which may have a substituent (preferably 1 to 4 carbon atoms).

As the preferable substituent that the alkyl group of $Rb_0$ may have, a hydroxyl group or a halogen atom may be included. Examples of the halogen atom of $Rb_0$ include a fluorine atom, a chlorine atom, a bromine atom, and an iodine atom. As $Rb_0$, a hydrogen atom, a methyl group, a hydroxymethyl group or a trifluoromethyl group is preferable, and a hydrogen atom or a methyl group is particularly preferable.

Ab represents a single bond, an alkylene group, a divalent linking group having a monocyclic or polycyclic cycloalkyl structure, an ether bond, an ester bond, a carbonyl group, or a divalent linking group formed by a combination thereof. Ab is preferably a single bond or a divalent linking group represented by $-Ab_1-CO_2-$.

$Ab_1$ is a linear or branched alkylene group, a monocyclic or polycyclic cycloalkylene group, and preferably, a methylene group, an ethylene group, a cyclohexylene group, an adamantylene group, or a norbornylene group.

V represents a group having a lactone structure.

While any group may be used as the group having a lactone structure as long as the group has a lactone structure, a lactone structure with 5 to 7-membered rings in which other ring structures are condensed in the form of forming a bicyclo structure and a spiro structure with a 5 to 7-membered ring is preferable. It is more preferable that a repeating unit having a lactone structure represented by any one of the following General Formulae (LC1-1) to (LC1-17) be included. Further, the lactone structure may be directly bonded to the main chain. Preferable lactone structures are (LC1-1), (LC1-4), (LC1-5), (LC1-6), (LC1-8), (LC1-13), and (LC1-14).

[Chem.12]

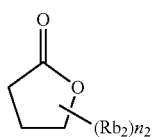
LC1-1

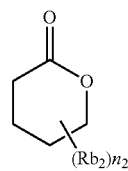
LC1-2

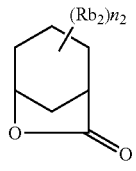
LC1-3

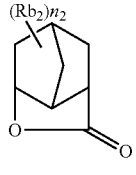
LC1-4

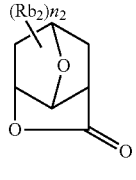
LC1-5

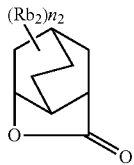
LC1-6

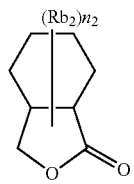
LC1-7

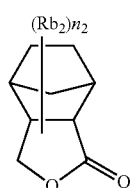
LC1-8

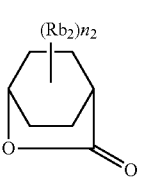
LC1-9

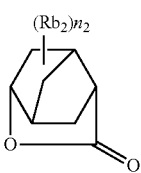
LC1-10

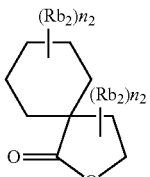
LC1-11

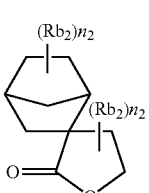
LC1-12

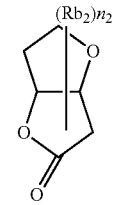
LC1-13

LC1-14
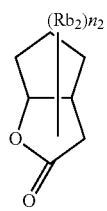

LC1-15
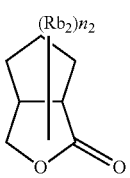

LC1-16
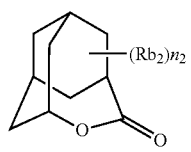

LC1-17
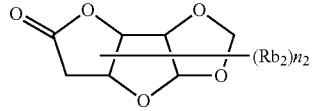

The lactone structure portion may have or may not have a substituent (Rb$_2$). As the preferable substituent (Rb$_2$), an alkyl group having 1 to 8 carbon atoms, a monovalent cycloalkyl group having 4 to 7 carbon atoms, an alkoxy group having 1 to 8 carbon atoms, an alkoxycarbonyl group having 2 to 8 carbon atoms, a carboxyl group, a halogen atom, a hydroxyl group, a cyano group, an acid-decomposable group, or the like, may be included. An alkyl group having 1 to 4 carbon atoms, a cyano group or an acid-decomposable group is more preferable. n$_2$ represents an integer from 0 to 4. If n$_2$ is 2 or more, the substituents (Rb$_2$) present in plural number may be the same as or different from each other, and the substituents (Rb$_2$) present in plural number may be bonded to each other to form a ring.

In the repeating units with the lactone group, optical isomers generally exist, but any optical isomer may be used. In addition, one optical isomer may be used alone or a plurality of optical isomers may be mixed and used. If one optical isomer is mainly used, the optical purity (ee) thereof is preferably 90% or more, and more preferably 95% or more.

The content ratio of the repeating unit having a lactone structure in Resin (P) is preferably within a range of 0 to 30 mol % with respect to all the repeating units within Resin (P) and is more preferably within a range of 0 to 10 mol %.

While specific examples of repeating units having a lactone structure within Resin (P) are shown below, the present invention is not limited thereto. In the formulae, Rx represents H, CH$_3$, CH$_2$OH, or CF$_3$.

[Chem. 13]

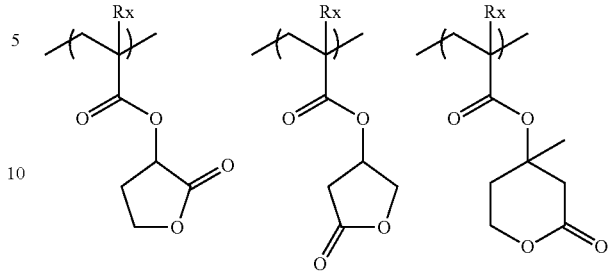

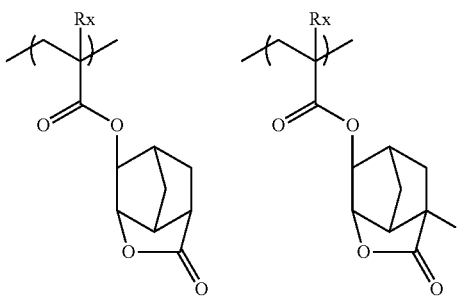

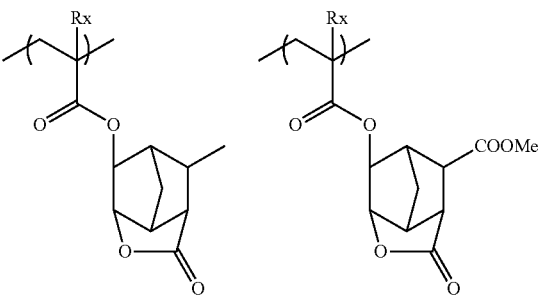

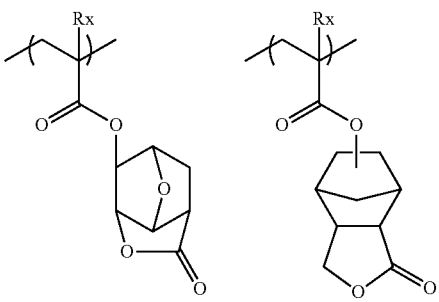

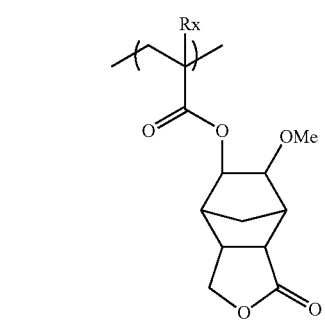

[Chem. 14]

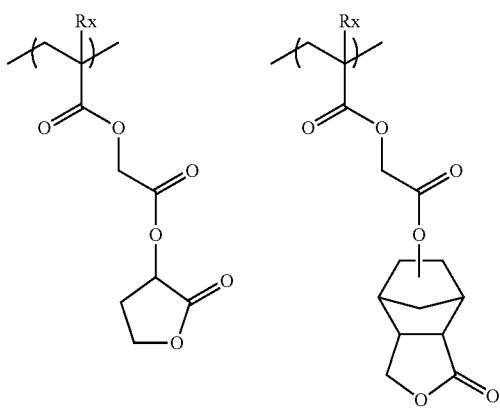

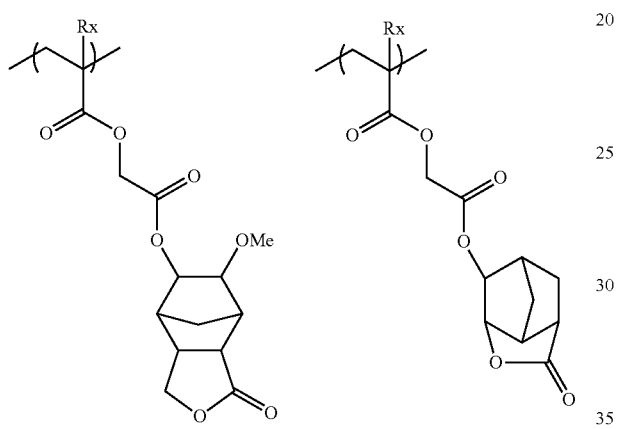

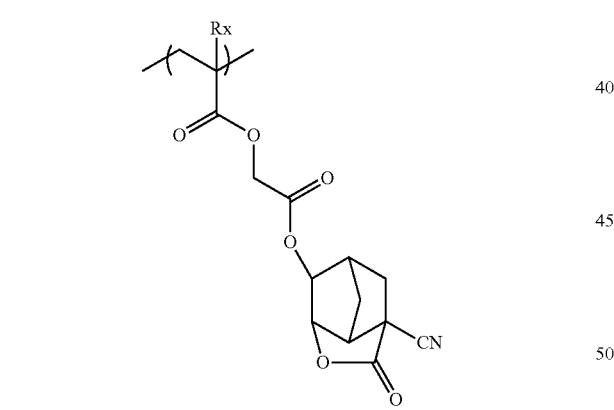

Resin (P) may include a repeating unit including a hydroxyl group. Due to this, substrate adhesion and affinity to the developer are improved. The repeating units having a hydroxyl group are preferably repeating units having an alicyclic hydrocarbon structure substituted with a hydroxyl group and preferably have no acid-decomposable group. The alicyclic hydrocarbon structure in the alicyclic hydrocarbon structure substituted with a hydroxyl group is preferably an adamantyl group, a diadamantyl group, or a norbornane group. The alicyclic hydrocarbon structure substituted with a preferable hydroxyl group is preferably a partial structure represented by the following General Formulae (VIIa) to (VIIc).

[Chem. 15]

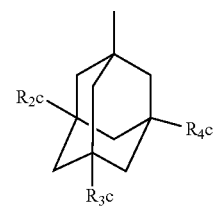

(VIIa)

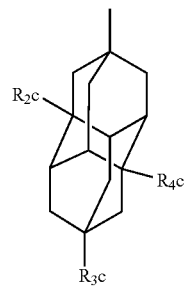

(VIIb)

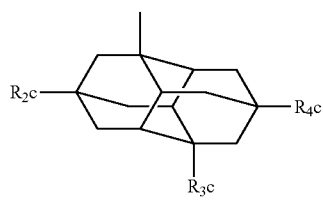

(VIIc)

In General Formulae (VIIa) to (VIIc), $R_2c$ to $R_4c$ respectively independently represent a hydrogen atom or a hydroxyl group, provided that at least one of $R_2c$ to $R_4c$ represents a hydroxyl group. Preferably, one or two of $R_2c$ to $R_4c$ is a hydroxyl group, and the rest are hydrogen atoms. In General Formula (VIIa), two of $R_2c$ to $R_4c$ are hydroxyl groups and other is more preferably a hydrogen atom.

Examples of the repeating units having a partial structure represented by General Formulae (VIIa) to (VIIc) include repeating units represented by the following General Formulae (AIIa) to (AIIc).

[Chem. 16]

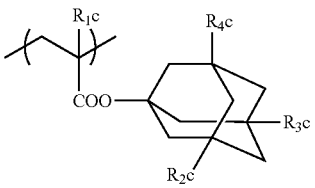

(AIIa)

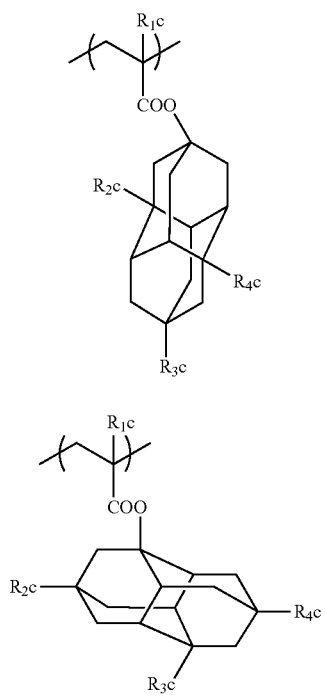

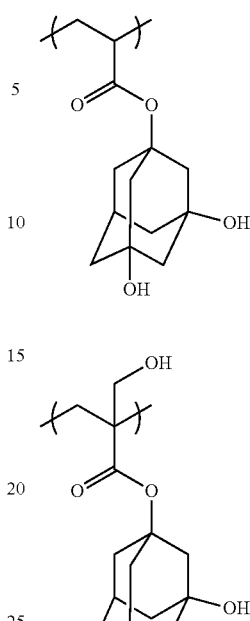

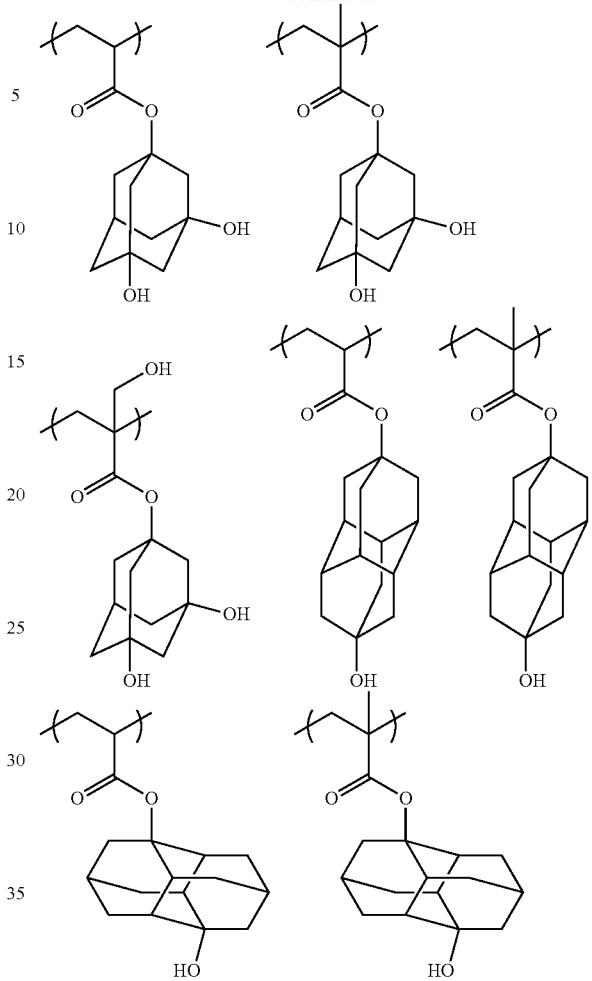

In General Formulae (AIIa) to (AIIc), $R_1c$ represents a hydrogen atom, a methyl group, a trifluoromethyl group, or a hydroxymethyl group.

$R_2c$ to $R_4c$ are synonymous with $R_2c$ to $R_4c$ in General Formulae (VIIa) to (VIIc).

While Resin (P) may or may not contain a repeating unit including a hydroxyl group, in a case where a repeating unit including a hydroxyl group is contained, the content ratio of the repeating unit including a hydroxyl group is preferably 1 to 20 mol % with respect to all repeating units within Resin (P), more preferably 3 to 15 mol %, and still more preferably 5 to 10 mol %.

Specific examples of the repeating units having a hydroxyl group are shown below, but the present invention is not limited thereto.

[Chem. 17]

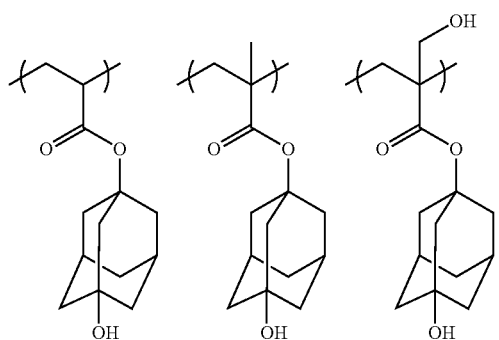

Resin (P) may also include a repeating unit including an acid group. Examples of the acid group include a carboxyl group, a sulfonamide group, a sulfonylimide group, a bissulfonylimide group, and an aliphatic alcohol substituted with an electron-withdrawing group at the α-position (for example, hexafluoroisopropanol group), and repeating units having a carboxyl group are more preferred. By containing a repeating unit including an acid group, the resolution through the use of contact holes increases. As the repeating unit including an acid group, a repeating unit in which the acid group is directly bonded to the main chain of the resin such as a repeating unit with acrylic acid or methacrylic acid, a repeating unit in which the acid group is bonded to the main chain of the resin via a linking group, and further a polymerization initiator or a chain transfer agent including an acid group used during polymerization and introducing to the terminal of a polymer chain are all preferable. A repeating structure with acrylic acid or methacrylic acid is particularly preferable.

While Resin (P) may not contain a repeating unit including an acid group, in a case where a repeating unit including an acid group is contained, the content ratio of the repeating unit including an acid group is preferably equal to or less than 15 mol % with respect to all repeating units within Resin (P), and equal to or less than 10 mol % is more preferable. In a case where Resin (P) contains a repeating unit including an acid group, the content ratio of the repeating unit including an acid group within Resin (P) is ordinarily equal to or greater than 1 mol %.

While specific examples of repeating units including an acid group are shown below, the present invention is not limited thereto. In the specific examples, Rx represents H, CH₃, CH₂OH, or CF₃.

[Chem. 18]

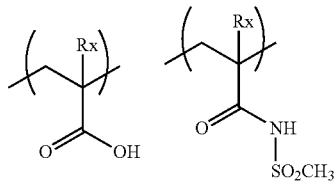

Resin (P) used in the composition of the invention may contain, in addition to the above-described repeating structure units, various repeating structure units for the purpose of controlling the dry etching resistance, suitability for a standard developer, substrate adhesion, a resist profile, and characteristics generally required for an actinic ray-sensitive or radiation-sensitive resin composition, such as resolution, heat resistance, and sensitivity.

The repeating structure units such as this may include repeating structure units corresponding to the following monomers, however, they are not limited to these.

In so doing, characteristics required of a resin used in the composition according to the present invention, in particular, micro-adjustment of
(1) solubility in a coating solvent,
(2) a film-forming property (glass transition point),
(3) alkaline developability,
(4) film loss (selection of hydrophilic, hydrophobic, or alkali-soluble group),
(5) adhesion of an unexposed portion to a substrate,
(6) dry etching resistance,
and the like is made possible.

As such a monomer, for example, there can be the examples of a compound or the like having one unsaturated bond where additional polymerization is possible which is selected from among acrylic esters, methacrylic esters, acrylamides, methacrylamides, an allyl compound, vinyl ethers, vinyl esters, and the like.

In addition to these, additionally-polymerizable unsaturated compounds, which are copolymerizable with monomers corresponding to a variety of repeating structure units described above, may be copolymerized.

In Resin (P) used in the composition of the present invention, the molar content ratio of each repeating structure unit is set as appropriate in order to adjust the dry etching resistance or suitability for a standard developer of an actinic ray-sensitive or radiation-sensitive resin composition, substrate adhesion, a resist profile, and characteristics generally required for an actinic ray-sensitive or radiation-sensitive resin composition, such as resolution, heat resistance, and sensitivity.

When the composition of the present invention is for ArF exposure, from the viewpoint of transparency with respect to ArF light, Resin (P) used in the composition of the present invention preferably essentially does not include an aromatic ring (specifically, the proportion of repeating units including an aromatic ring within the resin is preferably equal to or less than 5 mol %, more preferably equal to or less than 3 mol %, and ideally 0 mol %, that is, an aromatic group is not included), and Resin (P) preferably includes a monocyclic or polycyclic alicyclic hydrocarbon structure.

Further, Resin (P) preferably does not contain fluorine atoms or silicon atoms. More specifically, repeating units containing a fluorine atom or a silicon atom are preferably equal to or less than 15 mol % of all repeating units of the resin, equal to or less than 10 mol % is more preferable, equal to or less than 5 mol % is still more preferable, and including no repeating units containing a fluorine atom or a silicon atom is most preferable.

In a case where the composition of the present invention includes Resin (E) (hydrophobic resin) described later, such an embodiment is particularly preferable from the viewpoint of compatibility with a hydrophobic resin.

As Resin (P) which is used in the composition of the present invention, all the repeating units preferably are consisting of (meth)acrylate-based repeating units. In this case, any of the repeating units in which all repeating units are methacrylate-based repeating units, all repeating units are acrylate-based repeating units, and all repeating units are methacrylate-based repeating units and acrylate-based repeating units may be used, however, the acrylate-based repeating unit being 50 mol % or less of all repeating units is preferable.

In a case where the composition of the present invention is irradiated with KrF excimer laser light, an electron beam, X-rays or high-energy light rays with a wavelength of 50 nm or less (EUV and the like), Resin (P) preferably further has a hydroxystyrene-based repeating unit. More preferably, including a hydroxystyrene-based repeating unit, a hydroxystyrene-based repeating unit protected by an acid-decomposable group and an acid-decomposable repeating unit such as a tertiary alkyl(meth)acrylate ester is preferable.

Examples of the repeating unit having a preferable hydroxystyrene-based acid decomposable group may include a repeating unit with t-butoxycarbonyloxy styrene, 1-alkoxy-ethoxy styrene, tertiary alkyl(meth)acrylate ester or the like, and a repeating unit with 2-alkyl-2-adamantyl(meth)acrylate and dialkyl(1-adamantyl)methyl(meth)acrylate is more preferable.

Resin (P) in the present invention can be synthesized in accordance with conventional methods (for example, radical polymerization). For example, as the general synthesis method, a bulk polymerization method in which polymerization is carried out by dissolving monomer types and an initiator in a solvent and heating the solution, a dropwise addition polymerization method in which a solution of monomer types and an initiator is added dropwise to a heating solvent over 1 to 10 hours, or the like may be included, and a dropwise addition polymerization method is preferable. Examples of the reaction solvent include ethers such as tetrahydrofuran, 1,4-dioxane, and diisopropyl ether, ketones such as methyl ethyl ketone and methyl isobutyl ketone, an ester solvent such as ethyl acetate, an amide solvent such as dimethylformamide and dimethylacetamide, and the later-described solvents capable of dissolving the composition of the invention, such as propylene glycol monomethyl ether acetate, propylene glycol monomethyl ether, and cyclohexanone described later. Polymerization with the use of the same solvent as the solvent used in the photosensitive composition of the present invention is more preferable. This suppresses generation of the particles during storage.

It is preferable that the polymerization reaction be carried out under an inert gas atmosphere such as nitrogen or argon. As the polymerization initiator, commercially available radical initiators (an azo-based initiator, peroxide, or the like) are used to initiate the polymerization. As the radical initiator, an azo initiator is preferable, and the azo initiator having an ester group, a cyano group or a carboxyl group is preferable. Preferred examples of the initiator include azobisisobutyronitrile, azobisdimethylvaleronitrile, dimethyl 2,2'-azobis(2-methylpropionate), and the like. The initiator is added or added in installments, when necessary, and the target polymer is recovered after the reaction is complete by being added to a solvent using a method such as powder or solid recovery. The concentration of the reaction is 5 to 50% by mass and preferably 10 to 30% by mass. The reaction temperature is usually in the range of 10° C. to 150° C., preferably 30° C. to 120° C., more preferably 60 to 100° C.

After the reaction is complete, the resultant is allowed to cool to room temperature and purified. Purification may be carried out by applying common methods such as a liquid-liquid extraction method in which residual monomers and oligomer components are removed by washing with water or combining appropriate solvents, a purification method in a solution state such as ultrafiltration in which only those with less than or equal to a specific molecular weight are extracted and removed, a reprecipitation method in which residual monomers and the like are removed by coagulating the resin in a poor solvent through dropwise addition of the resin solution to a poor solvent, a purification method in a solid state in which a separated resin slurry is washed with a poor solvent, or the like. For example, the resin may be precipitated as a solid by the resin bringing a solvent in which the resin is hardly soluble or insoluble (poor solvent) which has a volumetric amount of 10 times or less, preferably from 10 to 5 times into contact with the reaction solution.

The solvent used during the operation of precipitation or reprecipitation from the polymer solution (a precipitation or reprecipitation solvent) may be sufficient if it is a poor solvent for the polymer, and the solvent which can be used may be appropriately selected from a hydrocarbon, a halogenated hydrocarbon, a nitro compound, an ether, a ketone, an ester, a carbonate, an alcohol, a carboxylic acid, water, a mixed solvent containing these solvents, and the like, according to the kind of the polymer. Among the above, a solvent including at least an alcohol (in particular, methanol or the like) or water is preferable as the precipitation or reprecipitation solvent.

The amount of the precipitation or reprecipitation solvent used may be appropriately selected by taking into consideration the efficiency, yield and the like, but in general, the amount used is from 100 to 10,000 parts by mass, preferably from 200 to 2000 parts by mass, and more preferably from 300 to 1000 parts by mass, based on 100 parts by mass of the polymer solution.

The temperature during the precipitation or reprecipitation may be appropriately selected by taking into consideration the efficiency or the operability but is usually at approximately 0 to 50° C., and preferably in the vicinity of room temperature (for example, approximately from 20 to 35° C.). The precipitation or reprecipitation operation may be carried out by well-known methods of a batch type or a continuous type using a common mixing vessel such as a stirred tank.

Typically, the precipitated or reprecipitated polymer is provided for use after being subjected to common solid-liquid separation such as filtration and centrifugation, and then dried. Filtration is carried out using a filtration material with solvent resistance, preferably under reduced pressure. Drying is performed at a temperature of approximately 30 to 100° C. and preferably approximately 30 to 50° C. under normal pressure or reduced pressure (preferably under reduced pressure).

Incidentally, after the resin is once precipitated and separated, the resin may be dissolved again in a solvent and then put into contact with a solvent in which the resin is hardly soluble or insoluble. That is, there may be used a method including, after the completion of radical polymerization reaction, bringing the polymer into contact with a solvent in which the polymer is hardly soluble or insoluble, to precipitate a resin (process a), separating the resin from the solution (process b), dissolving the resin again in a solvent to prepare a resin solution A (process c), bringing the resin solution A into contact with a solvent in which the resin is hardly soluble or insoluble and which has a volumetric amount of less than 10 times (preferably 5 times or less) the resin solution A, to precipitate a resin solid (process d), and separating the precipitated resin (process e).

Moreover, in order to inhibit the aggregation or the like of the resin after preparation of the composition, for example, as described in JP2009-037108A, a process in which the synthesized resin is dissolved in a solvent to prepare the solution and the resulting solution is heated at a temperature of about 30 to 90° C. for about 30 minutes to 4 hours may be added.

The weight average molecular weight of Resin (P) in the present invention in terms of polystyrene equivalent value through a GPC method is preferably 1,000 to 200,000, more preferably 2,000 to 40,000, even more preferably 3,000 to 30,000, and particularly preferably 3,000 to 27,000. By keeping the weight average molecular weight 1,000 to 200,000, deterioration in heat resistance and dry etching resistance may be prevented and deterioration of film formability due to developability deterioration or high viscosity may be prevented.

The dispersity (molecular weight distribution, Mw/Mn) is usually from 1.0 to 3.0, preferably from 1.0 to 2.6, more preferably from 1.0 to 2.0, and particularly preferably from 1.4 to 2.0. The resolution and resist formation is improved as the molecular weight distribution becomes smaller, and also, the side wall of the resist pattern becomes smoother and roughness is improved. In the present specification, the weight average molecular weight (Mw) and the number average molecular weight (Mn) of Resin (P) may be obtained by using, for example, an HLC-8120 (manufactured by Tosoh Corporation) using a TSK gel Multipore HXL-M column (manufactured by Tosoh Corporation, 7.8 mm ID×30.0 cm as a column and THF (tetrahydrofuran) as an eluent.

In the actinic ray-sensitive or radiation-sensitive resin composition of the present invention, the content ratio of Resin (P) in the total composition is preferably 30 to 99% by mass, and more preferably 60 to 95% by mass of total solid content.

In addition, in the present invention, Resin (P) may be used either alone or as a combination of two or more.

[2] Resin (A) not Including Repeating Unit Represented by General Formula (b1)

The actinic ray-sensitive or radiation-sensitive resin composition of the present invention may contain Resin (A) not including Repeating Unit (b1) represented by General Formula (bI) described above.

Resin (A) is preferably a resin in which the polarity increases and solubility with respect to a developer including an organic solvent decreases through the function of an acid, and more specifically, a resin including the "repeating unit including an acid-decomposable group" described above is preferable.

The content ratio of a repeating unit including an acid-decomposable group is preferably 20 to 80 mol % with respect to all repeating units within Resin (A), and is more preferably 50 to 80 mol %.

In addition to a repeating unit including an acid-decomposable group, Resin (A) may contain the repeating unit described as a repeating unit that Resin (P) may include. The preferable range of content of such repeating units with respect to all repeating units within Resin (A) is the same as that described for Resin (P).

Further, the preferable range of each physical characteristic value (for example, the molecular weight and the dispersity) of Resin (A) and the synthesis method of Resin (A) are also the same as those described for Resin (P).

While the actinic ray-sensitive or radiation-sensitive resin composition of the present invention may or may not contain Resin (A), in a case where the actinic ray-sensitive or radiation-sensitive resin composition does contain Resin (A), the content ratio of Resin (A) with respect to the total solid content of the composition is preferably 5 to 50% by mass and more preferably 5 to 30% by mass.

[3] Compound Capable of Generating Acid Through Irradiation of Actinic Rays or Radiation (B)

The composition in the present invention further contains a compound that generates an acid by the irradiation of actinic rays or radiation (B) (which will also be hereinafter referred to as an "acid generator"). Compound (B) capable of generating an acid through the irradiation of actinic rays or radiation is preferably a compound capable of generating an organic acid through the irradiation of actinic rays or radiation.

As an acid generator, photoinitiators of photo-cation polymerization, photoinitiators of photo radical polymerization, photodecoloring agents of dyes, photo-discoloring agents, known compounds that generate an acid by the irradiation of actinic rays or radiation, which are used in microresists or the like, and mixtures thereof may be properly selected and used.

Examples of the acid generator include diazonium salts, phosphonium salts, sulfonium salts, iodonium salts, imide sulfonates, oxime sulfonates, diazodisulfone, disulfone, and o-nitrobenzylsulfonate.

Examples of the preferred compounds among the acid generator (B) include the compounds represented by the following General Formulae (ZI), (ZII), and (ZIII).

[Chem. 19]

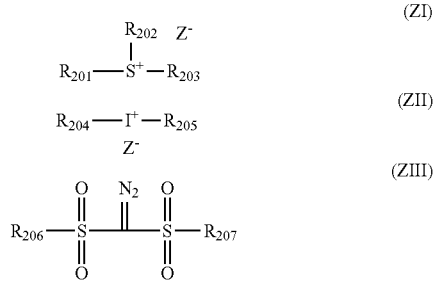

In General Formula (ZI), $R_{201}$, $R_{202}$, and $R_{203}$ respectively independently represent an organic group.

The number of carbon atoms of the organic group as $R_{201}$, $R_{202}$ and $R_{203}$ is generally 1 to 30, and preferably 1 to 20.

In addition, two of $R_{201}$ to $R_{203}$ may bond to form a ring structure, and an oxygen atom, a sulfur atom, an ester bond, an amide bond, or a carbonyl group may be included in the ring. As the group formed by two of $R_{201}$ to $R_{203}$ being bonded, an alkylene group (for example, a butylene group or a pentylene group) may be included.

$Z^-$ represents a non-nucleophilic anion.

As the non-nucleophilic anion as $Z^-$, for example, a sulfonate ion, a carboxylate ion, a sulfonylimide anion, a bis(alkylsulfonyl)imide anion, a tris(alkylsulfonyl)methyl anion, or the like may be included.

The non-nucleophilic anion is an anion having an exceedingly low ability for causing a nucleophilic reaction, and is also an anion capable of suppressing time-dependent decomposition due to the intermolecular nucleophilic reaction in the molecule. Therefore, temporal stability of the resist composition is improved.

As the sulfonate anion, for example, an aliphatic sulfonate anion, an aromatic sulfonate anion, a camphorsulfonic acid anion, or the like, may be included.

As the carboxylate anion, for example, an aliphatic carboxylate anion, an aromatic carboxylate anion, and an aralkyl carboxylate anion, or the like, may be included.

The aliphatic moiety in the aliphatic sulfonate anion and the aliphatic carboxylate anion may be an alkyl group or a cycloalkyl group. It is preferably an alkyl group having 1 to 30 carbon atoms and a cycloalkyl group having 3 to 30 carbon atoms, and examples thereof include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group, and a bornyl group, and the like.

The aromatic group in the aromatic sulfonate anion and the aromatic carboxylate anion may preferably include an aryl group having 6 to 14 carbon atoms, and may include, for example, a phenyl group, a tolyl group, a naphthyl group, or the like.

The alkyl group, the cycloalkyl group, and the aryl group in the aliphatic sulfonate anion and aromatic sulfonate anion may have a substituent. As the substituent of the alkyl group, the cycloalkyl group, and the aryl group in the aliphatic sulfonate anion and the aromatic sulfonate anion, for example, a nitro group, a halogen atom (a fluorine atom, a chlorine atom, a bromine atom, an iodine atom), a carboxyl group, a hydroxyl group, an amino group, a cyano group, an alkoxy group (preferably 1 to 15 carbon atoms), a cycloalkyl group (preferably 3 to 15 carbon atoms), an aryl group (preferably 6 to 14 carbon atoms), an alkoxycarbonyl group (preferably 2 to 7 carbon atoms), an acyl group (preferably 2 to 12 carbon atoms), an alkoxycarbonyloxy group (preferably 2 to 7 carbon atoms), an alkylthio group (preferably 1 to 15 carbon atoms), an alkylsulfonyl group (preferably 1 to 15 carbon atoms), an alkyliminosulfonyl group (preferably 1 to 15 carbon atoms), an aryloxysulfonyl group (preferably 6 to 20 carbon atoms), an alkyl aryloxysulfonyl group (preferably 7 to 20 carbon atoms), a cycloalkyl aryloxysulfonyl group (preferably 10 to 20 carbon atoms), an alkyloxy alkyloxy group (preferably 5 to 20 carbon atoms), a cycloalkyl alkyloxy alkyloxy group (preferably 8 to 20 carbon atoms), or the like, may be included. Regarding the aryl group and the ring structure each group has, an alkyl group (preferably 1 to 15 carbon atoms) or a cycloalkyl group (preferably 3 to 15 carbon atoms) may be further included as a substituent.

The aralkyl group in the aralkyl carboxylate anion may preferably include an aralkyl group having 7 to 12 carbon atoms, and may include, for example, a benzyl group, a phenethyl group, a naphthylmethyl group, a naphthylethyl group, a naphthylbutyl group, or the like.

The alkyl group, the cycloalkyl group, the aryl group, and the aralkyl group in the aliphatic carboxylate anion, the aromatic carboxylate anion and the aralkyl carboxylate anion may have a substituent. Examples of the substituent include the same as those in the aromatic sulfonate anion, that is, a halogen atom, an alkyl group, a cycloalkyl group, an alkoxy group, an alkylthio group, and the like.

As the sulfonylimide anion, for example, a saccharin anion may be included.

The alkyl group in the bis(alkylsulfonyl)imide anion and the tris(alkylsulfonyl)methide anion is preferably an alkyl group having 1 to 5 carbon atoms, and may include, for example, a methyl group, an ethyl group, a propyl group, an isopropyl group, an n-butyl group, an isobutyl group, a sec-butyl group, a pentyl group, a neopentyl group, or the like.

The two alkyl groups in the bis(alkylsulfonyl)imide anion may be linked with each other to form an alkylene group (preferably 2 to 4 carbon atoms), and may form a ring with the imide group and two sulfonyl groups.

Examples of a substituent that an alkylene group formed by the two alkyl groups in the alkyl groups and the bis(alkylsulfonyl)imide anion may have include a halogen atom, an alkyl group substituted with a halogen atom, an alkoxy group, an alkylthio group, an alkyloxy sulfonyl group, an aryloxy sulfonyl group, a cycloalkyl aryloxysulfonyl group, and the like, and an alkyl group substituted with a fluorine atom is preferable.

Examples of other non-nucleophilic anions include fluorophosphates (for example, $PF_6^-$), fluoroborates (for example, $BF_4^-$), fluoroantimonates (for example, $SbF_6^-$), and the like.

The non-nucleophilic anion for $Z^-$ is preferably an aliphatic sulfonate anion substituted at at least its α-position with respect to sulfonic acid with a fluorine atom, an aromatic sulfonate anion substituted with a fluorine atom, or a group having a fluorine atom, a bis(alkylsulfonyl)imido anion in which an alkyl group is substituted with a fluorine atom, or a tris(alkylsulfonyl)methide anion in which an alkyl group is substituted with a fluorine atom. The non-nucleophilic anion is more preferably a perfluorinated aliphatic sulfonate anion having 4 to 8 carbon atoms or a benzenesulfonate anion having a fluorine atom, and still more preferably a nonafluorobutanesulfonate anion, a perfluorooctanesulfonate anion, a pentafluorobenzenesulfonate anion, or a 3,5-bis(trifluoromethyl)benzenesulfonate anion.

The acid generator is preferably a compound capable of generating an acid represented by the following General Formula (III) or (IV) through the irradiation of actinic rays or radiation. When the acid generator is the compound capable of generating an acid represented by the following General Formula (III) or (IV), it has a cyclic organic group, and therefore, resolution and roughness property can be further improved.

The non-nucleophilic anion may be an anion capable of generating an organic acid, represented by the following General Formula (III) or (IV).

[Chem. 20]

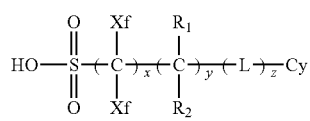

(III)

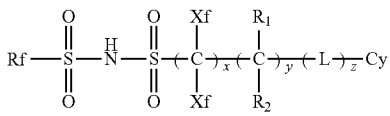

(IV)

In the general formula, Xf's respectively independently represent a fluorine atom, or an alkyl group substituted with at least one fluorine atom.

$R_1$ and $R_2$ respectively independently represent a hydrogen atom, a fluorine atom, or an alkyl group. In a case where y≥2, each $R_1$ and $R_2$ may be the same or different from one another.

L's respectively independently represent a divalent linking group. In a case where z≥2, each L may be the same or different from one another.

Cy represents a cyclic organic group.

Rf is a group including a fluorine atom.

x represents an integer from 1 to 20.

y represents an integer from 0 to 10.

z represents an integer from 0 to 10.

Xf represents a fluorine atom or an alkyl group substituted with at least one fluorine atom. The number of carbon atoms of this alkyl group is preferably 1 to 10, and more preferably 1 to 4. In addition, the alkyl group substituted with at least one fluorine atom is preferably a perfluoroalkyl group.

Xf is preferably a fluorine atom or a perfluoroalkyl group having 1 to 4 carbon atoms. More specifically, Xf is preferably a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, or $CH_2CH_2C_4F_9$, and more preferably a fluorine atom or $CF_3$. In particular, it is preferable that both Xf's are fluorine atoms.

$R_1$ and $R_2$ respectively independently represent a hydrogen atom, a fluorine atom, or an alkyl group. This alkyl group may have a substituent (preferably a fluorine atom) and is preferably an alkyl group having 1 to 4 carbon atoms. More preferably, this alkyl group is a perfluoroalkyl group having 1 to 4 carbon atoms. Specific examples of the alkyl group having a substituent as $R_1$ and $R_2$, may include, for example, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, or $CH_2CH_2C_4F_9$, and among these, $CF_3$ is preferable.

L represents a divalent linking group. As this divalent linking group, for example, —COO—, —COO—, —CONH—, —NHCO—, —CO—, —O—, —S—, —SO—, —SO$_2$—, an alkylene group (preferably 1 to 6 carbon atoms), a cycloalkylene group (preferably 3 to 10 carbon atoms), an alkenylene group (preferably 2 to 6 carbon atoms), a divalent linking group combining a plurality of these, or the like may be included. Among these, —COO—, —COO—, —CONH—, —NHCO—, —CO—, —O—, —SO$_2$—, —COO-alkylene group-, —OCO-alkylene group-, —CONH-alkylene group-, or —NHCO-alkylene group-, is preferable, and —COO—, —COO—, —CONH—, —SO$_2$—, —COO-alkylene group-, or —OCO-alkylene group- is more preferable.

Cy represents a cyclic organic group. As the cyclic organic group, for example, an alicyclic group, an aryl group, and a heterocyclic group may be included.

The alicyclic group may be monocyclic or polycyclic. Examples of the monocyclic alicyclic group include a monocyclic cycloalkyl group such as a cyclopentyl group, a cyclohexyl group, and a cyclooctyl group. As the polycyclic alicyclic group, for example, a polycyclic cycloalkyl group such as a norbornyl group, a tricyclodecanyl group, a tetracyclodecanyl group, a tetracyclododecanyl group, and an adamantyl group may be included. Among these, an alicyclic group having a bulky structure of 7 or more carbon atoms such as a norbornyl group, a tricyclodecanyl group, a tetracyclodecanyl group, a tetracyclododecanyl group, and an adamantyl group is preferable from the viewpoint of suppressing diffusibility in a film in a PEB process (heating after exposure) and improving the MEEF (Mask Error Enhancement Factor).

The aryl group may be monocyclic or polycyclic. As this aryl group, for example, a phenyl group, a naphthyl group, a phenanthryl group, and an anthryl group may be included. Among these, a naphthyl group of which light absorbance at 193 nm is relatively low is preferable.

The heterocyclic group may be monocyclic or polycyclic, however, a polycyclic heterocyclic group can suppress diffusion of acid more. In addition, the heterocyclic group may or may not have aromaticity. As the heterocyclic group which has aromaticity, for example, a furan ring, a thiophene ring, a benzofuran ring, a benzothiophene ring, a dibenzofuran ring, a dibenzothiophene ring, and a pyridine ring may be included. As the heterocyclic group which does not have aromaticity, for example, a tetrahydropyran ring, a lactone ring and a decahydro isoquinoline ring may be included. As the heterocyclic ring in the heterocyclic group, a furan ring, a thiophene ring, a pyridine ring, or a decahydro isoquinoline ring is particularly preferable. In addition, as examples of the lactone ring, the lactone structure exemplified in Resin (P) described above may be included.

The above cyclic organic group may have a substituent. Examples of the substituent include an alkyl group (may be either linear or branched, and 1 to 12 carbon atoms is preferable), a cycloalkyl group (may be any of monocyclic, polycyclic, or a spiro ring, and 3 to 20 carbon atoms is preferable), an aryl group (6 to 14 carbon atoms is preferable), a hydroxyl group, an alkoxy group, an ester group, an amide group, a urethane group, a ureido group, a thioether group, a sulfonamido group, a sulfonic acid ester group, and the like. In addition, the carbon constituting the cyclic organic group (carbon contributing to the ring formation) may also be a carbonyl carbon.

x is preferably 1 to 8, preferably 1 to 4 among these, and particularly preferably 1. y is preferably 0 to 4 and more preferably 0. z is preferably from 0 to 8, and preferably from 0 to 4 among these.

As the group containing a fluorine atom represented by Rf, for example, an alkyl group having at least one fluorine atom, a cycloalkyl group having at least one fluorine atom, and an aryl group having at least one fluorine atom may be included.

The alkyl group, cycloalkyl group, and aryl group may be substituted with a fluorine atom or may be substituted with other substituents containing a fluorine atom. If Rf is a cycloalkyl group having at least one fluorine atom or an aryl group having at least one fluorine atom, the other substituents containing a fluorine atom may include, for example, an alkyl group substituted with at least one fluorine atom.

In addition, the alkyl group, cycloalkyl group, and aryl group may be further substituted with a substituent which does not contain a fluorine atom. Examples of the substituent include those containing no fluorine atoms among those described above for Cy.

As the alkyl group having at least one fluorine atom represented by Rf, for example, the same alkyl group substituted with at least one fluorine atom represented by Xf described above may be included. As the cycloalkyl group having at least one fluorine atom represented by Rf, for example, a perfluorocyclopentyl group and a perfluorocyclohexyl group may be included. As the aryl group having at least one fluorine atom represented by Rf, for example, a perfluorophenyl group may be included.

As the organic group represented by $R_{201}$, $R_{202}$, and $R_{203}$, for example, corresponding groups in Compounds (ZI-1), (ZI-2), (ZI-3), and (ZI-4) described later may be included.

In addition, the organic group may be a compound having a plurality of structures represented by General Formula (ZI). For example, a compound having a structure in which at least one of $R_{201}$ to $R_{203}$ of the compound represented by General Formula (ZI) is bonded to at least one of $R_{201}$ to $R_{203}$ of another compound represented by General Formula (ZI) through a single bond or a linking group may be included.

The more preferable (ZI) component may include Compounds (ZI-1), (ZI-2), (ZI-3), and (ZI-4) described below.

Compound (ZI-1) is an aryl sulfonium compound in which at least one of $R_{201}$ to $R_{203}$ of General Formula (ZI) is an aryl group, that is, a compound in which the aryl sulfonium is a cation.

In the aryl sulfonium compound, all of $R_{201}$ to $R_{203}$ may be an aryl group, or a part of $R_{201}$ to $R_{203}$ may be an aryl group and the rest may be an alkyl group or a cycloalkyl group.

The aryl sulfonium compound may include, for example, a triarylsulfonium compound, a diaryl alkyl sulfonium compound, an aryl dialkyl sulfonium compound, a diaryl cycloalkyl sulfonium compound, or an aryl dicycloalkyl sulfonium compound.

As the aryl group of the aryl sulfonium compound, a phenyl group or a naphthyl group is preferable, and a phenyl group is more preferable. The aryl group may be an aryl group containing a heterocyclic structure having an oxygen atom, a nitrogen atom, a sulfur atom, or the like. The heterocyclic structure may include a pyrrole residue, a furan residue, a thiophene residue, an indole residue, a benzofuran residue, a benzothiophene residue, or the like. When the aryl sulfonium compound has two or more aryl groups, the two or more aryl groups may be the same as or different from each other.

The alkyl group or the cycloalkyl group that the aryl sulfonium compound has when necessary is preferably a linear or branched alkyl group having 1 to 15 carbon atoms and a cycloalkyl group having 3 to 15 carbon atoms, and may include, for example, a methyl group, an ethyl group, a propyl group, an n-butyl group, a sec-butyl group, a t-butyl group, a cyclopropyl group, a cyclobutyl group, a cyclohexyl group, or the like.

The aryl group, the alkyl group, and the cycloalkyl group of $R_{201}$ to $R_{203}$ may have an alkyl group (for example, 1 to 15 carbon atoms), a cycloalkyl group (for example, 3 to 15 carbon atoms), an aryl group (for example, 6 to 14 carbon atoms), an alkoxy group (for example, 1 to 15 carbon atoms), a halogen atom, a hydroxyl group, or a phenylthio group as a substituent. The substituent is preferably a linear or branched alkyl group having 1 to 12 carbon atoms, a cycloalkyl group having 3 to 12 carbon atoms, or a linear, branched, or cyclic alkoxy group having 1 to 12 carbon atoms, and more preferably an alkyl group having 1 to 4 carbon atoms or an alkoxy group having 1 to 4 carbon atoms. The substituent maybe substituted for any one of the three $R_{201}$ to $R_{203}$, or may be substituted for all three. In addition, when $R_{201}$ to $R_{203}$ are the aryl group, the substituent is preferably substituted at the p-position of the aryl group.

Next, Compound (ZI-2) will be described.

Compound (ZI-2) is a compound in which $R_{201}$ to $R_{203}$ in Formula (ZI) respectively independently represent an organic group which does not have an aromatic ring. Here, an aromatic ring also includes an aromatic ring containing a hetero atom.

In the organic group which does not contain an aromatic ring as $R_{201}$ to $R_{203}$, the number of carbon atoms is generally 1 to 30 and the number of carbon atoms is preferably 1 to 20.

$R_{201}$ to $R_{203}$ are respectively independently preferably an alkyl group, a cycloalkyl group, an allyl group or a vinyl group, more preferably a linear or branched 2-oxo alkyl group, a 2-oxocycloalkyl group, an alkoxycarbonyl methyl group, and particularly preferably a linear or branched 2-oxo alkyl group.

As the alkyl group and the cycloalkyl group of $R_{201}$ to $R_{203}$, a linear or branched alkyl group having 1 to 10 carbon atoms (for example, a methyl group, an ethyl group, a propyl group, a butyl group or a pentyl group), a cycloalkyl group having 3 to 10 carbon atoms (a cyclopentyl group, a cyclohexyl group or a norbonyl group) may be preferably included. As the more preferable alkyl group, a 2-oxo alkyl group or an alkoxycarbonyl methyl group may be included. As the more preferable cycloalkyl group, a 2-oxo cycloalkyl group may be included.

The 2-oxo alkyl group may be either linear or branched and preferably includes a group having >C=O at the second position of the above alkyl group.

The 2-oxo cycloalkyl group may preferably include a group having >C=O at the second position of the above cycloalkyl group.

The alkoxy group in the alkoxycarbonyl methyl group may preferably include an alkoxy group having 1 to 5 carbon atoms (a methoxy group, an ethoxy group, a propoxy group, a butoxy group, or a pentoxy group).

$R_{201}$ to $R_{203}$ may be further substituted with a halogen atom, an alkoxy group (for example, 1 to 5 carbon atoms), a hydroxyl group, a cyano group or a nitro group.

Next, Compound (ZI-3) will be described.

Compound (ZI-3) is a compound represented by the following General Formula (ZI-3), which is a compound having a phenacylsulfonium salt structure.

[Chem. 21]

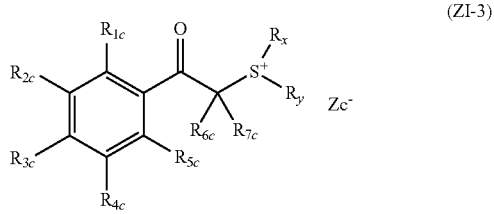

(ZI-3)

In General Formula (ZI-3), $R_{1c}$ to $R_{5c}$ respectively independently represent a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group.

$R_{6c}$ and $R_{7c}$ respectively independently represent a hydrogen atom, an alkyl group, a cycloalkyl group, a halogen atom, a cyano group, or an aryl group.

$R_x$ and $R_y$ respectively independently represent an alkyl group, a cycloalkyl group, a 2-oxo alkyl group, a 2-oxo cycloalkyl group, an alkoxycarbonylalkyl group, an allyl group, or a vinyl group.

Any two or more of $R_{1c}$ to $R_{5c}$, $R_{5c}$ and $R_{6c}$, $R_{6c}$ and $R_{7c}$, $R_{5c}$ and $R_x$, $R_x$ and $R_y$, may be bonded to each other to form a ring structure, and this ring structure may include an oxygen atom, a sulfur atom, a ketone group, an ester bond, or an amide bond.

The ring structure may include an aromatic or non-aromatic hydrocarbon ring, an aromatic or non-aromatic heterocyclic ring, or a polycyclic condensed ring formed by two or more of these rings being combined. The ring structure includes a 3- to 10-membered ring, and is preferably a 4- to 8-membered ring, and more preferably a 5- or 6-membered ring.

The group formed by any two or more of $R_{1c}$ to $R_{5c}$, $R_{6c}$ and $R_{7c}$, and $R_x$ and $R_y$ being bonded may include a butylene group, a pentylene group, or the like.

The group formed by $R_{5c}$ and $R_{6c}$, and $R_{5c}$ and $R_x$ being bonded may preferably include a single bond or an alkylene group, and as an alkylene group, a methylene group, an ethylene group, or the like may be included.

$Zc^-$ represents a non-nucleophilic anion, and may include the same non-nucleophilic anions as $Z^-$ in General Formula (ZI).

The alkyl group as $R_{1c}$ to $R_{7c}$ may be either linear or branched, and may include, for example, an alkyl group having 1 to 20 carbon atoms, preferably a linear or branched alkyl group having 1 to 12 carbon atoms (for example, a methyl group, an ethyl group, a linear or branched propyl group, a linear or branched butyl group, or a linear or branched pentyl group), and the cycloalkyl group may include, for example, a cycloalkyl group having 3 to 10 carbon atoms (for example, a cyclopentyl group or a cyclohexyl group).

The aryl group as $R_{1c}$ to $R_{5c}$ preferably has 5 to 15 carbon atoms, and examples thereof include a phenyl group and a naphthyl group.

The alkoxy group as $R_{1c}$ to $R_{5c}$ may be any of linear, branched, and cyclic, and examples thereof include an alkoxy group having 1 to 10 carbon atoms, preferably a linear or branched alkoxy group having 1 to 5 carbon atoms (for example, a methoxy group, an ethoxy group, a linear or branched propoxy group, a linear or branched butoxy group, and a linear or branched pentoxy group), and a cyclic alkoxy group having 3 to 10 carbon atoms (for example, a cyclopentyloxy group and a cyclohexyloxy group).

Specific examples of the alkoxy group in the alkoxycarbonyl group as $R_{1c}$ to $R_{5c}$ are the same as specific examples of the alkoxy group as $R_{1c}$ to $R_{5c}$ described above.

Specific examples of the alkyl group in the alkylcarbonyloxy group and the alkylthio group as $R_{1c}$ to $R_{5c}$ are the same as specific examples of the alkyl group as $R_{1c}$ to $R_{5c}$ described above.

Specific examples of the cycloalkyl group in the cycloalkyl carbonyloxy group as $R_{1c}$ to $R_{5c}$ are the same as specific examples of the cycloalkyl group of $R_{1c}$ to $R_{5c}$ described above.

Specific examples of the aryl group in the aryloxy group and the arylthio group as $R_{1c}$ to $R_{5c}$ are the same as specific examples of the aryl group $R_{1c}$ to $R_{5c}$ described above.

Preferably, any of $R_{1c}$ to $R_{5c}$ is a linear or branched alkyl group, a cycloalkyl group, or a linear, branched or cyclic alkoxy group, and more preferably, the sum of the number of carbon atoms in $R_{1c}$ to $R_{5c}$ is 2 to 15. As a result, solvent solubility is further improved and the generation of particles is suppressed during storage.

The ring structure which may be formed by the mutual bonding of any two or more of $R_{1c}$ to $R_{5c}$, preferably includes a 5- or 6-membered ring, and particularly preferably a 6-membered ring (such as a phenyl ring).

The ring structure which may be formed by $R_{5c}$ and $R_{6c}$ being bonded to each other may include a 4 or more-membered ring (particularly preferably a 5- to 6-membered ring) formed together with a carbonyl carbon atom and a carbon atom in General Formula (I) by $R_{5c}$ and $R_{6c}$ being bonded to each other to constitute a single bond or an alkylene group (a methylene group, an ethylene group, or the like).

The aryl group as $R_{6c}$ and $R_{7c}$ preferably has 5 to 15 carbon atoms, and may include, for example, a phenyl group or a naphthyl group.

As an aspect of $R_{6c}$ and $R_{7c}$, it is preferable that both of them be an alkyl group. In particular, it is preferable that each of $R_{6c}$ and $R_{7c}$ be a linear or branched alkyl group having 1 to 4 carbon atoms, and particularly, it is preferable that both be a methyl group.

In addition, when $R_{6c}$ and $R_{7c}$ are bonded to each other to form a ring, the group formed by $R_{6c}$ and $R_{7c}$ being bonded is preferably an alkylene group having 2 to 10 carbon atoms, and may include, for example, an ethylene group, a propylene group, a butylene group, a pentylene group, a hexylene group, or the like. In addition, the ring formed by $R_{6c}$ and $R_{7c}$ being bonded may have a hetero atom such as an oxygen atom in the ring.

The alkyl group and the cycloalkyl group as $R_x$ and $R_y$ may include the same alkyl groups and the cycloalkyl groups as $R_{1c}$ to $R_{7c}$.

The 2-oxo alkyl group and the 2-oxo cycloalkyl group as $R_x$ and $R_y$ may include the group having >C=O at the second position of the alkyl group and the cycloalkyl group as $R_{1c}$ to $R_{7c}$.

The alkoxy group in the alkoxycarbonyl alkyl group as $R_x$ and $R_y$ may include the same alkoxy groups as $R_{1c}$ to $R_{5c}$, and the alkyl groups may include, for example, an alkyl group having 1 to 12 carbon atoms, and preferably include a linear alkyl group having 1 to 5 carbon atoms (for example, a methyl group or an ethyl group).

The allyl group as $R_x$ and $R_y$ is not particularly limited, however, an unsubstituted allyl group, or an allyl group substituted with a monocyclic or polycyclic cycloalkyl group (preferably a cycloalkyl group having 3 to 10 carbon atoms) is preferable.

The vinyl group as $R_x$ and $R_y$ is not particularly limited, however, an unsubstituted vinyl group, or a vinyl group substituted with a monocyclic or polycyclic cycloalkyl group (preferably a cycloalkyl group having 3 to 10 carbon atoms) is preferable.

A ring structure which may be formed by the mutual bonding of $R_{5c}$ and $R_x$ includes a 5 or higher-membered ring (particularly preferably a 5-membered ring), formed together with a sulfur atom and a carbonyl carbon atom in General Formula (I) by the mutual bonding of $R_{5c}$ and $R_x$ to constitute a single bond or an alkylene group (a methylene group, an ethylene group, and the like).

The ring structure which may be formed by the mutual bonding of $R_x$ and $R_y$ includes a 5- or 6-membered ring, and particularly preferably a 5-membered ring (that is, a tetrahydrothiophene ring), formed together with the sulfur atom in General Formula (ZI-3) by divalent $R_x$ and $R_y$ (for example, a methylene group, an ethylene group, a propylene group, or the like).

$R_x$ and $R_y$ are preferably an alkyl group or a cycloalkyl group having 4 or more carbon atoms, and are an alkyl group or a cycloalkyl group having more preferably 6 or more, even more preferably 8 or more carbon atoms.

$R_1$, to $R_{7c}$, $R_x$, and $R_y$ may have further substituents and the substituent such as this may include a halogen atom (for example, a fluorine atom), a hydroxyl group, a carboxyl group, a cyano group, a nitro group, an alkyl group, a cycloalkyl group, an aryl group, an alkoxy group, an aryloxy group, an acyl group, an arylcarbonyl group, an alkoxyalkyl group, an aryloxyalkyl group, an alkoxycarbonyl group, an aryloxycarbonyl group, an alkoxycarbonyloxy group, an aryloxycarbonyloxy group, or the like.

$R_{1c}$, $R_{2c}$, $R_{1c}$, and $R_{5c}$ in the General Formula (ZI-3) described above respectively independently preferably represent a hydrogen atom, and $R_{1c}$ represents a group other than a hydrogen atom, that is, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group.

Specific examples of the cation of the compound represented by General Formula (ZI-2) or (ZI-3) in the present invention are shown below.

[Chem. 22]

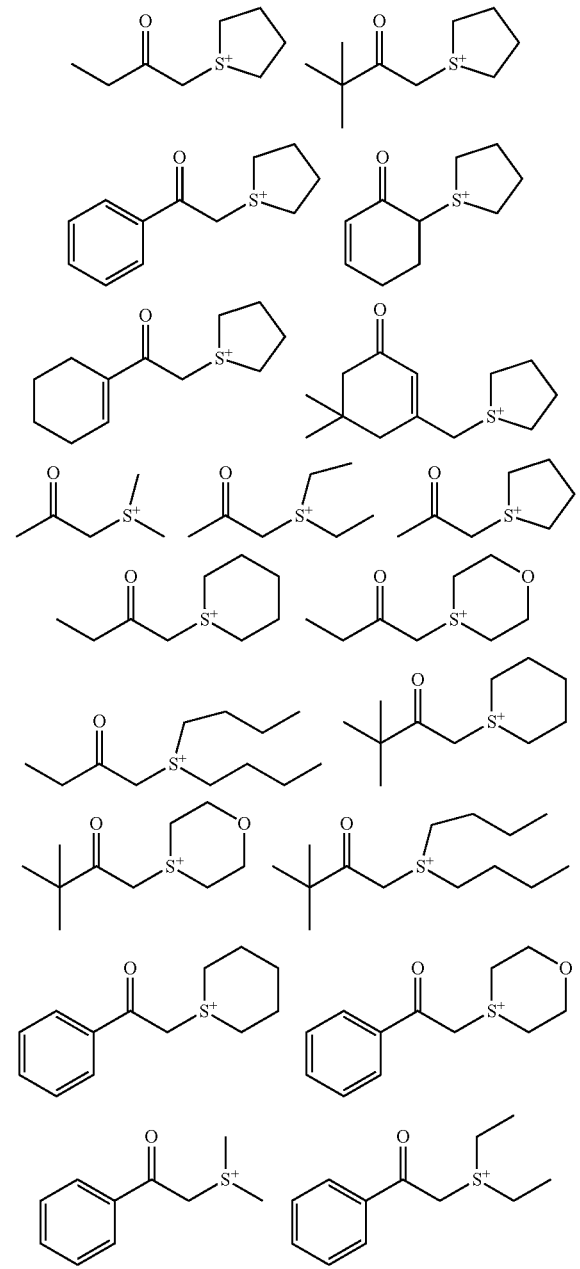

[Chem. 23]

47
-continued
[Chem. 24]
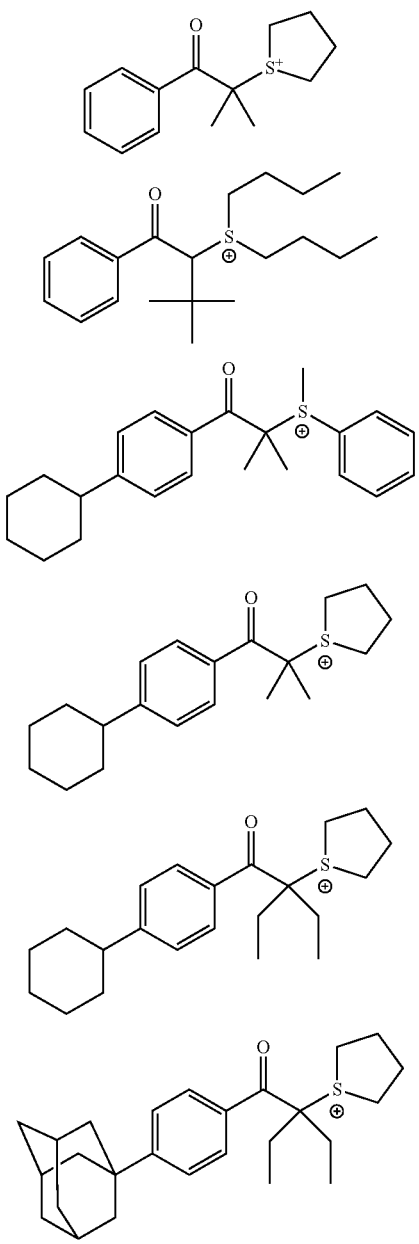
48
-continued
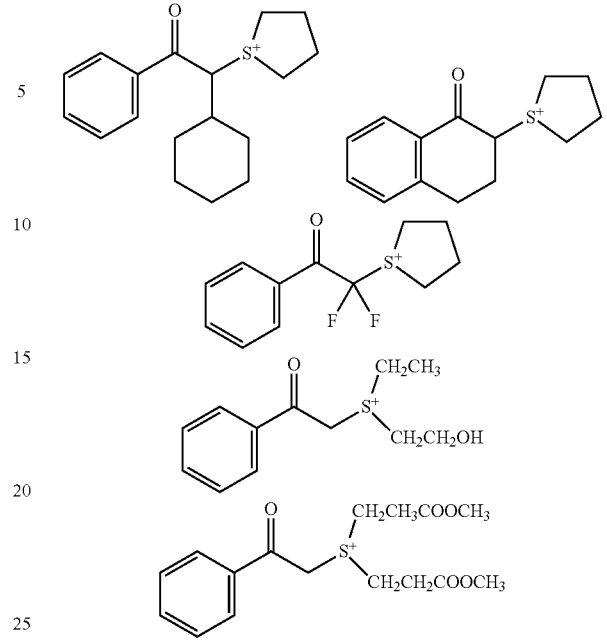
[Chem. 25]
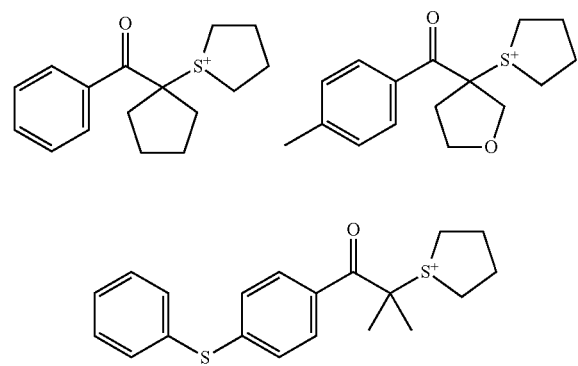
[Chem. 26]

-continued

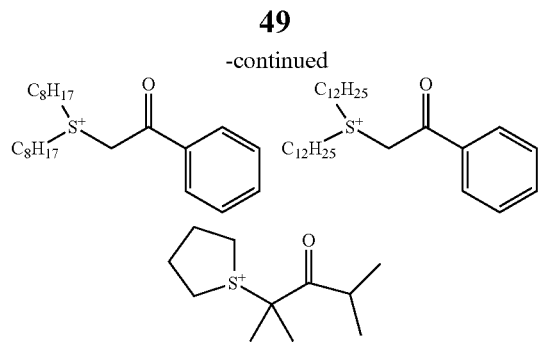

[Chem. 27]

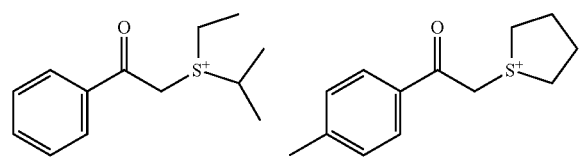

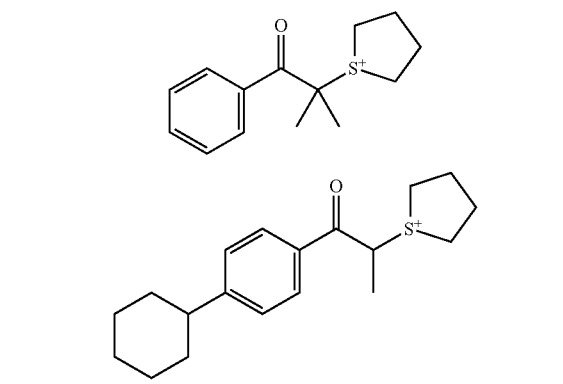

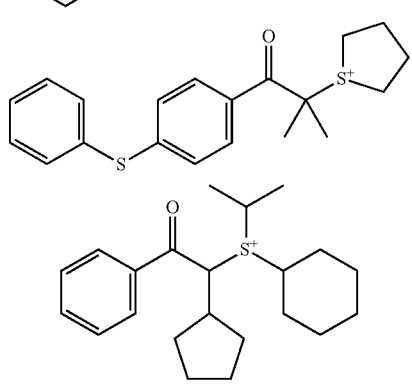

-continued

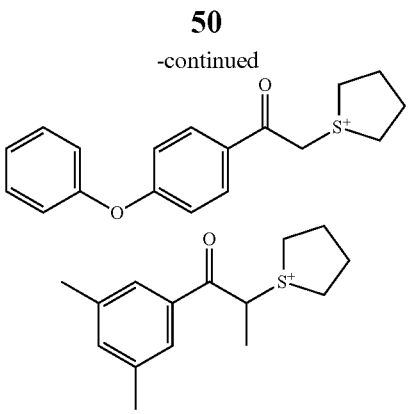

Next, Compound (ZI-4) will be described.
Compound (ZI-4) is represented by following General Formula (ZI-4).

[Chem. 28]

$$\text{(ZI-4)}$$

In General Formula (ZI-4), $R_{13}$ represents a group having a hydrogen atom, a fluorine atom, a hydroxyl group, an alkyl group, a cycloalkyl group, an alkoxy group, an alkoxycarbonyl group, or a cycloalkyl group. These groups may have a substituent.

$R_{14}$'s, if present in plural number, respectively independently represent a group having a hydroxyl group, an alkyl group, a cycloalkyl group, an alkoxy group, an alkoxycarbonyl group, an alkylcarbonyl group, an alkylsulfonyl group, a cycloalkylsulfonyl group, or a cycloalkyl group. These groups may have a substituent.

$R_{15}$'s respectively independently represent an alkyl group, a cycloalkyl group, or a naphthyl group. Two $R_{15}$'s may be bonded to each other to form a ring. These groups may have a substituent.

l represents an integer from 0 to 2.
r represents an integer from 0 to 8.
$Z^-$ represents a non-nucleophilic anion, and examples thereof include the same non-nucleophilic anions as mentioned above as $Z^-$ in General Formula (ZI).

In General Formula (ZI-4), the alkyl group of $R_{13}$, $R_{14}$, and $R_{15}$ has a linear shape or a branched shape, preferably has 1 to 10 carbon atoms, and is preferably a methyl group, an ethyl group, an n-butyl group, a t-butyl group, or the like.

The cycloalkyl group of $R_{13}$, $R_{14}$, and $R_{15}$ may include a monocyclic or polycyclic cycloalkyl group (preferably a cycloalkyl group having 3 to 20 carbon atoms), and is preferably cyclopropyl, cyclopentyl, cyclohexyl, cycloheptyl, or cyclooctyl.

The alkoxy group of $R_{13}$ and $R_{14}$ has a linear shape or a branched shape, preferably has 1 to 10 carbon atoms, and is preferably a methoxy group, an ethoxy group, an n-propoxy group, an n-butoxy group, or the like.

The alkoxycarbonyl group of $R_{13}$ and $R_{14}$ has a linear shape or a branched shape, preferably has 2 to 11 carbon atoms, and is preferably a methoxycarbonyl group, an ethoxycarbonyl group, an n-butoxycarbonyl group, or the like.

The group having a cycloalkyl group of $R_{13}$ and $R_{14}$, may include a monocyclic or polycyclic cycloalkyl group (preferably a cycloalkyl group having 3 to 20 carbon atoms), and may include, for example, a monocyclic or polycyclic cycloalkyloxy group, or an alkoxy group having a monocyclic or polycyclic cycloalkyl group. These groups may have further substituents.

In the monocyclic or polycyclic cycloalkyloxy group of $R_{13}$, and $R_{14}$, the total number of carbon atoms is preferably 7 or more, the total number of carbon atoms is more preferably greater than or equal to 7 and less than or equal to 15, and, furthermore, having a monocyclic cycloalkyl group is preferable. The monocyclic cycloalkyloxy group having a total of 7 or more carbon atoms is a monocyclic cycloalkyloxy group in which a cycloalkyloxy group such as a cyclopropyloxy group, a cyclobutyloxy group, a cyclopentyloxy group, a cyclohexyloxy group, a cycloheptyloxy group, a cyclooctyloxy group, and a cyclododecanyloxy group has an arbitrary substituent such as an alkyl group such as a methyl group, an ethyl group, a propyl group, a butyl group, a pentyl group, a hexyl group, a heptyl group, an octyl group, a dodecyl group, a 2-ethylhexyl group, an isopropyl group, a sec-butyl group, a t-butyl group or an iso-amyl group, a hydroxyl group, a halogen atom (a fluorine atom, a chlorine atom, a bromine atom, an iodine atom), a nitro group, a cyano group, an amide group, a sulfonamide group, an alkoxy group such as a methoxy group, an ethoxy group, a hydroxyethoxy group, a propoxy group, a hydroxypropoxy group or a butoxy group, an alkoxycarbonyl group such as a methoxycarbonyl group or an ethoxycarbonyl group, an acyl group such as a formyl group, an acetyl group or a benzoyl group, an acyloxy group such as an acetoxy group or a butyryloxy group, a carboxyl group, or the like, and represents a monocyclic cycloalkyloxy group in which the total number of carbon atoms combined with an arbitrary substituent on the cycloalkyl group is 7 or more.

In addition, the polycyclic cycloalkyloxy group having a total of 7 or more carbon atoms may include a norbonyloxy group, a tricyclodecanyloxy group, a tetracyclodecanyloxy group, an adamantyloxy group, or the like.

As the alkoxy group having a monocyclic or polycyclic cycloalkyl group of $R_{13}$ and $R_{14}$, the total number of carbon atoms is preferably 7 or more, the total number of carbon atoms is more preferably greater than or equal to 7 and less than or equal to 15, and, furthermore, an alkoxy group having a monocyclic cycloalkyl group is preferable. The alkoxy group having a total number of carbon atoms of 7 or more and having a monocyclic cycloalkyl group indicates an alkoxy group where the above-described monocyclic cycloalkyl group which may have a substituent is substituted on an alkoxy group such as methoxy, ethoxy, propoxy, butoxy, pentyloxy, hexyloxy, heptoxy, octyloxy, dodecyloxy, 2-ethylhexyloxy, isopropoxy, sec-butoxy, t-butoxy, and iso-amyloxy, in which the total number of carbon atoms inclusive of the number of carbon atoms of the substituent is 7 or more. For example, a cyclohexylmethoxy group, a cyclopentylethoxy group, a cyclohexylethoxy group, or the like may be included, and a cyclohexylmethoxy group is preferable.

In addition, the alkoxy group having a polycyclic cycloalkyl group having a total of 7 or more carbon atoms may include a norbornylmethoxy group, a norbornylethoxy group, a tricyclodecanylmethoxy group, a tricyclodecanylethoxy group, a tetracyclodecanylmethoxy group, a tetracyclodecanylethoxy group, an adamantylmethoxy group, an adamantylethoxy group or the like, and is preferably a norbornylmethoxy group, a norbornylethoxy group, or the like.

As the alkyl group of the alkylcarbonyl group of $R_{14}$, the same specific examples of alkyl groups as $R_{13}$ to $R_{15}$ described above may be included.

The alkylsulfonyl group and the cycloalkylsulfonyl group of $R_{14}$ may have a linear shape, a branched shape, or a cyclic shape, and preferably have 1 to 10 carbon atoms, and are preferably, for example, a methanesulfonyl group, an ethanesulfonyl group, an n-propanesulfonyl group, an n-butanesulfonyl group, a cyclopentanesulfonyl group, a cyclohexanesulfonyl group, or the like.

The substituent each of the above groups may have includes a halogen atom (for example, a fluorine atom), a hydroxyl group, a carboxyl group, a cyano group, a nitro group, an alkoxy group, an alkoxyalkyl group, an alkoxycarbonyl group, an alkoxycarbonyloxy group, or the like.

The alkoxy group includes, for example, a linear, branched, or cyclic alkoxy group or the like having 1 to 20 carbon atoms such as a methoxy group, an ethoxy group, an n-propoxy group, an i-propoxy group, an n-butoxy group, a 2-methylpropoxy group, a 1-methylpropoxy group, a t-butoxy group, a cyclopentyloxy group, a cyclohexyloxy group, or the like.

The alkoxyalkyl group includes, for example, a linear, branched, or cyclic alkoxyalkyl group or the like having 2 to 21 carbon atoms such as a methoxymethyl group, an ethoxymethyl group, a 1-methoxyethyl group, a 2-methoxyethyl group, a 1-ethoxyethyl group or a 2-ethoxyethyl group, or the like.

The alkoxycarbonyl group includes, for example, a linear, branched, or cyclic alkoxycarbonyl group or the like having 2 to 21 carbon atoms such as a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, a cyclopentyloxycarbonyl group or a cyclohexyloxycarbonyl group, or the like.

The alkoxycarbonyloxy group includes, for example, a linear, branched, or cyclic alkoxycarbonyloxy group or the like having 2 to 21 carbon atoms such as a methoxycarbonyloxy group, an ethoxycarbonyloxy group, an n-propoxycarbonyloxy group, an i-propoxycarbonyloxy group, an n-butoxycarbonyloxy group, a t-butoxycarbonyloxy group, a cyclopentyloxycarbonyloxy group or a cyclohexyloxycarbonyloxy, or the like.

The ring structure which may be formed by two $R_{15}$'s being bonded to each other may include a 5-membered or 6-membered ring, particularly preferably a 5-membered ring (that is, a tetrahydrothiophene ring) formed by two $R_{15}$'s together with a sulfur atom in General Formula (ZI-4), and may be ring-condensed with an aryl group or cycloalkyl group. This divalent $R_{15}$ may have a substituent, and as the substituent, for example, a hydroxyl group, a carboxyl group, a cyano group, a nitro group, an alkyl group, a cycloalkyl group, an alkoxy group, an alkoxyalkyl group, an alkoxycarbonyl group, an alkoxycarbonyloxy group, or the like may be included. The substituent for the ring structure may be present in plural number and these may be bonded to each other to form a ring (an aromatic or non-aromatic hydrocarbon ring, an aromatic or non-aromatic heterocyclic ring, or a polycyclic condensed ring formed by combining two or more of these rings).

$R_{15}$ in General Formula (ZI-4) is preferably a methyl group, an ethyl group, a naphthyl group, a divalent group in which two $R_{15}$'s are bonded to each other to form a tetrahydrothiophene ring structure together with a sulfur atom, or the like.

The substituent $R_{13}$ and $R_{14}$ may have is preferably a hydroxyl group, an alkoxy group, an alkoxycarbonyl group, or a halogen atom (particularly, a fluorine atom).

As 1, 0 or 1 is preferable, and 1 is more preferable.

As r, 0 to 2 is preferable.

Specific examples of the cation of the compound represented by General Formula (ZI-4) in the invention are shown below.

[Chem. 29]

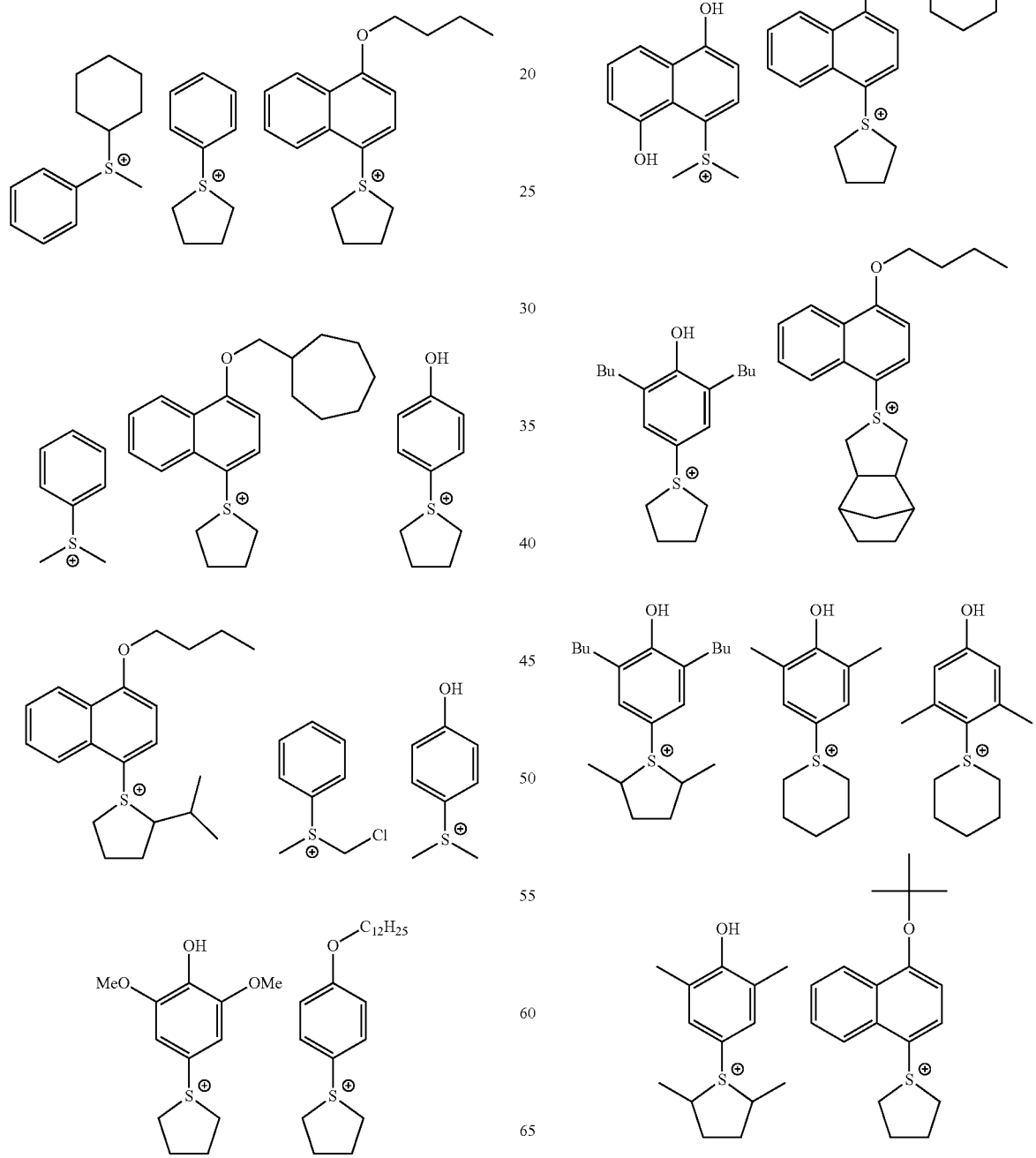

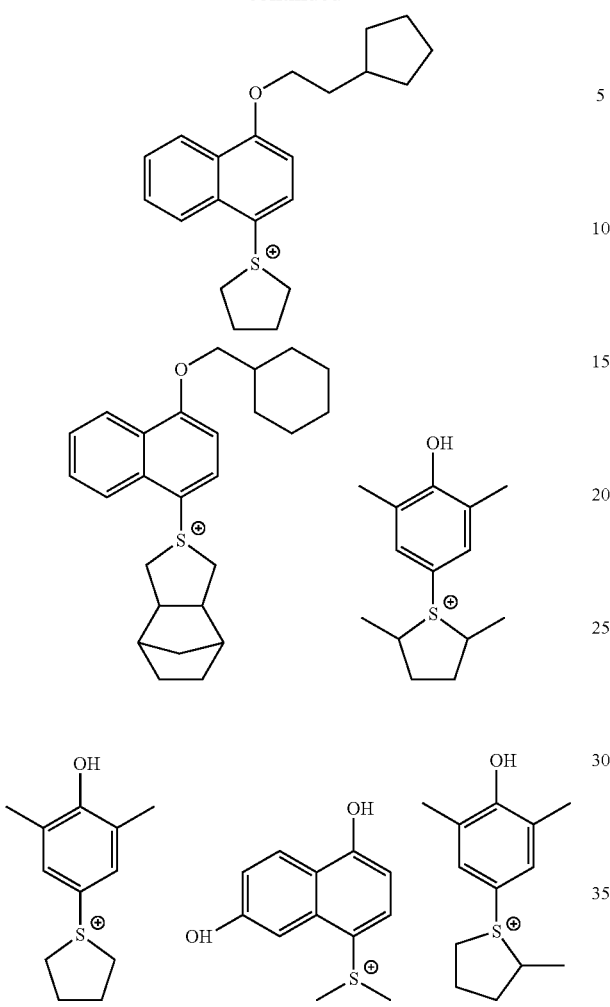
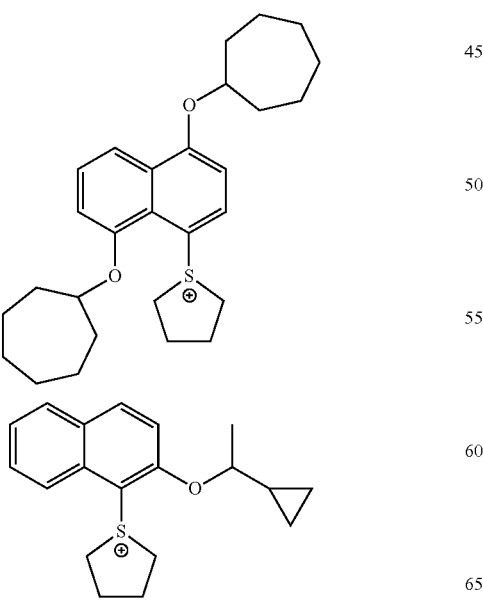
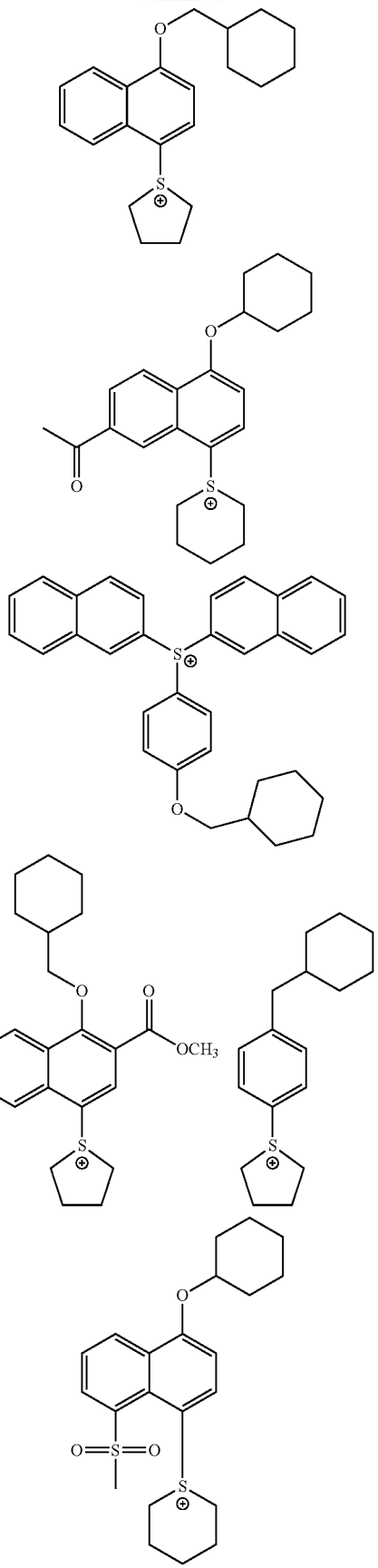

-continued

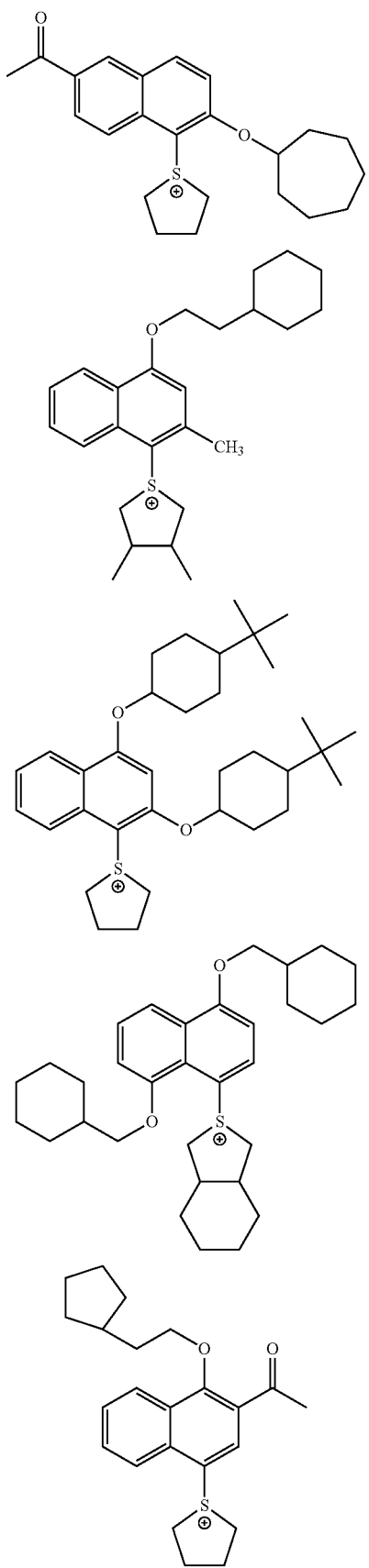

-continued

Next, General Formulae (ZII) and (ZIII) will be described.

In General Formulae (ZII) and (ZIII), $R_{204}$ to $R_{207}$ respectively independently represent an aryl group, an alkyl group, or a cycloalkyl group.

The aryl group of $R_{204}$ to $R_{207}$ is preferably a phenyl group or a naphthyl group, and more preferably a phenyl group. The aryl group of $R_{204}$ to $R_{207}$ may also be an aryl group having a heterocyclic structure having an oxygen atom, a nitrogen atom, a sulfur atom, or the like. As the skeleton of the aryl group having a heterocyclic structure, for example, pyrrole, furan, thiophene, indole, benzofuran, benzothiophene, or the like, may be included.

Preferred examples of the alkyl group and cycloalkyl group in $R_{204}$ to $R_{207}$ include a linear or branched alkyl group having 1 to 10 carbon atoms (for example, a methyl group, an ethyl group, a propyl group, a butyl group, a pentyl group), and a cycloalkyl group having 3 to 10 carbon atoms (a cyclopentyl group, a cyclohexyl group, or a norbornyl group).

The aryl group, the alkyl group, and the cycloalkyl group of $R_{204}$ to $R_{207}$ may have a substituent. As the substituent the aryl group, the alkyl group, and the cycloalkyl group of $R_{204}$ to $R_{207}$ may include, for example, an alkyl group (for example, 1 to 15 carbon atoms), a cycloalkyl group (for example, 3 to 15 carbon atoms), an aryl group (for example, 6 to 15 carbon atoms), an alkoxy group (for example, 1 to 15 carbon atoms), a halogen atom, a hydroxyl group, a phenylthio group, or the like.

$Z^-$ represents a non-nucleophilic anion, and examples thereof include the same non-nucleophilic anions as mentioned above as $Z^-$ in General Formula (ZI).

The acid generator may also further include a compound represented by the following General Formulae (ZIV), (ZV), and (ZVI).

[Chem. 31]

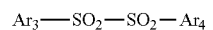

(ZIV)

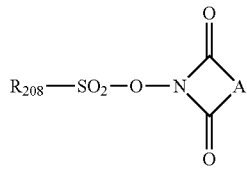

(ZV)

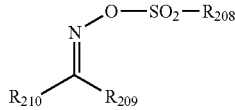

(ZVI)

In General Formulae (ZIV) to (ZVI), $Ar_3$ and $Ar_4$ respectively independently represent an aryl group.

$R_{208}$, $R_{209}$, and $R_{210}$ respectively independently represent an alkyl group, a cycloalkyl group, or an aryl group.

A represents an alkylene group, an alkenylene group, or an arylene group.

Specific examples of the aryl group of $Ar_3$, $Ar_4$, $R_{208}$, $R_{209}$, and $R_{210}$ may include the same specific examples of the aryl group of $R_{201}$, $R_{202}$, and $R_{203}$ in General Formula (ZI-1).

Specific examples of the alkyl group and the cycloalkyl group of $R_{208}$, $R_{209}$, and $R_{210}$ include the same specific examples of the alkyl group and the cycloalkyl group of $R_{201}$, $R_{202}$, and $R_{203}$ in General Formula (ZI-2), respectively.

The alkylene group of A may include an alkylene group having 1 to 12 carbon atoms (for example, a methylene group, an ethylene group, a propylene group, an isopropylene group, a butylene group, an isobutylene group, or the like), the alkenylene group of A may include an alkenylene group having 2 to 12 carbon atoms (for example, an ethenylene group, a propenylene group, a butenylene group, or the like), and the arylene group of A may include an arylene group having 6 to 10 carbon atoms (for example, a phenylene group, a tolylene group, a naphthylene group, or the like), respectively.

In the acid generator, a compound represented by General Formulae (ZI) to (ZIII) is more preferable.

Furthermore, the acid generator is preferably a compound capable of generating an acid having one sulfonic acid group or imide group, more preferably a compound capable of generating a monovalent perfluoroalkanesulfonic acid, a compound capable of generating an aromatic sulfonic acid substituted with a monovalent fluorine atom or a fluorine atom-containing group, or a compound capable of generating an imide acid substituted with a monovalent fluorine atom or a fluorine atom-containing group, and still more preferably a sulfonium salt of a fluoro-substituted alkanesulfonic acid, fluorine-substituted benzenesulfonic acid, fluorine-substituted imide acid, or fluorine-substituted methide acid. The acid generator which can be used is particularly preferably a compound capable of generating a fluoro-substituted alkanesulfonic acid, a fluoro-substituted benzenesulfonic acid, or a fluoro-substituted imide acid, wherein the pKa of the acid generated is −1 or less, and in this case, the sensitivity can be enhanced.

Particularly preferred examples of the acid generator are shown below.

[Chem. 32]

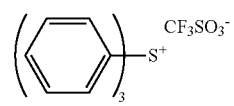

(z1)

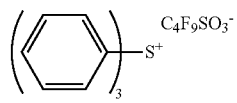

(z2)

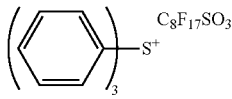

(z3)

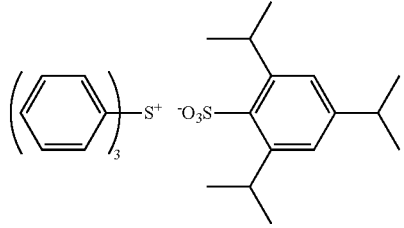

(z4)

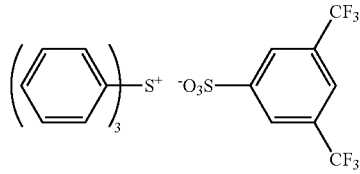

(z5)

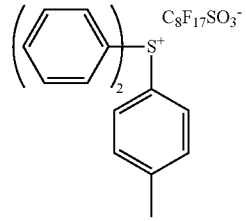

(z6)

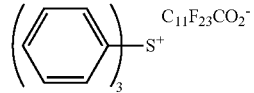

(z7)

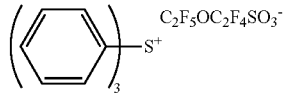

(z8)

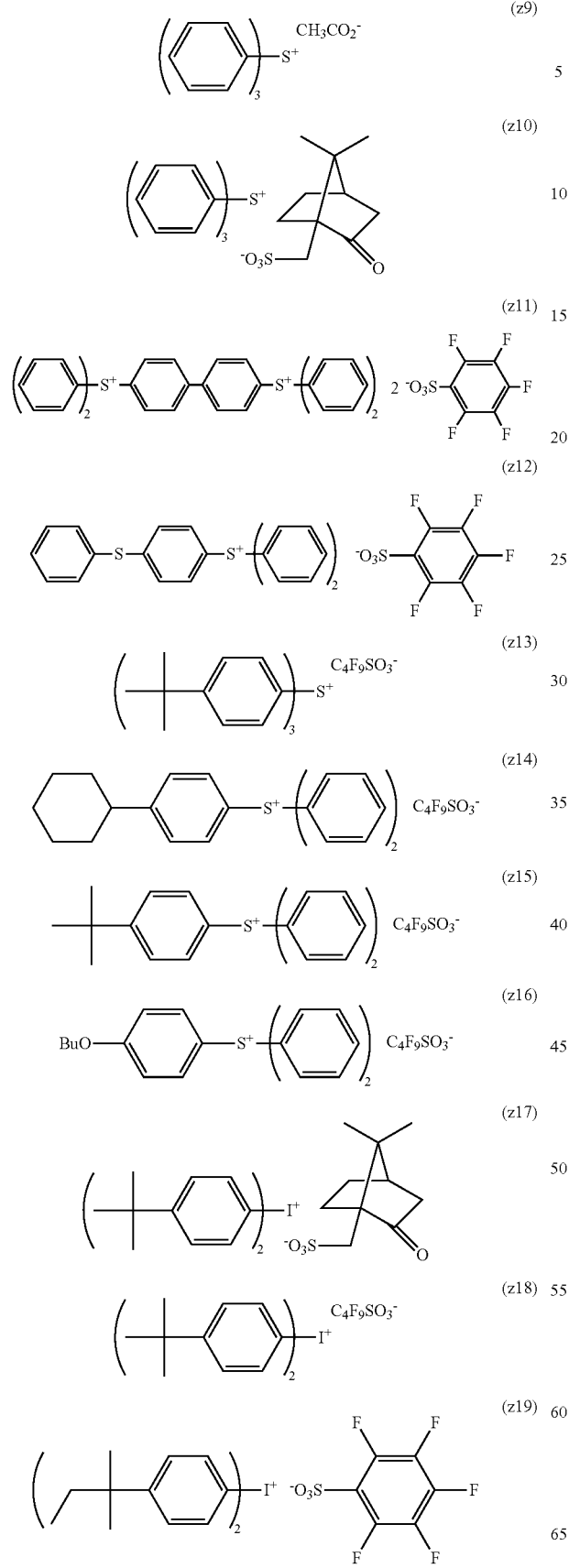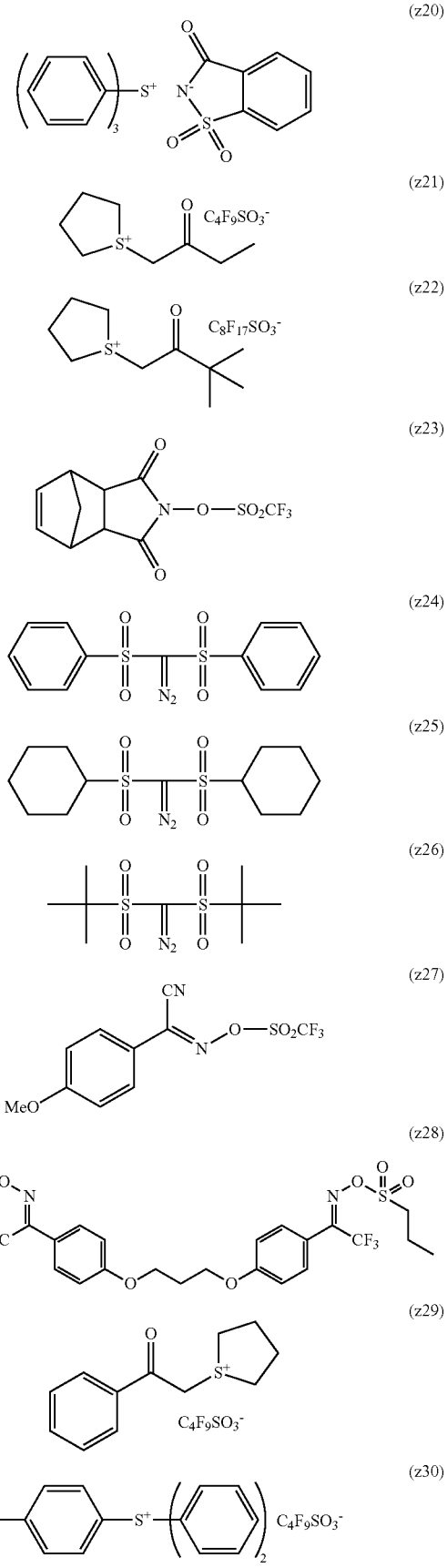

-continued
(z31) 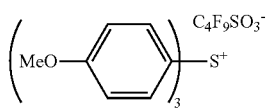
(z32) 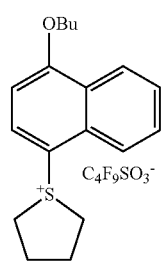
(z33) 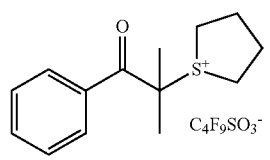
(z34) 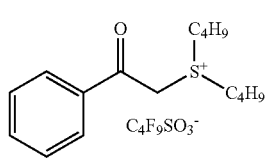
(z35) 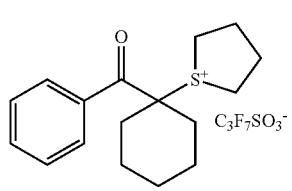
(z36) 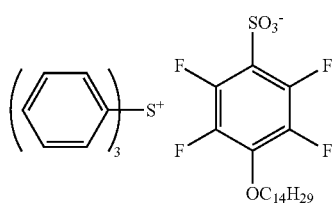
(z37) 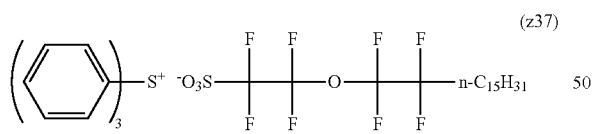
(z38) 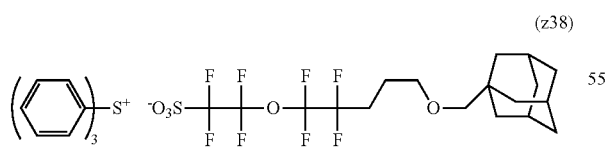
(z39) 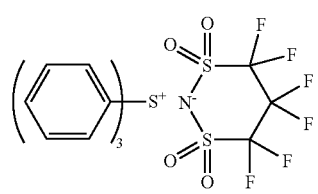
-continued
(z40) 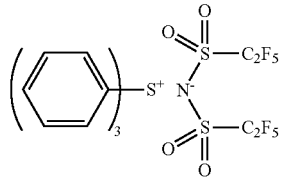
[Chem. 33]
(z41) 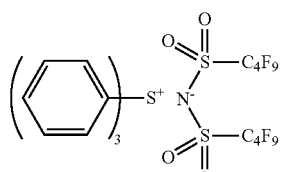
(z42) 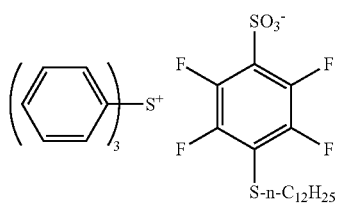
(z43) 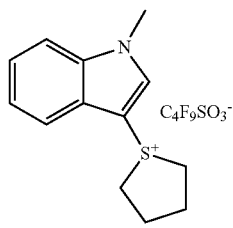
(z44) 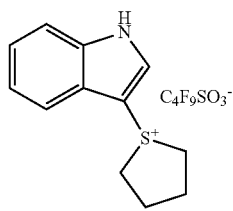
(z45) 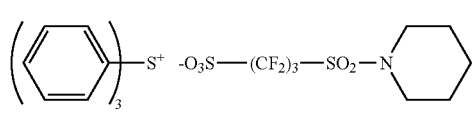
(z46) 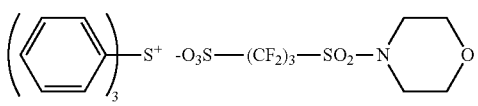
(z47)
(z48)
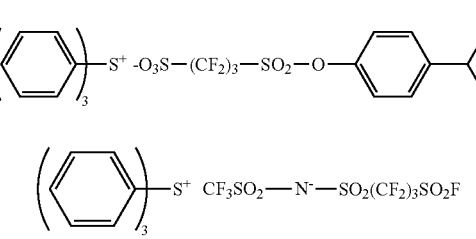

(z49) 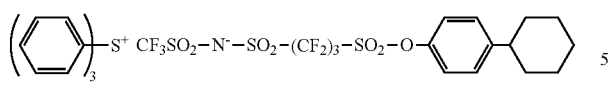
(z50) 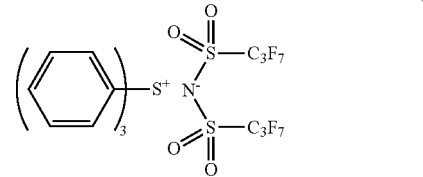
(z51) 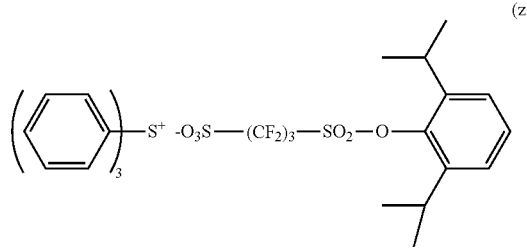
(z52) 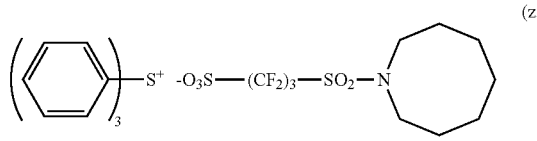
(z53) 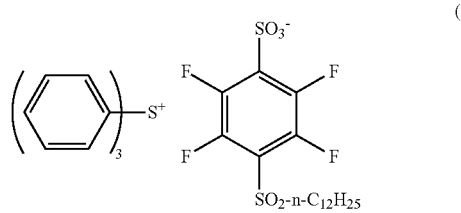
(z54) 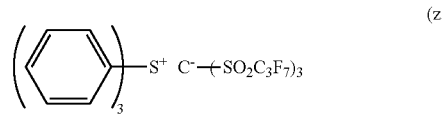
(z55) 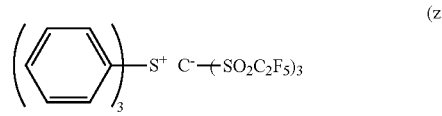
(z56) 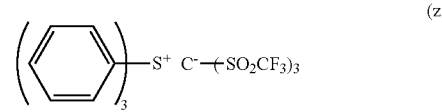
(z57) 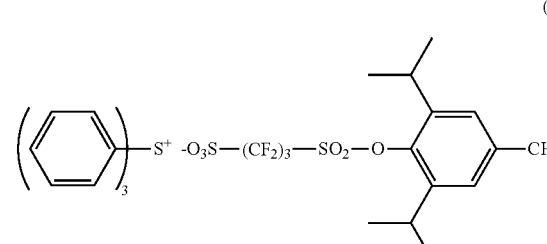
(z58) 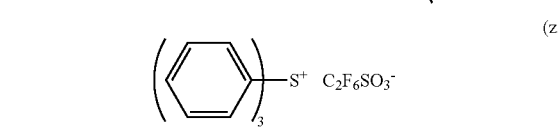
(z59) 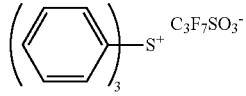
(z60) 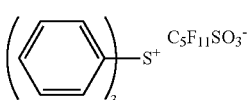
(z61) 
(z62) 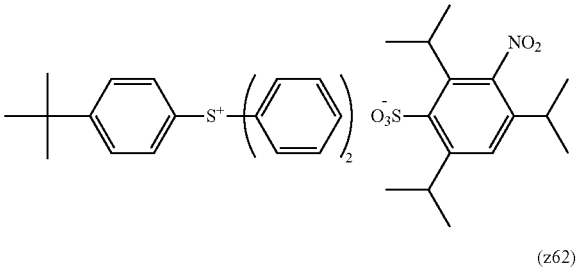
(z63) 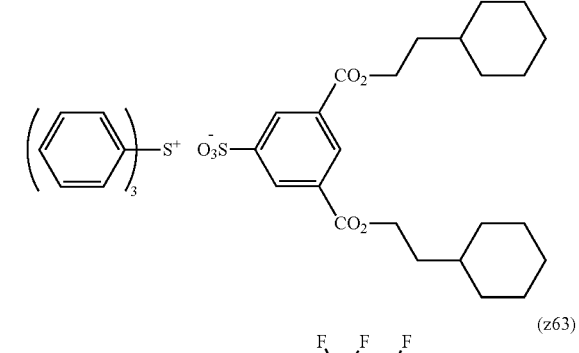
(z64) 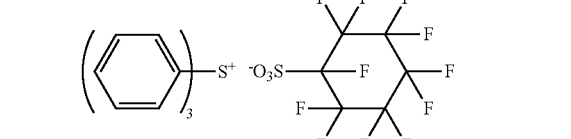
(z65) 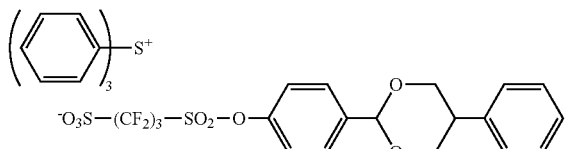
(z66) 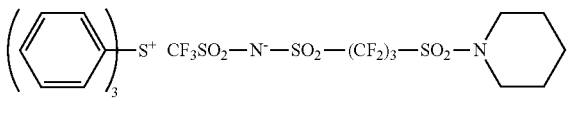

(z67)
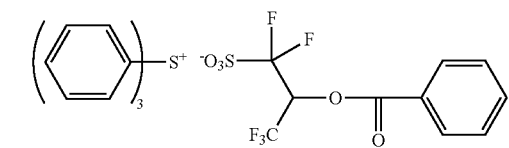
[Chem. 34]
(z68)
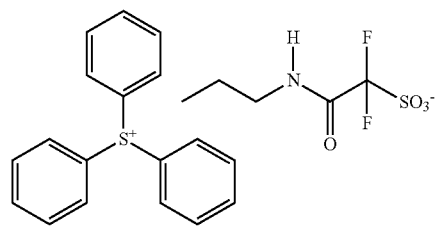
(z69)
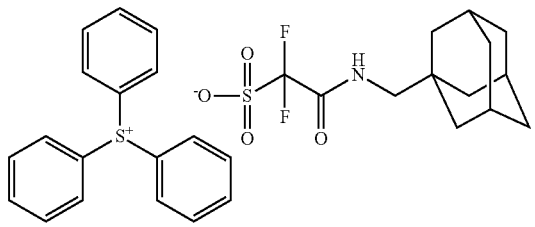
(z70)
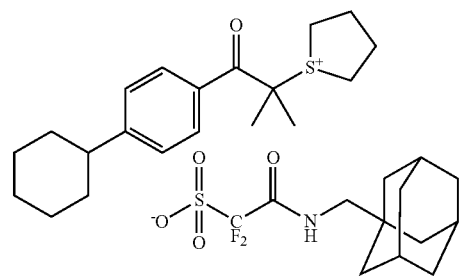
(z71)
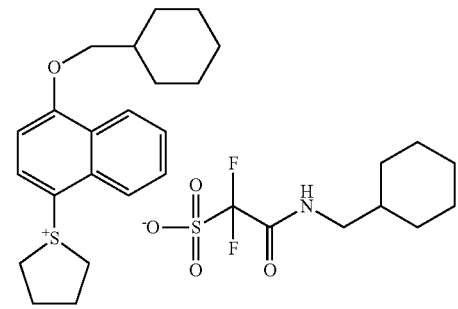
(z72)
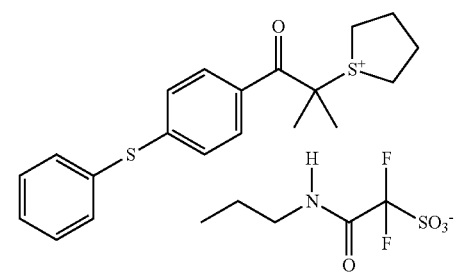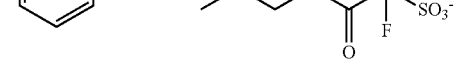
(z73)
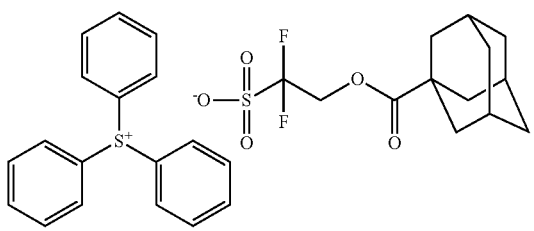
(z74)
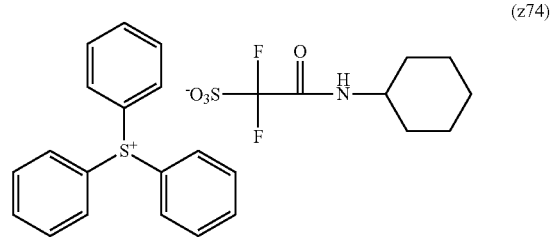
(z75)
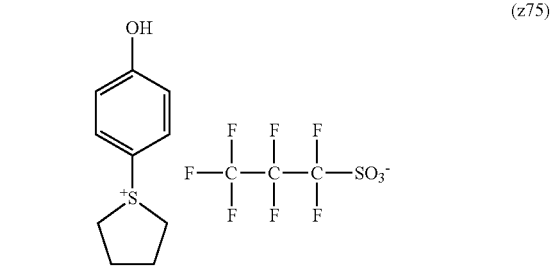
(z76)
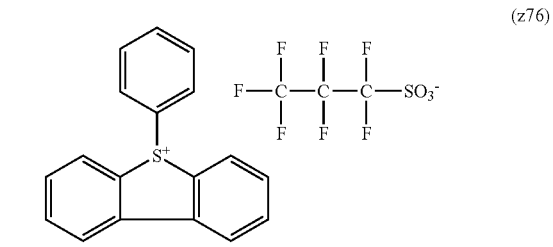
(z77)
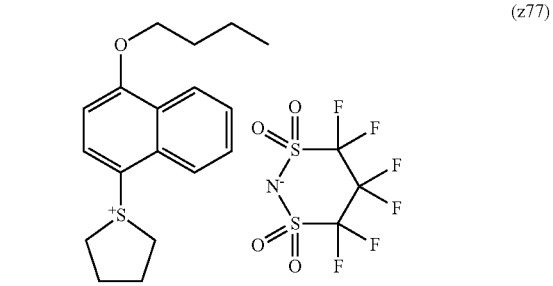
(z78)
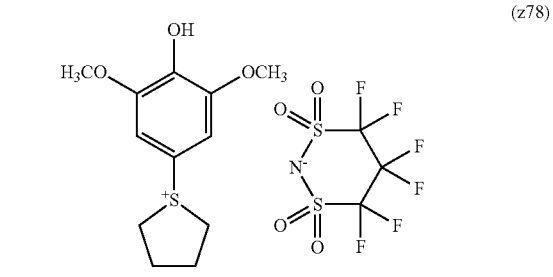

-continued (z79)
(z80)
(z81)
(z82)
(z83)
(z84)

-continued (z85)
(z86)
(z87)
(z88)

[Chem. 35]

(z89)
(z90)

(z91) 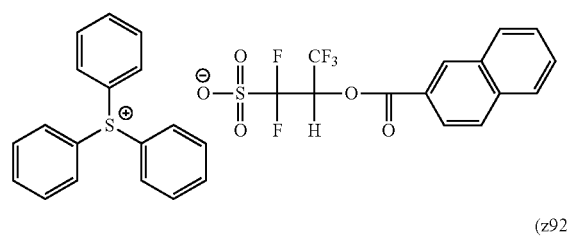
(z92) 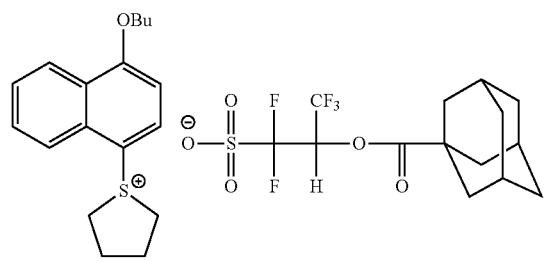
[Chem. 36]
(z93) 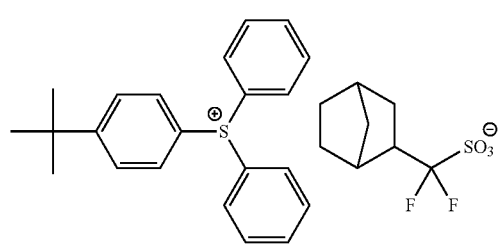
(z94) 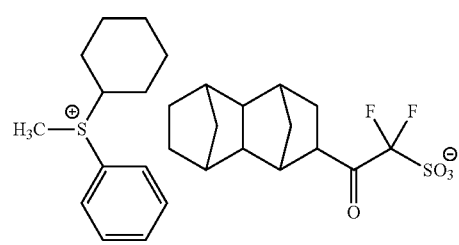
(z95) 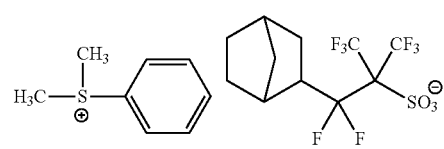
(z96) 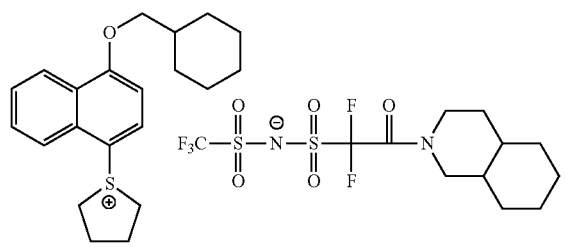
(z97) 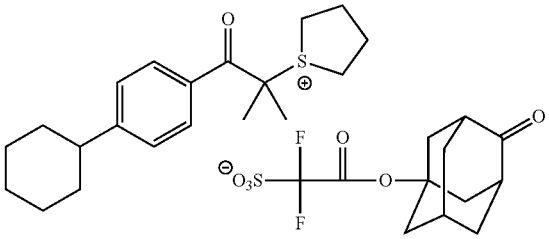
(z98) 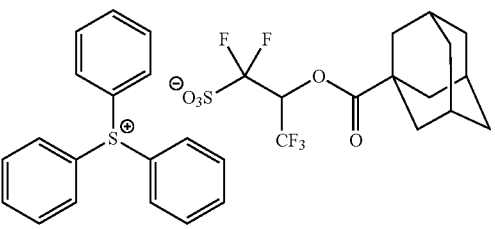
(z99) 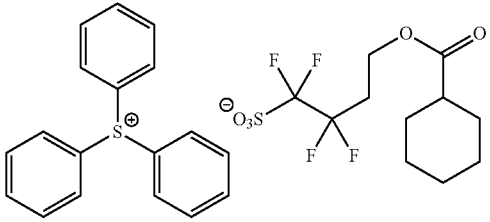
(z100) 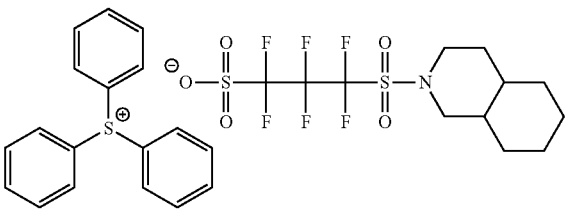
(z101) 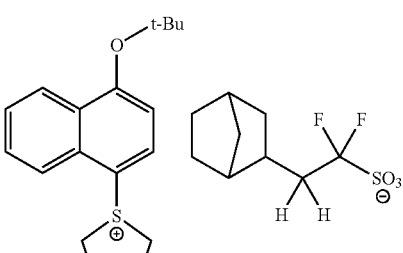
(z102) 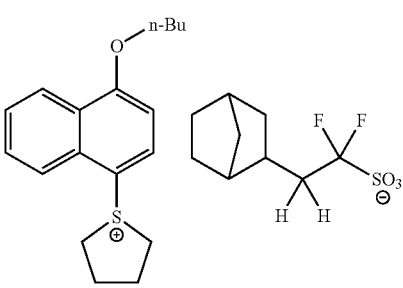
The acid generator can be synthesized by well-known methods, and, for example, can be synthesized in accordance with the method disclosed in JP2007-161707A.

As for the acid generator, one kind may be used, or two or more kinds may be used in combination.

The content ratio in the composition of Compound (B) capable of generating an acid upon irradiation of actinic rays or radiation is preferably from 0.1 to 30% by mass, more preferably from 0.5 to 25% by mass, still more preferably from 3 to 20% by mass, and particularly preferably from 3 to 15% by mass, based on the total solid contents of the actinic ray-sensitive or radiation-sensitive resin composition.

Furthermore, in the case where the acid generator is represented by General Formula (ZI-3) or (ZI-4), the content ratio thereof is preferably from 5 to 35% by mass, more preferably from 8 to 30% by mass, still more preferably from 9 to 30% by mass, and particularly preferably from 9 to 25% by mass, based on the total solid contents of the composition.

[4-1] Basic Compound or Ammonium Salt Compound (C) Capable of Decreasing Basicity Through Irradiation of Actinic Rays or Radiation The actinic ray-sensitive or radiation-sensitive resin composition of the present invention preferably contains a basic compound in which the basicity decreases through the irradiation of actinic rays or radiation or an ammonium salt compound in which the basicity decreases through the irradiation of actinic rays or radiation (hereinafter also referred to as a "Compound (C)").

Compound (C) is preferably Compound (C-1) having a basic functional group or an ammonium group and a group capable of generating an acidic functional group upon the irradiation of actinic rays or radiation. That is, Compound (C) is preferably a basic compound having a basic functional group and a group capable of generating an acidic functional group upon the irradiation of actinic rays or radiation, or an ammonium salt compound having an ammonium group and a group capable of generating an acidic functional group upon the irradiation of actinic rays or radiation. The actinic ray-sensitive or radiation-sensitive resin compound of the present invention may include one type of Compound (C) or may include two or more types of Compound (C). For example, the actinic ray-sensitive or radiation-sensitive resin compound of the present invention may include the basic compound described above and the ammonium salt compound described above.

The compound which is generated due to decomposition of Compound (C) (including Compound (C-1)) upon the irradiation of actinic rays or radiation and decreased in basicity includes compounds represented by the following General Formulae (PA-I), (PA-II), and (PA-III), and from the viewpoint that excellent effects can be attained at a high level in terms of all of LWR, evenness in local pattern dimensions, and DOF, the compounds represented by General Formulae (PA-II) and (PA-III) are particularly preferred.

First, a compound represented by General Formula (PA-I) will be described.

Q-A$_1$-(X)$_n$—B—R    (PA-I)

In General Formula (PA-I), A$_1$ represents a single bond or a divalent linking group.

Q represents —SO$_3$H or —CO$_2$H. Q is equivalent to an acidic functional group generated by the irradiation of actinic rays or radiation.

X represents —SO$_2$— or —CO—.

n represents 0 or 1.

B represents a single bond, an oxygen atom, or —N(Rx)-.

Rx represents a hydrogen atom or a monovalent organic group.

R represents a monovalent organic group having a basic functional group, or a monovalent organic group having an ammonium group.

The divalent linking group in A1 is preferably a divalent linking group having 2 to 12 carbon atoms, and examples thereof include an alkylene group, a phenylene group, and the like. The divalent linking group is more preferably an alkylene group having at least one fluorine atom, preferably having 2 to 6 carbon atoms, and more preferably 2 to 4 carbon atoms. A linking group such as an oxygen atom or a sulfur atom may be included in the alkylene chain. The alkylene group is particularly preferably an alkylene group where from 30 to 100% by number of the hydrogen atoms are substituted with a fluorine atom, more preferably an alkylene group where the carbon atom bonded to the Q site has a fluorine atom, still more preferably a perfluoroalkylene group, and even still more preferably a perfluoroethylene group, a perfluoropropylene group, or a perfluorobutylene group.

The monovalent organic group in Rx preferably has 4 to 30 carbon atoms, and may include, for example, an alkyl group, a cycloalkyl group, an aryl group, an aralkyl group, an alkenyl group, or the like.

The alkyl group in Rx may have a substituent, is preferably a linear or branched alkyl group having 1 to 20 carbon atoms, and may have an oxygen atom, a sulfur atom, or a nitrogen atom in the alkyl chain.

Further, the alkyl group having a substituent includes a group where a cycloalkyl group is substituted particularly on a linear or branched alkyl group (for example, an adamantylmethyl group, an adamantylethyl group, a cyclohexylethyl group, camphor residue, or the like).

The cycloalkyl group in Rx may have a substituent, is preferably a cycloalkyl group having 3 to 20 carbon atoms, and may have an oxygen atom in the ring.

The aryl group in Rx may have a substituent, and is preferably an aryl group having 6 to 14 carbon atoms.

The aralkyl group in Rx may have a substituent, and is preferably an aralkyl group having 7 to 20 carbon atoms.

The alkenyl group in Rx may have a substituent, and may include, for example, a group having a double bond at any position of the alkyl groups included as Rx.

Preferred examples of the partial structure of the basic functional group include a crown ether structure, a primary to tertiary amine structure, and a nitrogen-containing heterocyclic structure (for example, pyridine, imidazole, pyrazine, or the like).

The preferable partial structure of the ammonium group may include, for example, a primary to tertiary ammonium, pyridinium, imidazolinium, or pyrazinium structure, or the like.

In addition, as the basic functional group, a functional group having a nitrogen atom is preferable, and a structure having a primary to tertiary amino group or a nitrogen-containing heterocyclic structure is more preferable. In these structures, from the viewpoint of enhancing the basicity, it is preferred that all atoms adjacent to a nitrogen atom contained in the structure be a carbon atom or a hydrogen atom. Further, in view of enhancing the basicity, an electron-withdrawing functional group (carbonyl group, sulfonyl group, cyano group, halogen atom, or the like) is preferably not bonded directly to the nitrogen atom.

The monovalent organic group in the monovalent organic group including such a structure (R group) preferably has 4 to 30 carbon atoms, and may include, for example, an alkyl group, a cycloalkyl group, an aryl group, an aralkyl group, an alkenyl group, or the like, and each group may have a substituent.

The alkyl group, the cycloalkyl group, the aryl group, the aralkyl group and the alkenyl group in the alkyl group, the cycloalkyl group, the aryl group, the aralkyl group and the alkenyl group including the basic functional group or the ammonium group in R are the same alkyl group, cycloalkyl group, aryl group, aralkyl group, and alkenyl group included as Rx, respectively.

As the substituent each group described above may have, for example, a halogen atom, a hydroxyl group, a nitro group, a cyano group, a carboxyl group, a carbonyl group, a cycloalkyl group (preferably 3 to 10 carbon atoms), an aryl group (preferably 6 to 14 carbon atoms), an alkoxy group (preferably 1 to 10 carbon atoms), an acyl group (preferably 2 to 20 carbon atoms), an acyloxy group (preferably 2 to 10 carbon atoms), an alkoxycarbonyl group (preferably 2 to 20 carbon atoms), an aminoacyl group (preferably, 2 to 20 carbon atoms), or the like may be included. As for the cyclic structure in the aryl group, the cycloalkyl group, and the like, the substituent further includes an alkyl group (preferably having 1 to 20 carbon atoms). For the aminoacyl group, the substituent may further include one or two alkyl groups (preferably 1 to 20 carbon atoms).

When B is —N(Rx)—, it is preferable that R and Rx be bonded to each other to form a ring. By forming the ring structure, stability is improved and the storage stability of the composition using this is improved. The number of carbon atoms constituting the ring is preferably from 4 to 20, and the ring may be monocyclic or polycyclic and may contain an oxygen atom, a sulfur atom, or a nitrogen atom in the ring.

The monocyclic structure may include a 4- to 8-membered ring containing a nitrogen atom. An example of the polycyclic structure includes a structure formed by combining two, three, or more monocyclic structures. The monocyclic structure and the polycyclic structure may have a substituent, which is preferably, for example, a halogen atom, a hydroxyl group, a cyano group, a carboxyl group, a carbonyl group, a cycloalkyl group (preferably 3 to 10 carbon atoms), an aryl group (preferably 6 to 14 carbon atoms), an alkoxy group (preferably 1 to 10 carbon atoms), an acyl group (preferably 2 to 15 carbon atoms), an acyloxy group (preferably 2 to 15 carbon atoms), an alkoxycarbonyl group (preferably 2 to 15 carbon atoms), an aminoacyl group (preferably 2 to 20 carbon atoms), or the like. As for the cyclic structure in the aryl group, cycloalkyl group and the like, the substituent may further include an alkyl group (preferably having 1 to 15 carbon atoms). For the aminoacyl group, the substituent may further include one or two alkyl groups (preferably 1 to 15 carbon atoms).

Among the compounds represented by General Formula (PA-I), compounds of which the Q site is sulfonic acid can be synthesized using a general sulfonamide reaction. For example, a method in which a sulfonamide bond is formed by selectively reacting one of the sulfonyl halide parts of a bis-sulfonyl halide compound with an amine compound, and then, the other sulfonyl halide part is hydrolyzed, or a method in which a cyclic sulfonic acid anhydride is reacted with an amine compound and is ring-opened, may be used.

Next, a compound represented by General Formula (PA-II) will be described.

$Q_1\text{-}X_1\text{—NH—}X_2\text{-}Q_2$                         (PA-II)

In General Formula (PA-II), $Q_1$ and $Q_2$ respectively independently represent a monovalent organic group. Here, either one of $Q_1$ and $Q_2$ has a basic functional group. $Q_1$ and $Q_2$ may also be bonded to each other to form a ring and the ring formed may have a basic functional group.

$X_1$ and $X_2$ respectively independently represent —CO— or —SO$_2$—.

In addition, —NH— is equivalent to an acidic functional group generated by the irradiation of actinic rays or radiation.

In General Formula (PA-II), the monovalent organic group as $Q_1$ and $Q_2$ preferably has 1 to 40 carbon atoms, and may include, for example, an alkyl group, a cycloalkyl group, an aryl group, an aralkyl group, an alkenyl group, or the like.

The alkyl group in $Q_1$ and $Q_2$ may have a substituent, is preferably a linear or branched alkyl group having 1 to 30 carbon atoms, and may have an oxygen atom, a sulfur atom, or a nitrogen atom in the alkyl chain.

The cycloalkyl group in $Q_1$ and $Q_2$ may have a substituent, is preferably a cycloalkyl group having 3 to 20 carbon atoms, and may have an oxygen atom or a nitrogen atom in the ring.

The aryl group in $Q_1$ and $Q_2$ may have a substituent, and is preferably an aryl group having 6 to 14 carbon atoms.

The aralkyl group in $Q_1$ and $Q_2$ may have a substituent, and is preferably an aralkyl group having 7 to 20 carbon atoms.

The alkenyl group in $Q_1$ and $Q_2$ may have a substituent, and may include, for example, a group having a double bond at any position of the above alkyl group.

As the substituent each group described above may have, for example, a halogen atom, a hydroxyl group, a nitro group, a cyano group, a carboxyl group, a carbonyl group, a cycloalkyl group (preferably 3 to 10 carbon atoms), an aryl group (preferably 6 to 14 carbon atoms), an alkoxy group (preferably 1 to 10 carbon atoms), an acyl group (preferably 2 to 20 carbon atoms), an acyloxy group (preferably 2 to 10 carbon atoms), an alkoxycarbonyl group (preferably 2 to 20 carbon atoms), an aminoacyl group (preferably, 2 to 10 carbon atoms), or the like, may be included. As for the cyclic structure in the aryl group, cycloalkyl group and the like, examples of the substituent further include an alkyl group (preferably having 1 to 10 carbon atoms). For the aminoacyl group, the substituent may further include an alkyl group (preferably 1 to 10 carbon atoms). Examples of the alkyl group having a substituent include a perfluoroalkyl group such as a perfluoromethyl group, a perfluoroethyl group, a perfluoropropyl group, and a perfluorobutyl group.

As a preferable partial structure of the basic functional group that at least one of $Q_1$ and $Q_2$ may have, the same partial structure described as the basic functional group R of General Formula (PA-I) may be included.

In the case where $Q_1$ and $Q_2$ are bonded to each other to form a ring and the ring formed has a basic functional group, examples of the structure thereof include a structure where the organic group of $Q_1$ and $Q_2$ is further bonded to an alkylene group, an oxy group, an imino group, or the like.

In General Formula (PA-II), at least any one of $X_1$ and $X_2$ is preferably —SO$_2$—.

Next, a compound represented by General Formula (PA-III) will be described.

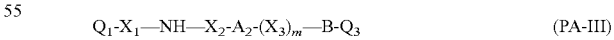

$Q_1\text{-}X_1\text{—NH—}X_2\text{-}A_2\text{-}(X_3)_m\text{—B-}Q_3$                (PA-III)

In General Formula (PA-III), $Q_1$ and $Q_3$ respectively independently represent a monovalent organic group. Here, either one of $Q_1$ and $Q_3$ has a basic functional group. It is also possible that $Q_1$ and $Q_3$ be bonded to each other to form a ring and the ring formed have a basic functional group.

$X_1$, $X_2$ and $X_3$ respectively independently represent —CO— or —SO$_2$—.

$A_2$ represents a divalent linking group.

B represents a single bond, an oxygen atom, or —N(Qx)-.

Qx represents a hydrogen atom or a monovalent organic group.

When B is —N(Qx)-, $Q_3$ and Qx may be bonded to each other to form a ring.

m represents 0 or 1.

In addition, —NH— is equivalent to an acidic functional group generated by the irradiation of actinic rays or radiation.

$Q_1$ is synonymous with $Q_1$ in General Formula (PA-II).

The organic group of $Q_3$ may include the same organic group of $Q_1$ and $Q_2$ in General Formula (PA-II).

Incidentally, in the case where $Q_1$ and $Q_3$ are bonded to each other to form a ring and the ring formed has a basic functional group, examples of the structure thereof include a structure where the organic group of $Q_1$ and $Q_3$ is further bonded to an alkylene group, an oxy group, an imino group, or the like.

The divalent linking group in $A_2$ is preferably a divalent linking group (1 to 8 carbon atoms) having a fluorine atom, and may include, for example, an alkylene group (1 to 8 carbon atoms) having a fluorine atom, a phenylene group having a fluorine atom, or the like. An alkylene group having a fluorine atom is more preferable, and the number of carbon atoms is preferably 2 to 6 and the number of carbon atoms is more preferably 2 to 4. A linking group such as an oxygen atom or a sulfur atom may be included in the alkylene chain. The alkylene group is preferably an alkylene group in which 30 to 100% of the number of hydrogen atoms are substituted with a fluorine atom, more preferably a perfluoroalkylene group, and particularly preferably a perfluoroalkylene group having 2 to 4 carbon atoms.

The monovalent organic group in Qx is preferably an organic group having 4 to 30 carbon atoms, and may include, for example, an alkyl group, a cycloalkyl group, an aryl group, an aralkyl group, an alkenyl group, or the like. The alkyl group, the cycloalkyl group, the aryl group, the aralkyl group, and the alkenyl group are the same as Rx in the above Formula (PA-I).

In General Formula (PA-III), $X_1$, $X_2$, and $X_3$ are preferably —$SO_2$—.

Compound (C) is preferably a sulfonium salt compound of the compound represented by General Formula (PA-I), (PA-II), or (PA-III), or an iodonium salt compound of the compound represented by General Formula (PA-I), (PA-II), or (PA-III), and more preferably a compound represented by the following General Formula (PA1) or (PA2).

[Chem. 37]

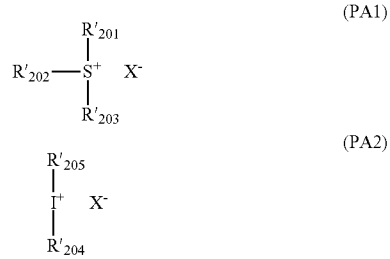

In General Formula (PA1), $R'_{201}$, $R'_{202}$, and $R'_{203}$ respectively independently represent an organic group, and specific examples thereof are the same as those for $R_{201}$, $R_{202}$, and $R_{203}$ of General Formula ZI in Component (B).

$X^-$ represents a sulfonate ion or a carboxylate ion in which a hydrogen atom of the —$SO_3H$ site or the —COOH site of the compound represented by General Formula (PA-I) is detached, or an anion in which a hydrogen atom of the —NH— site of the compound represented by General Formula (PA-II) or (PA-III) is detached.

In General formula (PA2), $R'_{204}$ and $R'_{205}$ respectively independently represent an aryl group, an alkyl group, or a cycloalkyl group, and specific examples thereof are the same as those for $R_{204}$ and $R_{205}$ of the formula ZII in Component (B).

$X^-$ represents a sulfonate anion or a carboxylate anion in which a hydrogen atom of the —$SO_3H$ site or the —COOH site of the compound represented by General Formula (PA-I) is eliminated, or an anion in which a hydrogen atom of the —NH— site of the compound represented by General Formula (PA-II) or (PA-III) is eliminated.

Compound (C) is decomposed by the irradiation of actinic rays or radiation, and produces, for example, a compound represented by General Formula (PA-I), (PA-II) or (PA-III).

The compound represented by General Formula (PA-I) is a compound having a sulfonic acid group or carboxylic acid group together with a basic functional group or an ammonium group and thereby being reduced in or deprived of the basicity or changed from basic to acidic as compared with Compound (C).

The compound represented by General Formula (PA-II) or (PA-III) is a compound having an organic sulfonylimino group or organic carbonylimino group together with a basic functional group and thereby being reduced in or deprived of the basicity or changed from basic to acidic as compared with Compound (C).

In the present invention, basicity being reduced by the irradiation of actinic rays or radiation means that an acceptor property of Compound (C) for protons (acid generated by the irradiation of actinic rays or radiation) is reduced by irradiation with radiation or actinic rays. The acceptor property being reduced means that, in an equilibrium reaction in which a non-covalent bond complex, which is a proton adduct, is produced from the compound having a basic functional group and a proton, or an equilibrium reaction in which a counter-cation of the compound having an ammonium group is exchanged with a proton, an equilibrium constant in the chemical equilibrium thereof is reduced.

In this way, the resist film contains Compound (C) in which the basicity decreases through the irradiation of actinic rays or radiation, so that in the unexposed portion, the acceptor property of Compound (C) is sufficiently brought out and an unintended reaction between an acid diffused from the exposed portion or the like and Resin (P) can be inhibited, whereas in the exposed portion, the acceptor property of Compound (C) decreases and the intended reaction of an acid with Resin (P) unfailingly occurs. Such an operation mechanism is considered to contribute to obtaining an excellent pattern in terms of the line width variation (LWR), the evenness of local pattern dimensions, the focus latitude (DOF), and the pattern profile.

In addition, the basicity can be confirmed by a pH measurement, and the calculated value can be determined by commercially available software.

Hereinafter, specific examples of Compound (C) which produces a compound represented by General Formula (PA-I) by the irradiation of actinic rays or radiation are shown below, however, the present invention is not limited to these.

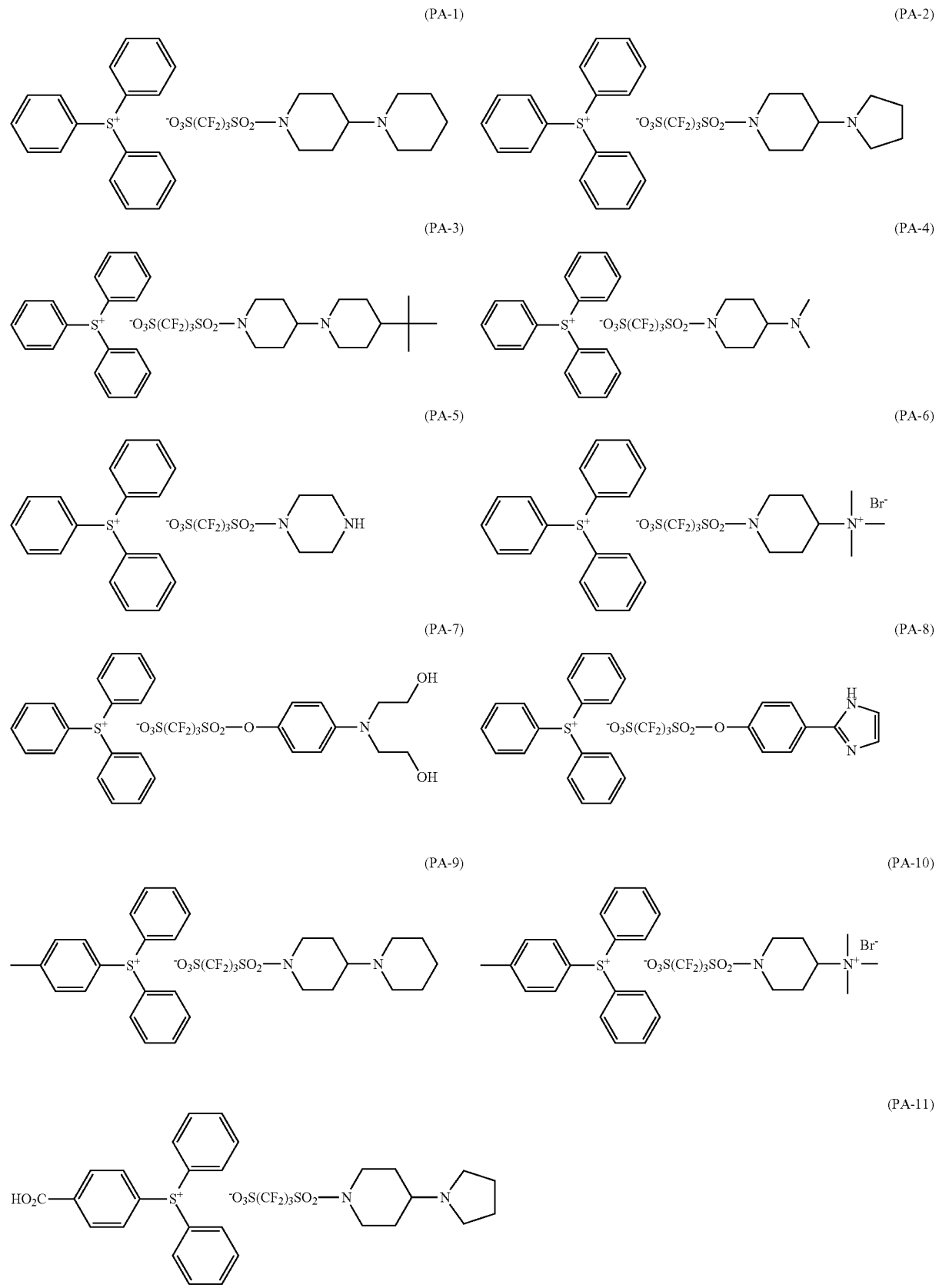

-continued
(PA-12)
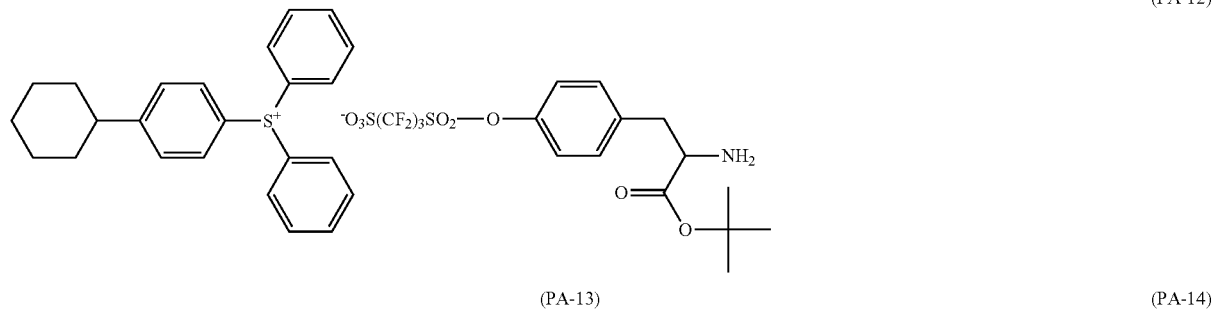
(PA-13) (PA-14)
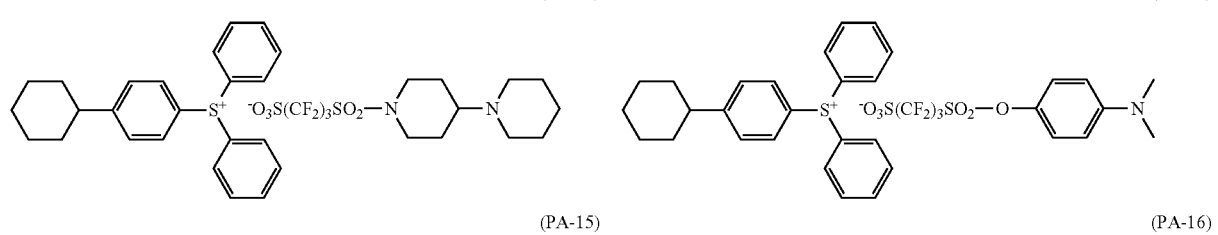
(PA-15) (PA-16)
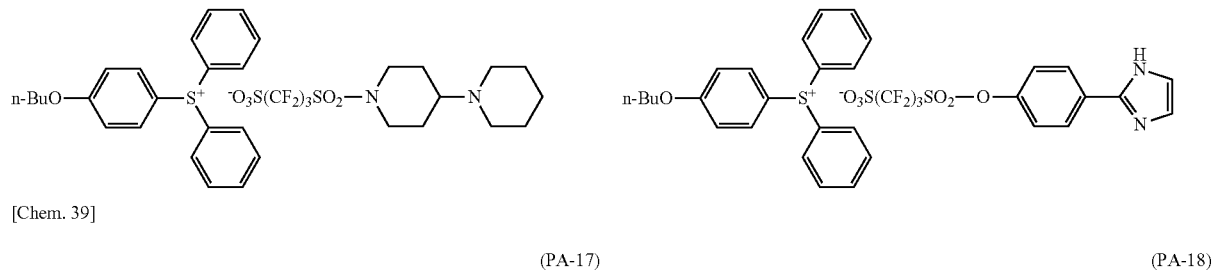
[Chem. 39]
(PA-17) (PA-18)
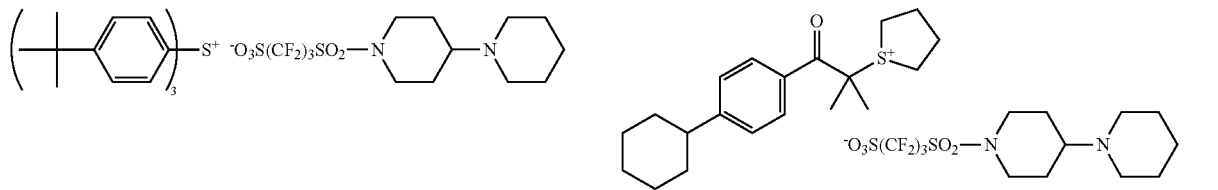
(PA-19) (PA-20)
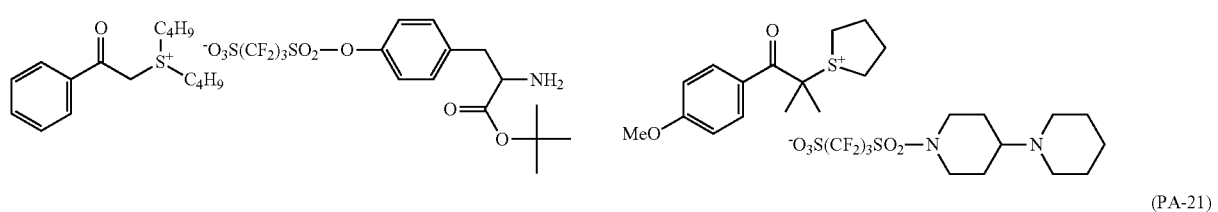
(PA-21)
(PA-22)
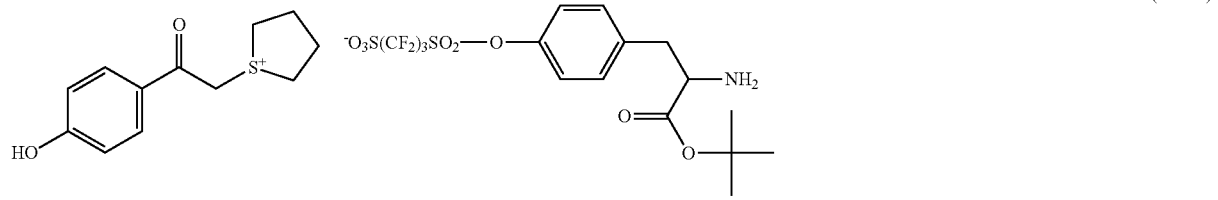

-continued
(PA-23)
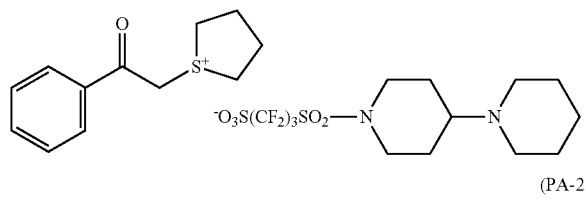
(PA-24)
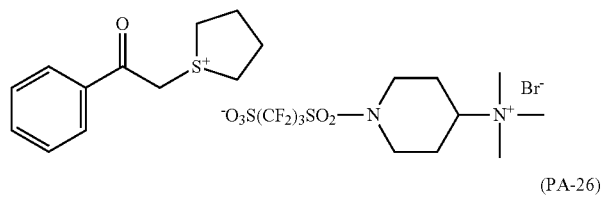
(PA-25)
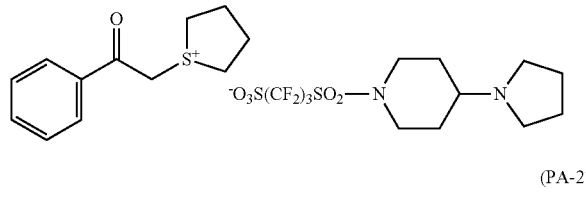
(PA-26)
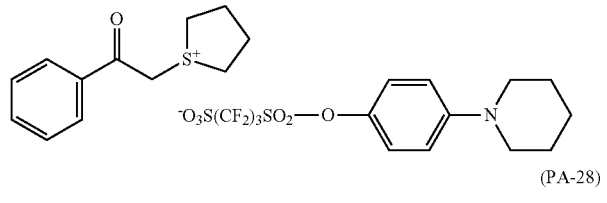
(PA-27)
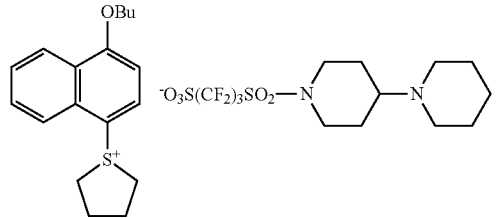
(PA-28)
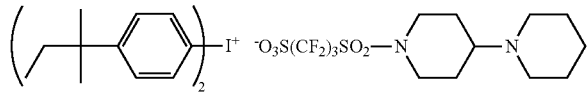
(PA-29)
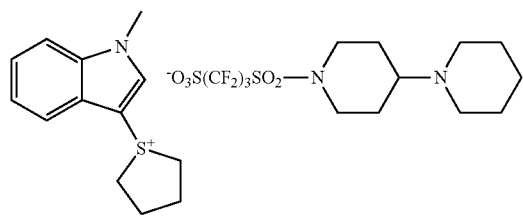
(PA-30)
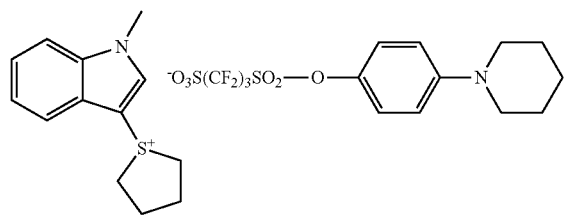
(PA-31)
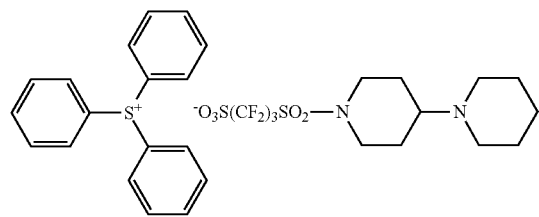
(PA-32)
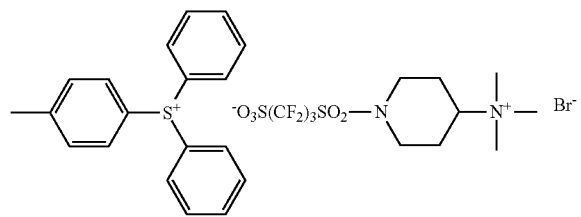
[Chem. 40]
(PA-33)
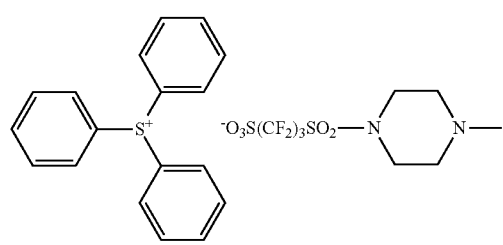
(PA-34)
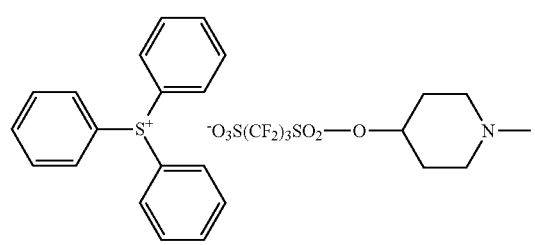

-continued
(PA-35)
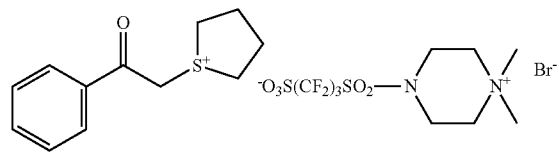
(PA-36)
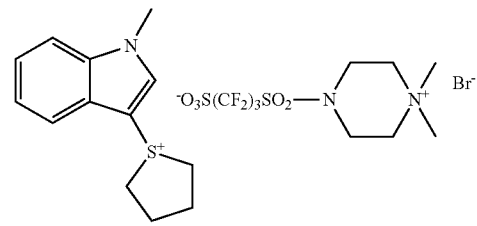
(PA-37)
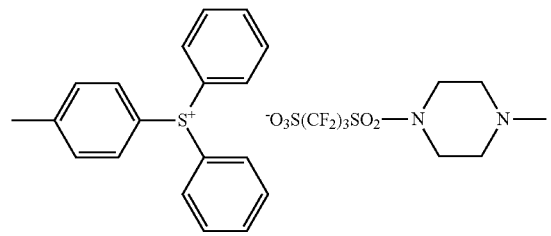
(PA-38)
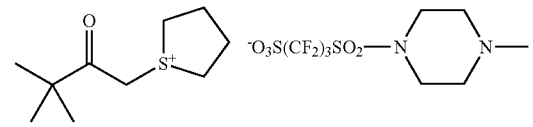
(PA-39)
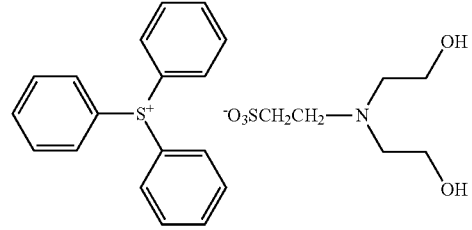
(PA-40)
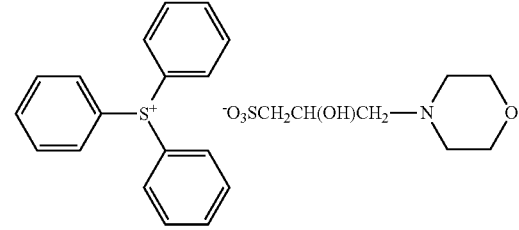
(PA-41)
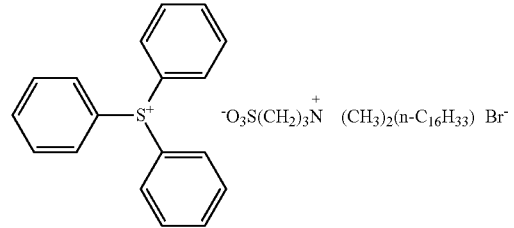
(PA-42)
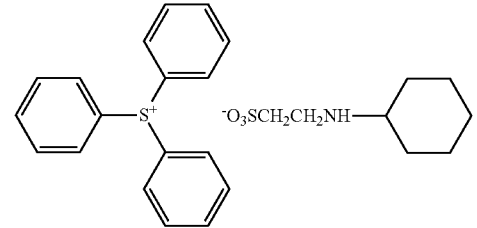
(PA-43)
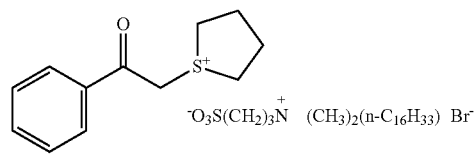
(PA-44)
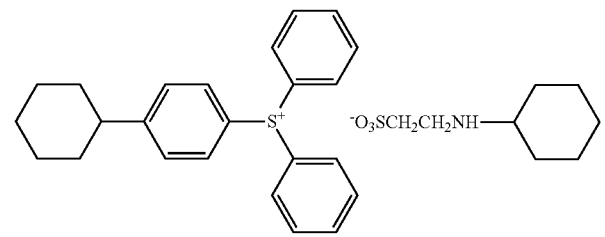
(PA-45)
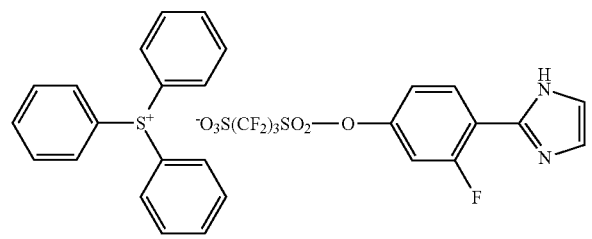
(PA-46)
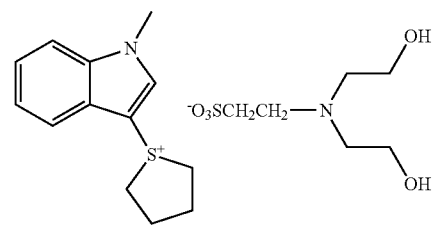

-continued
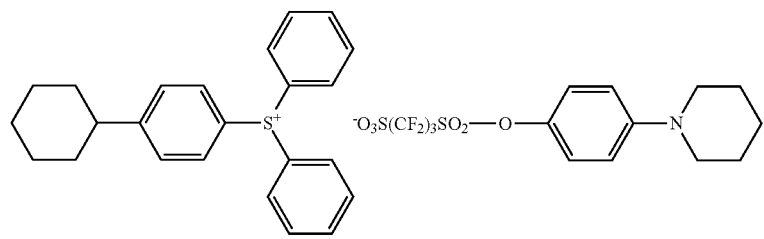
(PA-47)
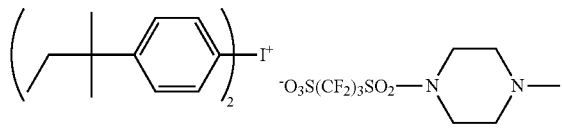
(PA-48)
[Chem. 41]
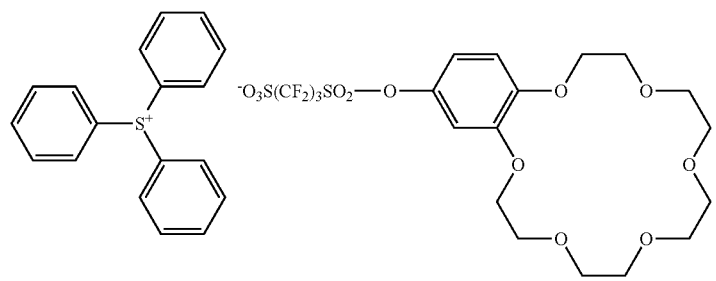
(PA-49)
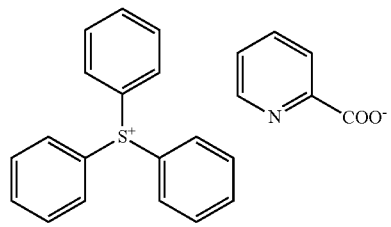
(PA-50)
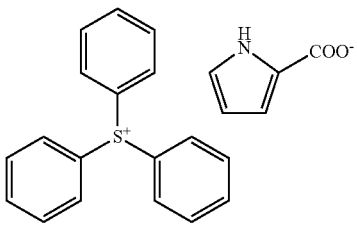
(PA-51)
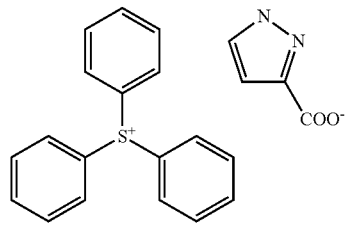
(PA-52)
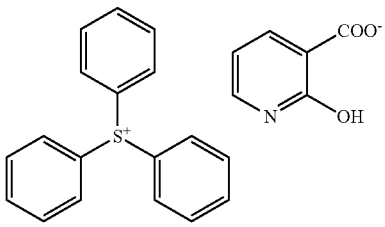
(PA-53)
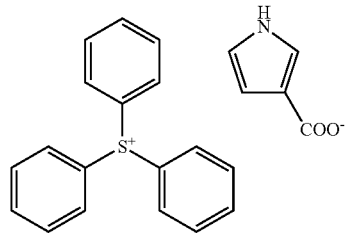
(PA-54)
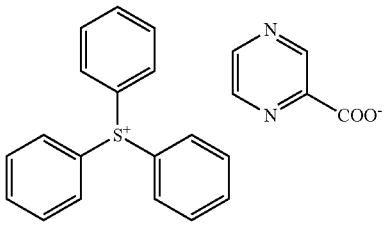
(PA-55)

-continued

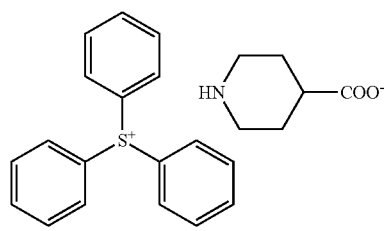
(PA-56)

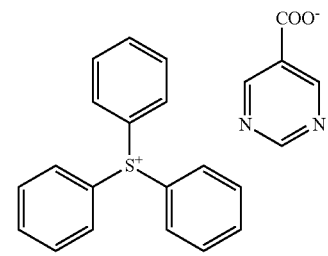
(PA-57)

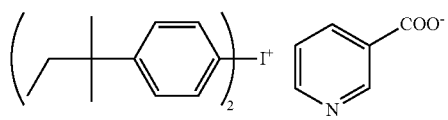
(PA-58)

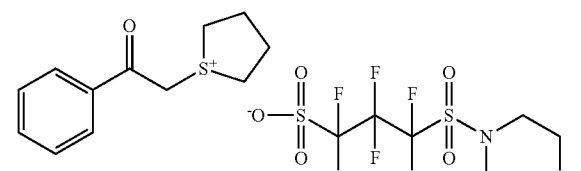
(PA-59)

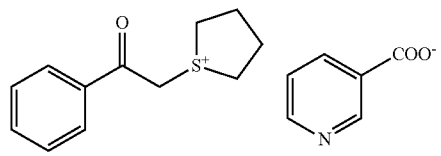
(PA-60)

These compounds can be easily synthesized from a compound represented by General Formula (PA-I) or a lithium, sodium or potassium salt thereof and a hydroxide, bromide, chloride, or the like of iodonium or sulfonium, by utilizing the salt exchange method described in JP1999-501909T (JP-H11-501909T) or JP2003-246786A. The synthesis may also be performed in accordance with the synthesis method described in JP1995-333851A (JP-H07-333851A).

Hereinafter, specific examples of Compound (C) which produces a compound represented by General Formula (PA-II) or (PA-III) by the irradiation of actinic rays or radiation are shown below, however, the present invention is not limited to these.

[Chem. 42]

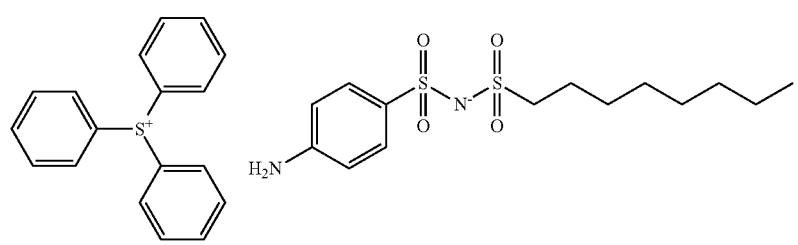
(PA-61)

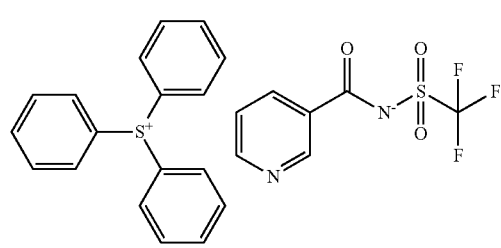
(PA-62)

(PA-63)
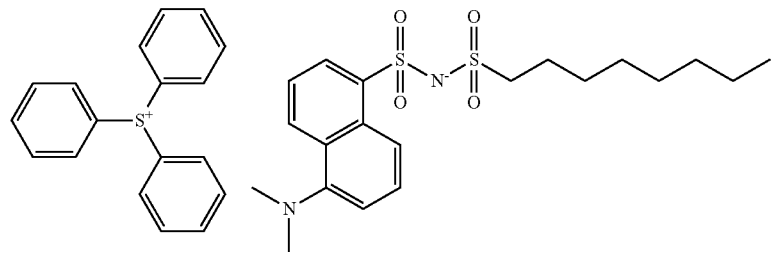
(PA-64)
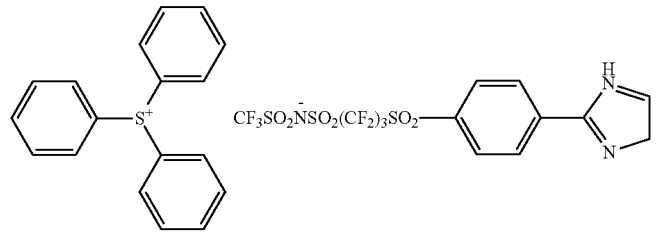
(PA-65)
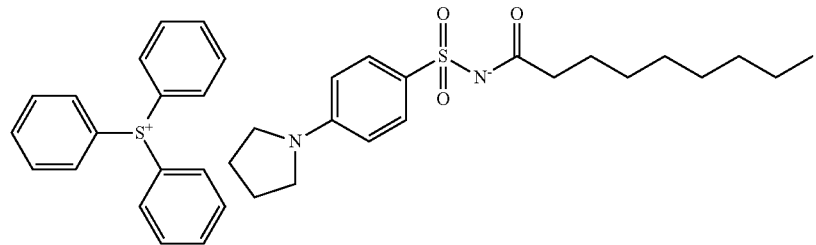
(PA-66)
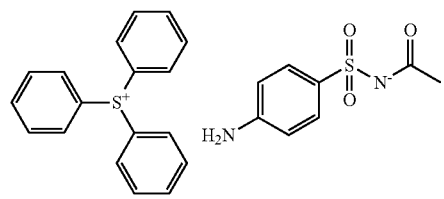
(PA-67)
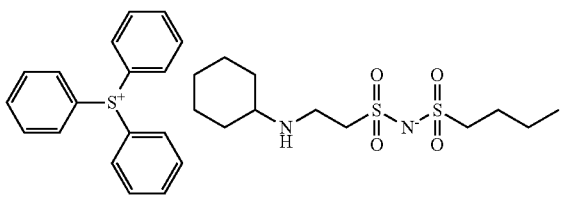
(PA-68)
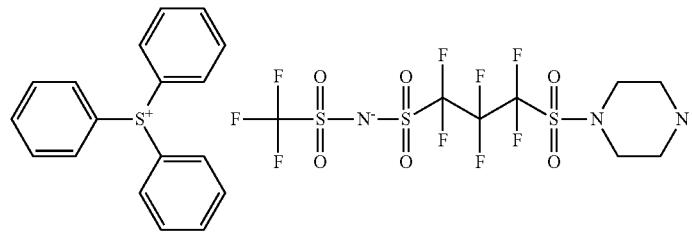
(PA-69)
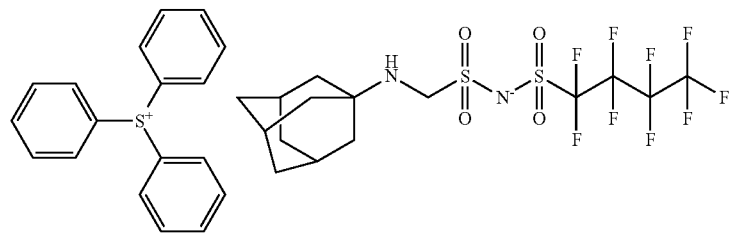

(PA-70)
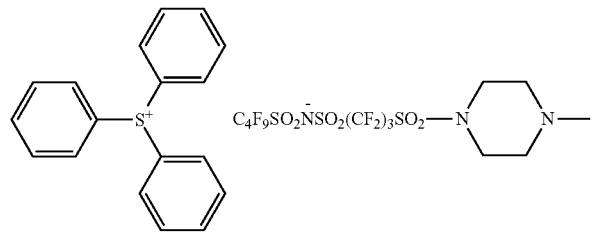
(PA-71)
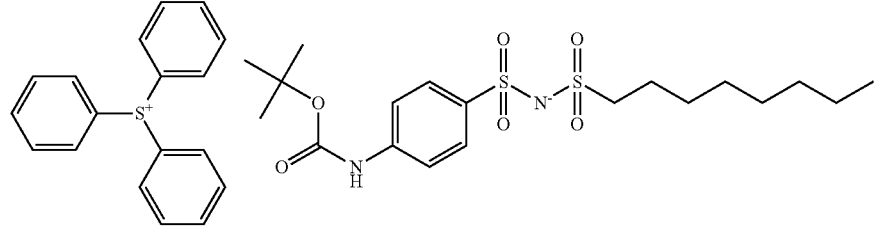
(PA-72)
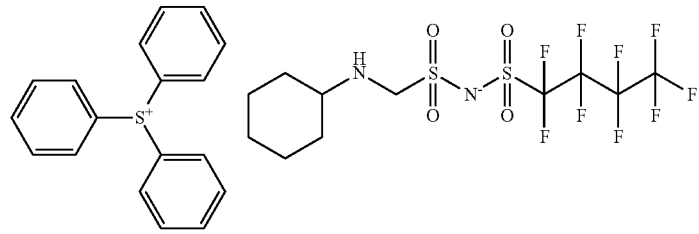
(PA-73)
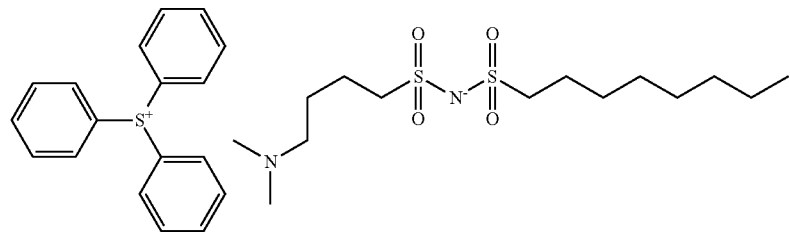
(PA-74) (PA-75)
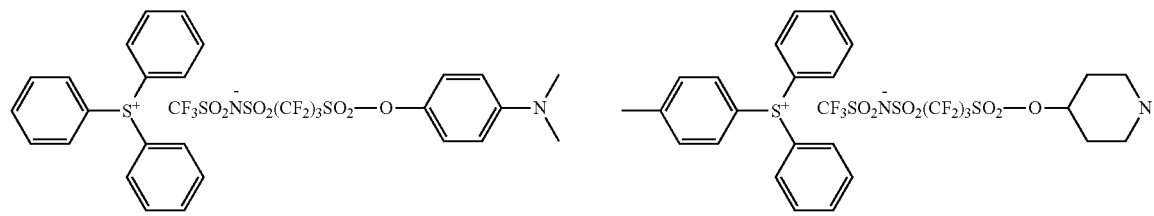
(PA-76)
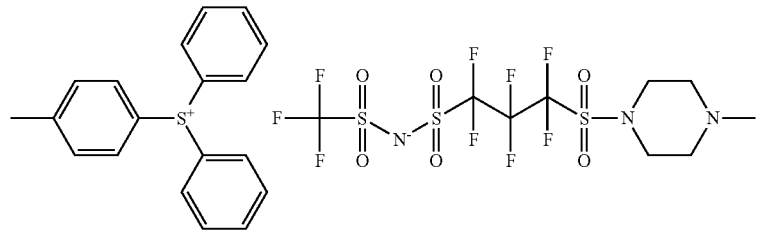

-continued
(PA-77)
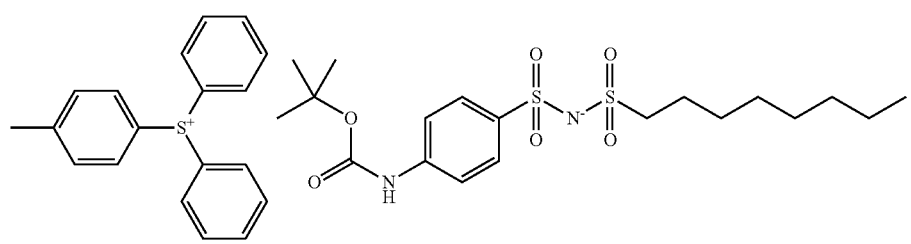
(PA-78)
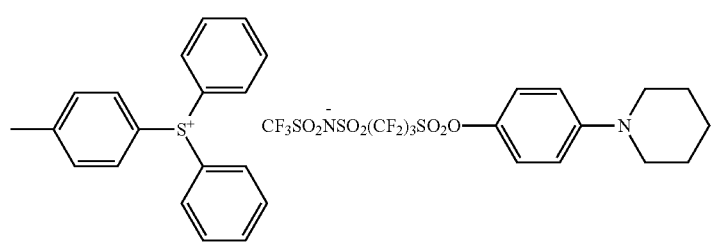
(PA-79)
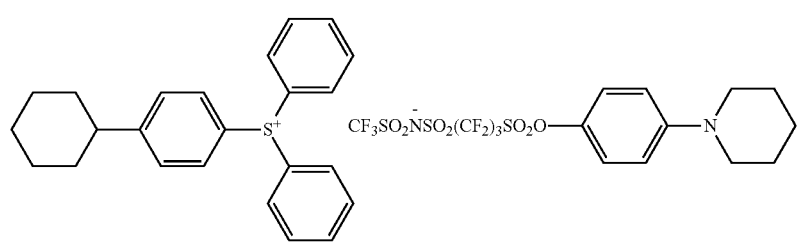
(PA-80)
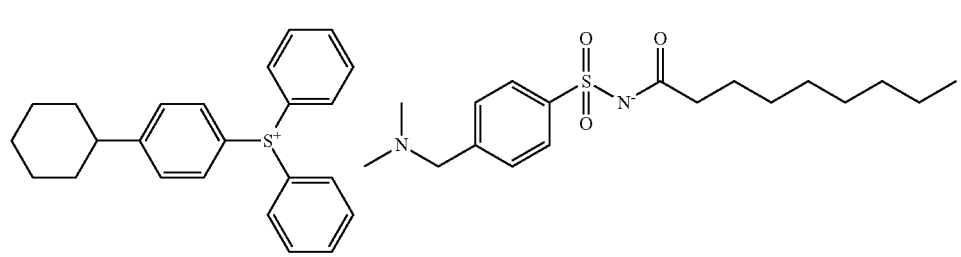
(PA-81)
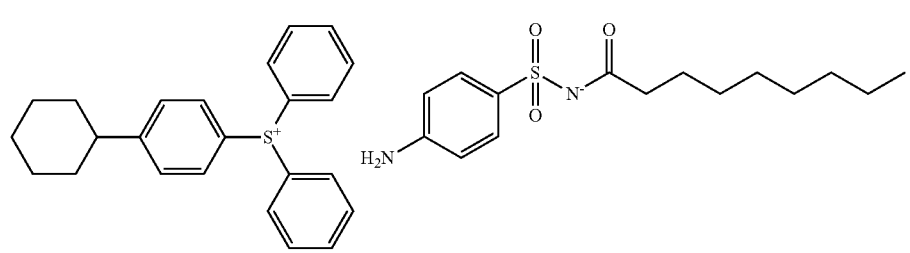
(PA-82)
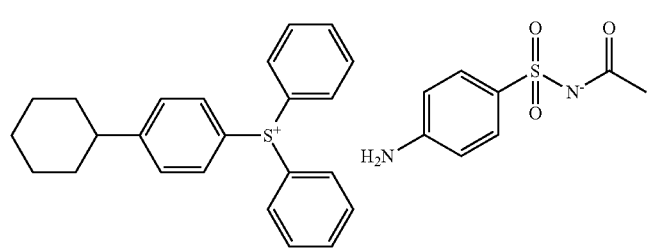

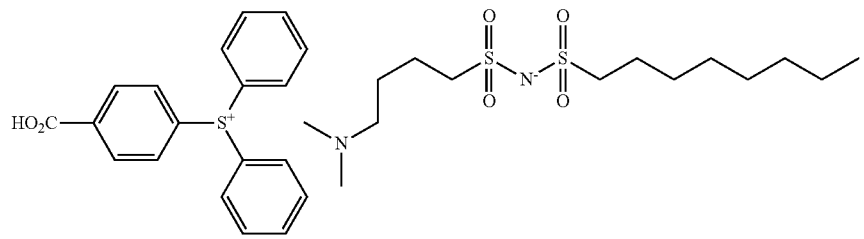 (PA-83)
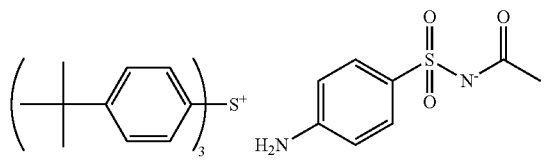 (PA-84)
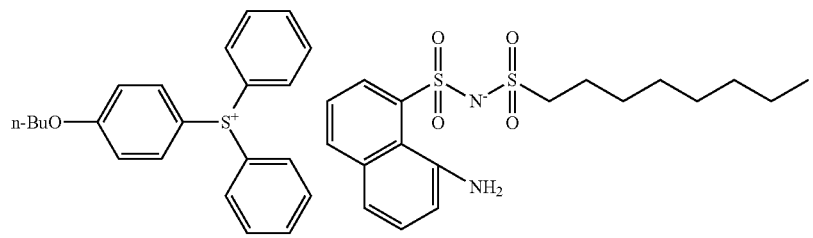 (PA-85)
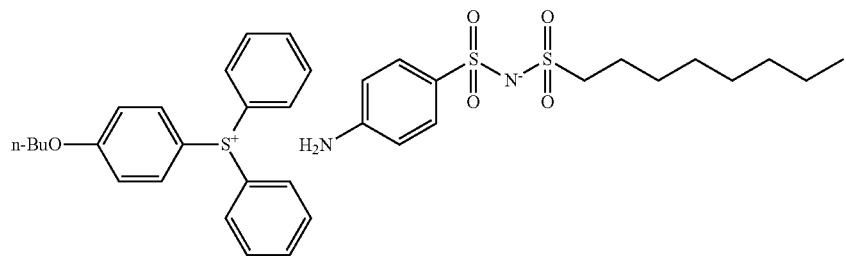 (PA-86)
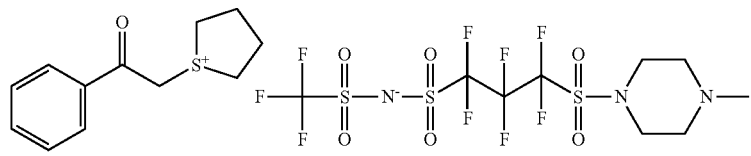 (PA-87)
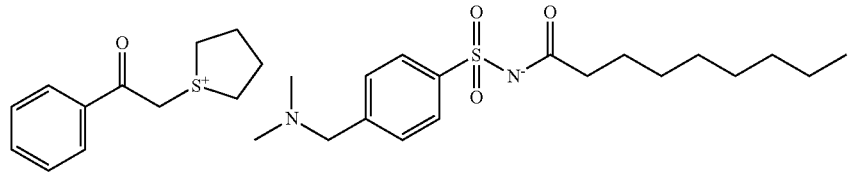 (PA-88)
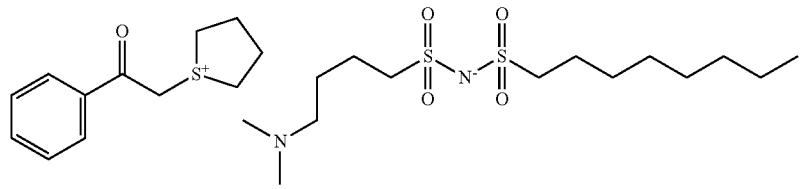 (PA-89)
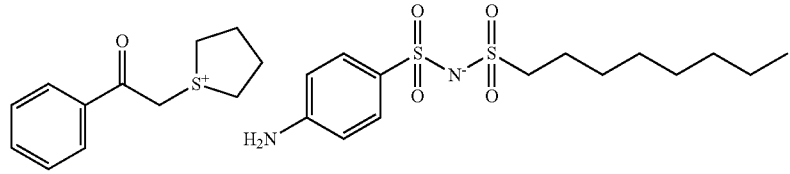 (PA-90)

-continued
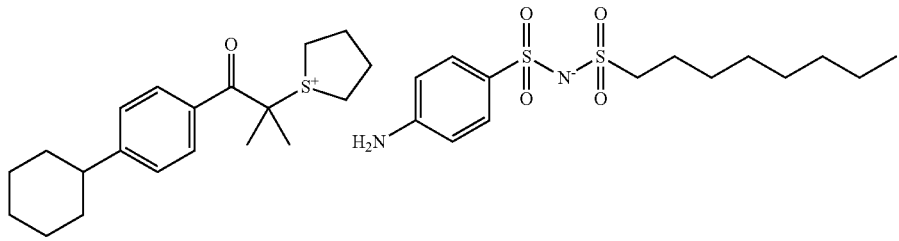
(PA-91)
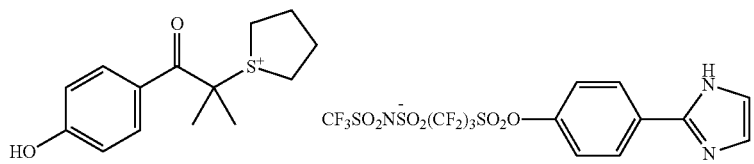
(PA-92)
[Chem. 44]
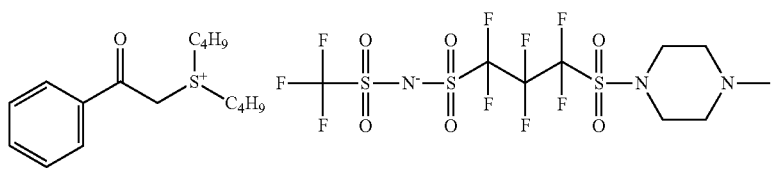
(PA-93)
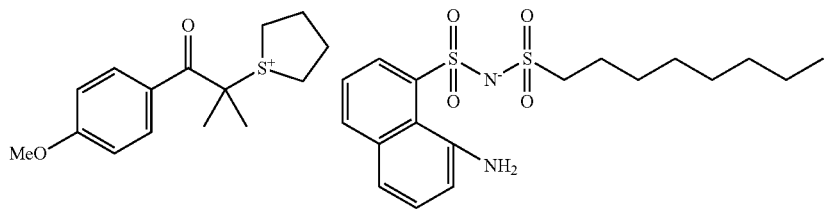
(PA-94)
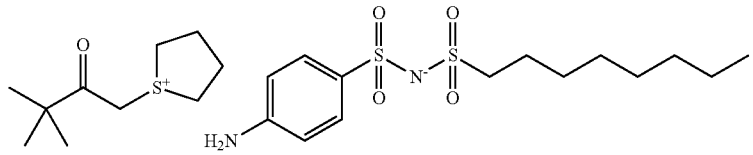
(PA-95)
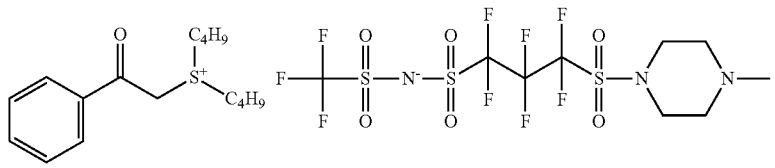
(PA-96)
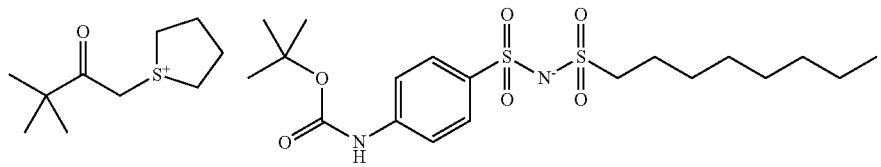
(PA-97)
(PA-98)
(PA-99)
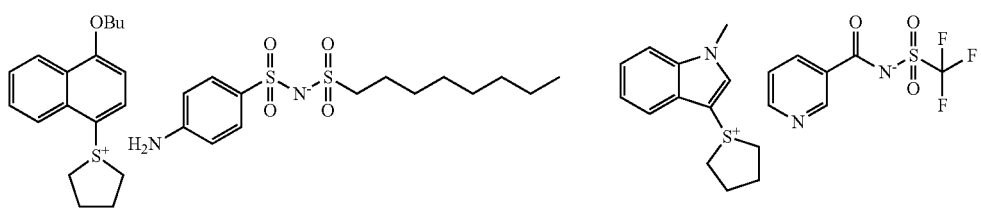

-continued
(PA-100)
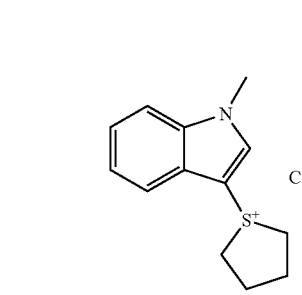 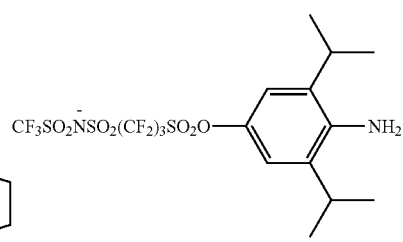
(PA-101)
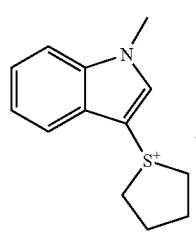 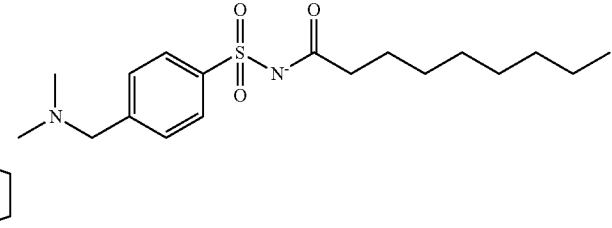
(PA-102)
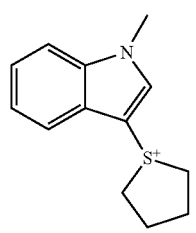 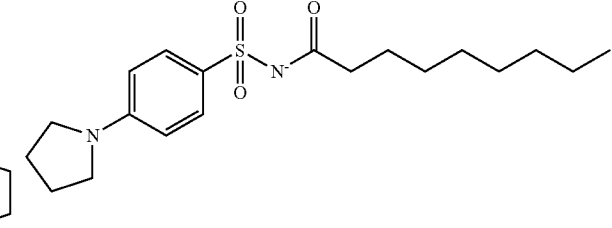
(PA-103)
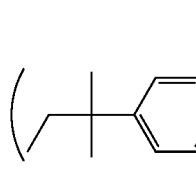 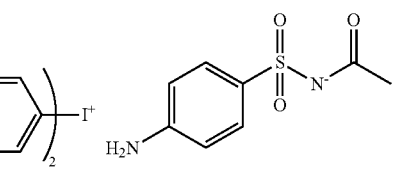
(PA-104)
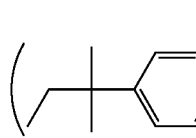 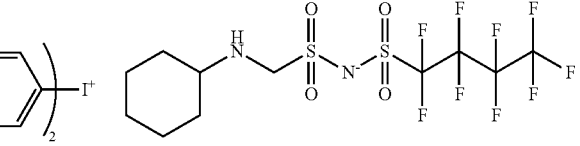
(PA-105)
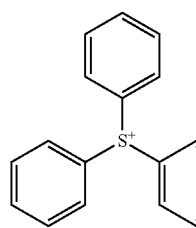 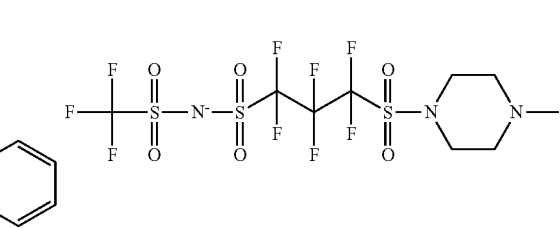
(PA-106)
(PA-107)
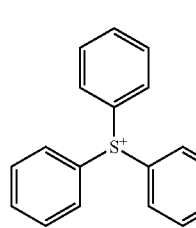 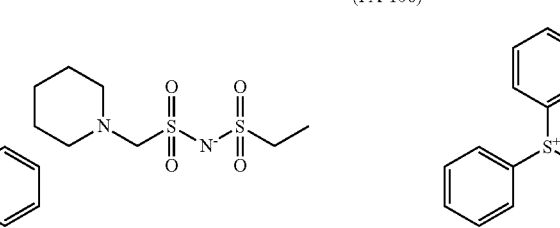 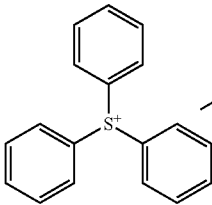

[Chem. 45]
(PA-108)
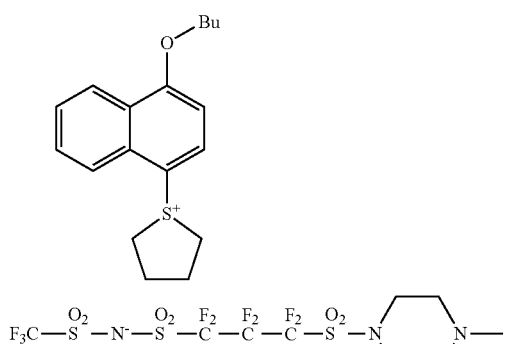
(PA-109)
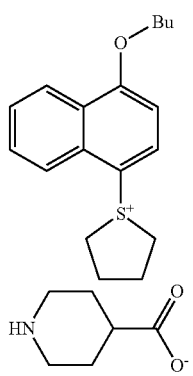
(PA-110)
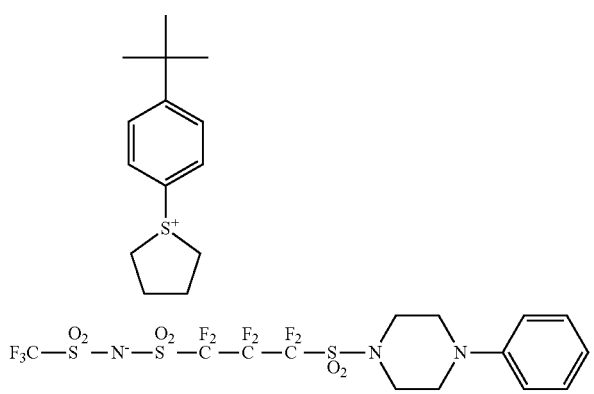
(PA-111)
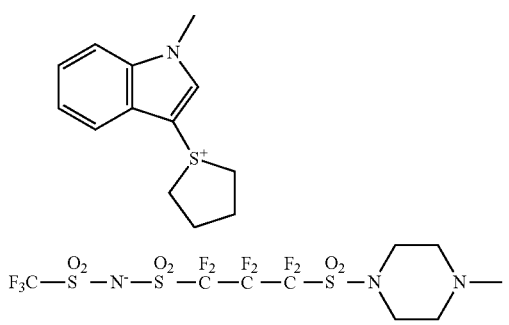
(PA-112)
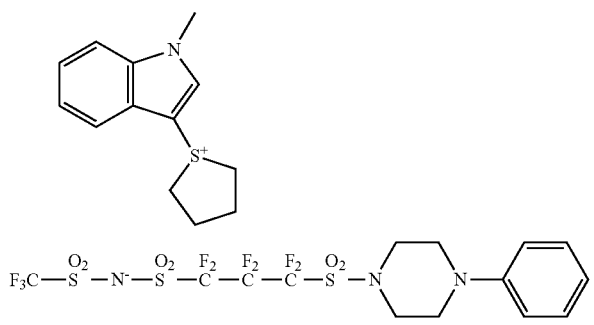
(PA-113)
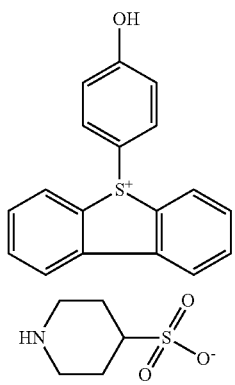
(PA-114)
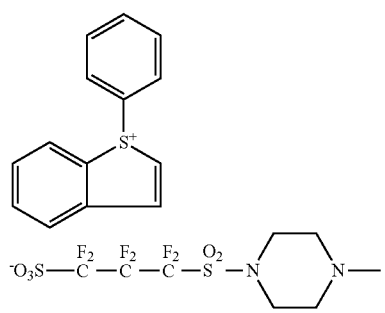
(PA-115)
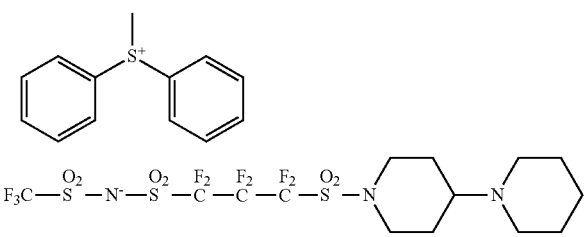

-continued
(PA-116)
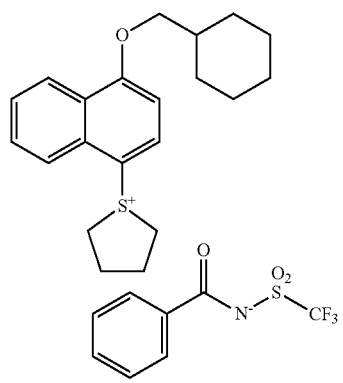
(PA-117)
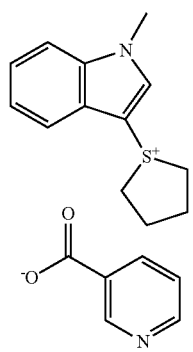
(PA-118)
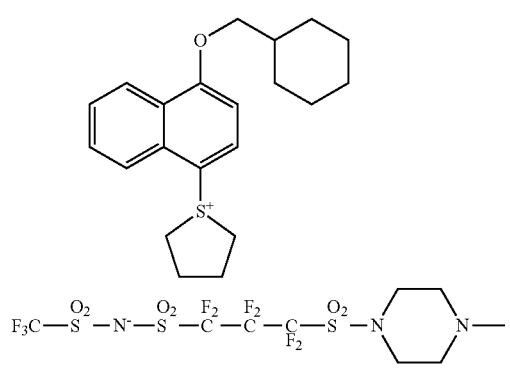
(PA-119)
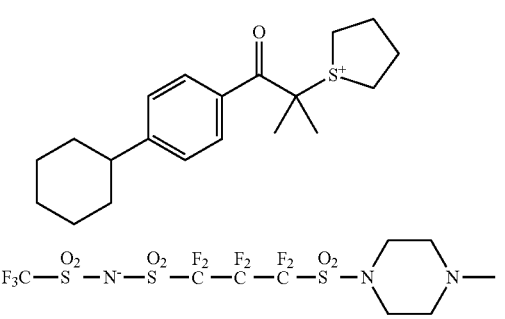
(PA-120)
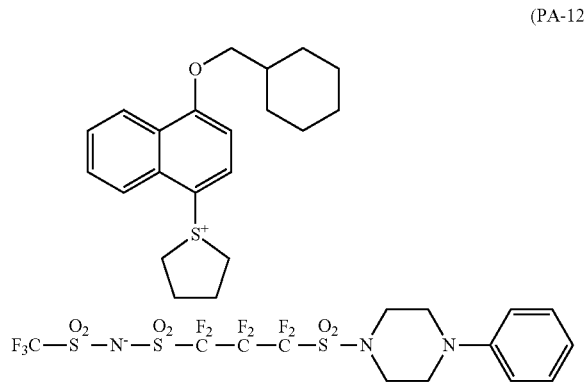
(PA-121)
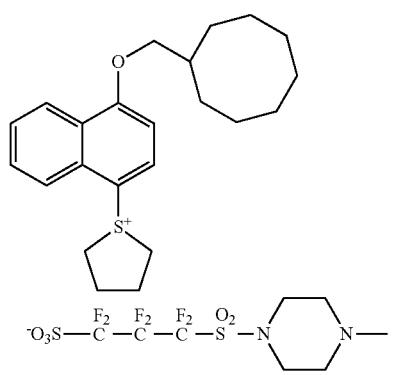
(PA-122)
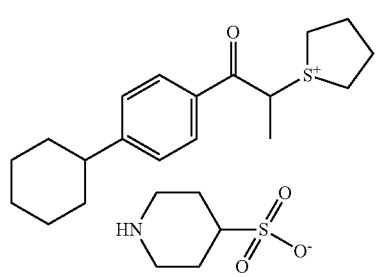

[Chem. 46]
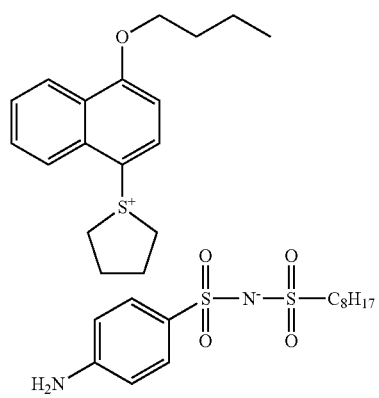
(PA-123)
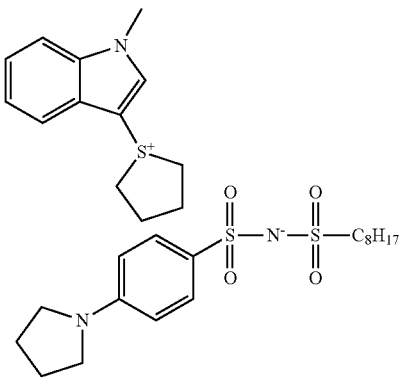
(PA-124)
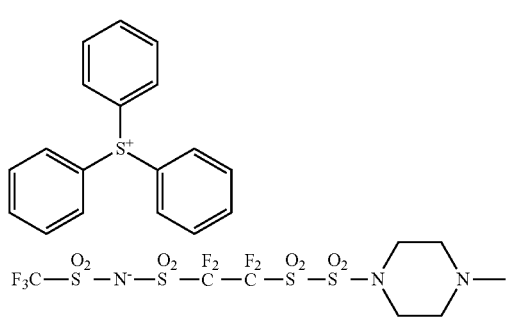
(PA-125)
[Chem. 47]
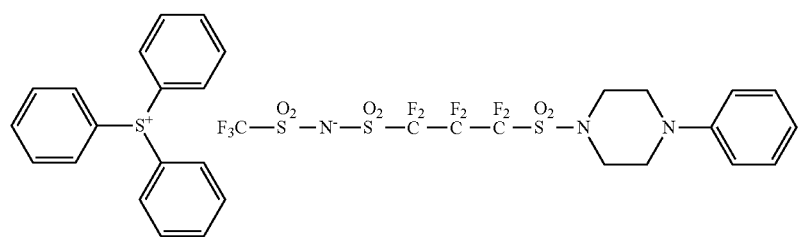
(PA-126)
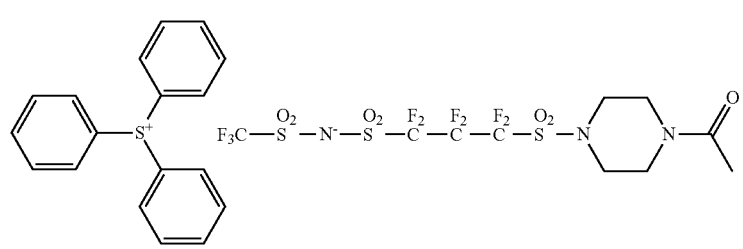
(PA-127)
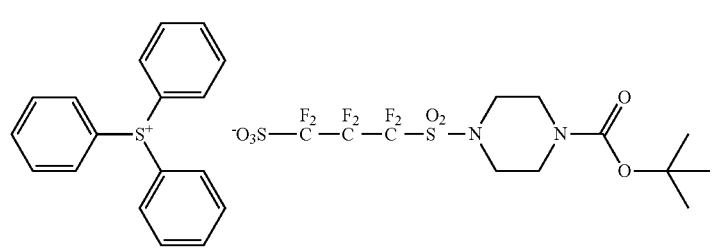
(PA-128)

-continued
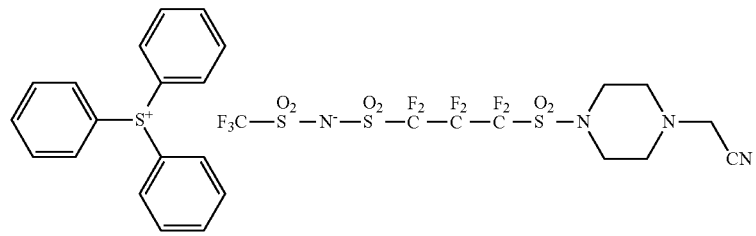
(PA-129)
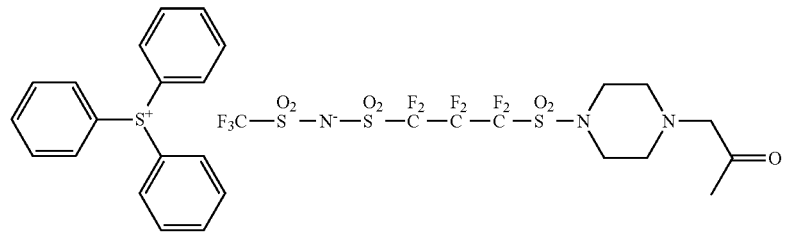
(PA-130)
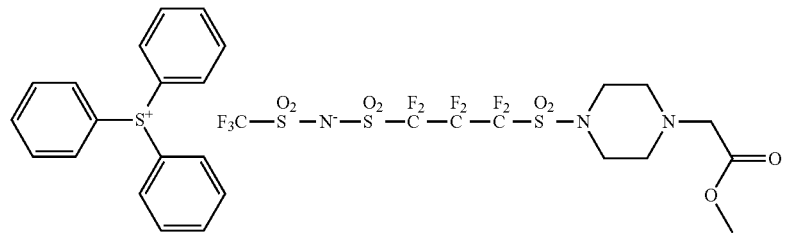
(PA-131)
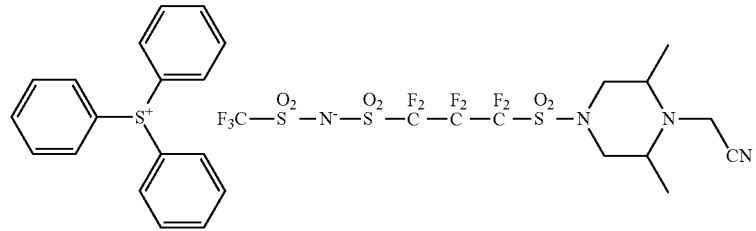
(PA-132)
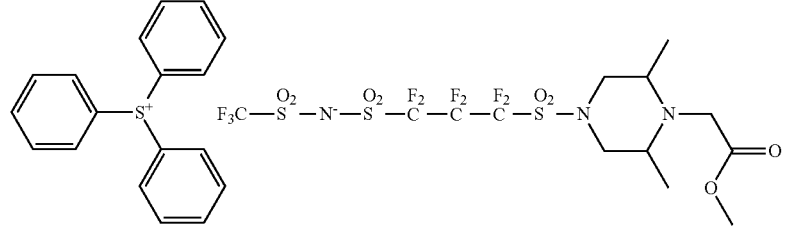
(PA-133)
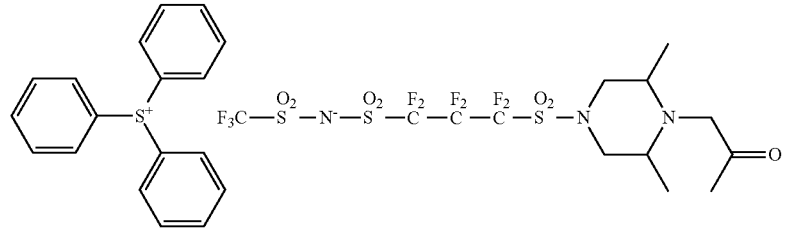
(PA-134)

-continued
[Chem. 48]
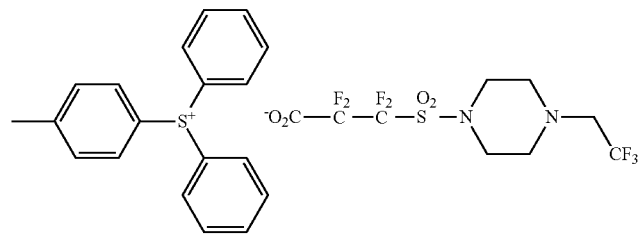
(PA-135)
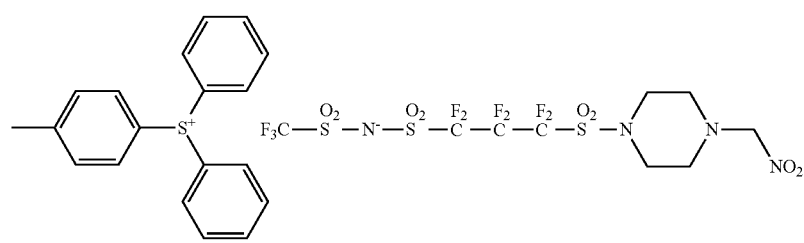
(PA-136)
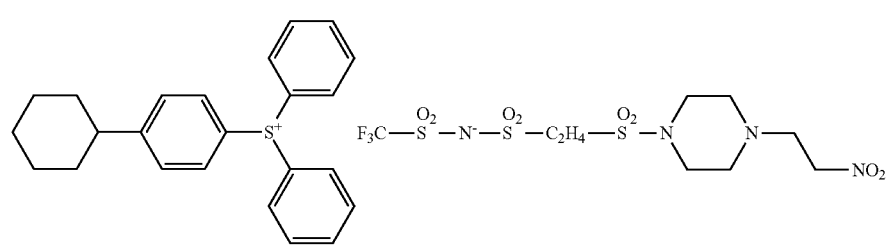
(PA-137)
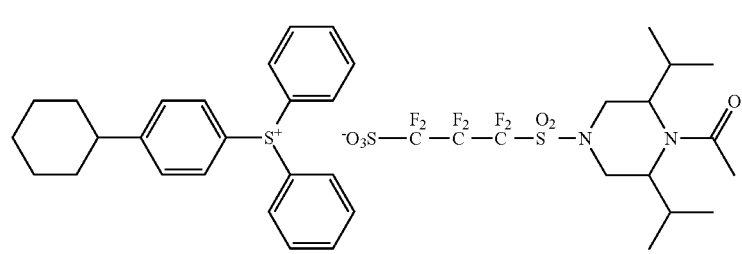
(PA-138)
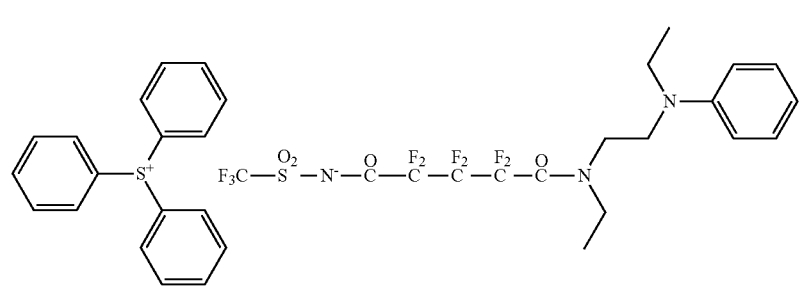
(PA-139)
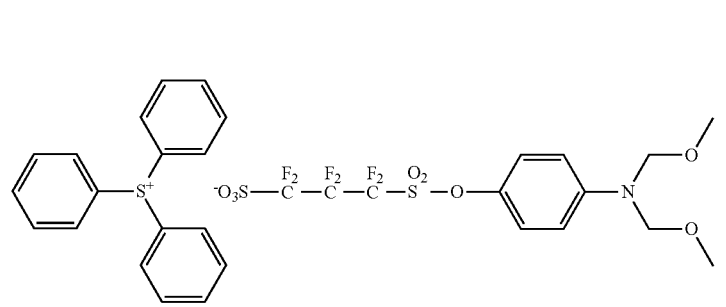
(PA-140)

-continued
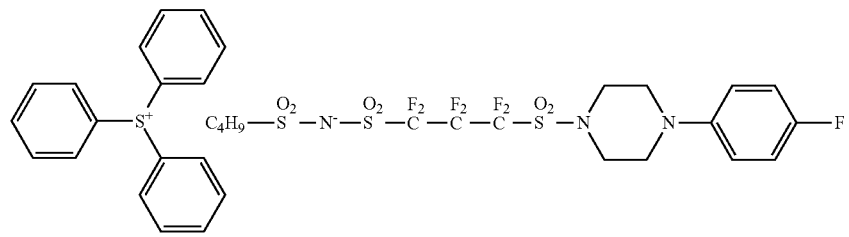
(PA-141)
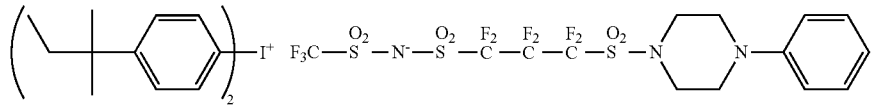
(PA-142)
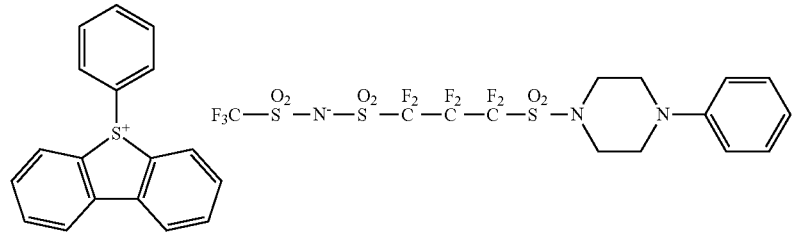
(PA-143)
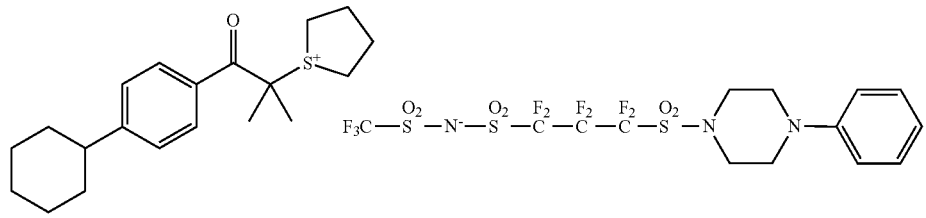
(PA-144)
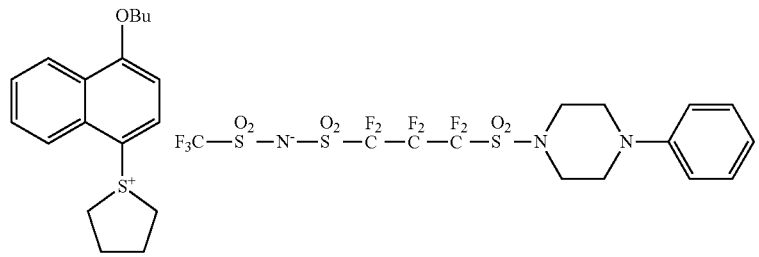
(PA-145)
[Chem. 49]
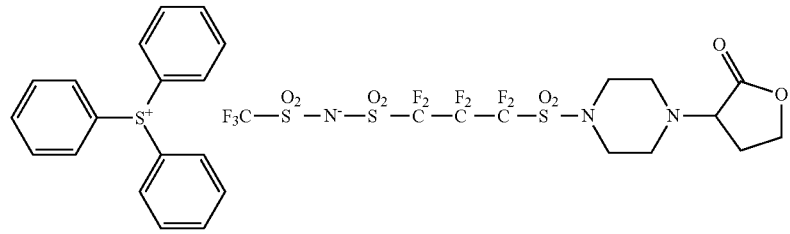
(PA-146)
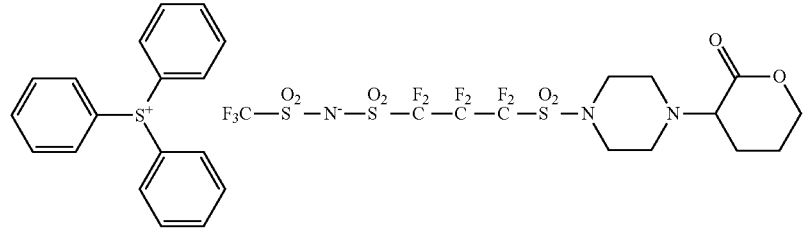
(PA-147)

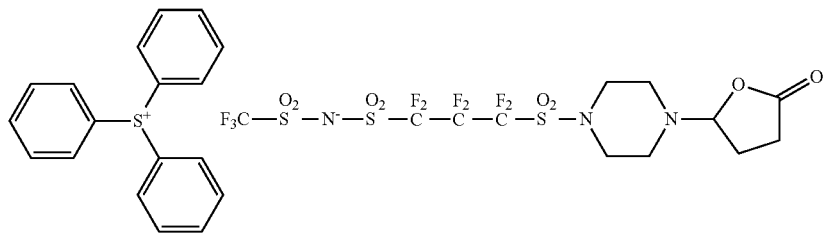

(PA-148)

These compounds may be readily synthesized by using a general sulfonic acid esterification reaction or a sulfonamide reaction. For example, a method in which a sulfonamide bond or a sulfonate ester bond is formed by selectively reacting one of the sulfonyl halide parts of a bissulfonyl halide compound with amine, alcohol, or the like including a partial structure represented by General Formula (PA-II) or (PA-III), and then, the other sulfonyl halide part is hydrolyzed, or a method in which a cyclic sulfonic acid anhydride is ring-opened by amine or alcohol including a partial structure represented by General Formula (PA-II), may be used. The amine or alcohol including a partial structure represented by General Formula (PA-II) or (PA-III) may be synthesized by reacting amine or alcohol with an anhydride such as (R'O$_2$C)$_2$O or (R'SO$_2$)$_2$O, or an acid chloride compound such as R'O$_2$CCl or R'SO$_2$Cl (R' is a methyl group, an n-octyl group, a trifluoromethyl group, or the like) under a basic condition. In particular, these compounds can be synthesized in accordance with the synthesis examples disclosed in JP2006-330098A.

The molecular weight of Compound (C) is preferably 500 to 1,000.

While the actinic ray-sensitive or radiation-sensitive resin composition of the present invention may or may not contain Compound (C), in a case where Compound (C) is contained, 0.1 to 20% by mass with the solid content of the actinic ray-sensitive or radiation-sensitive resin composition as the reference is preferable, and 0.1 to 10% by mass is more preferable.

[4-2] Basic Compound (C')

The actinic ray-sensitive or radiation-sensitive resin composition of the present invention may contain Basic Compound (C') (excludes Compound (C) described above) in order to reduce changes in performance over time from exposure to heating.

Preferred examples of Basic Compound (C') include compounds having structures represented by the following Formulae (A) to (E).

[Chem. 50]

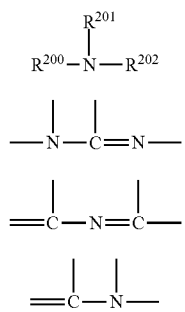

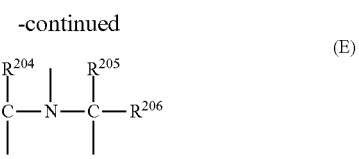

In General Formulae (A) and (E), $R^{200}$, $R^{201}$, and $R^{202}$ may be the same as or different from each other, and represent a hydrogen atom, an alkyl group (preferably having 1 to 20 carbon atoms), a cycloalkyl group (preferably having 3 to 20 carbon atoms), or an aryl group (having 6 to 20 carbon atoms), in which $R^{201}$ and $R^{202}$ may be bonded to each other to form a ring. $R^{203}$, $R^{204}$, $R^{205}$, and $R^{206}$ may be the same as or different from each other, and represent an alkyl group having 1 to 20 carbon atoms.

The alkyl group having a substituent as the alkyl group is preferably an aminoalkyl group having 1 to 20 carbon atoms, a hydroxyalkyl group having 1 to 20 carbon atoms, or a cycloalkyl group having 1 to 20 carbon atoms.

The alkyl group in General Formulae (A) and (E) is more preferably unsubstituted.

Preferred examples of the compound include guanidine, aminopyrrolidine, pyrazole, pyrazoline, piperazine, aminomorpholine, aminoalkylmorpholine, piperidine, and the like, and more preferred examples of the compound include a compound having an imidazole structure, a diazabicyclo structure, an onium hydroxide structure, an onium carboxylate structure, a trialkylamine structure, an aniline structure, or a pyridine structure; an alkylamine derivative having one or both of a hydroxyl group and an ether bond; and an aniline derivative having a hydroxyl group and/or an ether bond.

Examples of the compound having an imidazole structure include imidazole, 2,4,5-triphenylimidazole, benzimidazole, and the like. Examples of the compound having a diazabicyclo structure include 1,4-diazabicyclo[2,2,2]octane, 1,5-diazabicyclo[4,3,0]non-5-ene, 1,8-diazabicyclo[5,4,0]undec-7-ene, and the like. Examples of the compound having an onium hydroxide structure include triarylsulfonium hydroxide, phenacylsulfonium hydroxide, and sulfonium hydroxide having a 2-oxoalkyl group, specifically, triphenylsulfonium hydroxide, tris(t-butylphenyl)sulfonium hydroxide, bis(t-butylphenyl)iodonium hydroxide, phenacylthiophenium hydroxide, 2-oxopropylthiophenium hydroxide, and the like. The compound having an onium carboxylate structure is a compound where the anion moiety of the compound having an onium hydroxide structure becomes a carboxylate, and examples thereof include acetate, adamantane-1-carboxylate, perfluoroalkyl carboxylate, and the like. Examples of the compound having a trialkylamine structure include tri(n-butyl)amine, tri(n-octyl)amine, and the like. Examples of the compound having an aniline structure include 2,6-diisopropylaniline, N,N-dimethylaniline, N,N-dibutylaniline, N,N- dihexylaniline, and the like. Examples of the alkylamine derivative having one or both of a hydroxyl group and an ether bond include ethanolamine, diethanolamine, triethanolamine, tris(methoxyethoxyethyl)amine, and the like. Examples of the aniline derivative having one or both of a hydroxyl group and an ether bond include N,N-bis(hydroxyethyl)aniline and the like.

Preferred examples of Basic Compound (C') further include a phenoxy group-containing amine compound, a phenoxy group-containing ammonium salt compound, a sulfonic acid ester group-containing amine compound, and a sulfonic acid ester group-containing ammonium salt compound.

As for the phenoxy group-containing amine compound, the phenoxy group-containing ammonium salt compound, the sulfonic acid ester group-containing amine compound, and the sulfonic acid ester group-containing ammonium salt compound, it is preferable that at least one alkyl group be bonded to the nitrogen atom. Further, it is preferable that the compound have an oxygen atom in the alkyl chain to form an oxyalkylene group. The number of oxyalkylene groups within the molecule is 1 or more, preferably from 3 to 9, and more preferably from 4 to 6. Among the oxyalkylene groups, the structures of —$CH_2CH_2O$—, —$CH(CH_3)CH_2O$—, or —$CH_2CH_2CH_2O$— are preferred.

Specific examples of the phenoxy group-containing amine compound, the phenoxy group-containing ammonium salt compound, the sulfonic acid ester group-containing amine compound, and the sulfonic acid ester group-containing ammonium salt compound include, but are not limited to, Compounds (C1-1) to (C3-3) illustrated in paragraph [0066] in the specification of US2007/0224539A.

In addition, as one of Basic Compound (C'), a nitrogen-containing organic compound having a group detached by the action of acid may be used. Examples of this compound may include a compound represented by the following General Formula (F). Incidentally, the compound represented by the following General Formula (F) exhibits an effective basicity in the system as a result of elimination of the group which is detached by the action of an acid.

[Chem. 51]

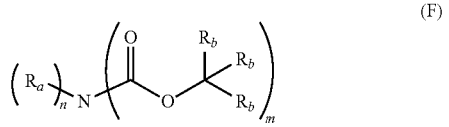

(F)

In General Formula (F), $R_a$'s, independently, represent a hydrogen atom, an alkyl group, a cycloalkyl group, an aryl group, or an aralkyl group. In addition, when n=2, the two $R_a$'s may be the same as or different from each other, and two $R_a$'s may be bonded to each other to form a divalent heterocyclic hydrocarbon group (preferably having 20 or fewer carbon atoms) or a derivative thereof.

$R_b$'s independently represent a hydrogen atom, an alkyl group, a cycloalkyl group, an aryl group, and an aralkyl group. However, in —$C(R_b)(R_b)(R_b)$, when one or more of $R_b$'s are hydrogen atoms, at least one of the remaining $R_b$'s is a cyclopropyl group or a 1-alkoxyalkyl group.

At least two $R_b$'s may be bonded to each other to form an alicyclic hydrocarbon group, an aromatic hydrocarbon group, a heterocyclic hydrocarbon group, or a derivative thereof.

n represents an integer from 0 to 2, m represents an integer from 1 to 3, respectively, and n+m=3.

In General Formula (F), the alkyl group, the cycloalkyl group, the aryl group, and the aralkyl group represented by $R_a$ and $R_b$ may be substituted with a functional group such as a hydroxyl group, a cyano group, an amino group, a pyrrolidino group, a piperidino group, a morpholino group or an oxo group, an alkoxy group, or a halogen atom.

Examples of the alkyl group, the cycloalkyl group, the aryl group, or the aralkyl group of R described above (the alkyl group, the cycloalkyl group, the aryl group, and the aralkyl group may be substituted with the functional group described above, an alkoxy group, or a halogen atom) include a group derived from a linear or branched alkane such as, for example, methane, ethane, propane, butane, pentane, hexane, heptane, octane, nonane, decane, undecane, or dodecane, a group in which a group derived from such alkanes is substituted with one or more types or one or more of cycloalkyl group such as, for example, a cyclobutyl group, a cyclopentyl group, or a cyclohexyl group, a group derived from a cycloalkane such as cyclobutane, cyclopentane, cyclohexane, cycloheptane, cyclooctane, norbornane, adamantane, or noradamantane, a group in which a group derived from such cycloalkanes is substituted with one or more types or one or more of linear or branched alkyl group such as, for example, a methyl group, an ethyl group, an n-propyl group, an i-propyl group, an n-butyl group, a 2-methylpropyl group, a 1-methylpropyl group, or a t-butyl group, a group derived from an aromatic compound such as benzene, naphthalene, or anthracene, a group in which a group derived from such aromatic compounds is substituted with one or more types or one or more of a linear or branched alkyl group such as, for example, a methyl group, an ethyl group, an n-propyl group, an i-propyl group, an n-butyl group, a 2-methylpropyl group, a 1-methylpropyl group, or a t-butyl group, a group derived from a polycyclic compound such as pyrrolidine, piperidine, morpholine, tetrahydrofuran, tetrahydropyran, indole, indoline, quinoline, perhydroquinoline, indazole, or benzimidazole, a group in which a group derived from such polycyclic compounds is substituted with one or more types or one or more of a linear or branched alkyl group or aromatic compound, a group in which a group derived from a linear or branched alkane or a group derived from a cycloalkane is substituted with one or more types or one or more of an aromatic compound such as a phenyl group, a naphthyl group, or an anthracenyl group, and the like, or a group in which the substituents described above are substituted with a functional group such as a hydroxyl group, a cyano group, an amino group, a pyrrolidino group, a piperidino group, a morpholino group, or an oxo group, and the like.

Further, examples of a divalent polycyclic hydrocarbon group (preferably with 1 to 20 carbon atoms) formed by the $R_a$'s described above being bonded to one another or a derivative thereof include a group derived from a polycyclic compound such as pyrrolidine, piperidine, morpholine, 1,4,5,6-tetrahydropyrimidine, 1,2,3,4-tetrahydroquinoline, 1,2,3,6-tetrahydropyridine, homo-piperazine, 4-aza-benzimidazole, benzotriazole, 5-aza-benzotriazole, 1H-1,2,3-triazole, 1,4,7-triazacyclononane, tetrazole, 7-azaindole, indazole, benzimidazole, imidazo[1,2-a]pyridine, (1S,4S)-(+)-2,5-diazabicyclo[2.2.1]heptane, 1,5,7-triazabicyclo[4.4.0]dec-5-ene, indole, indoline, 1,2,3,4-tetrahydroquinoxaline, pertetrahydroquinoline, and 1,5,9-triazacyclo dodecane, a group in which a group derived from such polycyclic compounds is substituted with one or more types or one or more of a group derived from a linear or branched alkane, a group derived from a cycloalkane, a group derived from an aromatic compound, a group derived from a polycyclic compound, or a functional group such as a hydroxyl group, a cyano group, an amino group, a pyrrolidino group, a piperidino group, a morpholino group, or an oxo group, and the like.
Specific examples of the compound represented by General Formula (F) are shown below.
[Chem. 52]
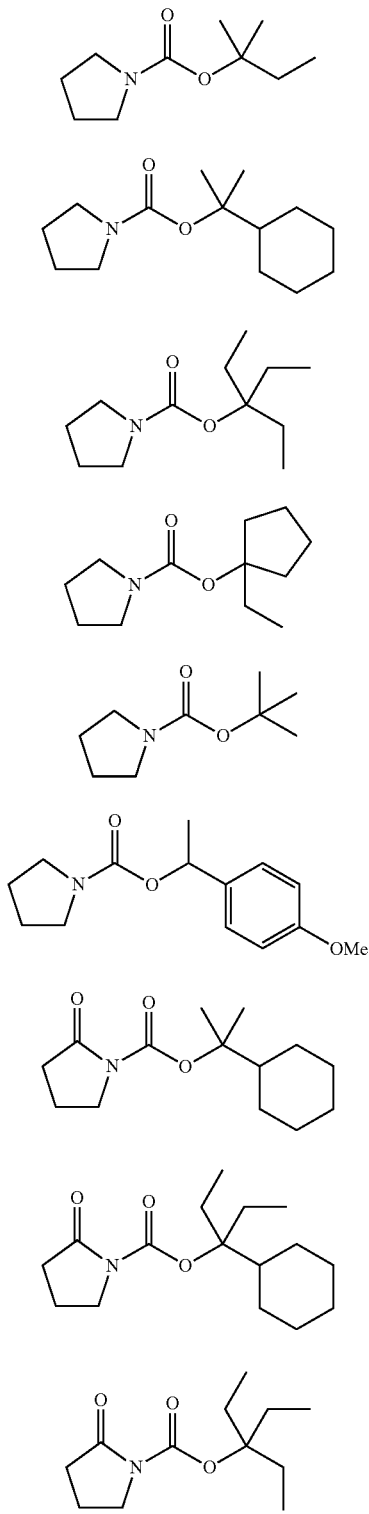
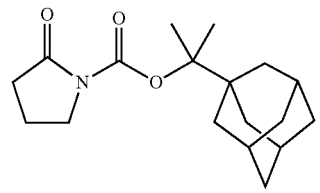

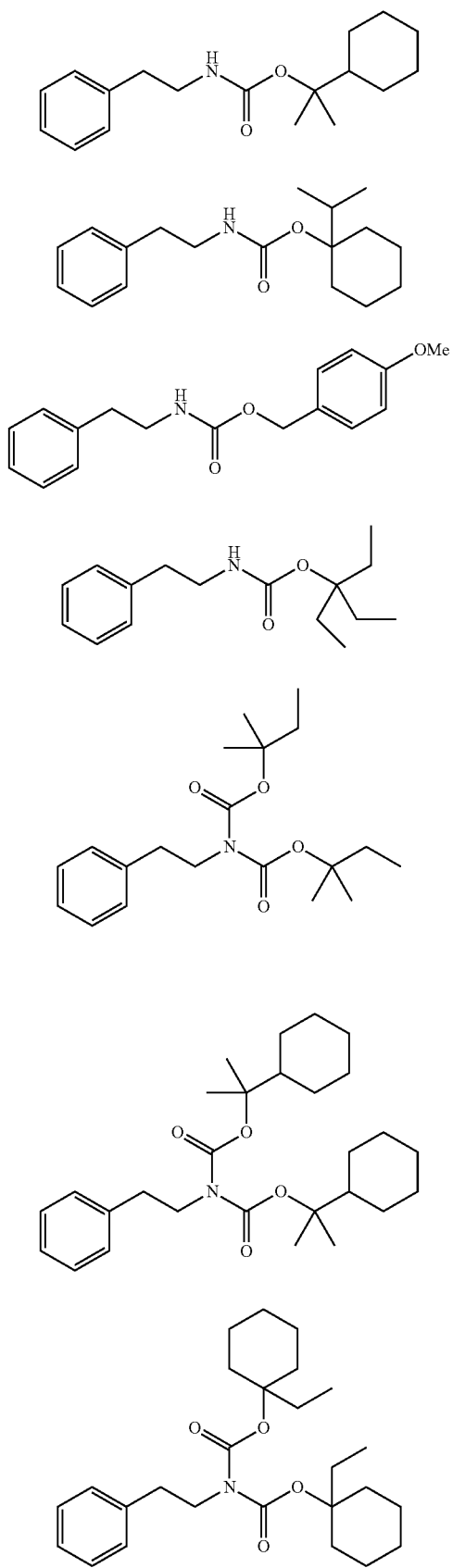
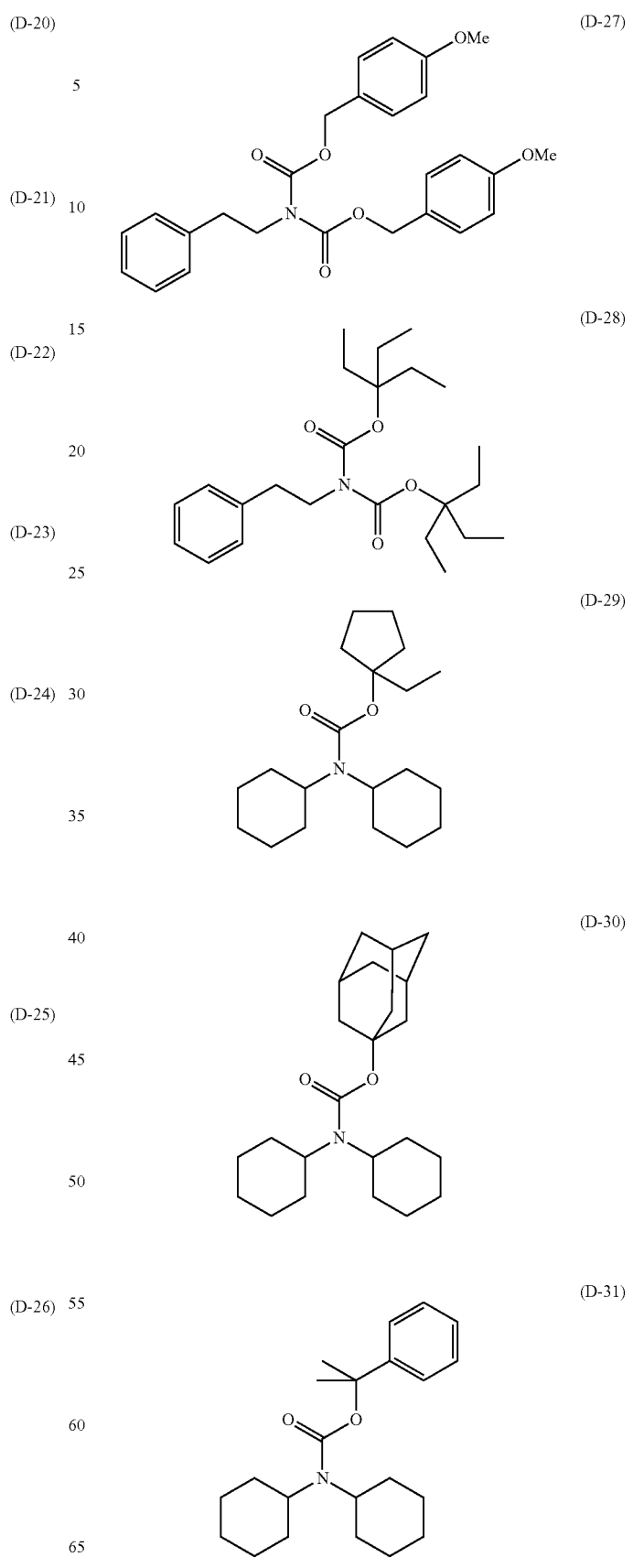

(D-32)
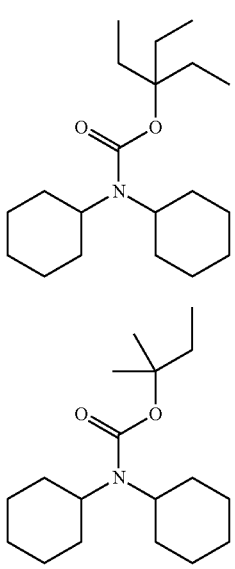
[Chem. 53]
(D-33)
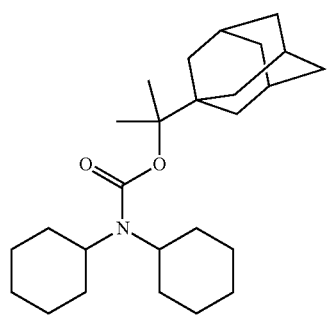
(D-34)
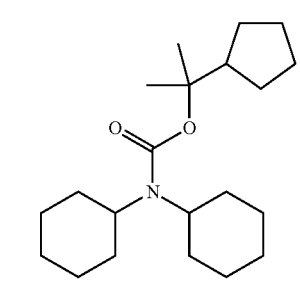
(D-35)
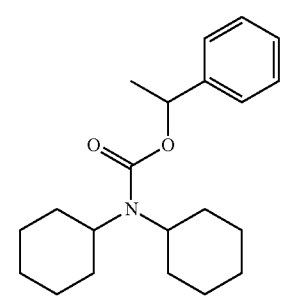
(D-36)
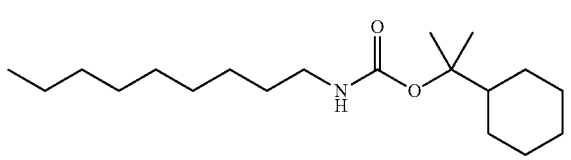
(D-37)
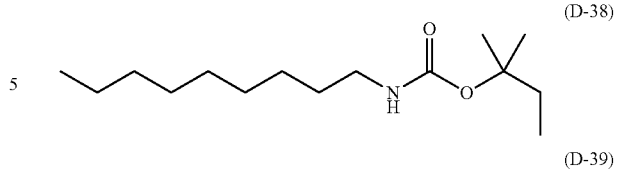
(D-38)
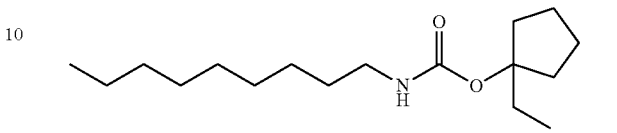
(D-39)
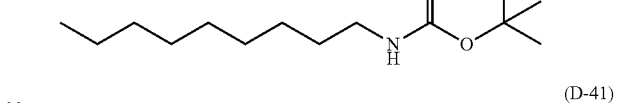
(D-40)
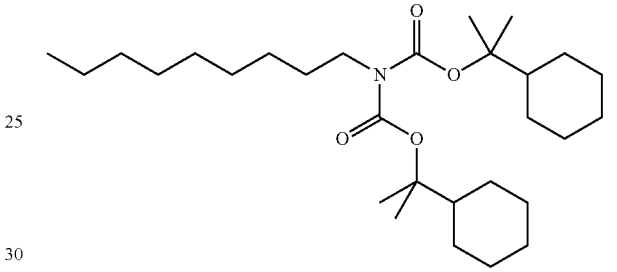
(D-41)
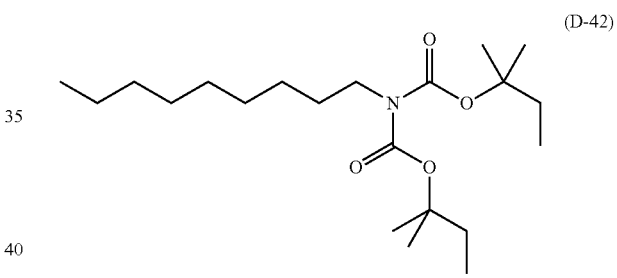
(D-42)
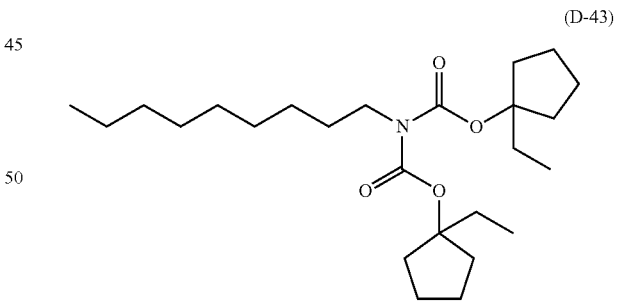
(D-43)
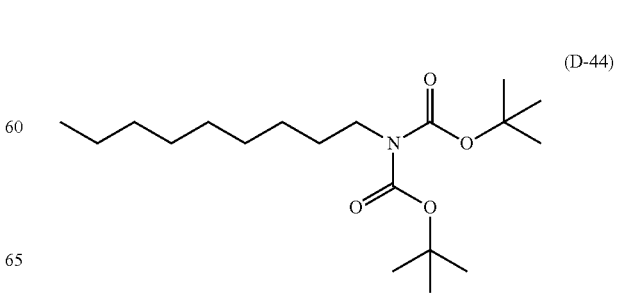
(D-44)

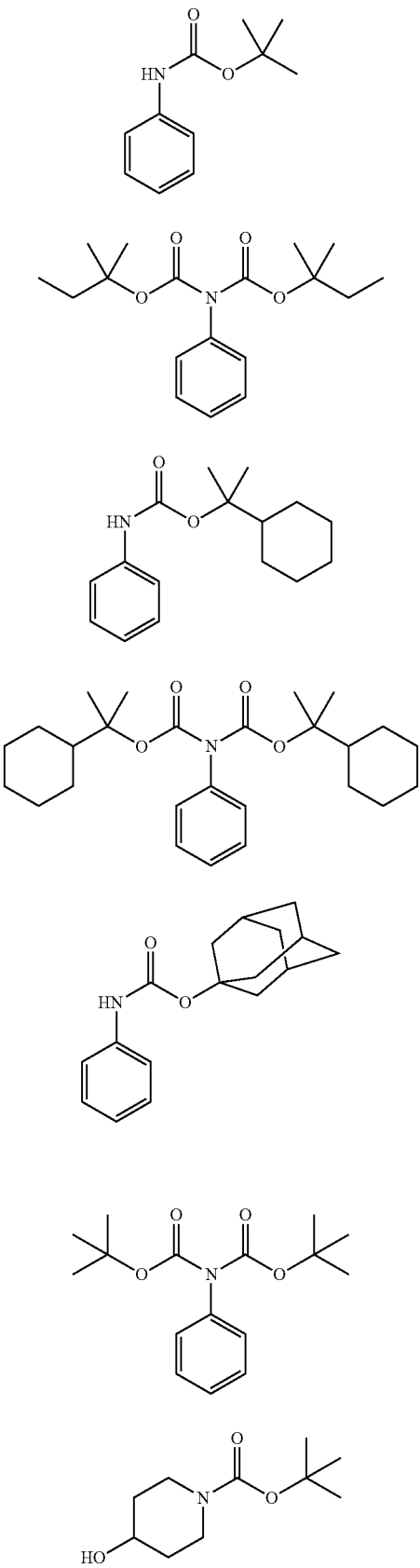
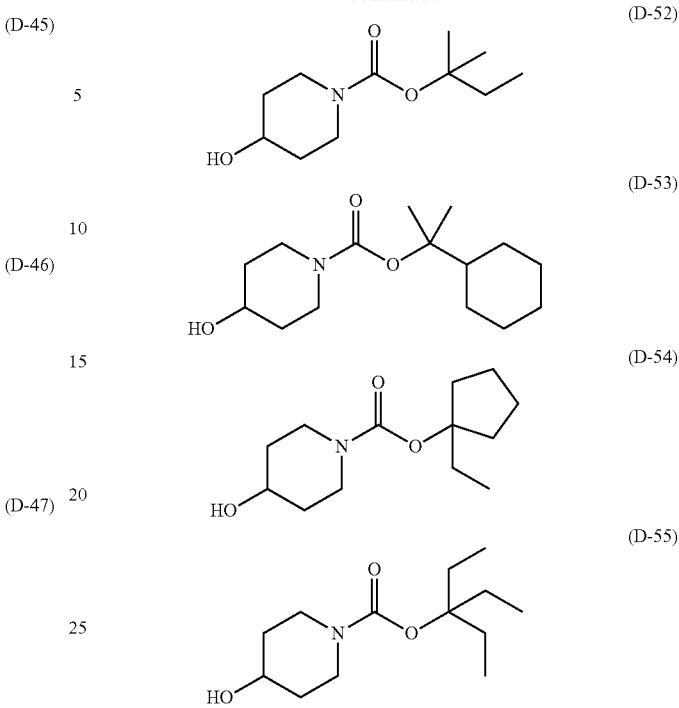

The compound represented by General Formula (F) to be used may be commercially available or may be synthesized from a commercially available amine by the method described in Protective Groups in Organic Synthesis, 4th edition, and the like. In particular, it may also be synthesized in accordance with, for example, a method described in JP2009-199021A as a general method.

The molecular weight of Basic Compound (C') is preferably from 250 to 2,000, and more preferably from 400 to 1,000. From the viewpoints of further reduction in LWR and evenness in local pattern dimensions, the molecular weight of the basic compound is preferably 400 or more, more preferably 500 or more, and still more preferably 600 or more.

Basic Compound (C') may be used in combination with Compound (C), or may be used singly or in combination of two or more kinds thereof.

The actinic ray-sensitive or radiation-sensitive resin composition of the present invention may or may not contain Basic Compound (C'), however, if the composition does, the amount of Basic Compound (C') used is typically 0.001 to 10% by mass, and preferably 0.01 to 5% by mass with regard to solids of the actinic ray-sensitive or radiation-sensitive resin composition.

The ratio of the acid generator and Basic Compound (C') used in the composition is preferably acid generator to the basic compound (molar ratio)=2.5 to 300. In other words, the molar ratio is preferably 2.5 or more from the viewpoint of sensitivity and resolution, and is preferably 300 or less from the viewpoint of suppressing the reduction of the resolution by an enlargement of the resist pattern over time from the exposure to the heat treatment. The acid generator to the basic compound ratio (molar ratio) is more preferably 5.0 to 200, and even more preferably 7.0 to 150.

[5] Solvent (D)

A solvent which can be used to prepare the actinic ray-sensitive or radiation-sensitive resin composition in the present invention may include an organic solvent such as, for example, alkylene glycol monoalkyl ether carboxylate, alkylene glycol monoalkyl ether, alkyl lactate, alkyl alkoxy propionate, cyclic lactone (preferably having 4 to 10 carbon atoms), a monoketone compound which may also have a ring (preferably having 4 to 10 carbon atoms), an alkylene carbonate, alkyl alkoxy acetate, or alkyl pyruvate.

Specific examples of these solvents may include those disclosed in [0441] to [0455] of US2008/0187860A.

In the present invention, a mixed solvent in which a solvent containing a hydroxyl group in the structure is mixed with a solvent not containing a hydroxyl group may be used as an organic solvent.

The solvent containing a hydroxyl group and the solvent not containing a hydroxyl group may be appropriately selected from the compounds exemplified above, however, as a solvent containing a hydroxyl group, alkylene glycol monoalkyl ether, alkyl lactate, or the like is preferable, and propylene glycol monomethyl ether (PGME, alternative name 1-methoxy-2-propanol) or ethyl lactate is more preferable as a solvent containing a hydroxyl group. Further, the solvent not containing a hydroxyl group is preferably, for example, an alkylene glycol monoalkyl ether acetate, an alkyl alkoxypropionate, a monoketone compound which may contain a ring, a cyclic lactone or an alkyl acetate, particularly preferably propylene glycol monomethyl ether acetate (PGME, alternative name, 1-methoxy-2-acetoxypropane), ethyl ethoxypropionate, 2-heptanone, γ-butyrolactone, cyclohexanone, or butyl acetate, and most preferably propylene glycol monomethyl ether acetate, ethyl ethoxypropionate, or 2-heptanone.

The mixing ratio (mass) of the solvent containing a hydroxyl group and a solvent not containing a hydroxyl group is 1/99 to 99/1, preferably 10/90 to 90/10, and more preferably is 20/80 to 60/40. The mixed solvent containing 50% by mass or more of the solvent not containing a hydroxyl group is particularly preferable in terms of coating uniformity.

The solvent is preferably a solvent containing propylene glycol monomethyl ether acetate, and preferably a solvent of propylene glycol monomethyl ether acetate alone, or a mixed solvent of two or more kinds, containing propylene glycol monomethyl ether acetate.

[6] Hydrophobic Resin (E)

The actinic ray-sensitive or radiation-sensitive resin composition of the present invention may contain a hydrophobic resin including at least one of a fluorine atom or a silicon atom particularly when applied to immersion exposure (hereinafter also referred to as "Hydrophobic Resin (E)" or simply "Resin (E)"). By this, Hydrophobic Resin (E) is unevenly distributed to the surface layer of the film and when the immersion medium is water, the static and dynamic contact angle on the resist film surface for water as well as the followability of liquid for liquid immersion can be enhanced.

Hydrophobic Resin (E) is preferably unevenly distributed to the interface, as described above, but unlike a surfactant, need not necessarily have a hydrophilic group in the molecule and may not contribute to uniform mixing of polar or nonpolar substances.

Hydrophobic Resin (E) typically contains one or both of a fluorine atom and a silicon atom. One or both of the fluorine atom and the silicon atom in Hydrophobic Resin (E) may be included in the main chain of the resin or included in the side chain.

In the case where Hydrophobic Resin (E) contains a fluorine atom, the resin preferably contains, as the fluorine atom-containing partial structure, a fluorine atom-containing alkyl group, a fluorine atom-containing cycloalkyl group, or a fluorine atom-containing aryl group.

The fluorine atom-containing alkyl group is a linear or branched alkyl group with at least one hydrogen atom being substituted with a fluorine atom. This alkyl group preferably has 1 to 10 carbon atoms, and more preferably 1 to 4 carbon atoms. The fluorine atom-containing alkyl group may further have a substituent other than a fluorine atom.

The fluorine atom-containing cycloalkyl group is a monocyclic or polycyclic cycloalkyl group with at least one hydrogen atom being substituted with a fluorine atom. This fluorine atom-containing cycloalkyl group may further have a substituent other than fluorine atoms.

The fluorine atom-containing aryl group is an aryl group with at least one hydrogen atom being substituted with a fluorine atom. Examples of this aryl group include a phenyl group, a naphthyl group, and the like. The fluorine atom-containing aryl group may further have a substituent other than fluorine atoms.

Examples of the fluorine atom-containing alkyl group, the fluorine atom-containing cycloalkyl group, and the fluorine atom-containing aryl group preferably include the groups represented by the following General Formulae (F2) to (F4), but the invention is not limited thereto.

[Chem. 54]

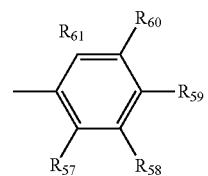

(F2)

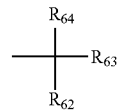

(F3)

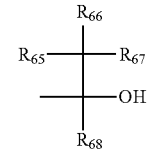

(F4)

In General Formulae (F2) to (F4), $R_{57}$ to $R_{68}$ respectively independently represent a hydrogen atom, a fluorine atom, or an (linear or branched) alkyl group. Here, at least one of $R_{57}$ to $R_{61}$, at least one of $R_{62}$ to $R_{64}$, and at least one of $R_{65}$ to $R_{68}$ respectively independently represents a fluorine atom or an alkyl group (preferably having 1 to 4 carbon atoms) with at least one hydrogen atom substituted with a fluorine atom.

It is preferable that all of $R_{57}$ to $R_{61}$ and $R_{65}$ to $R_{67}$ be each a fluorine atom. $R_{62}$, $R_{63}$, and $R_{68}$ are each preferably an alkyl group (preferably having 1 to 4 carbon atoms) with at least one hydrogen atom substituted with a fluorine atom, and more preferably a perfluoroalkyl group having 1 to 4 carbon atoms. $R_{62}$ and $R_{63}$ may be linked with each other to form a ring.

Specific examples of the group represented by General Formula (F2) may include a p-fluorophenyl group, a pentafluorophenyl group, a 3,5-di(trifluoromethyl)phenyl group, and the like.

Specific examples of the group represented by General Formula (F3) may include a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl)hexyl group, a 2,2,3,3-tetrafluorocyclobutyl group, a perfluorocyclohexyl group, or the like. A hexafluoroisopropyl group, a heptafluoroisopropyl group, a hexafluoro(2-methyl)isopropyl group, an octafluoroisobutyl group, a nonafluoro-t-butyl group or a perfluoroisopentyl group is preferable, and a hexafluoroisopropyl group or a heptafluoroisopropyl group is more preferable.

Specific examples of the group represented by General Formula (F4) include —C(CF$_3$)$_2$OH, —C(C$_2$F$_5$)$_2$OH, —C(CF$_3$)(CH$_3$)OH, —CH(CF$_3$)OH, and the like, and —C(CF$_3$)$_2$OH is preferred.

The fluorine atom-containing partial structure may be bonded directly to the main chain or may be further bonded to the main chain through a group selected from the group consisting of an alkylene group, a phenylene group, an ether bond, a thioether bond, a carbonyl group, an ester bond, an amide bond, a urethane bond and a ureylene bond, or a group formed by the combination of two or more thereof.

A favorable repeating unit having a fluorine atom may include a unit shown below.

[Chem. 55]

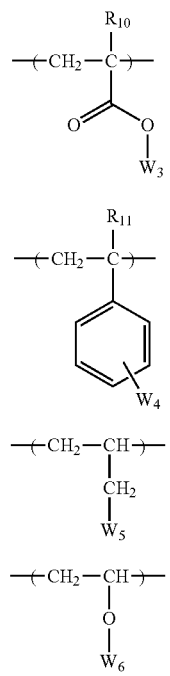

In the formulae, R$_{10}$ and R$_{11}$ respectively independently represent a hydrogen atom, a fluorine atom, or an alkyl group. The alkyl group is preferably a linear or branched alkyl group having 1 to 4 carbon atoms, may have a substituent, and the alkyl group having a substituent may particularly include a fluorinated alkyl group.

W$_3$ to W$_6$ respectively independently represent an organic group having at least one or more fluorine atoms. Specifically, an atomic group of (F2) to (F4) may be included.

Furthermore, other than these, Hydrophobic Resin (E) may contain a unit as shown below as the repeating units having a fluorine atom.

[Chem. 56]

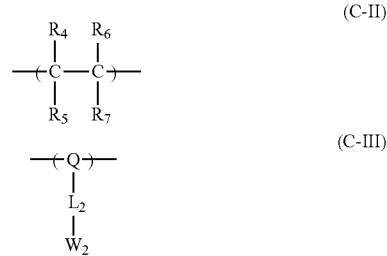

In the formula, R$_4$ to R$_7$ respectively independently represent a hydrogen atom, a fluorine atom, or an alkyl group. The alkyl group is preferably a linear or branched alkyl group having 1 to 4 carbon atoms, may have a substituent, and the alkyl group having a substituent may particularly include a fluorinated alkyl group.

Incidentally, at least one of R$_4$ to R$_7$ represents a fluorine atom. R$_4$ and R$_5$ or R$_6$ and R$_7$ may form a ring.

W$_2$ represents an organic group containing at least one fluorine atom. Specifically, an atomic group of (F2) to (F4) may be included.

L$_2$ represents a single bond or a divalent linking group. The divalent linking group may be a substituted or unsubstituted arylene group, a substituted or unsubstituted alkylene group, a substituted or unsubstituted cycloalkylene group, —O—, —SO$_2$—, —CO—, —N(R)— (in the formula, R represents a hydrogen atom or an alkyl), —NHSO$_2$—, or a divalent linking group combining a plurality of these.

Q represents an alicyclic structure. The alicyclic structure may have a substituent, be a monocyclic type, or a polycyclic type, and may be a bridge type in the case of a polycyclic type. The monocyclic type is preferably a cycloalkyl group having 3 to 8 carbon atoms, and may include, for example, a cyclopentyl group, a cyclohexyl group, a cyclobutyl group, a cyclooctyl group, or the like. The polycyclic type may include a group having a bicyclo structure, a tricyclo structure, a tetracyclo structure, or the like, having 5 or more carbon atoms, is preferably a cycloalkyl group having 6 to 20 carbon atoms, and may include, for example, an adamantyl group, a norbornyl group, a dicyclopentyl group, a tricyclodecanyl group, a tetracyclododecyl group, or the like. A portion of the carbon atoms in the cycloalkyl group may be substituted with a hetero atom such as an oxygen atom. In particular, preferred examples of Q include a norbornyl group, a tricyclodecanyl group, a tetracyclododecyl group, and the like.

Specific examples of the repeating units having a fluorine atom are shown below, but the invention is not limited thereto.

In the specific examples, X$_1$ represents a hydrogen atom, —CH$_3$, —F, or —CF$_3$. X$_2$ represents —F or —CF$_3$.

[Chem. 57]

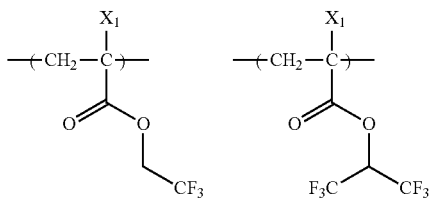

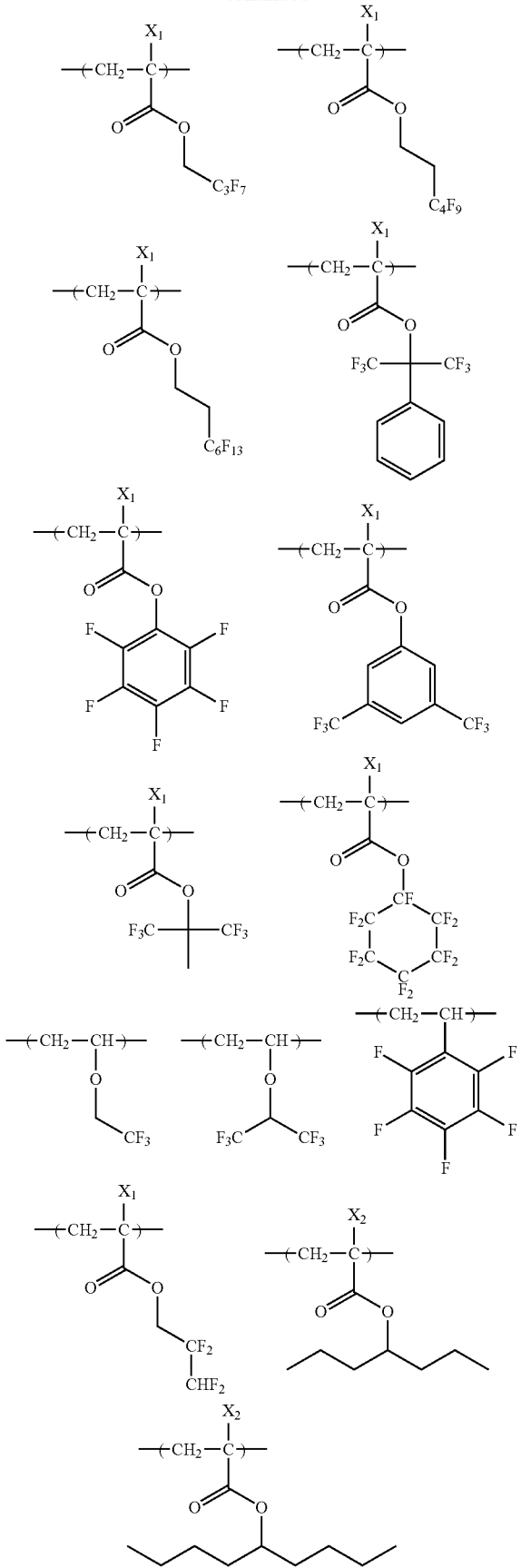
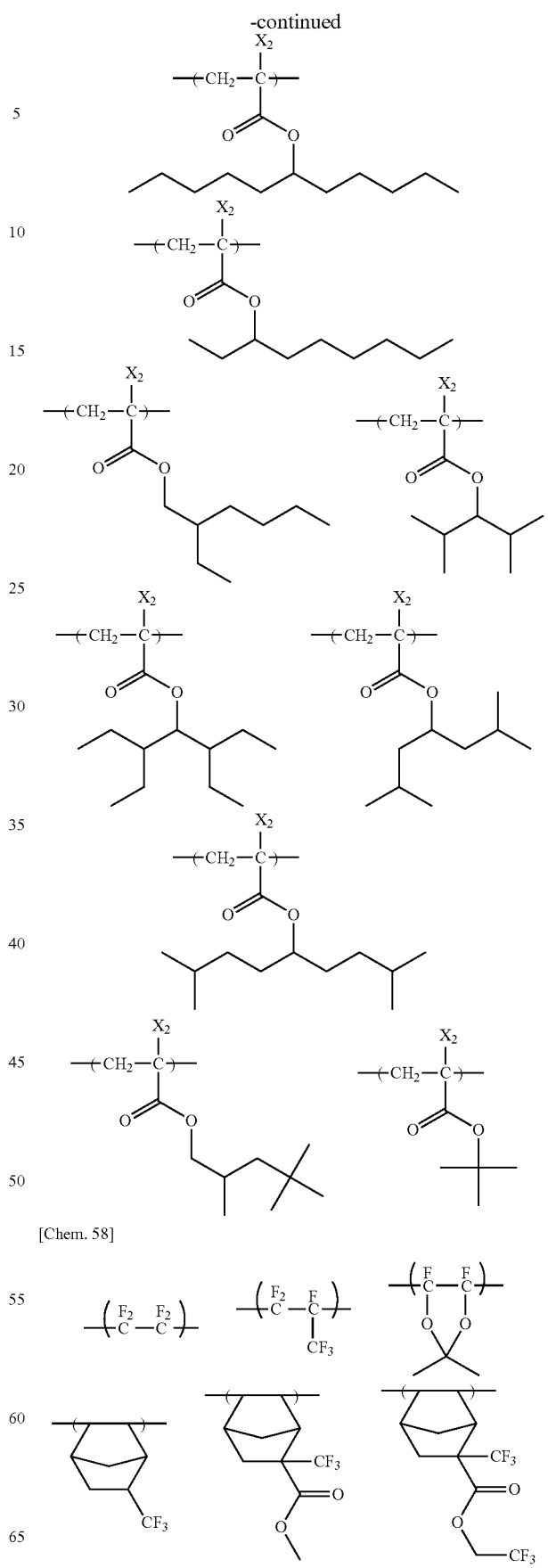

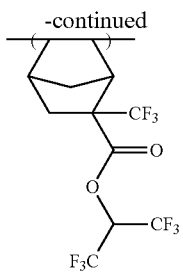

Hydrophobic Resin (E) may contain a silicon atom. It is preferably a resin having an alkylsilyl structure (preferably a trialkylsilyl group) or a cyclosiloxane structure as a partial structure having a silicon atom.

Specific examples of the alkylsilyl structure and cyclosiloxane structure include groups represented by the following Formulae (CS-1) to (CS-3), and the like.

[Chem. 59]

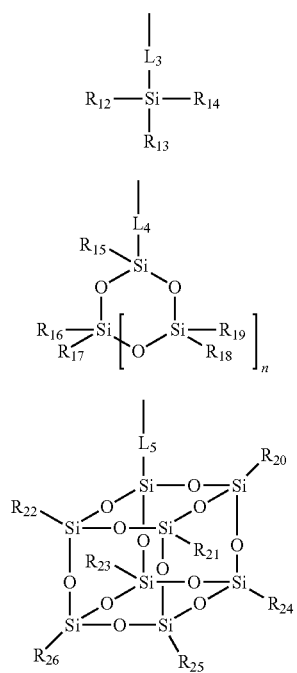

In General Formulae (CS-1) to (CS-3), $R_{12}$ to $R_{26}$ respectively independently represent a linear or branched alkyl group (preferably having 1 to 20 carbon atoms) or a cycloalkyl group (preferably having 3 to 20 carbon atoms).

$L_3$ to $L_5$ each represent a single bond or a divalent linking group. The divalent linking group is a single group or a combination of two or more groups (preferably with equal to or less than 12 carbon atoms in total) selected from a group consisting of an alkylene group, a phenylene group, an ether bond, a thioether bond, a carbonyl group, an ester bond, an amide bond, a urethane bond, and a urea bond.

n represents an integer from 1 to 5. n is preferably an integer from 2 to 4.

Specific examples of the repeating unit having the groups represented by General Formulae (CS-1) to (CS-3) are shown below, but the invention is not limited thereto. Further, in the specific examples, X1 represents a hydrogen atom, —$CH_3$, —F, or —$CF_3$.

[Chem. 60]

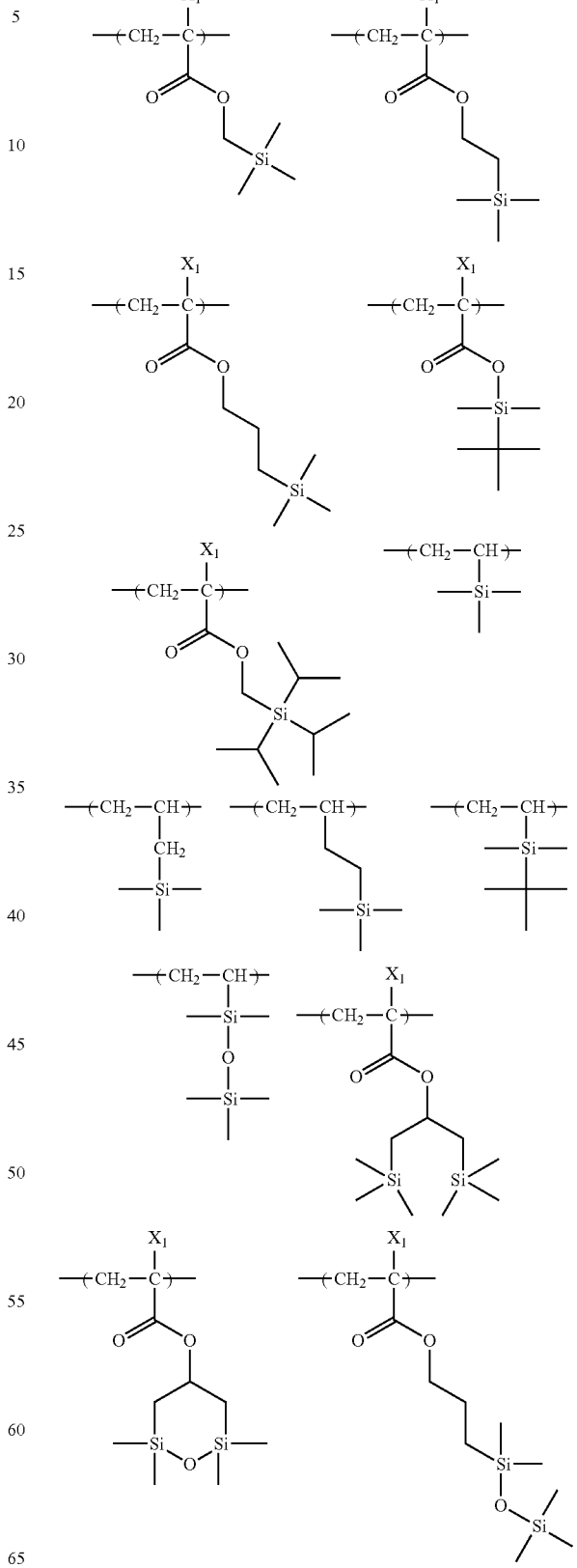

-continued

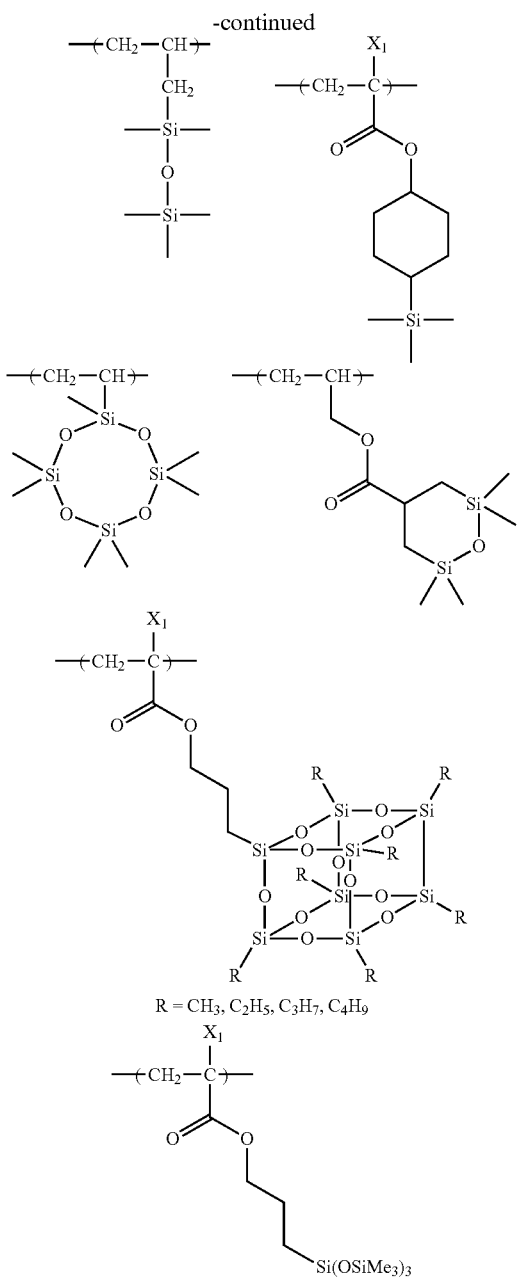

Moreover, Hydrophobic Resin (E) may contain at least one group selected from the group consisting of the following (x) to (z)

(x) an acid group,
(y) a group with a lactone structure, an anhydride group, or an acid imide group,
(z) a group capable of being decomposed by the action of acid Examples of Acid Group (x) include a phenolic hydroxyl group, a carboxylic acid group, a fluorinated alcohol group, a sulfonic acid group, a sulfonamide group, a sulfonimide group, a (alkylsulfonyl) (alkylcarbonyl)methylene group, an (alkylsulfonyl) (alkylcarbonyl) imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, a tris(alkylsulfonyl)methylene group, and the like.

The preferable acid group may include a fluorinated alcohol group (preferably hexafluoroisopropanol), a sulfonimide group, or a bis(alkylcarbonyl)methylene group.

Examples of the repeating unit having Acid Group (x) include a repeating unit in which an acid group is directly bonded to the main chain of the resin, such as a repeating unit by an acrylic acid or a methacrylic acid, or a repeating unit in which an acid group is bonded to the main chain of the resin through a linking group or the like. Alternatively, in this repeating unit, an acid group may be introduced into the terminal of a polymer chain by using a polymerization initiator having an acid group or a chain transfer agent during the polymerization. Both cases are favorable. The repeating unit having Acid Group (x) may have at least any one of a fluorine atom and a silicon atom.

The content of the repeating unit having Acid Group (x) is preferably 1 to 50 mol %, more preferably 3 to 35 mol %, and even more preferably 5 to 20 mol % with regard to all repeating units in Hydrophobic Resin (E).

Specific examples of the repeating unit having Acid Group (x) are shown below, however, the present invention is not limited to these. In the formulae, Rx represents a hydrogen atom, $CH_3$, $CF_3$, or $CH_2OH$.

[Chem. 61]

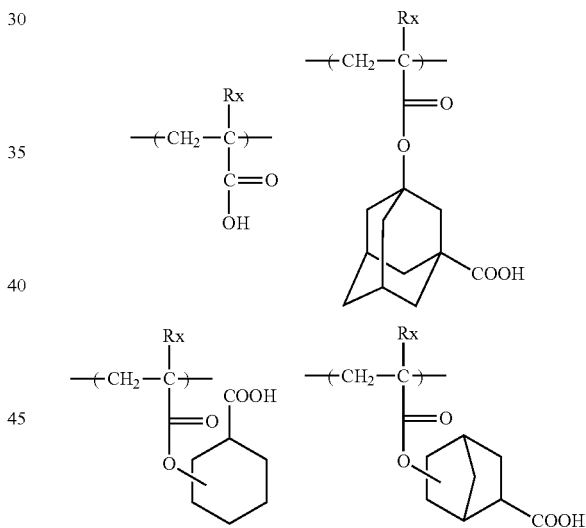

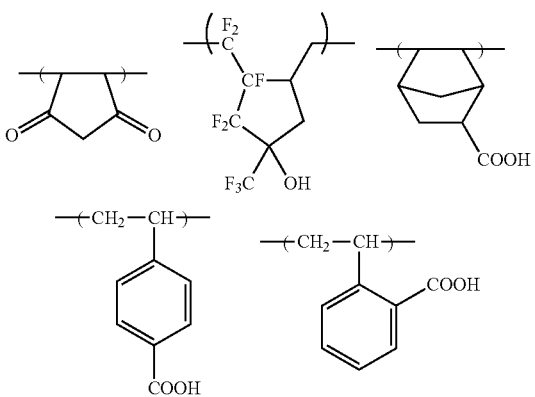

137
-continued
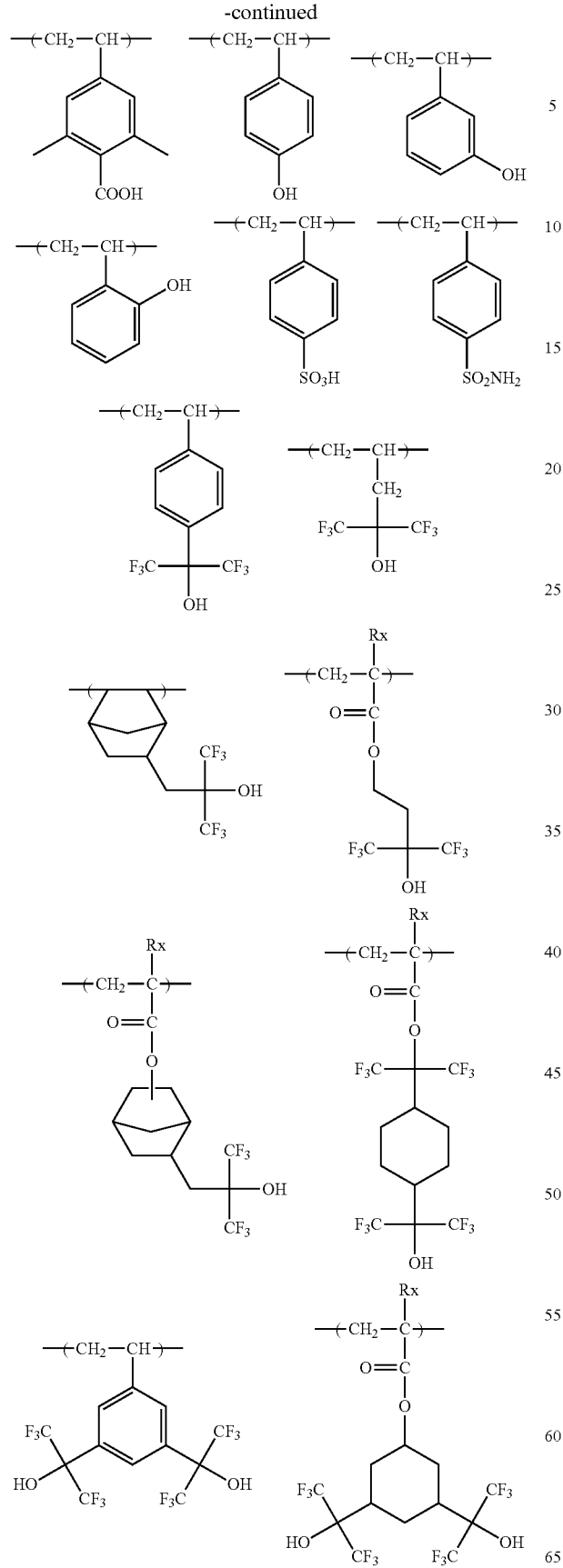
138
-continued
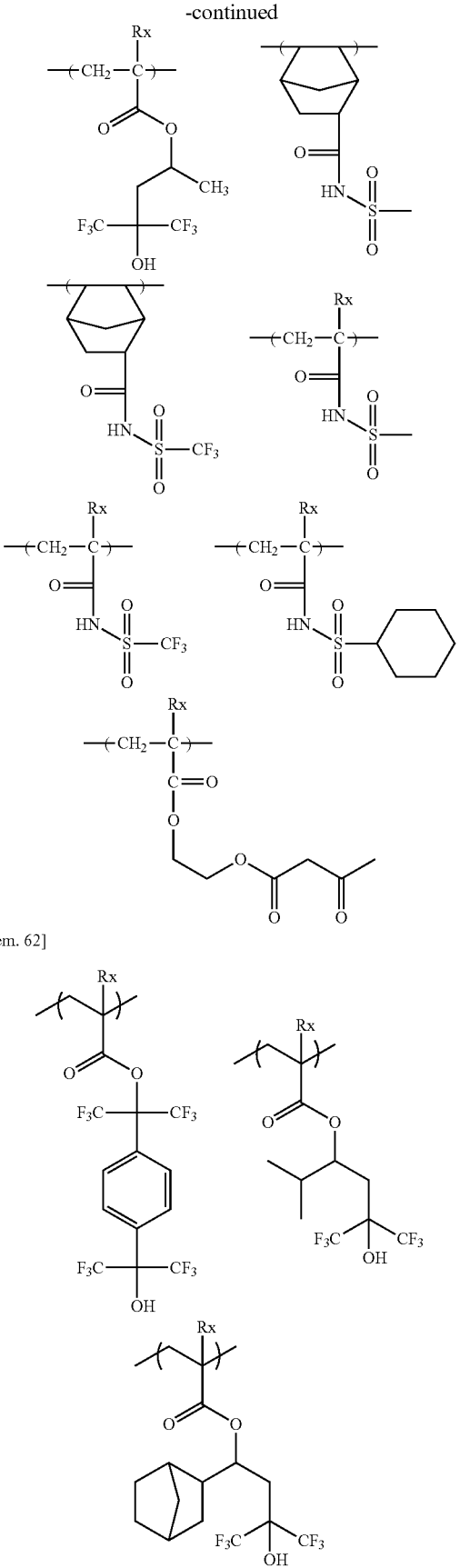
[Chem. 62]

As the group having a lactone structure, the acid anhydride group, or the acid imide group (y), a group having a lactone structure is particularly preferred.

The repeating unit including these groups is, for example, a repeating unit in which this group is bonded directly to the main chain of the resin, such as a repeating unit by acrylate ester and methacrylate ester. This repeating unit may alternatively be a repeating unit in which the group is bonded to the main chain of the resin through a linking group. This repeating group may also be introduced at the end of the resin using a polymerization initiator or a chain transfer agent having this group when polymerized.

Examples of the repeating unit having a group having a lactone structure are the same as those of the repeating unit having a lactone structure described above in the paragraph of the Acid-Decomposable Resin (P).

The content of the repeating unit having a group having a lactone structure, an acid anhydride group, or an acid imide group is preferably from 1 to 100 mol %, more preferably from 3 to 98 mol %, and still more preferably from 5 to 95 mol %, based on all the repeating units in the hydrophobic resin.

The repeating unit having Group (z) capable of being decomposed by the action of the acid in Hydrophobic Resin (E) may include the same repeating unit having an acid-decomposable group described in the Resin (P) section. The repeating unit having Group (z) capable of decomposing by the action of acid may have at least any one of a fluorine atom and a silicon atom. The content of the repeating unit having Group (z) capable of being decomposed by the action of the acid in Hydrophobic Resin (E) is preferably 1 to 80 mol %, more preferably 10 to 80 mol %, even more preferably 20 to 60 mol % with regard to all repeating units in Resin (E).

Hydrophobic Resin (E) may further contain a repeating unit represented by the following General Formula (CIII).

[Chem. 63]

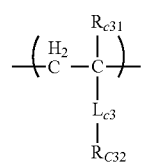

(CIII)

In General Formula (CIII), $R_{c31}$ represents a hydrogen atom, an alkyl group, (may be substituted with a fluorine atom or the like), a cyano group, or a —$CH_2$—O—$Rac_2$ group. In the formula, $Rac_2$ represents a hydrogen atom, an alkyl group, or an acyl group. $R_{c31}$ is preferably a hydrogen atom, a methyl group, a hydroxymethyl group, or a trifluoromethyl group, and particularly preferably a hydrogen atom or a methyl group.

$R_{c32}$ represents a group containing an alkyl group, a cycloalkyl group, an alkenyl group, a cycloalkenyl group, or an aryl group. These groups may be substituted with a group containing a fluorine atom or a silicon atom.

$L_{c3}$ represents a single bond or a divalent linking group.

In General Formula (CIII), the alkyl group of $R_{c32}$ is preferably a linear or branched alkyl group having 3 to 20 carbon atoms.

The cycloalkyl group is preferably a cycloalkyl group with 3 to 20 carbon atoms.

The alkenyl group is preferably an alkenyl group with 3 to 20 carbon atoms.

The cycloalkenyl group is preferably a cycloalkenyl group with 3 to 20 carbon atoms.

The aryl group is preferably an aryl group having 6 to 20 carbon atoms, and more preferably a phenyl group or a naphthyl group, each of which may have a substituent.

Rc32 is preferably an unsubstituted alkyl group or an alkyl group substituted with a fluorine atom.

The divalent linking group of $L_{c3}$ is preferably an alkylene group (preferably having 1 to 5 carbon atoms), an ether bond, a phenylene group, or an ester bond (a group represented by —COO—).

The content of the repeating unit represented by General Formula (CIII) is preferably from 1 to 100 mol %, more preferably from 10 to 90 mol %, and still more preferably from 30 to 70 mol %, based on all the repeating units in the hydrophobic resin.

Hydrophobic Resin (E) preferably further contains a repeating unit represented by the following General Formula (CII-AB).

[Chem. 64]

(CII-AB)

In Formula (CII-AB), $R_{c11}'$ and $R_{c12}'$ respectively independently represent a hydrogen atom, a cyano group, a halogen atom, or an alkyl group.

Zc' represents an atomic group containing two carbon atoms (C—C) which are bonded, for forming an alicyclic structure.

The content of the repeating unit represented by General Formula (CII-AB) is preferably from 1 to 100 mol %, more preferably from 10 to 90 mol %, and still more preferably from 30 to 70 mol %, based on all the repeating units in the hydrophobic resin.

Specific examples of the repeating units represented by General Formulae (III) and (CII-AB) are shown below, but the invention is not limited thereto. In the formula, Ra represents H, $CH_3$, $CH_2OH$, $CF_3$, or CN.

[Chem. 65]

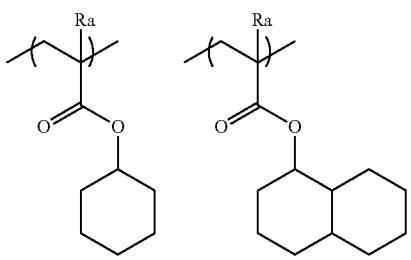

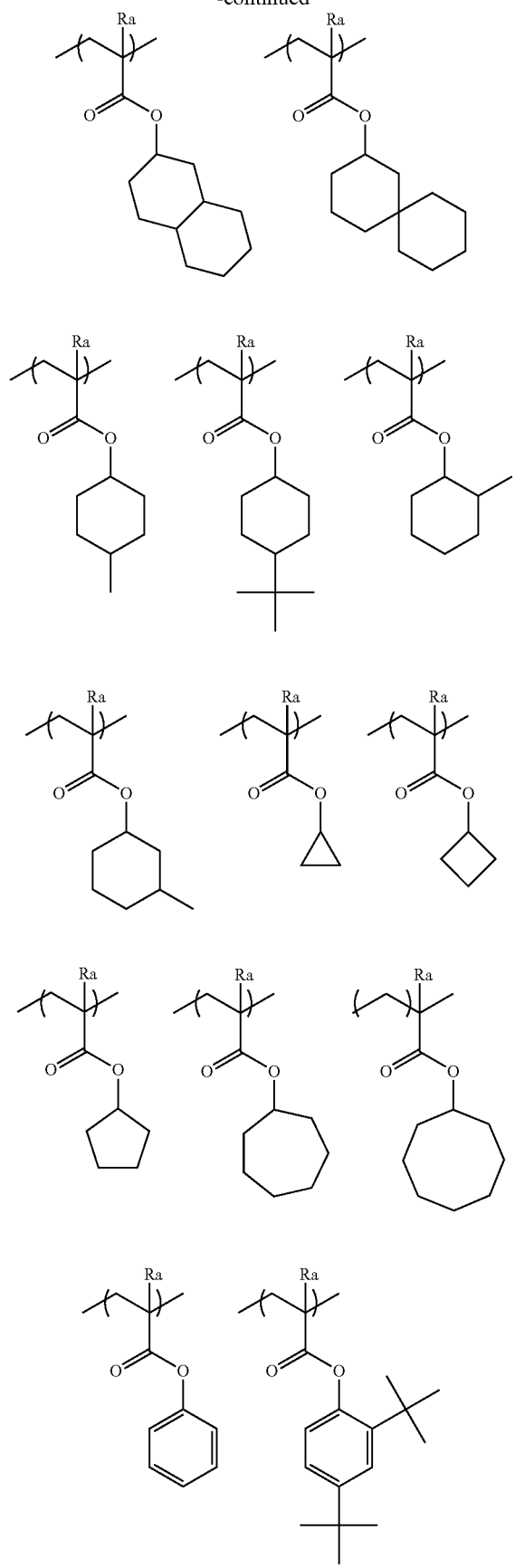
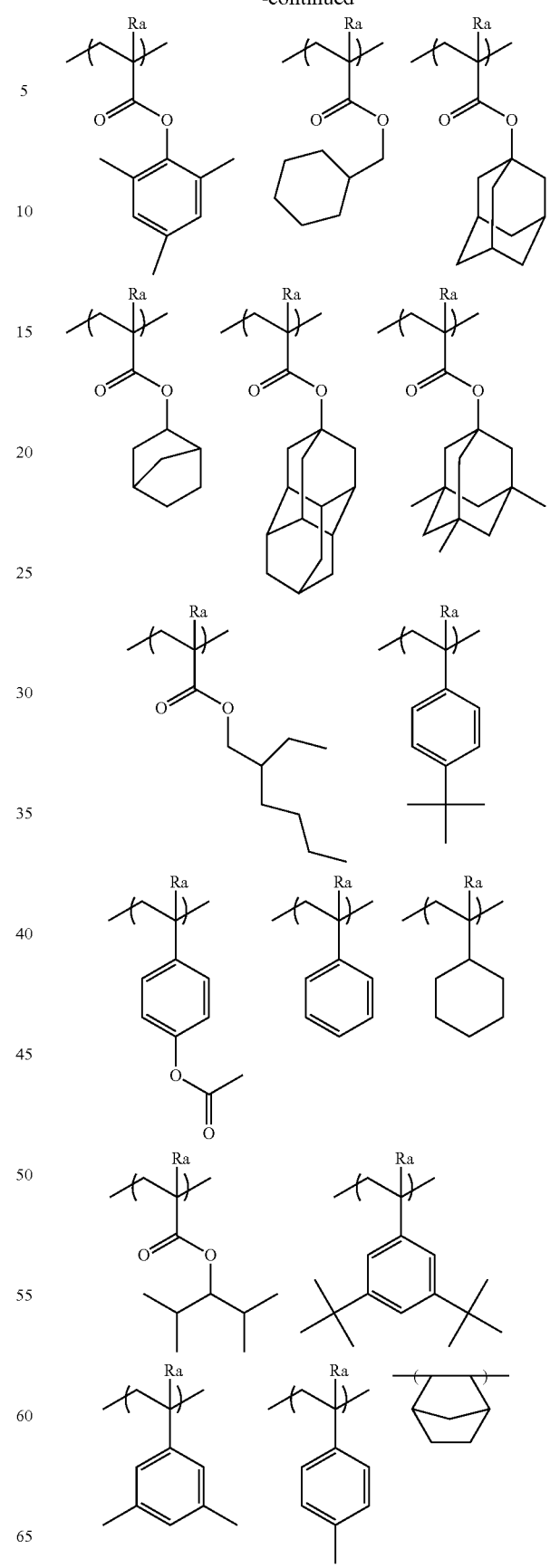

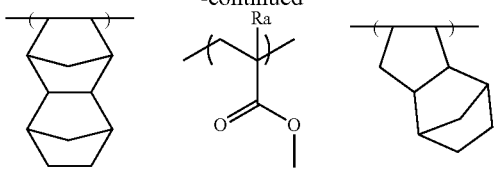

In a case where Hydrophobic Resin (E) includes a fluorine atom, the content of the fluorine atom is preferably 5 to 80% by mass with respect to the mass average molecular weight of Hydrophobic Resin (E), and 10 to 80% by mass is more preferable. In addition, the repeating unit including a fluorine atom is preferably 10 to 100 mol % and more preferably 30 to 100 mol % with regard to all repeating units in Hydrophobic Resin (E).

In a case where Hydrophobic Resin (E) includes a silicon atom, the content of the silicon atom is preferably 2 to 50% by mass with respect to the mass average molecular weight of Hydrophobic Resin (E), and 2 to 30% by mass is more preferable. In addition, the repeating unit including a silicon atom is preferably 10 to 100 mol % and more preferably 20 to 100 mol % with regard to all repeating units in Hydrophobic Resin (E).

The mass average molecular weight of a standard polystyrene conversion of Hydrophilic Resin (E) is preferably 1,000 to 100,000, more preferably 1,000 to 50,000, and even more preferably 2,000 to 15,000.

In addition, Hydrophobic Resin (E) may be used either alone or as a combination of two or more.

The content of Hydrophobic Resin (E) in the composition is preferably 0.01 to 10% by mass, more preferably 0.05 to 8% by mass, and even more preferably 0.1 to 5% by mass with regard to total solids in the composition of the present invention.

In Hydrophobic Resin (E), similarly to Resin (P), it is of course preferred that the content of impurities such as metals be low, but also, the content of residual monomers or oligomer components is preferably from 0.01 to 5% by mass, more preferably from 0.01 to 3% by mass, and still more preferably from 0.05 to 1% by mass. Thus, an actinic ray-sensitive or radiation-sensitive resin composition with no changes over time such as impurities in liquid or changes in sensitivity may be obtained. In addition, the molecular weight distribution (Mw/Mn, also referred to as degree of dispersion) is preferably in the range of 1 to 5, more preferably 1 to 3, and even more preferably is in the range of 1 to 2 from the viewpoint of resolution, the resist formation, the side wall of the resist pattern, roughness, and the like.

A variety of commercially available products may be used as Hydrophobic Resin (E), or Hydrophobic Resin (E) may be synthesized in accordance with conventional methods (for example, radical polymerization). For example, as a general synthesis method, a bulk polymerization method in which polymerization is carried out by dissolving monomer types and an initiator in a solvent and heating the solution, a dropwise adding polymerization method in which a solution of monomer types and an initiator is added dropwise to a heating solvent over 1 to 10 hours, or the like may be included, and the dropwise adding polymerization method is preferable.

The reaction solvent, the polymerization initiator, the reaction conditions (temperature, concentration, and the like), and the purification method after the reaction are similar to those described in Resin (P), however, the reaction concentration is preferably 30 to 50% by mass in the synthesis of Hydrophobic Resin (E).

Specific examples of Hydrophobic Resin (E) are shown below. Further, the molar ratio (corresponding to each repeating unit in order from the left), the mass average molecular weight, and the dispersibility of the repeating unit in each resin is shown in the following Table 1.

[Chem. 66]

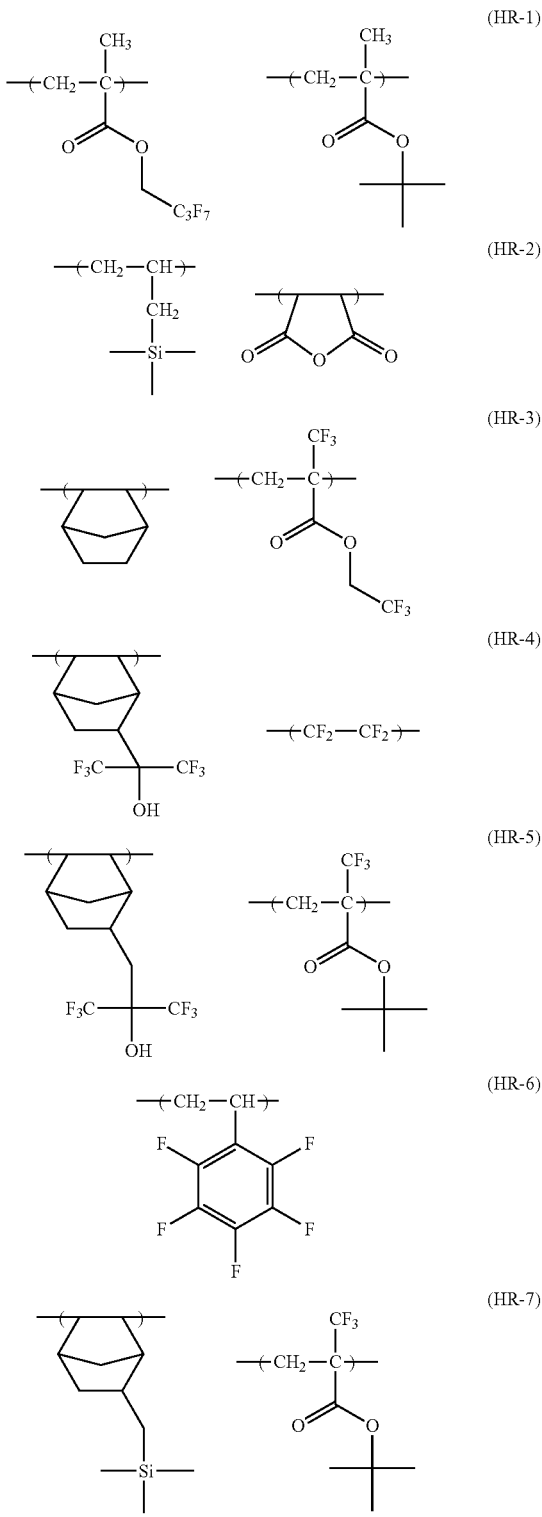

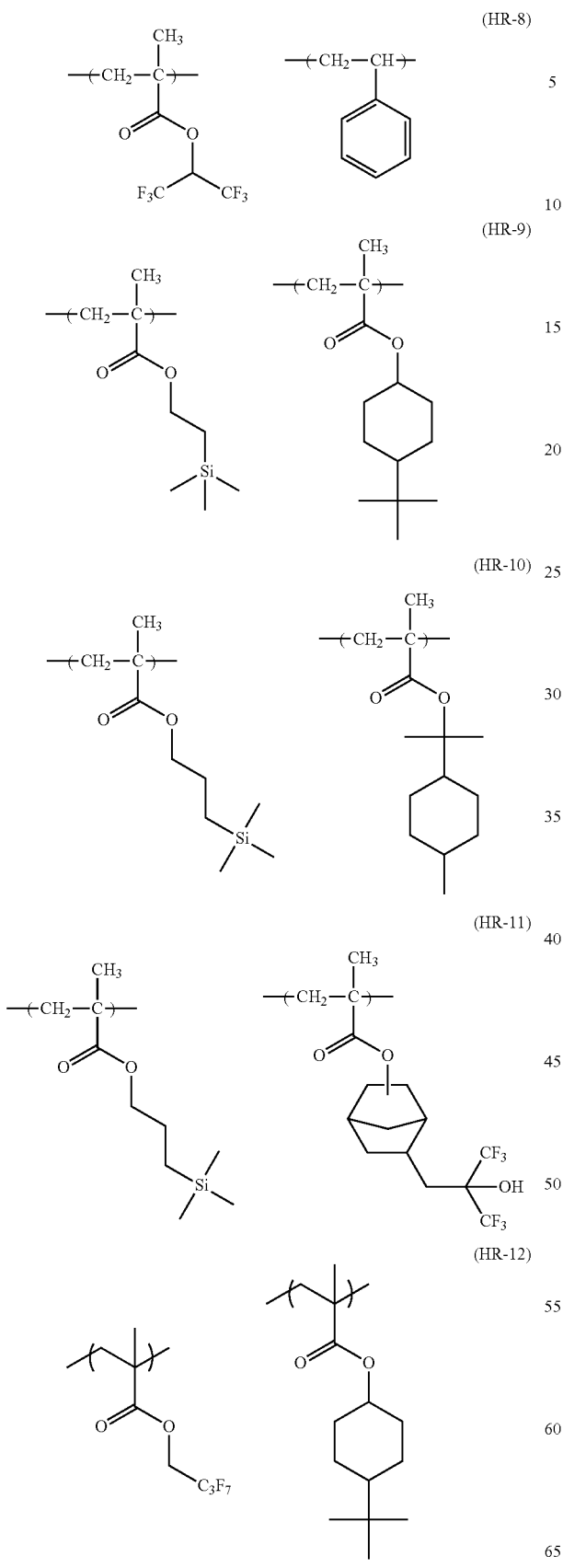
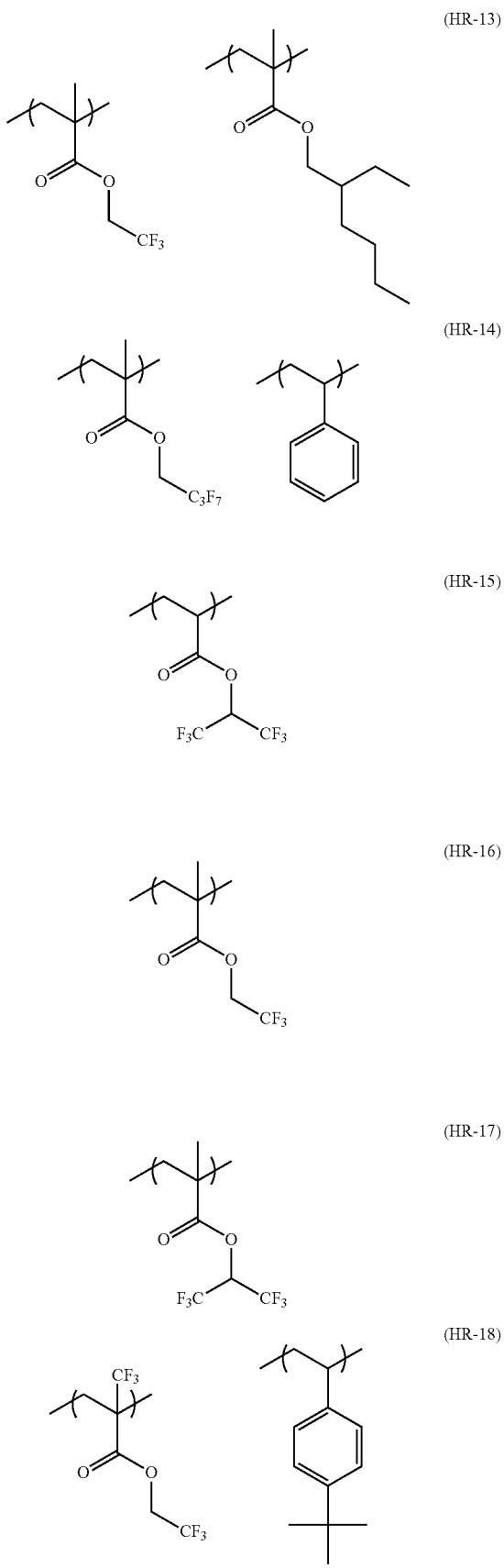

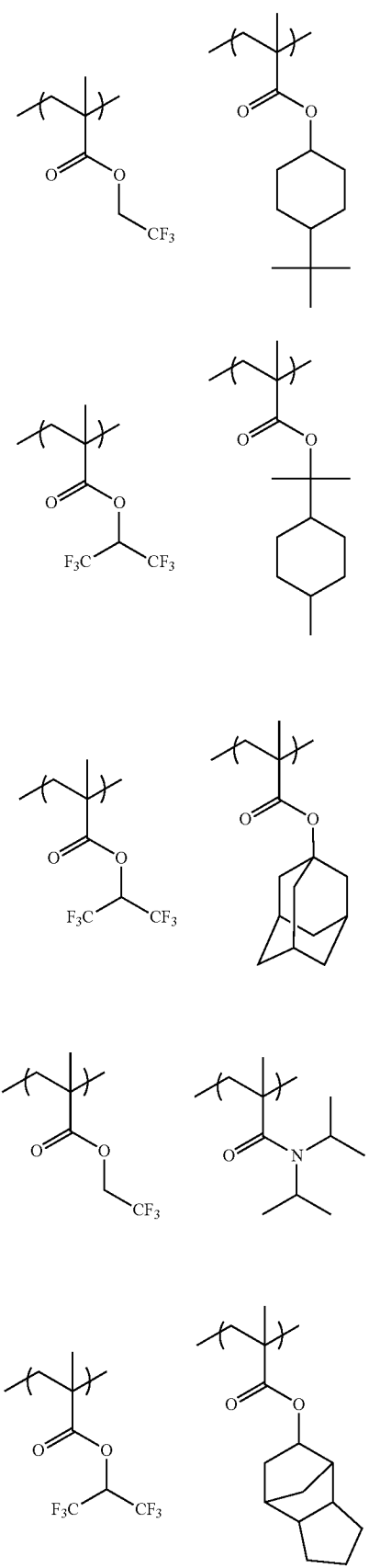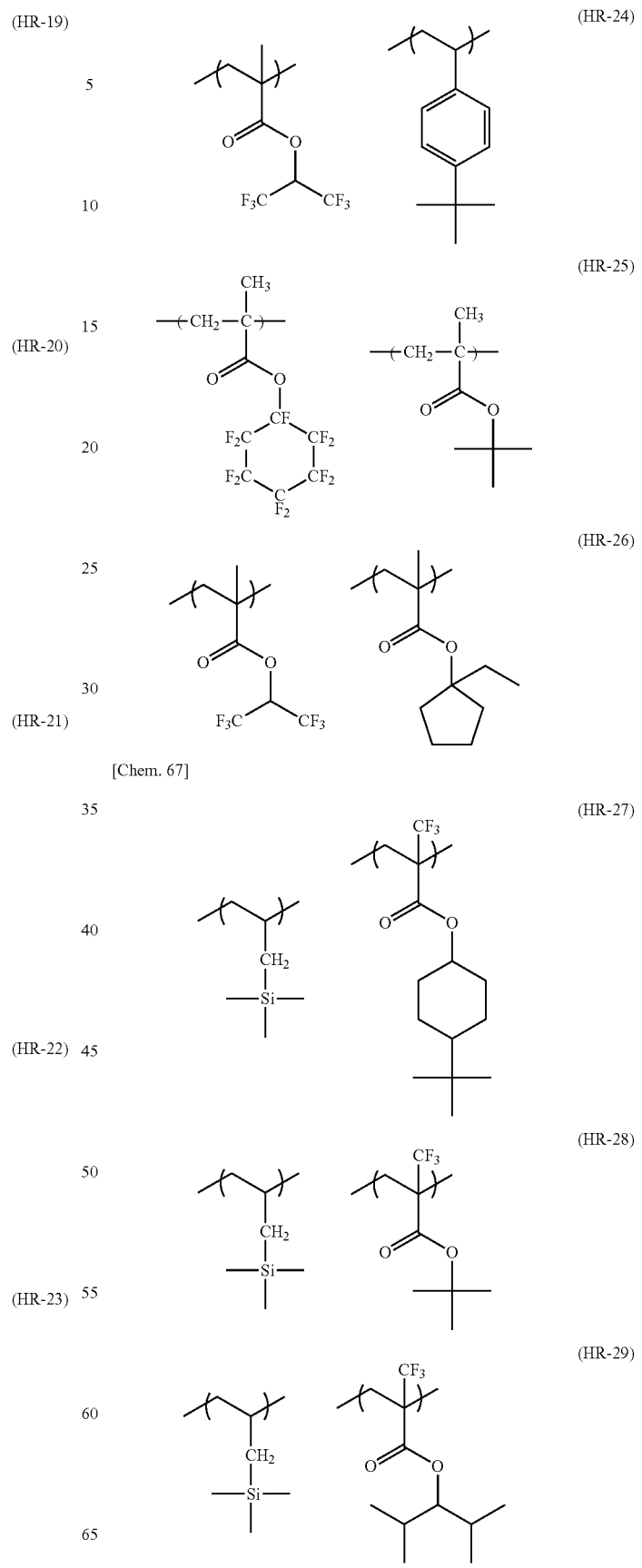

(HR-30) 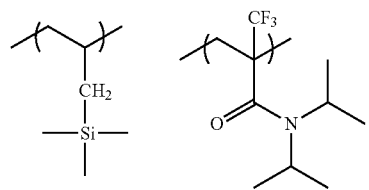
(HR-31) 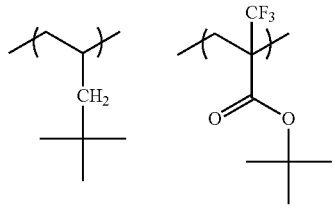
(HR-32) 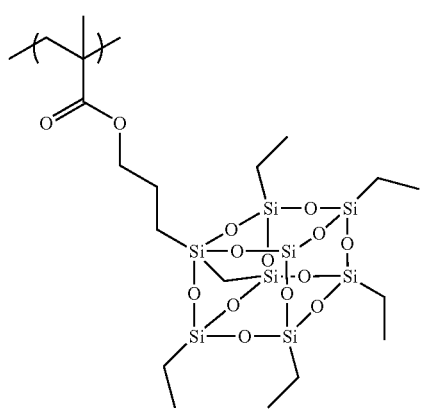
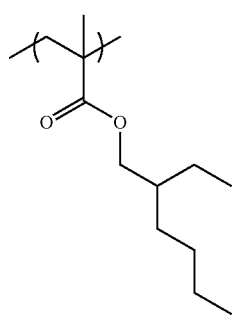
(HR-33) 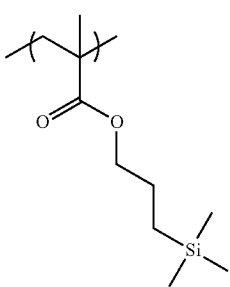 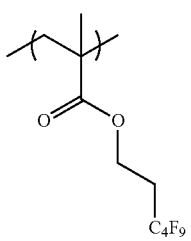
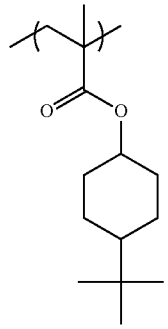
(HR-34) 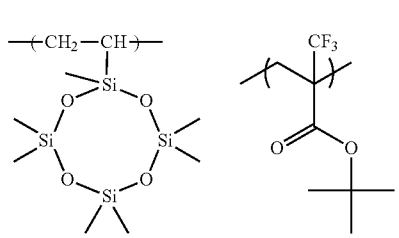
(HR-35) 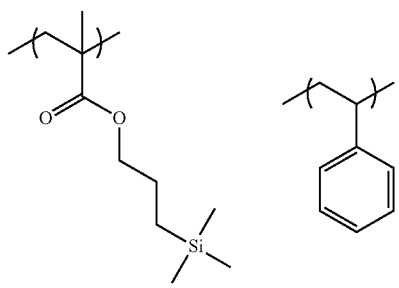
(HR-36) 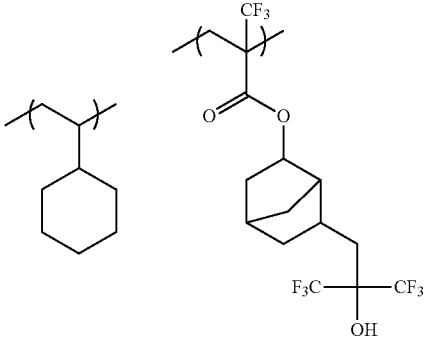
(HR-37) 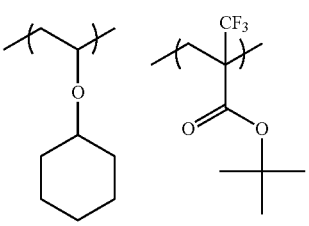

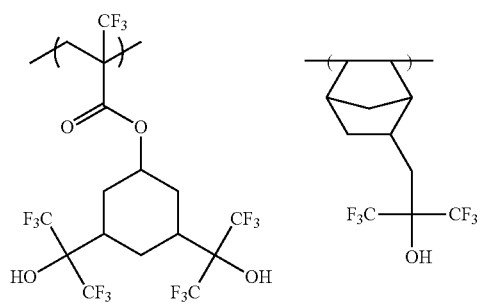
(HR-38)
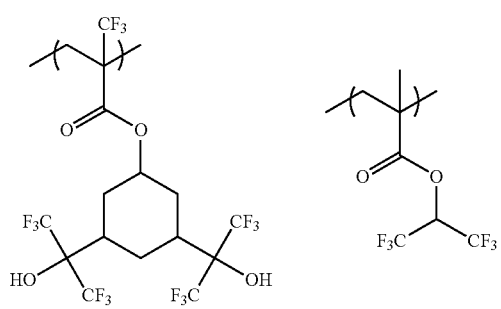
(HR-39)
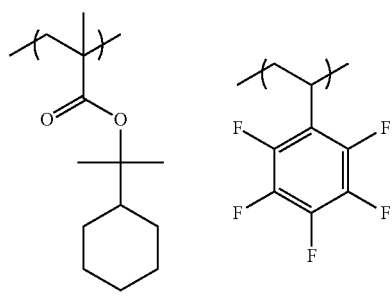
(HR-40)
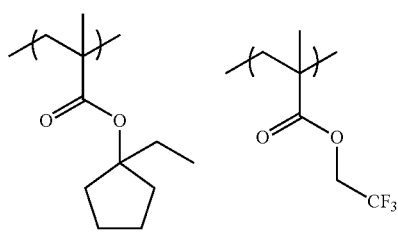
(HR-41)
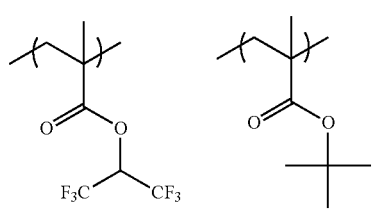
(HR-42)
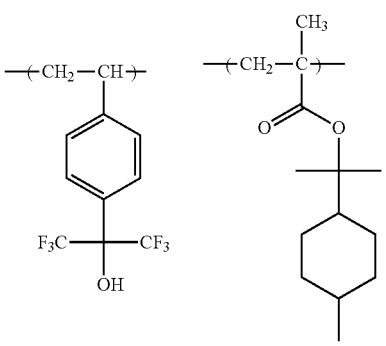
(HR-43)
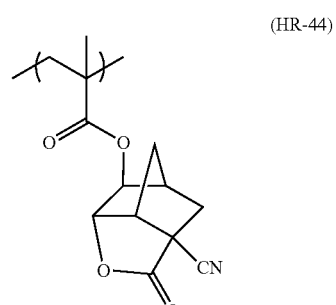
(HR-44)
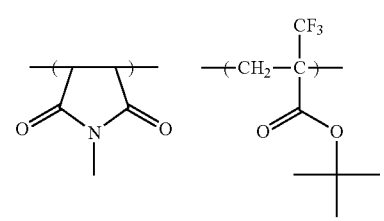
(HR-45)
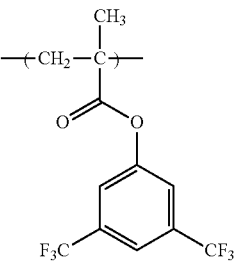
(HR-46)
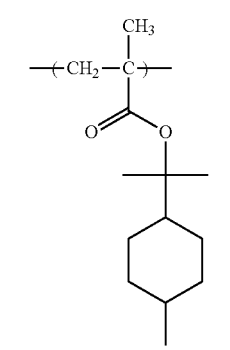
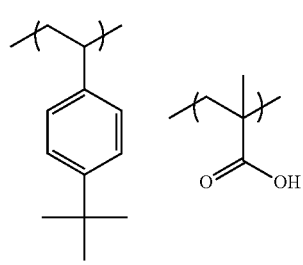
(HR-47)

(HR-48)
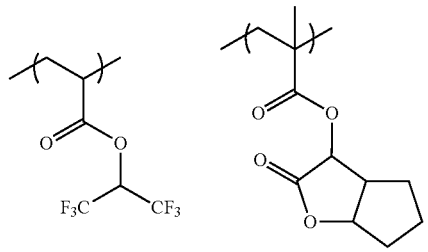
[Chem. 68]
(HR-49)
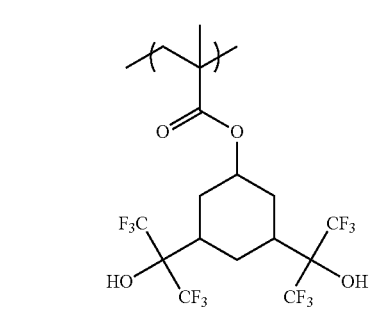
(HR-50)
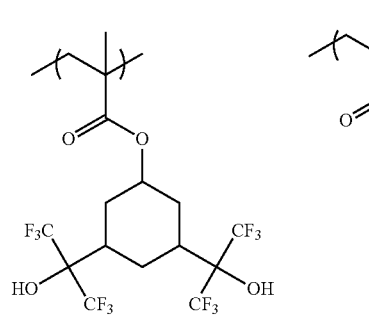
(HR-51)
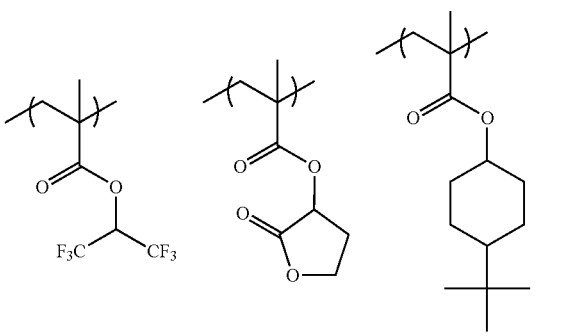
(HR-52)
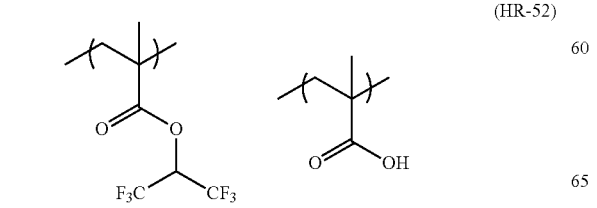
(HR-53)
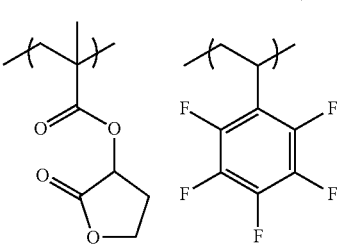
(HR-54)
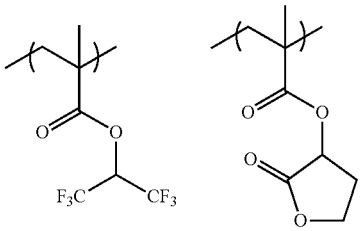
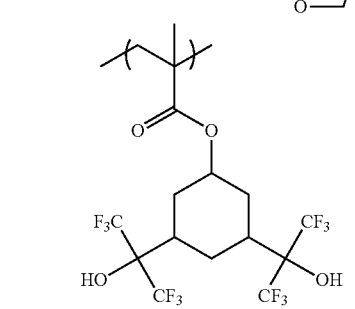
(HR-55)
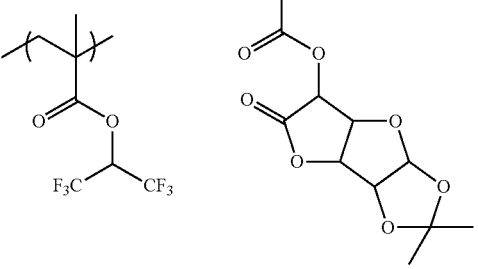
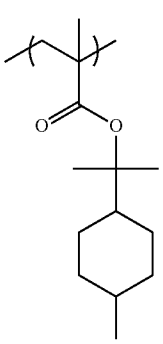
(HR-56)
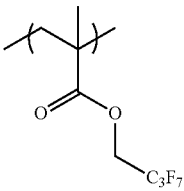

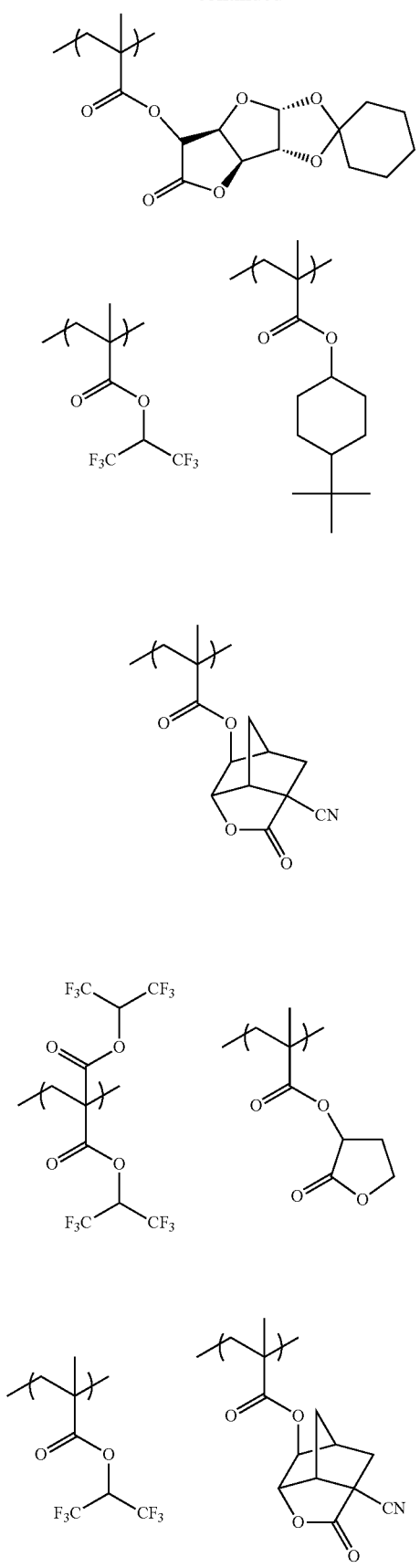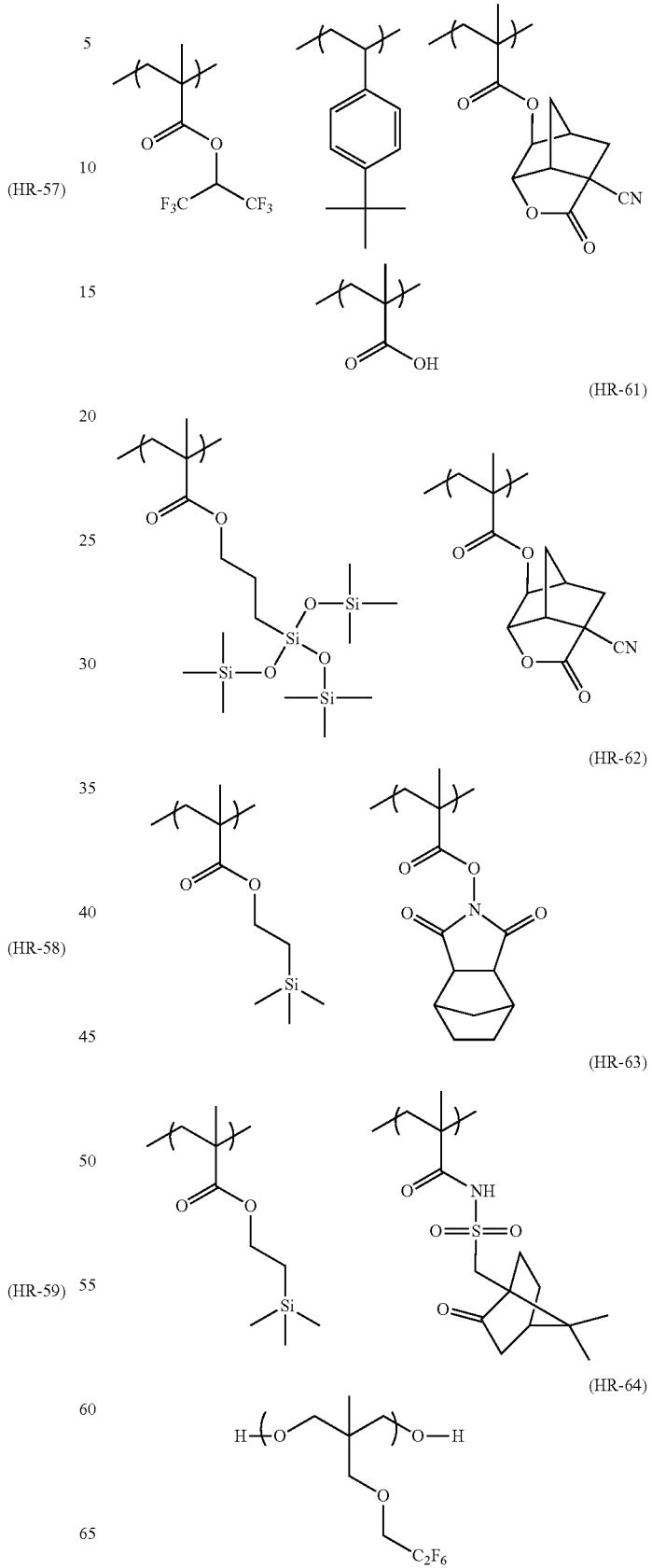

(HR-65)
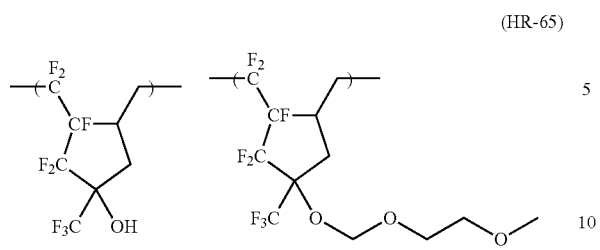
[Chem. 69]
(HR-66)
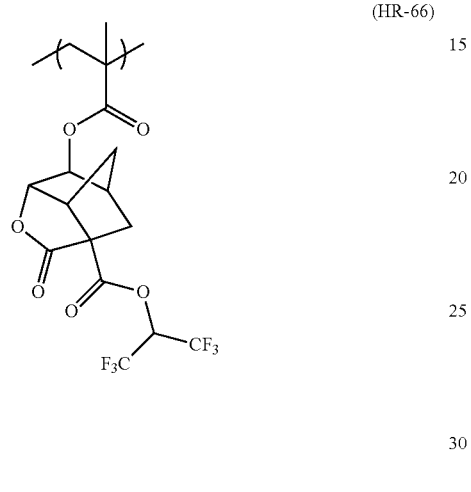
(HR-67)
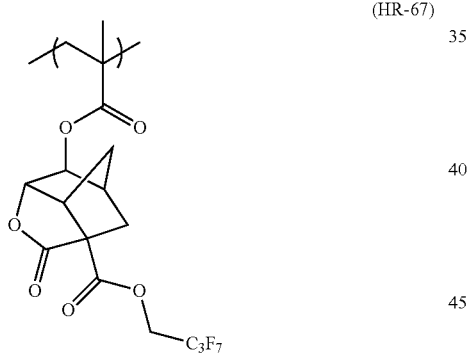
(HR-68)
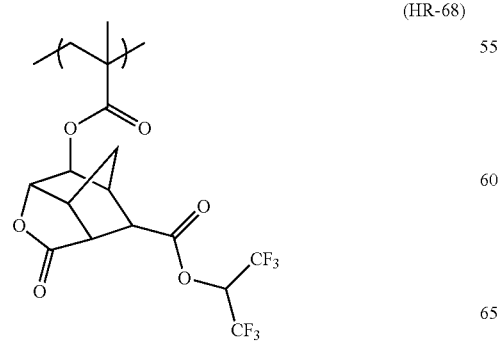
(HR-69)
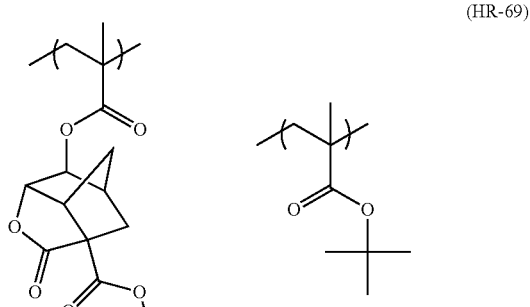
(HR-70)
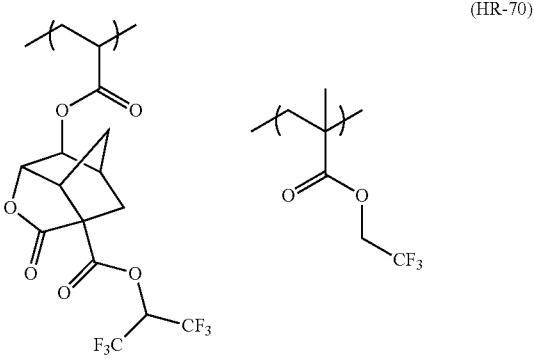
(HR-71)
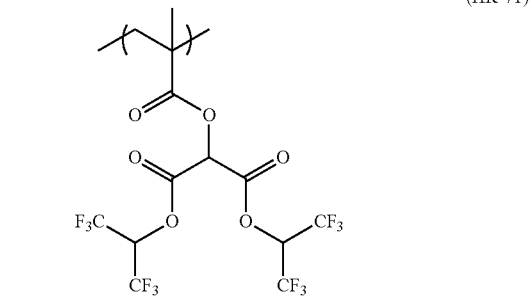
(HR-72)
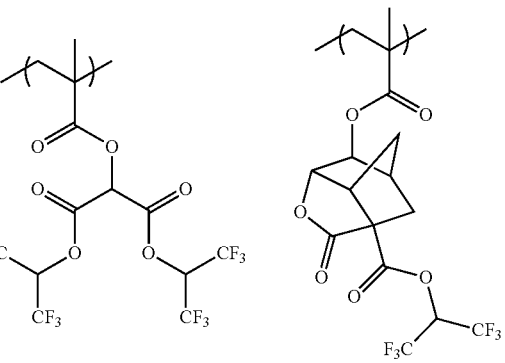

(HR-73)
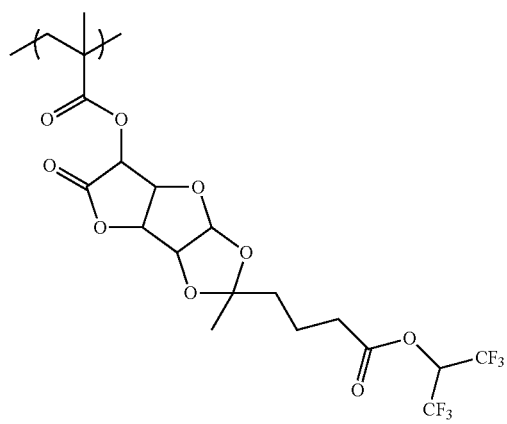
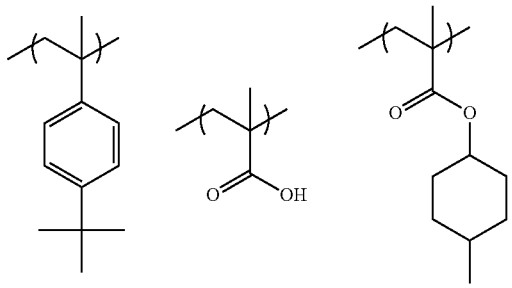
(HR-74)
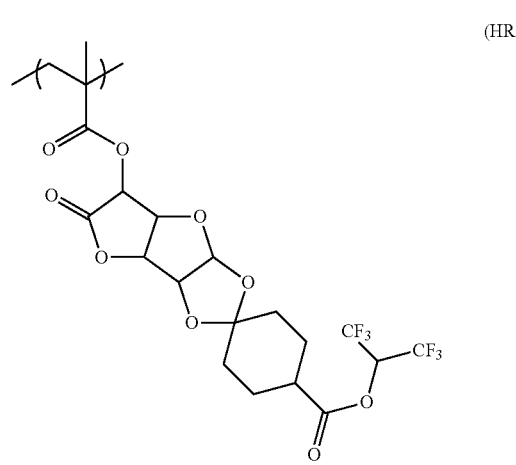
(HR-75)
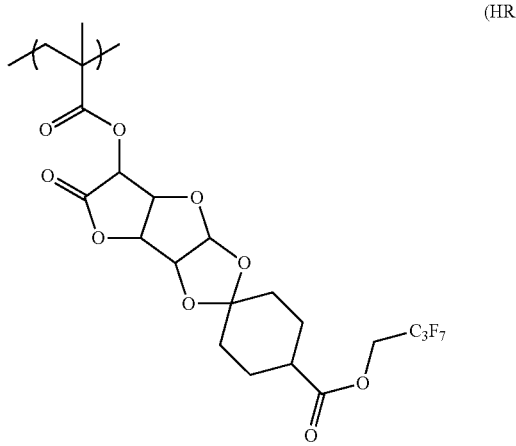
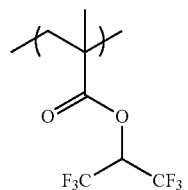
(HR-76)
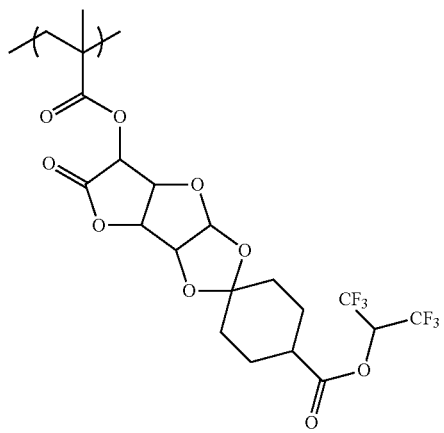
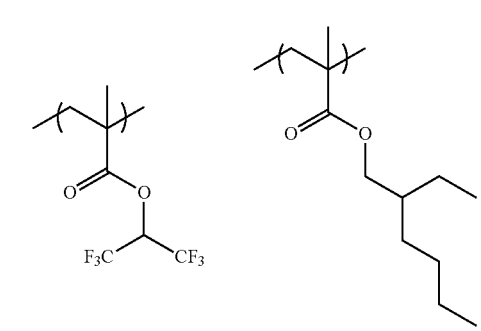
(HR-77)
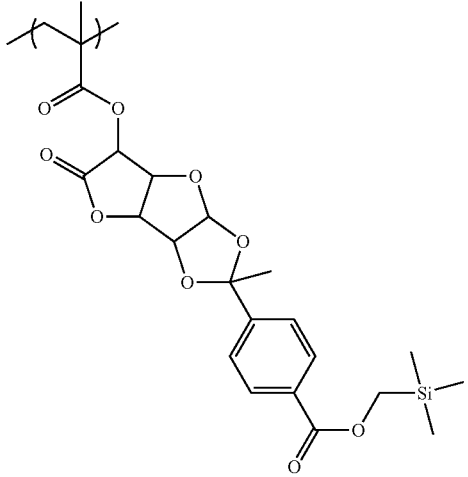

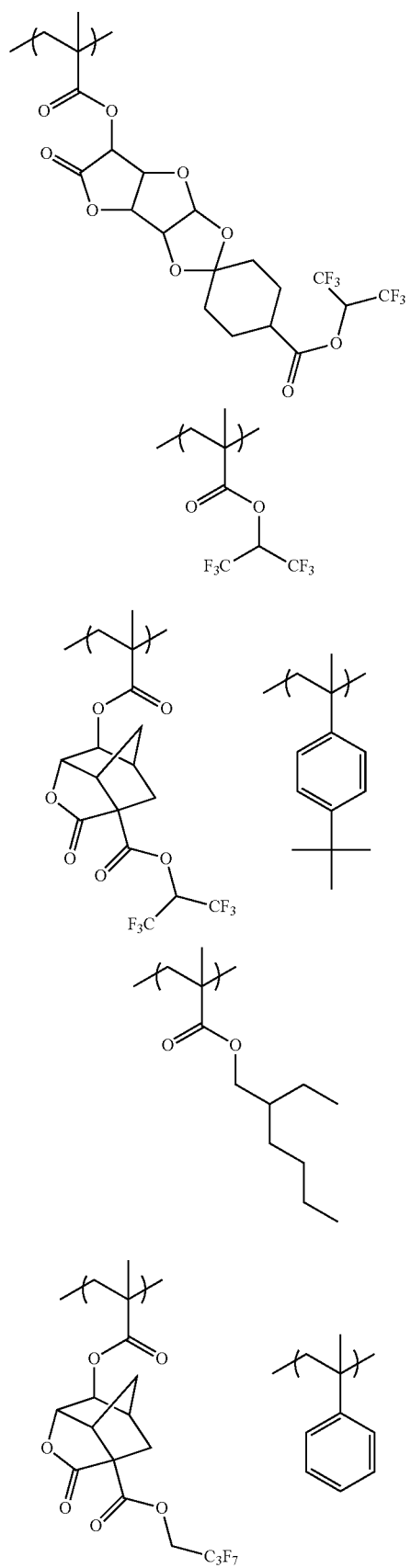
(HR-78)
(HR-79)
[HR-80]
[Chem. 70]
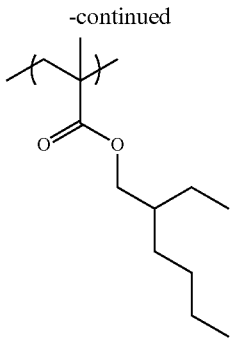
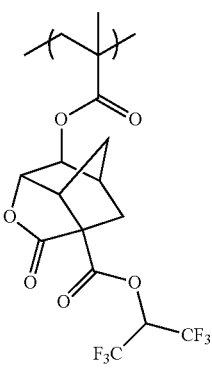 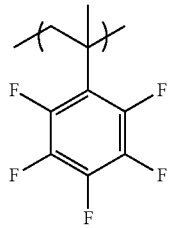
(HR-81)
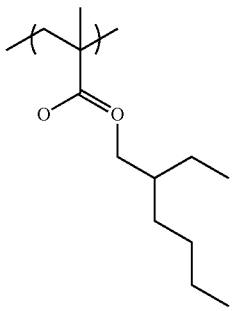
(HR-82)
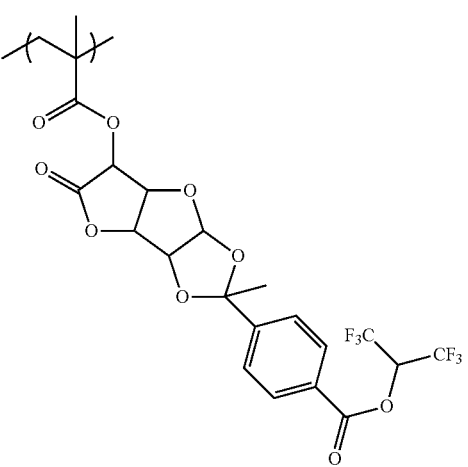

163
-continued
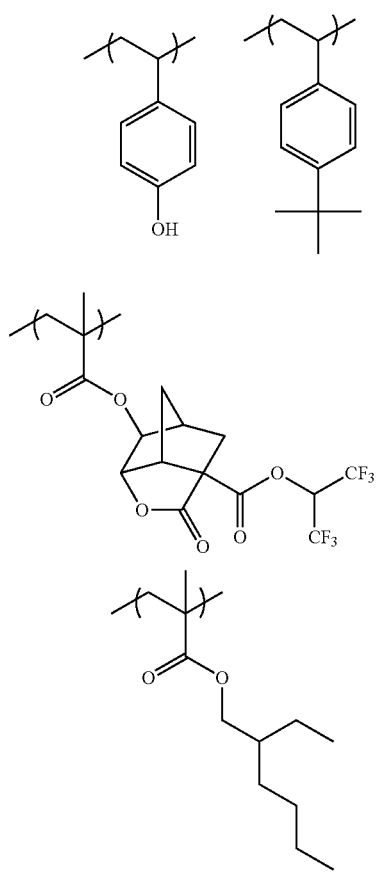
(HR-83)
(HR-84)
(HR-85)
164
-continued
(HR-86)
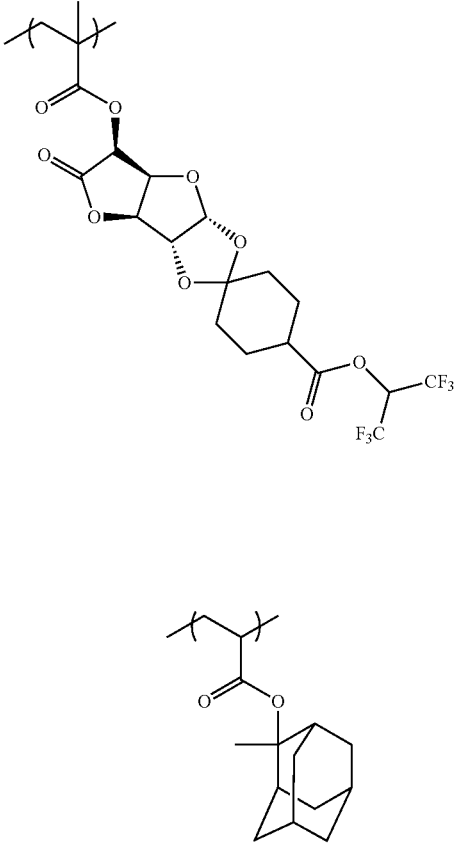
(HR-87)
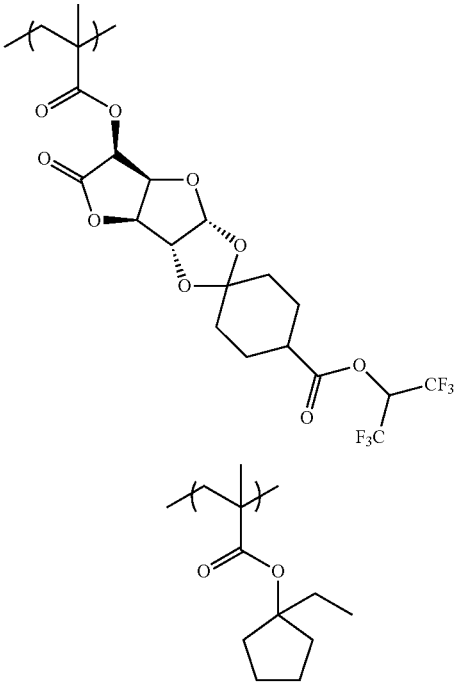

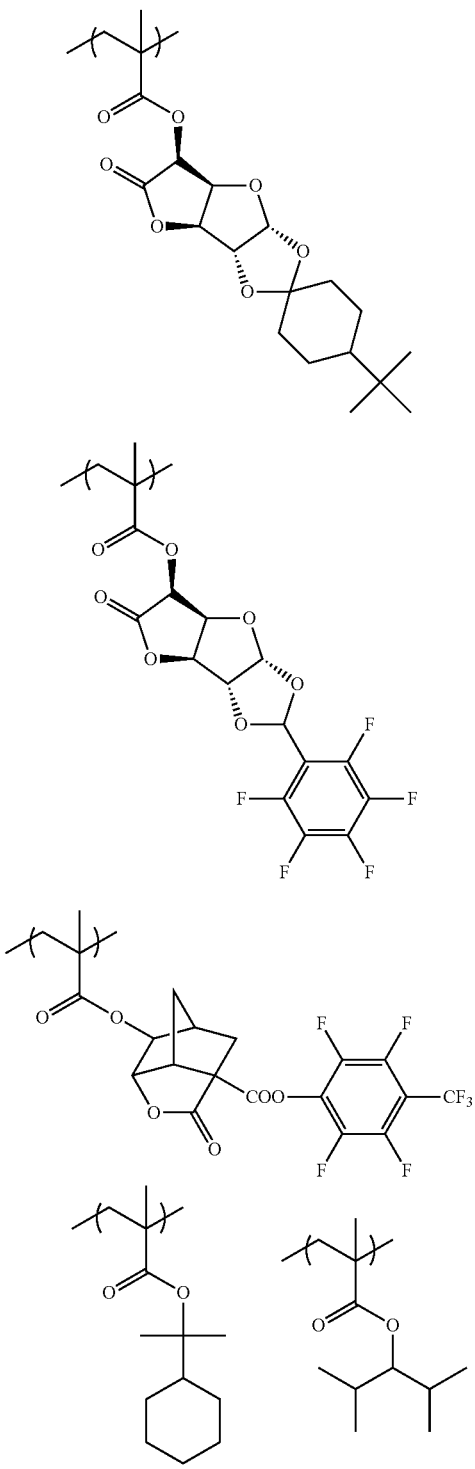

(HR-88)

(HR-89)

(HR-90)

TABLE 1

| Resin | Composition | Mw | Mw/Mn |
|---|---|---|---|
| HR-1 | 50/50 | 4900 | 1.4 |
| HR-2 | 50/50 | 5100 | 1.6 |
| HR-3 | 50/50 | 4800 | 1.5 |
| HR-4 | 50/50 | 5300 | 1.6 |

TABLE 1-continued

| Resin | Composition | Mw | Mw/Mn |
|---|---|---|---|
| HR-5 | 50/50 | 4500 | 1.4 |
| HR-6 | 100 | 5500 | 1.6 |
| HR-7 | 50/50 | 5800 | 1.9 |
| HR-8 | 50/50 | 4200 | 1.3 |
| HR-9 | 50/50 | 5500 | 1.8 |
| HR-10 | 40/60 | 7500 | 1.6 |
| HR-11 | 70/30 | 6600 | 1.8 |
| HR-12 | 40/60 | 3900 | 1.3 |
| HR-13 | 50/50 | 9500 | 1.8 |
| HR-14 | 50/50 | 5300 | 1.6 |
| HR-15 | 100 | 6200 | 1.2 |
| HR-16 | 100 | 5600 | 1.6 |
| HR-17 | 100 | 4400 | 1.3 |
| HR-18 | 50/50 | 4300 | 1.3 |
| HR-19 | 50/50 | 6500 | 1.6 |
| HR-20 | 30/70 | 6500 | 1.5 |
| HR-21 | 50/50 | 6000 | 1.6 |
| HR-22 | 50/50 | 3000 | 1.2 |
| HR-23 | 50/50 | 5000 | 1.5 |
| HR-24 | 50/50 | 4500 | 1.4 |
| HR-25 | 30/70 | 5000 | 1.4 |
| HR-26 | 50/50 | 5500 | 1.6 |
| HR-27 | 50/50 | 3500 | 1.3 |
| HR-28 | 50/50 | 6200 | 1.4 |
| HR-29 | 50/50 | 6500 | 1.6 |
| HR-30 | 50/50 | 6500 | 1.6 |
| HR-31 | 50/50 | 4500 | 1.4 |
| HR-32 | 30/70 | 5000 | 1.6 |
| HR-33 | 30/30/40 | 6500 | 1.8 |
| HR-34 | 50/50 | 4000 | 1.3 |
| HR-35 | 50/50 | 6500 | 1.7 |
| HR-36 | 50/50 | 6000 | 1.5 |
| HR-37 | 50/50 | 5000 | 1.6 |
| HR-38 | 50/50 | 4000 | 1.4 |
| HR-39 | 20/80 | 6000 | 1.4 |
| HR-40 | 50/50 | 7000 | 1.4 |
| HR-41 | 50/50 | 6500 | 1.6 |
| HR-42 | 50/50 | 5200 | 1.6 |
| HR-43 | 50/50 | 6000 | 1.4 |
| HR-44 | 70/30 | 5500 | 1.6 |
| HR-45 | 50/20/30 | 4200 | 1.4 |
| HR-46 | 30/70 | 7500 | 1.6 |
| HR-47 | 40/58/2 | 4300 | 1.4 |
| HR-48 | 50/50 | 6800 | 1.6 |
| HR-49 | 100 | 6500 | 1.5 |
| HR-50 | 50/50 | 6600 | 1.6 |
| HR-51 | 30/20/50 | 6800 | 1.7 |
| HR-52 | 95/5 | 5900 | 1.6 |
| HR-53 | 40/30/30 | 4500 | 1.3 |
| HR-54 | 50/30/20 | 6500 | 1.8 |
| HR-55 | 30/40/30 | 7000 | 1.5 |
| HR-56 | 60/40 | 5500 | 1.7 |
| HR-57 | 40/40/20 | 4000 | 1.3 |
| HR-58 | 60/40 | 3800 | 1.4 |
| HR-59 | 80/20 | 7400 | 1.6 |
| HR-60 | 40/40/15/5 | 4800 | 1.5 |
| HR-61 | 60/40 | 5600 | 1.5 |
| HR-62 | 50/50 | 5900 | 2.1 |
| HR-63 | 80/20 | 7000 | 1.7 |
| HR-64 | 100 | 5500 | 1.8 |
| HR-65 | 50/50 | 9500 | 1.9 |
| HR-66 | 100 | 6000 | 1.5 |
| HR-67 | 100 | 6000 | 1.4 |
| HR-68 | 100 | 9000 | 1.5 |
| HR-69 | 60/40 | 8000 | 1.3 |
| HR-70 | 80/20 | 5000 | 1.4 |
| HR-71 | 100 | 9500 | 1.5 |
| HR-72 | 40/60 | 8000 | 1.4 |
| HR-73 | 55/30/5/10 | 8000 | 1.3 |
| HR-74 | 100 | 13000 | 1.4 |
| HR-75 | 70/30 | 8000 | 1.3 |
| HR-76 | 50/40/10 | 9500 | 1.5 |
| HR-77 | 100 | 9000 | 1.6 |
| HR-78 | 80/20 | 3500 | 1.4 |
| HR-79 | 90/8/2 | 13000 | 1.5 |
| HR-80 | 85/10/5 | 5000 | 1.5 |
| HR-81 | 80/18/2 | 6000 | 1.5 |
| HR-82 | 50/20/30 | 5000 | 1.3 |

TABLE 1-continued

| Resin | Composition | Mw | Mw/Mn |
|---|---|---|---|
| HR-83 | 90/10 | 8000 | 1.4 |
| HR-84 | 100 | 9000 | 1.6 |
| HR-85 | 80/20 | 15000 | 1.6 |
| HR-86 | 70/30 | 4000 | 1.42 |
| HR-87 | 60/40 | 8000 | 1.32 |
| HR-88 | 100 | 3800 | 1.29 |
| HR-89 | 100 | 6300 | 1.35 |
| HR-90 | 50/40/10 | 8500 | 1.51 |

[7] Surfactant (F)

The actinic ray-sensitive or radiation-sensitive resin composition in the present invention may or may not further contain a surfactant, and in the case where it contains a surfactant, it is preferable to include either one or both of a fluorine-based and silicon-based surfactant (a fluorine-based surfactant, a silicon-based surfactant, or a surfactant containing both fluorine atoms and silicon atoms) or two or more kinds thereof.

By the actinic ray-sensitive or radiation-sensitive resin composition in the present invention containing a surfactant, a resist pattern with satisfactory sensitivity and resolution, therefore, less adhesion and developing defects, may be obtained when an exposure light source of 250 nm or less, particularly 220 nm or less, is used.

Examples of one or both of the fluorine-based and silicon-based surfactant include the surfactants described in paragraph [0276] in the specification of US2008/0248425A, such as EFtop EF301 and EF303 (manufactured by Shin-Akita Kasei K.K.); Florad FC430, 431, and 4430 (manufactured by Sumitomo 3M Inc.); Megaface F171, F173, F176, F189, F113, F110, F177, F120, and R08 (manufactured by Dainippon Ink & Chemicals, Inc.); Surflon S-382, SC101, 102, 103, 104, 105, and 106, and KH-20 (manufactured by Asahi Glass Co., Ltd.); Troysol S-366 (manufactured by Troy Chemical); GF-300, and GF-150 (manufactured by Toagosei Chemical Industry Co., Ltd.); Surflon S-393 (manufactured by Seimi Chemical Co., Ltd.); EFtop EF121, EF122A, EF122B, RF122C, EF125M, EF135M, EF351, EF352, EF801, EF802, and EF601 (manufactured by JEMCO Inc.); PF636, PF656, PF6320, and PF6520 (manufactured by OMNOVA); and FTX-204G, 208G, 218G, 230G, 204D, 208D, 212D, 218D, and 222D (manufactured by NEOS Co., Ltd.). In addition, a polysiloxane polymer KP-341 (manufactured by Shin-Etsu Chemical Co., Ltd.) may also be used as the silicon-based surfactant.

Furthermore, other than those known surfactants above, a surfactant using a polymer having a fluoro-aliphatic group derived from a fluoro-aliphatic compound which is produced by a telomerization method (also called a telomer method) or an oligomerization method (also called an oligomer method), may also be used. The fluoro-aliphatic compound may be synthesized by methods disclosed in JP2002-90991A.

The surfactant corresponding to the above may include Megaface F178, F-470, F-473, F-475, F-476, F-472 (manufactured by DIC Corporation), a copolymer of acrylate (or methacrylate) having a $C_6F_{13}$ group and (poly(oxyalkylene)) acrylate (or methacrylate), a copolymer of acrylate (or methacrylate) having a $C_3F_7$ group, (poly(oxyethylene))acrylate (or methacrylate), and (poly(oxypropylene))acrylate (or methacrylate), or the like.

Moreover, a surfactant other than one or both of the fluorine-based and silicon-based surfactant, described in paragraph [0280] in the specification of US2008/0248425A, may also be used in the present invention.

These surfactants may be used either alone or as a combination of two or more.

If the actinic ray-sensitive or radiation-sensitive resin composition contains the surfactant, the amount of the surfactant used is preferably 0.0001 to 2% by mass, and more preferably 0.0005 to 1% by mass with regard to the total amount of the actinic ray-sensitive or radiation-sensitive resin composition (excluding the solvent).

On the other hand, by keeping the addition amount of the surfactant to be 10 ppm or less with regard to the total amount of the actinic ray-sensitive or radiation-sensitive resin composition (excluding the solvent), surface localization of the hydrophobic resin is enhanced, thereby the traceability of water may be improved when liquid immersion exposure is carried out since the surface of the resist film is made to be more hydrophobic.

[8] Other Additives (G)

The actinic ray-sensitive or radiation-sensitive resin composition in the present invention may or may not contain an onium carboxylate. The onium carboxylate such as this may include those described in [0605] to [0606] of US2008/0187860A.

The onium carboxylate such as this can be synthesized by reacting sulfonium hydroxide, iodonium hydroxide, ammonium hydroxide, and carboxylic acid with silver oxide in an appropriate solvent.

If the actinic ray-sensitive or radiation-sensitive resin composition contains the onium carboxylate, the content is typically 0.1 to 20% by mass, preferably 0.5 to 10% by mass, and more preferably 1 to 7% by mass with regard to the total solids of the composition.

The actinic ray-sensitive or radiation-sensitive resin composition of the invention may further contain a dye, a plasticizer, a photosensitizer, a light absorber, an alkali-soluble resin, a dissolution inhibitor, a compound for accelerating dissolution in a developer (for example, a phenol compound having a molecular weight of 1000 or less, or a carboxyl group-containing alicyclic or aliphatic compound), or the like, as necessary.

The phenol compound having a molecular weight of 1000 or less can be easily synthesized by those skilled in the art by referring to the methods described, for example, in JP1992-122938A (JP-H04-122938A), JP1990-28531A (JP-H02-28531A), U.S. Pat. No. 4,916,210A, EP219294B, and the like.

While specific examples of the carboxyl group-containing alicyclic or aliphatic compound include a carboxylic acid derivative having a steroid structure, such as cholic acid, deoxycholic acid, and lithocholic acid, an adamantanecarboxylic acid derivative, adamantanedicarboxylic acid, cyclohexanecarboxylic acid, cyclohexanedicarboxylic acid, and the like, the present invention is not limited thereto.

The actinic ray-sensitive or radiation-sensitive resin composition in the present invention is preferably used with a film thickness of 30 to 250 nm, and more preferably used with a film thickness of 30 to 200 nm from the viewpoint of improving resolution. This film thickness is possible by improving coating properties and film formability through setting the solid content concentration in the composition being in an appropriate range to have a moderate viscosity.

The solid content concentration of the actinic ray-sensitive or radiation-sensitive resin composition in the present invention is typically 1.0 to 10% by mass, preferably 2.0 to 5.7% by mass, and more preferably 2.0 to 5.3% by mass. When the solid content concentration is in this range, the resist solution can be uniformly applied on a substrate, and in addition, a resist pattern with excellent line width roughness can be formed. The reasons therefor are not clearly known, but it is considered that by setting the solid content concentration to 10% by mass or less, and preferably 5.7% by mass or less, the materials, particularly the photo-acid generator, in the resist solution, are prevented from aggregation, and as a result, a uniform resist film can be formed.

The solid content concentration is a mass percentage of the mass of other resist components excluding the solvents, based on the total mass of the actinic ray-sensitive or radiation-sensitive resin composition.

The actinic ray-sensitive or radiation-sensitive resin composition in the present invention is used by the above component being dissolved in a predetermined organic solvent, preferably the mixed solvent described above, filtered through a filter, and then coated on a predetermined support (substrate). The filter used in the filter filtration is preferably made of polytetrafluoroethylene, polyethylene, or nylon having a pore size of 0.1 μm or less, more preferably 0.05 μm or less, and still more preferably 0.03 μm or less. In the filtration by a filter, filtration may be carried out by cyclical filtration or by connecting a plurality of types of filters in series or in parallel and filtering, as disclosed in JP2002-62667A. In addition, the composition may also be filtered a plurality of times. Furthermore, a degassing treatment, and the like, may be carried out for the composition before and after filtration.

<Pattern Forming Method>

A pattern forming method (negative tone pattern forming method) of the present invention includes at least: (i) a process of forming a film using the actinic ray-sensitive or radiation-sensitive resin composition of the present invention described above; (ii) a process of exposing the film using actinic rays or radiation with a wavelength of equal to or less than 200 nm; and (iii) a process of developing the exposed film using a developer including an organic solvent containing at least one hetero atom and carbon atoms having 7 or more carbon atoms to form a negative tone pattern.

The exposure in (ii) may be liquid immersion exposure.

The pattern forming method of the invention preferably includes (iv) a heating process after the (ii) exposure process.

The pattern forming method of the invention may further include (v) a developing process using an alkali developer.

The pattern forming method of the present invention may include (ii) the exposure process a plurality of times.

The pattern forming method of the present invention may include (iv) the heating process a plurality of times.

The actinic ray-sensitive or radiation-sensitive film is formed by the actinic ray-sensitive or radiation-sensitive resin composition according to the present invention described above, and more specifically, it is preferably formed on a substrate. According to the pattern forming method of the present invention, the process of forming a film formed of the actinic ray-sensitive or radiation-sensitive resin composition on a substrate, the process of exposing the film, and the developing process can be performed using a generally known method.

It is also preferable to include a preheating process (PB; Prebake) after forming the film and before the exposure process.

Further, it is also preferable to include a post-exposure heating process (PEB; Post Exposure Bake) after the exposure process and before the developing process.

Regarding the heating temperature, heating of either of PB and PEB is preferably at a temperature of 70 to 130° C., and more preferably at a temperature of 80 to 120° C.

The heating time is preferably 30 to 300 seconds, more preferably 30 to 180 seconds, and even more preferably 30 to 90 seconds.

Heating can be carried out using means that are included in a normal exposure and development machine, and may also be carried out using a hot plate or the like.

Sensitivity or the pattern profile is improved by the reaction of the exposed portion being accelerated due to the bake.

The light source wavelength used in the exposure apparatus in the invention is not limited, but examples thereof include infrared light, visible light, ultraviolet light, far ultraviolet light, extreme ultraviolet light, X-rays, electron beams, and the like. Far ultraviolet light has a wavelength of preferably 250 nm or less, more preferably 220 nm or less, and particularly preferably 1 to 200 nm, specifically, a KrF excimer laser (248 nm), an ArF excimer laser (193 nm), an $F_2$ excimer laser (157 nm), X-rays, EUV radiation (13 nm), an electron beam, or the like with a KrF excimer laser, an ArF excimer laser, EUV radiation, or an electron beam being preferred, and an ArF excimer laser being more preferred.

Moreover, in the exposure of the invention, a liquid immersion exposure method may be applied.

The liquid immersion exposure method is a technology improving the resolution, and is a technology of exposure in which a high refractive index liquid (hereinafter also referred to as "liquid for liquid immersion") is filled between the projection lens and a sample.

As described above, with regard to the "effect of the liquid immersion", taking $\lambda_0$ as the wavelength of exposure light in air, n as the refractive index of the liquid for liquid immersion to air, and θ as the convergent half angle of the light beam, where $NA_0 = \sin θ$, the resolution and the focal depth in the event of liquid immersion can be expressed by the following formulae. Here, $k_1$ and $k_2$ are coefficients related to the process.

(resolution)=$k_1 \cdot (\lambda_0/n)/NA_0$ (focal depth)=$\pm k_2 \cdot (\lambda_0/n)/NA_0^2$ That is, the effect of the liquid immersion is equivalent to the wavelength using the exposure wavelength of 1/n. In other words, for the NA of the same projection optical system, the focal depth may be made to be n times by the liquid immersion. This is valid for all pattern shapes, and furthermore, combining with super-resolution technologies such as a phase shift method or a modified illumination method currently being considered is possible.

In the case of carrying out liquid immersion exposure, the washing of the surface of a film with an aqueous chemical liquid may be carried out (1) after forming a film on a substrate, and before exposing the film through a liquid for liquid immersion, and/or (2) after exposing a film through a liquid for liquid immersion and before heating the film.

As the liquid for liquid immersion, liquid with as small a temperature coefficient of the refractive index as possible is preferable so that the liquid is transparent to the exposure wavelength and suppresses the distortion of the optical image projected on the film to a minimum level, however, especially when the exposure light source is an ArF excimer laser (wavelength; 193 nm), the use of water is preferable in terms of availability and ease of handling, in addition to the viewpoints described above.

When water is used, an additive (liquid) increasing the surfactant potency along with reducing the surface tension of water may be added as a small fraction. This additive is preferably an additive which does not dissolve the resist layer on a wafer and with which the effects on the optical coat at the lower surface of the lens element can be ignored.

The additive is, for example, preferably an aliphatic-based alcohol with a refractive index approximately equal to that of water, and specific examples thereof include methyl alcohol, ethyl alcohol, and isopropyl alcohol. The addition of an alcohol with a refractive index approximately equal to that of water is advantageous in that even when the alcohol component is evaporated from water, thereby causing a change in the concentration, the change in the refractive index of the liquid as a whole can be minimized.

On the other hand, when a substance being opaque in light at 193 nm or an impurity whose refractive index is greatly different from that of water is mixed therein, the mixing would invite a distortion of the optical image projected on the resist. Accordingly, distilled water is preferred as the water used. Pure water filtered through an ion exchange filter or the like may also be used.

For the water, used as a liquid for liquid immersion, the electric resistivity is preferably 18.3 MΩcm or more, and the TOC (total organic matter concentration) is preferably 20 ppb or less. Also, the water is preferably subjected to a degassing treatment.

In addition, the performance of lithography can be improved by increasing the refractive index of the liquid for liquid immersion. From this point of view, the addition of additives increasing the refractive index to water or using heavy water ($D_2O$) instead of water is possible.

When the film formed using the composition of the present invention is exposed through a liquid immersion medium, Hydrophobic Resin (E) described above may be further added as necessary. By adding Hydrophobic Resin (E), the receding contact angle of the surface is improved. The receding contact angle of the film is preferably from 60° to 90°, and more preferably from 70° or greater.

In the liquid immersion exposure process, the contact angle of the liquid for liquid immersion for the resist film in a dynamic state becomes critical since the liquid for liquid immersion needs to move on the wafer following the movement of the exposure head scanning on the wafer at high speed and forming an exposure pattern, therefore, the resist is required to have an ability to follow the high-speed scan of the exposure head without the remaining droplets.

In order to prevent the film from directly contacting the liquid for liquid immersion, a hardly soluble film in a liquid for liquid immersion (hereinafter also referred to as a "top coat") may be provided between the film formed using the composition of the invention and the liquid for liquid immersion. As a function required for the top coat, coating suitability for the resist upper layer portion, transparency to radiation, particularly, radiation with a wavelength of 193 nm, and sparing solubility in the liquid for liquid immersion may be included. It is preferable that the top coat be not mixed with the resist, and can be coated uniformly on the resist upper layer.

The top coat is preferably a polymer which does not contain an aromatic group from the viewpoint of transparency at 193 nm.

Specifically, a hydrocarbon polymer, an acrylate polymer, polymethacrylate, polyacrylate, polyvinyl ether, a silicon-containing polymer, a fluorine-containing polymer and the like, may be included. Hydrophobic Resin (E) described above is also very suitable as a top coat. If impurities are dissolved out into the liquid for liquid immersion from the top coat, the optical lens becomes contaminated, and therefore, it is preferable that few residual monomer components of the polymer be contained in the top coat.

When stripping the top coat, a developer may be used or a separate stripping agent may be used. The stripping agent is preferably a solvent permeating the film to a lesser extent. Stripping by an alkali developer is preferable in that the stripping process may be performed simultaneously with the developing treatment process of the film. The top coat is preferably an acid from the viewpoint of stripping with the alkali developer, however, from the viewpoint of a non-intermixing property with the film, the top coat may be either neutral or alkaline.

The refractive index difference between the top coat and the liquid for liquid immersion is preferably is none or small. In this case, improving the resolution is possible. When the exposure light source is an ArF excimer laser (wavelength: 193 nm), the use of water is preferable as the liquid for liquid immersion, therefore, the top coat for ArF liquid immersion exposure preferably has a refractive index closer to that of water (1.44). In addition, the top coat is preferably a thin film from the viewpoint of transparency and the refractive index.

The top coat is preferably mixed neither with the film nor with the liquid for liquid immersion. From this point of view, when the liquid for liquid immersion is water, it is preferable that the solvent used for the top coat be hardly soluble in the solvent used in the composition of the present invention, and be a non-water soluble medium. In addition, when the liquid for liquid immersion is an organic solvent, the top coat may be either water-soluble or non-water-soluble.

In the invention, the substrate on which the film is formed is not particularly limited, and a substrate generally used in the manufacturing process of an inorganic substrate such as silicon, SiN, $SiO_2$, and TiN, a coating-based inorganic substrate such as an SOG, and a semiconductor such as an IC, the manufacturing process of a circuit substrate such as liquid crystal and a thermal head, and further, in other photofabrication lithography processes, may be used. In addition, an organic anti-reflective film may be formed between the film and the substrate, as necessary.

As the developer in the process (iii) of forming a negative tone pattern by developing using a developer containing an organic solvent (hereinafter also referred to as an "organic-based developer"), a developer including an organic solvent consisting at least one hetero atom and carbon atoms having 7 or more carbon atoms is used. Here, examples of a hetero atom include an oxygen atom, a sulfur atom, a nitrogen atom, and the like.

The organic solvent preferably has 8 or more carbon atoms, particularly preferably includes an ether group, an ester group, or a keto group as the functional group, examples of which include the ketone-based solvents, ester-based solvents, ether-based solvents, and the like shown below. By using such an organic solvent, the developing speed and the dissolution contrast can be favorably maintained. Here, while the upper limit of the number of carbon atoms is not particularly limited as long as the developer is a liquid at room temperature, the number of carbon atoms is ordinarily equal to or less than 15, and preferably equal to or less than 12.

Examples of ketone-based solvents include 2-heptanone, 2-octanone, 2-nonanone, 4-heptanone, diisobutyl ketone, methyl cyclohexanone, phenyl acetone, ionone, acetophenone, methyl naphthyl ketone, isophorone, and the like.

Examples of ester-based solvents include pentyl acetate, isopentyl acetate, cyclohexyl acetate, ethyl 3-ethoxy propionate, butyl propionate, propyl butyrate, propyl isobutyrate, butyl butyrate, butyl isobutyrate, isobutyl isobutyrate, propylene glycol diacetate, and the like.

Examples of ether-based solvents include dibutyl ether, diisobutyl ether, di-isopentyl ether, anisole, phenetole, diethylene glycol ethyl methyl ether, diethylene glycol diethyl ether, diethylene glycol dibutyl ether, and the like.

The above solvents may be mixed plurally, or may be used being mixed with other types of solvents or water. However, in order to exhibit a sufficient effect of the present invention, the organic solvent including at least one hetero atom and carbon atoms having 7 or more carbon atoms is normally contained at equal to or greater than 50% by mass of the total mass of the developer, preferably equal to or greater than 75% by mass, and more preferably equal to or greater than 90% by mass, and even more preferable is a case where all of the organic solvent that the developer includes being an organic solvent including at least one hetero atom and carbon atoms having 7 or more carbon atoms.

Further, the moisture content of the developer as a whole is preferably less than 10% by mass, and it is preferable that essentially there be no water contained.

That is, the amount of the organic solvent used with regard to the organic-based developer is preferably greater than or equal to 90% by mass and less than or equal to 100% by mass, and more preferably greater than or equal to 95% by mass and less than or equal to 100% by mass with regard to the total amount of the developer.

The vapor pressure at 20° C. of the organic-based developer is preferably 5 kPa or less, more preferably 3 kPa or less, and particularly preferably 2 kPa or less. By making the vapor pressure of the organic-based developer 5 kPa or less, evaporation of the developer on the substrate or in the development cup is suppressed, and temperature uniformity within the wafer surface is improved, and as a result, dimension uniformity within the wafer surface is improved.

An appropriate amount of a surfactant may be added to the organic-based developer, as necessary.

The surfactant is not particularly limited but, for example, one or both of an ionic or nonionic fluorine-based and silicon-based surfactant, or the like can be used. Examples of such a fluorine-based and/or silicon-based surfactant include surfactants described in JP1987-36663A (JP-S62-36663A), JP1986-226746A (JP-S61-226746A), JP1986-226745A (JP-S61-226745A), JP1987-170950A (JP-S62-170950A), JP1988-34540A (JP-S63-34540A), JP1995-230165A (JP-H07-230165A), JP1996-62834A (JP-H08-62834A), JP1997-54432A (JP-H09-54432A), JP1997-5988A (JP-H09-5988A), U.S. Pat. No. 5,405,720A, U.S. Pat. No. 5,360,692A, U.S. Pat. No. 5,529,881A, U.S. Pat. No. 5,296,330A, U.S. Pat. No. 5,436,098A, U.S. Pat. No. 5,576,143A, U.S. Pat. No. 5,294,511A, and U.S. Pat. No. 5,824,451A. A non-ionic surfactant is preferred. The non-ionic surfactant is not particularly limited, however, the use of fluorine-based surfactants or silicon-based surfactants is more preferable.

The amount of surfactant used is typically 0.001 to 5% by mass, preferably 0.005 to 2% by mass, and more preferably 0.01 to 0.5% by mass with regard to the total amount of the developer.

As the developing method, for example, a method in which a substrate is immersed in a tank filled with a developer for a certain period of time (dipping method), a method in which a developer is heaped up to the surface of a substrate by surface tension and developed by resting for a certain period of time (a paddling method), a method in which a developer is sprayed on the surface of the substrate (a spraying method), a method in which a developer is continuously discharged on a substrate rotated at a constant rate while scanning a developer-discharging nozzle at a constant rate (a dynamic dispensing method), or the like, may be applied.

If a variety of developing methods described above include a process in which a developer is discharged from a development nozzle of a development apparatus toward a resist film, the discharge pressure of the developer discharged (the flow rate per unit area of the developer discharged) is preferably 2 mL/sec/mm$^2$ or less, more preferably 1.5 mL/sec/mm$^2$ or less, and even more preferably 1 mL/sec/mm$^2$ or less. There is no particular lower limit of the flow rate, however, 0.2 mL/sec/mm$^2$ or more is preferable if the throughput is considered.

By making the discharge pressure of the developer discharged be in this range, defects of the pattern derived from the resist residue after development may be significantly reduced.

Details of this mechanism are not clearly known, but it is considered that it is possible that due to the discharge pressure being in the above-described range, the pressure imposed on the resist film by the developer is small and the resist film or resist pattern is kept from inadvertently chipping or collapsing.

In addition, the discharge pressure of the developer (mL/sec/mm$^2$) is a value at the developing nozzle exit in the development apparatus.

The method for adjusting the discharge pressure of the developer may include, for example, a method in which the discharge pressure is adjusted by a pump and the like, or a method in which the pressure is adjusted by the supply from a pressurized tank and changed, and the like.

Further, after the development using a developer including an organic solvent, stopping of the development by replacing with another solvent may be carried out.

After the development using a developer including an organic solvent, washing with a rinsing solution is preferably included.

The rinsing solution used in the rinsing process after the development using a developer including an organic solvent is not particularly limited as long as it does not dissolve the resist pattern, and a solution including an ordinary organic solvent may be used. As the rinsing solution, a rinsing solution including at least one organic solvent selected from a group consisting of a hydrocarbon-based solvent, a ketone-based solvent, an ester-based solvent, an alcohol-based solvent, an amide-based solvent, and an ether-based solvent is preferably used.

Specific examples of the hydrocarbon-based solvent, the ketone-based solvent, the ester-based solvent, the alcohol-based solvent, the amide-based solvent, and the ether-based solvent include those described above for the developer including an organic solvent.

After the development using a developer including an organic solvent, more preferably, washing with a rinsing solution containing at least one organic solvent selected from a group consisting of a ketone-based solvent, an ester-based solvent, an alcohol-based solvent, and an amide-based solvent is carried out; still more preferably, washing with a rinsing solution containing an alcohol-based solvent or an ester-based solvent is carried; particularly preferably, washing with a rinsing solution containing a monohydric alcohol is carried out; and most preferably, washing with a rinsing solution containing a monohydric alcohol having 5 or more carbon atoms is carried out.

Here, the monohydric alcohol used in the rinsing process may include a linear, branched, or cyclic monohydric alcohol, and specifically, 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol, 4-octanol or the like, may be used, and as the particularly preferable monohydric alcohol having 5 or more carbon atoms, 1-hexanol, 2-hexanol, 4-methyl-2-pentanol, 1-pentanol, 3-methyl-1-butanol or the like, may be used.

Each component described above may be mixed plurally, or may be used being mixed with organic solvents other than those described above.

The moisture content of the rinsing solution is preferably 10% by mass or less, more preferably 5% by mass or less, and particularly preferably 3% by mass or less. By making the moisture content 10% by mass or less, satisfactory development characteristics may be obtained.

The vapor pressure at 20° C. of the rinsing solution used after the development using a developer including an organic solvent is preferably from 0.05 kPa to 5 kPa, more preferably from 0.1 kPa to 5 kPa, and most preferably from 0.12 kPa to 3 kPa. By making the vapor pressure of the rinsing solution be greater than or equal to 0.05 kPa and less than or equal to 5 kPa, temperature uniformity within the wafer surface is improved and swelling due to the penetration of the rinsing solution is suppressed, therefore, dimension uniformity within the wafer surface is improved.

An appropriate amount of surfactant may be added to the rinsing solution and used.

In the rinsing process, the wafer developed using the developer including an organic solvent is cleaned using the rinsing solution containing an organic solvent described above. The cleaning method is not particularly limited, however, for example, a method in which a rinsing solution is continuously discharged on a substrate rotating at a constant rate (a spin coating method), a method in which a substrate is immersed in a tank filled with a rinsing solution for a certain period of time (a dipping method), a method in which a rinsing solution is sprayed on a substrate surface (a spraying method), or the like, may be applied, and among these, it is preferable that a cleaning treatment be carried out using the spin coating method, the substrate be rotated at a rotational speed of 2,000 rpm to 4,000 rpm after cleaning, and the rinsing solution be removed from the surface of the substrate. It is also preferable that the heating process (post bake) be included after the rinsing process. The residual developer and the rinsing solution between the patterns and inside the patterns are removed by a bake. The heating process after the rinsing process is usually carried out at 40 to 160° C., and preferably 70 to 95° C., and for usually from 10 seconds to 3 minutes, and preferably from 30 seconds to 90 seconds.

In addition, the present invention also relates to an electronic device manufacturing method including the pattern forming method of the present invention described above, and an electronic device manufactured by this manufacturing method.

The electronic device of the invention is suitably mounted on an electric electronic device (domestic appliances, OA and medium-related devices, optical devices, communication devices, and the like).

Examples

Hereinafter, the present invention will be described in detail by examples, however, the present invention is not limited by these.

(Synthesis of Resin P-1)

79.5 g of cyclohexane was placed in a three-necked flask in a nitrogen stream and heated to 80° C. Next, tricyclodecanyl methacrylic acid (52.9 g) and t-butyl methacrylate (79.6 g) were dissolved in cyclohexane (318 g) to prepare a monomer solution. Furthermore, 3.7 g (2.0 mol % with respect to the total amount of monomer) of Polymerization Initiator V-601 (manufactured by Wako Pure Chemical Industries, Ltd.) was added to the monomer solution and dissolved. The obtained solution was added dropwise to the flask described above over 6 hours. After the completion of dropwise addition, the mixture was further reacted at 80° C. for 2 hours. After cooling the reaction solution, the reaction solution was added dropwise to a mixed solution of 5565 g of methanol and 618 g of water, and the precipitated precipitant was filtered and dried to obtain 107.1 g of the following Resin (P-1). The weight-average molecular weight (Mw: polystyrene conversion) of the obtained Resin (P-1) was 17500, the dispersibility (Mw/Mn) (Mn: numerical average molecular weight (polystyrene conversion)) was 1.63, and the composition ratio (molar ratio) measured by $^{13}$C-NMR was 30/70.

[Chem. 71]

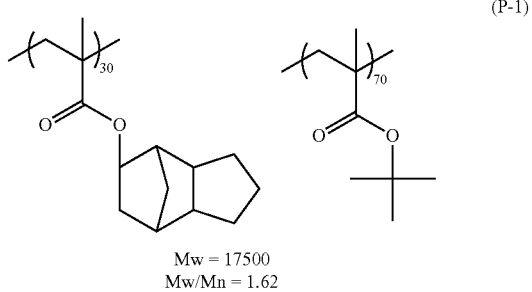

Below, Resins (P-2) to (P-14) were synthesized similarly to Resin (P-1).

The structure, the composition ratio (molar ratio) of the repeating units, the mass average molecular weight, and the dispersibility of the synthesized resins are shown below.

[Chem. 72]

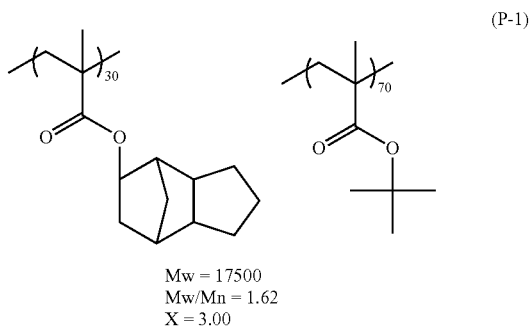

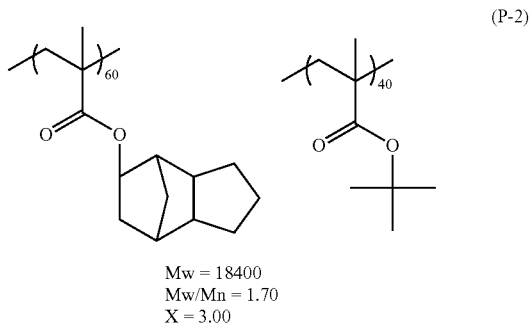

(P-3)
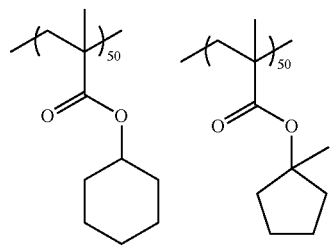
Mw = 15000
Mw/Mn = 1.65
X = 3.50
(P-4)
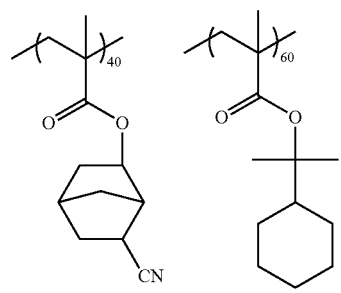
Mw = 14600
Mw/Mn = 1.61
X = 3.30
(P-5)
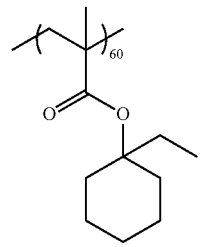
Mw = 21400
Mw/Mn = 1.62
X = 3.22
(P-6)
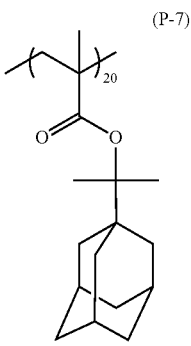
Mw = 14400
Mw/Mn = 1.71
X = 2.75
(P-7)
Mw = 22300
Mw/Mn = 1.68
X = 3.00
[Chem. 73]
(P-8)
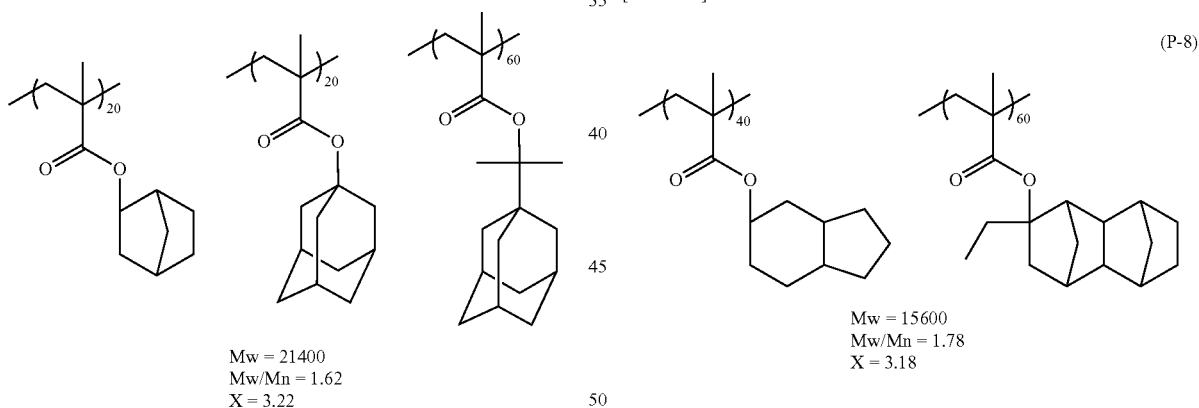
Mw = 15600
Mw/Mn = 1.78
X = 3.18
(P-9)
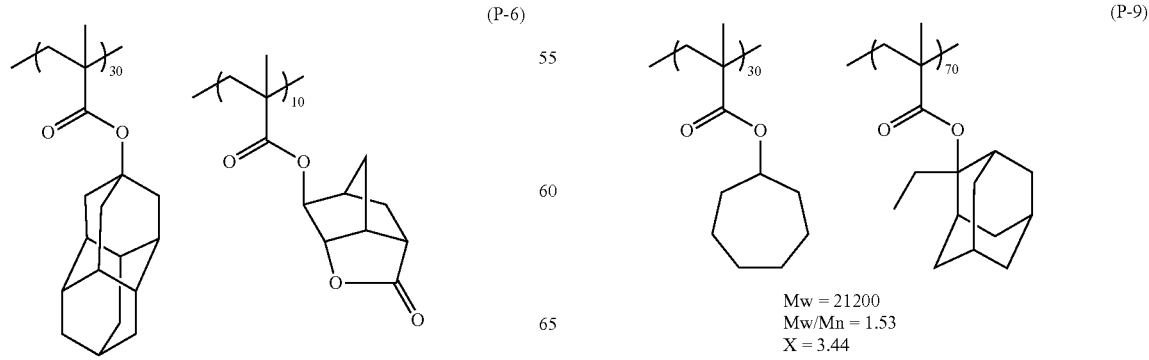
Mw = 21200
Mw/Mn = 1.53
X = 3.44

-continued
(P-10)
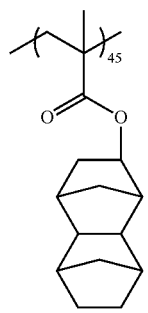 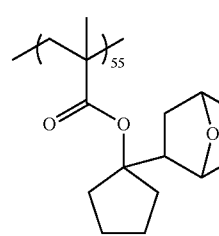
Mw = 21700
Mw/Mn = 1.75
X = 2.86
(P-11)
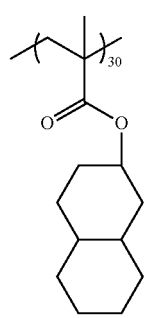 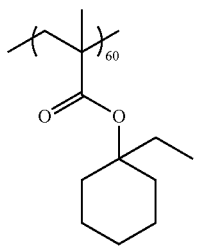 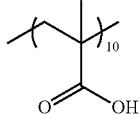
Mw = 11900
Mw/Mn = 1.84
X = 3.17
(P-12)
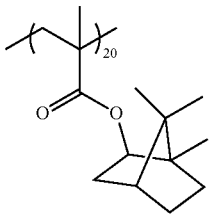 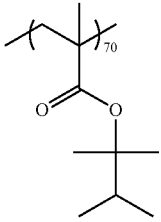
-continued
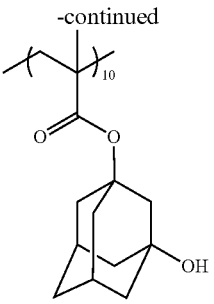
Mw = 16200
Mw/Mn = 1.63
X = 3.16
(P-13)
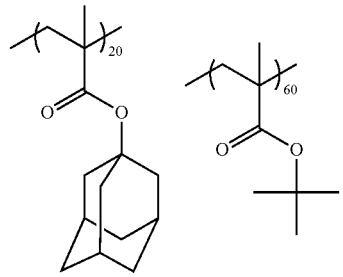
Mw = 21400
Mw/Mn = 1.62
X = 3.22, 3.00
(P-14)
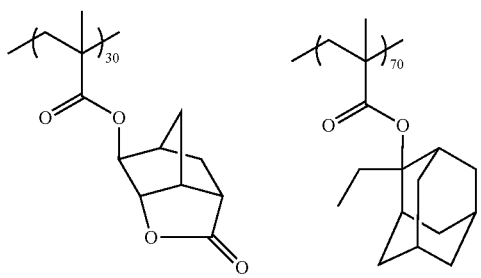
Mw = 18100
Mw/Mn = 1.69
<Acid Generator>
As the acid generator, the following compounds were used.
[Chem. 74]
PAG-1
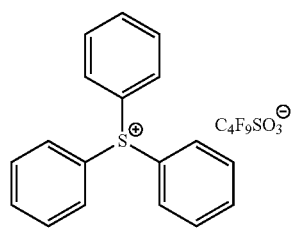
PAG-2
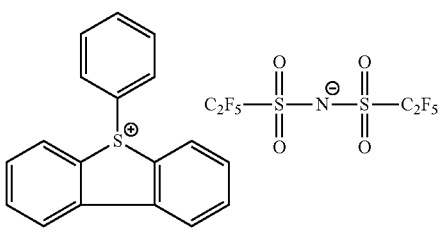

-continued
PAG-3
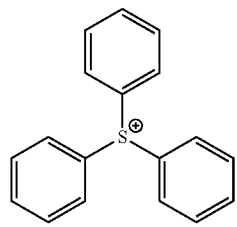 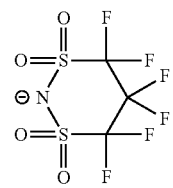
PAG-4
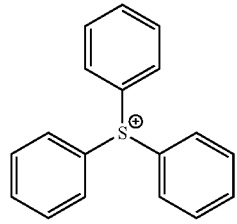 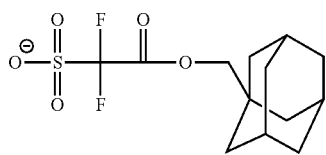
PAG-5
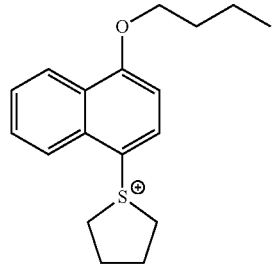 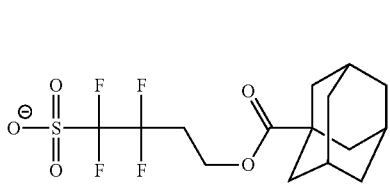
PAG-6
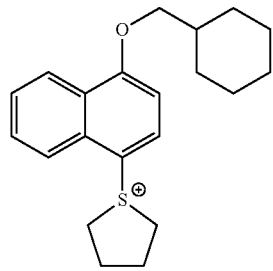 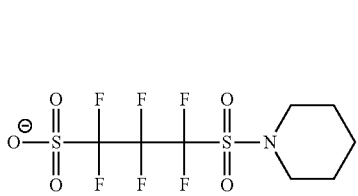
PAG-7
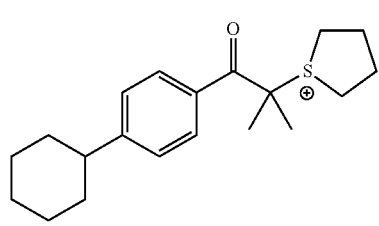 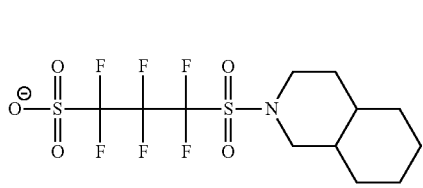
PAG-8
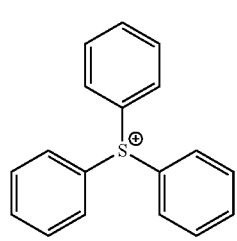 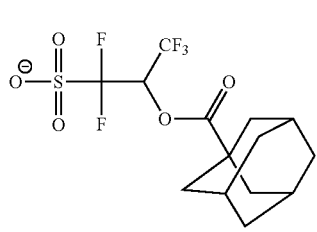

PAG-9
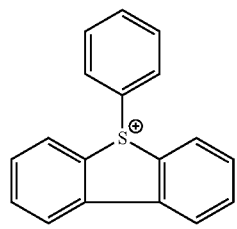
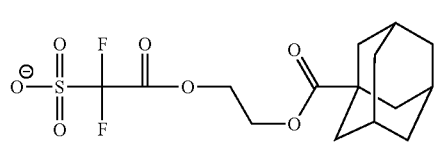
PAG-10
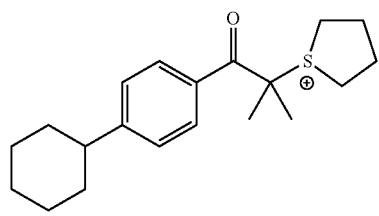
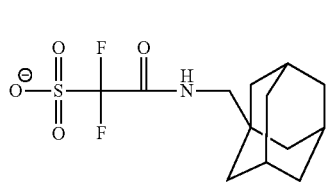
PAG-11
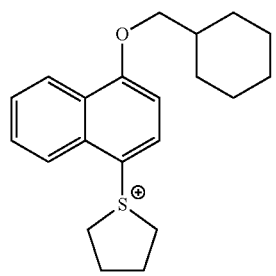
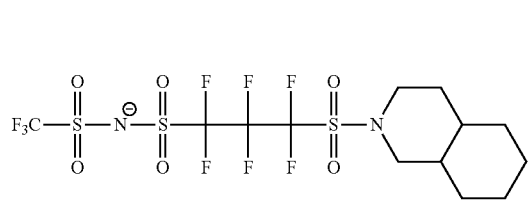
<Basic Compound (C) in which Basicity Decreases Through Irradiation of Actinic Rays or Radiation and Basic Compound (C')>
The following compounds were used as a basic compound in which the basicity decreases through the irradiation of actinic rays or radiation or a basic compound.
[Chem. 75]
N-1
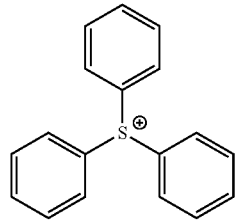
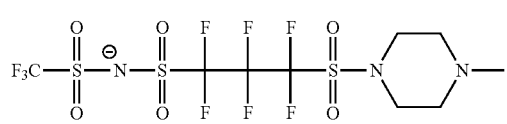
N-2
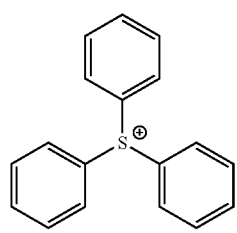
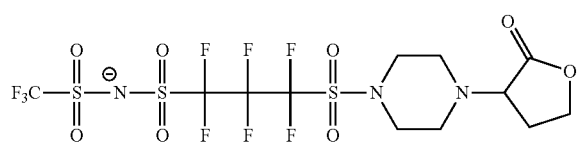
N-3
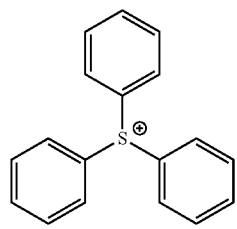
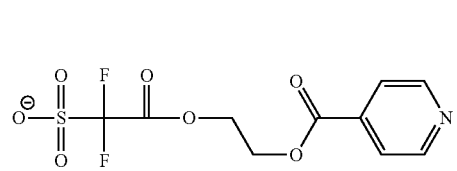

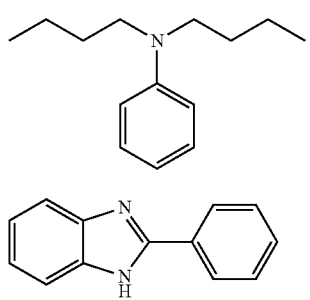
N-4

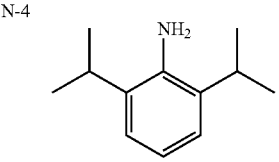
N-5

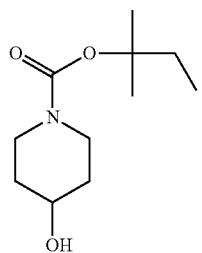

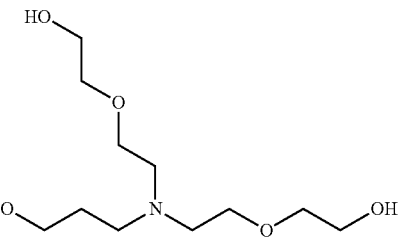
N-7

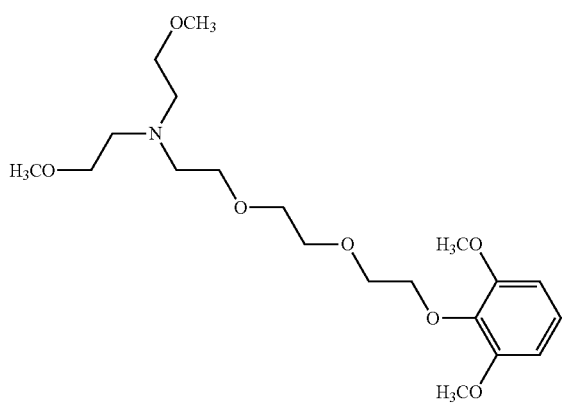

<Hydrophobic Resin>

As the hydrophobic resin, one appropriately selected from Resins (HR-1) to (HR-90) as exemplified above was used.

<Surfactant>

The following were used as the surfactant.

W-1: Megaface F176 (manufactured by Dainippon Ink & Chemicals, Inc.; fluorine-based)

W-2: Megaface R08 (manufactured by Dainippon Ink & Chemicals, Inc.; fluorine- and silicon-based)

W-3: Polysiloxane Polymer KP-341 (manufactured by Shin-Etsu Chemical Co., Ltd.; silicon-based)

W-4: Troysol S-366 (manufactured by Troy Chemical Co., Ltd.)

W-5: KH-20 (manufactured by Asahi Glass Co., Ltd.)

W-6: PolyFox PF-6320 (manufactured by OMNOVA Solutions Inc.; fluorine-based)

<Solvent>

The following were used as the solvent.

(Group a)

SL-1: Propylene glycol monomethyl ether acetate (PGMEA)

SL-2: Propylene glycol monomethyl ether propionate

SL-3: 2-Heptanone (Group b)

SL-4: Ethyl lactate

SL-5: Propylene glycol monomethyl ether (PGME)

SL-6: Cyclohexanone (Group c)

SL-7: γ-Butyrolactone

SL-8: Propylene carbonate

<Developer>

The following were used as the developer.

SG-1: 2-Nonanone

SG-2: Diisobutyl ketone

SG-3: Cyclohexyl acetate

SG-4: Isobutyl isobutyrate

SG-5: Isopentyl acetate

SG-6: Phenetole

SG-7: Dibutyl ether

SG-8: Butyl acetate

<Rinsing Solution>
The following were used as the rinsing solution.
SR-1: 4-Methyl-2-pentanol
SR-2: 1-Hexanol
<ArF Dry Exposure>
(Preparation of Resist)

The components shown in Table 2 below were dissolved in a solvent shown in Table 2 with a solid content of 3.8% by mass, and each was filtered through a polyethylene filter having a pore size of 0.03 μm to prepare an actinic ray-sensitive or radiation-sensitive resin composition (resist composition). ARC29A (manufactured by Nissan Chemical Industries, Ltd.) for forming an organic anti-reflective film was coated on a silicon wafer, and baked at 205° C. for 60 seconds to form an anti-reflective film having a film thickness of 86 nm. The actinic ray-sensitive or radiation-sensitive resin composition was coated thereon and baked (PB: Prebake) at 100° C. for 60 seconds to form a resist film having a film thickness of 100 nm. Pattern exposure was performed on the obtained resist film using an ArF excimer laser scanner (PAS5500/1100 manufactured by ASML Holding N.V., NA 0.75, Dipole, outer sigma of 0.89, and inner sigma of 0.65). Here, as the reticle, a 6% halftone mask with line size=75 nm, line:space=1:1 was used. After that, heating (PEB: Post Exposure Bake) was carried out for 60 seconds at 105° C. Next, the wafer was developed by paddling with the developers shown in the following Table 2 for 30 seconds and rinsed by paddling with the rinsing solutions shown in Table 2 for 30 seconds. Next, a 75 nm line and space pattern was obtained by rotating the wafer for 30 seconds at a rate of rotation of 4000 rpm.

[Exposure Latitude (EL) (%)]

An exposure dose at which a line and space (line:space=1:1) mask pattern with a line width of 75 nm can be realized was obtained as an optimal exposure dose $E_{opt}$. Next, the exposure dose when the line width is the target value of 75 nm±10% thereof (that is, 67.5 nm and 82.5 nm) was obtained. Further, the exposure latitude (EL) defined by the following formula was calculated. The greater the value of EL, the smaller the change in performance with the change in the exposure dose.

$[EL(\%)]=[$(exposure dose when line width is 82.5 nm)$-$(exposure dose when line width is 67.5 nm)$]/E_{opt}$

[Line Width Roughness (LWR) (nm)]

In the observation of a 75 nm (1:1) line and space resist pattern resolved at the optimal exposure dose in exposure latitude evaluation, when observing from the upper portion of the pattern through a length measurement scan type electron microscope (SEM (S-9380II, Hitachi, Ltd.)), the line width was observed at arbitrary points, and the measurement variation was evaluated at 3σ. The smaller the value, the more favorable the performance. A smaller value thereof indicates a more favorable performance.

[Dry Etching Resistance]

When etching the obtained pattern with a mixed gas of Ar gas of 1000 ml/min, $C_4F_6$ gas of 20 ml/min, and $O_2$ gas of 40 ml/min, the film thickness which is reduced per 1 second was taken as the etching speed (nm/sec). The lower the value, the higher the dry etching resistance.

The evaluation results are shown in the following Table 2.

TABLE 2

(Dry Exposure)

| Example | Resin (g) | Compound (B) (g) | Compound (C) (g) | Compound (C') (g) | Solvent (mass ratio) | Surfactant (0.003 g) | Developer (mass ratio) | Rinsing solution (mass ratio) | EL (%) | LWR (nm) | Dry etching speed (nm/sec) |
|---|---|---|---|---|---|---|---|---|---|---|---|
| Example 1 | P-1 (10) | PAG-8 (1.18) | N-1 (0.54) | | SL-1/SL-5 (60/40) | W-1 | SG-4 | SR-1 | 18.1 | 4.7 | 6.90 |
| Example 2 | P-2 (10) | PAG-8 (1.18) | N-1 (0.54) | | SL-1/SL-5 (60/40) | W-1 | SG-4 | SR-1 | 17.1 | 5.4 | 7.50 |
| Example 3 | P-3 (10) | PAG-4 (1.04) | | N-5 (0.14) | SL-1/SL-5 (60/40) | W-1 | SG-5 | SR-1 | 18.2 | 4.8 | 7.50 |
| Example 4 | P-4 (10) | PAG-3 (2.39) | | N-4/N-7 (0.04/0.04) | SL-5/SL-6 (30/70) | W-4 | SG-1 | SR-1 | 17.8 | 5.0 | 7.60 |
| Example 5 | P-5 (10) | PAG-2 (2.22) | N-1 (0.64) | | SL-1/SL-5 (60/40) | None | SG-6 | SR-1 | 17.2 | 5.3 | 7.30 |
| Example 6 | P-6 (10) | PAG-1 (1.50) | | N-9 (0.12) | SL-1/SL-2 (90/10) | W-5 | SG-2 | SR-1 | 17.7 | 5.1 | 7.10 |
| Example 7 | P-7 (10) | PAG-5 (1.45) | | N-8 (0.12) | SL-5/SL-6 (30/70) | W-4 | SG-1 | SR-1 | 18.3 | 4.7 | 6.90 |
| Example 8 | P-8 (10) | PAG-10 (1.33) | N-3 (0.76) | | SL-1/SL-8 (70/30) | W-6 | SG-6 | SR-2 | 17.7 | 5.2 | 7.20 |
| Example 9 | P-9 (10) | PAG-10 (1.28) | N-1 (0.58) | | SL-1 | W-1 | SG-1 | SR-1 | 18.2 | 4.8 | 7.40 |
| Example 10 | P-10 (10) | PAG-7 (1.32) | N-3 (0.14) | | SL-1/SL-5 (60/40) | W-1 | SG-7 | SR-1/SR-2 (90/10) | 18.3 | 4.9 | 6.90 |
| Example 11 | P-11 (10) | PAG-9 (1.14) | N-2 (0.44) | | SL-1/SL-4 (90/10) | W-3 | SG-3 | SR-1 | 17.6 | 5.0 | 7.30 |
| Example 12 | P-12 (10) | PAG-11 (1.26) | | N-6 (0.08) | SL-1/SL-5 (60/40) | None | SG-1 | SR-2 | 18.7 | 4.5 | 7.20 |
| Example 13 | P-13 (10) | PAG-2 (2.22) | N-1 (0.64) | N-5 (0.04) | SL-1/SL-7 (60/40) | None | SG-6 | SR-1 | 17.8 | 5.1 | 6.90 |
| Example 14 | P-4 (10) | PAG-7 (1.14) | | | SL-1/SL-3 (80/20) | W-3 | SG-1/SG-7 (50/50) | SR-1 | 17.9 | 5.1 | 7.40 |
| Example 15 | P-1/P-14 (5/5) | PAG-6 (1.48) | N-2 (0.64) | N-8 (0.14) | SL-1/SL-5 (60/40) | W-2 | SG-4 | SR-1 | 18.1 | 4.8 | 7.20 |
| Example 16 | P-3 (10) | PAG-6 (1.46) | N-1/N-2 (0.4/0.4) | | SL-1/SL-5 (60/40) | W-1 | SG-1 | SR-1 | 17.6 | 5.2 | 7.30 |

TABLE 2-continued (Dry Exposure)

| Example | Resin (g) | Compound (B) (g) | Compound (C) (g) | Compound (C') (g) | Solvent (mass ratio) | Surfactant (0.003 g) | Developer (mass ratio) | Rinsing solution (mass ratio) | EL (%) | LWR (nm) | Dry etching speed (nm/sec) |
|---|---|---|---|---|---|---|---|---|---|---|---|
| Example 17 | P-7 (10) | PAG-6/PAG-7 (0.88/0.75) | | N-5 (0.08) | SL-1/SL-5 (60/40) | W-1 | SG-5 | SR-1 | 18.2 | 4.7 | 7.00 |
| Comparative Example 1 | P-1 (10) | PAG-8 (1.18) | N-1 (0.54) | | SL-1/SL-5 (60/40) | W-1 | SG-8 | SR-1 | 8.5 | 7.9 | 8.80 |
| Comparative Example 2 | P-14 (10) | PAG-8 (1.18) | N-1 (0.54) | | SL-1/SL-5 (60/40) | W-1 | SG-4 | SR-1 | 12.3 | 7.2 | 9.10 |

<ArF Liquid Immersion Exposure>
(Preparation of Resist)

The components shown in Table 3 below were dissolved in a solvent shown in the Table 3 with a solid content of 3.8% by mass, and each was filtered through a polyethylene filter having a pore size of 0.03 μm to prepare an actinic ray-sensitive or radiation-sensitive resin composition (resist composition). ARC29SR (manufactured by Nissan Chemical Industries, Ltd.) for forming an organic anti-reflective film was coated on a silicon wafer, and baked at 205° C. for 60 seconds to form an anti-reflective film having a film thickness of 95 nm. The actinic ray-sensitive or radiation-sensitive resin composition was coated thereon and baked (PB: Prebake) at 100° C. for 60 seconds to form a resist film having a film thickness of 100 nm.

Pattern exposure was performed on the obtained wafer using an ArF excimer laser liquid immersion scanner (XT1700i manufactured by ASML Holding N.V., NA 1.20, C-Quad, outer sigma of 0.900, inner sigma of 0.812, and XY deflection) via a square array halftone mask with a hole size of 60 nm and the pitch between the holes of 90 nm. As the liquid for liquid immersion, ultrapure water was used. After that, heating (PEB: Post Exposure Bake) was carried out for 60 seconds at 105° C. Next, the wafer was developed by paddling in the developers shown in the following Table 3 for 30 seconds and rinsed by paddling in the rinsing solutions shown in Table 3 for 30 seconds. Next, a 45 nm contact hole pattern was obtained by rotating the wafer for 30 seconds at a rate of rotation of 4000 rpm.

[Exposure Latitude (EL, %)]

The hole size was observed using a length measurement scan type electron microscope (S-9380II, Hitachi, Ltd.), and the optimal exposure dose when resolving a contact hole pattern with a hole size of 45 nm was made the sensitivity ($E_{opt}$) (mJ/cm$^2$). Taking the determined optimal exposure dose ($E_{opt}$) as a standard, the exposure dose when the hole size reached a desired value, 45 nm±10% thereof (that is, 40.5 nm to 49.5 nm), was determined. Further, the exposure latitude (EL, %) defined by the following formula was calculated. When the value of EL is larger, the change in the performance with the change in the exposure dose is smaller, which is thus preferable.

[EL(%)]=[(exposure dose when line width is 40.5 nm)−(exposure dose when line width is 49.5 nm)]/$E_{opt}$

[Evenness of Local Pattern Dimensions (Local CDU, nm)]

At 20 locations of 1 μm$^2$ regions within a range exposed by one shot at the optimal exposure dose in the exposure latitude evaluation, 25 arbitrary hole sizes for each region, that is, a total of 500 hole sizes were measured, the standard deviation thereof was obtained, and 3σ was calculated. The smaller the value, the smaller the variation in the dimensions, indicating a satisfactory performance.

[Dry Etching Resistance]

When etching the obtained pattern with a mixed gas of Ar gas of 1000 ml/min, C$_4$F$_6$ gas of 20 ml/min, and O$_2$ gas of 40 ml/min, the film thickness which was reduced per 1 second was taken as the etching speed (nm/sec). The lower the value, the higher the dry etching resistance.

These evaluation results are shown in Table 3 below.

TABLE 3

(Liquid Immersion Exposure)

| Example | Resin (g) | Compound (B) (g) | Compound (C) (g) | Compound (C') (g) | Hydrophilic Resin (E) (g) | Solvent (mass ratio) | Surfactant (0.003 g) | Developer (mass ratio) | Rinsing solution (mass ratio) | EL (%) | Local CDU (nm) | Dry etching speed (nm/sec) |
|---|---|---|---|---|---|---|---|---|---|---|---|---|
| Example 18 | P-1 (10) | PAG-8 (1.18) | N-1 (0.54) | | HR-24 (0.06) | SL-1/SL-5 (60/40) | W-1 | SG-4 | SR-1 | 18 | 4.6 | 6.80 |
| Example 19 | P-2 (10) | PAG-8 (1.18) | N-1 (0.54) | | HR-24 (0.06) | SL-1/SL-5 (60/40) | W-1 | SG-4 | SR-1 | 18.1 | 5.3 | 7.60 |
| Example 20 | P-3 (10) | PAG-4 (1.04) | | N-5 (0.14) | HR-3 (0.06) | SL-1/SL-5 (60/40) | W-1 | SG-5 | SR-1 | 18.3 | 4.7 | 7.30 |
| Example 21 | P-4 (10) | PAG-3 (2.39) | | N-4/N-7 (0.04/0.04) | HR-26 (0.06) | SL-5/SL-6 (30/70) | W-4 | SG-1 | SR-1 | 17.7 | 4.8 | 7.70 |
| Example 22 | P-5 (10) | PAG-2 (2.22) | N-1 (0.64) | | HR-47 (0.06) | SL-1/SL-5 (60/40) | None | SG-6 | SR-1 | 17.3 | 5.2 | 7.10 |
| Example 23 | P-6 (10) | PAG-1 (1.50) | | N-9 (0.12) | HR-24 (0.06) | SL-1/SL-2 (90/10) | W-5 | SG-2 | SR-1 | 17.8 | 5 | 7.00 |

TABLE 3-continued (Liquid Immersion Exposure)

| Example | Resin (g) | Compound (B) (g) | Compound (C) (g) | Compound (C') (g) | Hydrophilic Resin (E) (g) | Solvent (mass ratio) | Surfactant (0.003 g) | Developer (mass ratio) | Rinsing solution (mass ratio) | EL (%) | Local CDU (nm) | Dry etching speed (nm/sec) |
|---|---|---|---|---|---|---|---|---|---|---|---|---|
| Example 24 | P-7 (10) | PAG-5 (1.45) | | N-8 (0.12) | HR-24/HR-79 (0.04/0.02) | SL-5/SL-6 (30/70) | W-4 | SG-1 | SR-1 | 18.2 | 4.8 | 6.80 |
| Example 25 | P-8 (10) | PAG-10 (1.33) | N-3 (0.76) | | HR-24 (0.06) | SL-1/SL-8 (70/30) | W-6 | SG-6 | SR-2 | 17.5 | 5.3 | 7.30 |
| Example 26 | P-9 (10) | PAG-10 (1.28) | N-1 (0.58) | | HR-24 (0.06) | SL-1 | W-1 | SG-1 | SR-1 | 18.1 | 5 | 7.50 |
| Example 27 | P-10 (10) | PAG-7 (1.32) | N-3 (0.14) | | HR-3 (0.06) | SL-1/SL-5 (60/40) | W-1 | SG-7 | SR-1/SR-2 (90/10) | 18.2 | 4.8 | 6.80 |
| Example 28 | P-11 (10) | PAG-9 (1.14) | N-2 (0.44) | | HR-24 (0.06) | SL-1/SL-4 (90/10) | W-3 | SG-3 | SR-1 | 17.5 | 4.8 | 7.20 |
| Example 29 | P-12 (10) | PAG-11 (1.26) | | N-6 (0.08) | HR-47 (0.06) | SL-1/SL-5 (60/40) | None | SG-1 | SR-2 | 18.5 | 4.4 | 7.10 |
| Example 30 | P-13 (10) | PAG-2 (2.22) | N-1 (0.64) | N-5 (0.04) | HR-47 (0.06) | SL-1/SL-7 (60/40) | None | SG-6 | SR-1 | 17.9 | 4.9 | 6.70 |
| Example 31 | P-4 (10) | PAG-7 (1.14) | | | HR-24 (0.06) | SL-1/SL-3 (80/20) | W-3 | SG-1/SG-7 (50/50) | SR-1 | 18.1 | 5.2 | 7.20 |
| Example 32 | P-1/P-14 (5/5) | PAG-6 (1.48) | N-2 (0.64) | N-8 (0.14) | HR-47 (0.06) | SL-1/SL-5 (60/40) | W-2 | SG-4 | SR-1 | 17.9 | 5 | 7.40 |
| Example 33 | P-3 (10) | PAG-6 (1.46) | N-1/N-2 (0.4/0.4) | | HR-24 (0.06) | SL-1/SL-5 (60/40) | W-1 | SG-1 | SR-1 | 17.5 | 5.3 | 7.30 |
| Example 34 | P-7 (10) | PAG-6/PAG-7 (0.88/0.75) | | N-5 (0.08) | HR-24 (0.06) | SL-1/SL-5 (60/40) | W-1 | SG-5 | SR-1 | 18.4 | 4.8 | 6.80 |
| Example 35 | P-6 (10) | PAG-7 (1.50) | | N-9 (0.12) | HR-24 (0.06) | SL-1/SL-2 (90/10) | W-5 | SG-2 | SR-1 | 18.2 | 4.8 | 7.00 |
| Comparative Example 3 | P-1 (10) | PAG-8 (1.18) | N-1 (0.54) | | HR-24 (0.06) | SL-1/SL-5 (60/40) | W-1 | SG-8 | SR-1 | 8.3 | 7.8 | 9.00 |
| Comparative Example 4 | P-14 (10) | PAG-8 (1.18) | N-1 (0.54) | | HR-24 (0.06) | SL-1/SL-5 (60/40) | W-1 | SG-4 | SR-1 | 12.2 | 7.4 | 9.10 |

Here, the effects of the invention of the present application can be expected not only in a pattern forming process using ArF excimer laser light, but the same effects can be expected, for example, in a pattern forming process using extreme ultraviolet light (EUV).

The pattern forming method of the present invention with which it is possible to provide a pattern with such a performance can be used favorably as a lithography process in the manufacture of various semiconductor elements and electronic devices such as recording media.

The present application is a continuation application of International Application No. PCT/JP2012/079587, filed Nov. 8, 2012, which claims priority to Japanese Patent Application No. 2011-245745, filed Nov. 9, 2011. The contents of these applications are incorporated herein by reference in their entirety.

What is claimed is:

1. A pattern forming method comprising:
   (i) a process of forming a film using an actinic ray-sensitive or radiation-sensitive resin composition containing
      a Resin (P) including a non-acid-decomposable Repeating Unit (b1) represented by the following General Formula (b1), a repeating unit including a group capable of being decomposed by acid and generating a polar group, and a repeating unit having a lactone structure in an amount of from greater than 0 mol % to 10 mol % or less with respect to all the repeating units within the Resin (P), and
      a Compound (B) capable of generating an acid through irradiation of actinic rays or irradiation;
   (ii) a process of exposing the film using actinic rays or radiation with a wavelength of equal to or less than 200 nm; and
   (iii) a process of developing the exposed film using a developer including an organic solvent containing a hetero atom and having 7 or more carbon atoms to form a negative tone pattern:

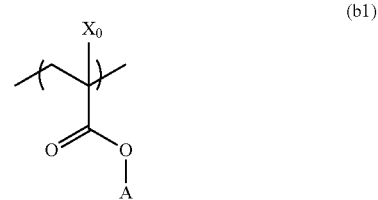

(b1)

in the formula, A represents an alicyclic hydrocarbon group including no oxygen atoms, and $X_0$ represents a hydrogen atom or an alkyl group.

2. The pattern forming method according to claim 1, wherein the Resin (P) contains equal to or greater than 50 mol % of the repeating unit including a group capable of being decomposed by acid and generating a polar group.

3. The pattern forming method according to claim 1, wherein in the Repeating Unit (b1), A is an alicyclic hydrocarbon group consisting of carbon atoms and hydrogen atoms or an alicyclic hydrocarbon group consisting of carbon atoms, hydrogen atoms, and nitrogen atoms.

4. The pattern forming method according to claim 1, wherein in the Repeating Unit (b1), A is an alicyclic hydrocarbon group consisting of carbon atoms and hydrogen atoms.

5. The pattern forming method according to claim 1, wherein the Repeating Unit (b1) satisfies 0<X<3.5 when numbers of each atom included in the unit are substituted into the following formula:

$X$=(total of the number of atoms configuring the Repeating Unit ($b1$)/{(number of carbon atoms)−(number of atoms that are neither carbon atoms nor hydrogen atoms)}.

6. The pattern forming method according to claim 1, wherein the Compound (B) is a compound capable of generating an organic acid represented by the following General Formulae (III) or (IV) through irradiation of actinic rays or radiation:

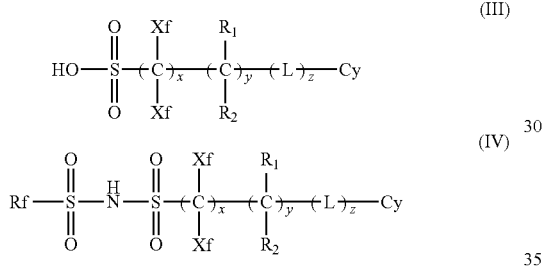

in General Formulae (III) and (IV),

Xf's respectively independently represent a fluorine atom or an alkyl group substituted with at least one fluorine atom, $R_1$ and $R_2$ respectively independently represent a hydrogen atom, a fluorine atom, or an alkyl group, and in a case where y≥2, each of $R_1$ and $R_2$ may be same as or different from one another, L's respectively independently represent a divalent linking group, and in a case where z≥2, each L may be the same as or different from one another, Cy represents a cyclic organic group, Rf is a group including a fluorine atom, x represents an integer from 1 to 20, y represents an integer from 0 to 10, and z represents an integer from 0 to 10.

7. The pattern forming method according to claim 1, wherein the actinic ray-sensitive or radiation-sensitive resin composition further contains a basic compound in which basicity decreases through the irradiation of actinic rays or radiation or an ammonium salt compound in which the basicity decreases through the irradiation of actinic rays or radiation.

8. The pattern forming method according to claim 1, wherein the actinic ray-sensitive or radiation-sensitive resin composition further contains a hydrophobic resin containing at least either of a fluorine atom or a silicon atom.

9. The pattern forming method according to claim 1, wherein the exposure in the process (ii) is immersion exposure.

10. The pattern forming method according to claim 1, wherein the moisture content of the developer is less than 10% by mass.

11. An actinic ray-sensitive or radiation-sensitive resin composition used for the pattern forming method according to claim 1 comprising:

a Resin (P) including a non-acid-decomposable Repeating Unit (b1) represented by the following General Formula (b1), a repeating unit including a group capable of being decomposed by acid and generating a polar group, and a repeating unit having a lactone structure in an amount of from greater than 0 mol % to 10 mol % or less with respect to all the repeating units within the Resin (P); and a Compound (B) capable of generating an acid through irradiation of actinic rays or irradiation:

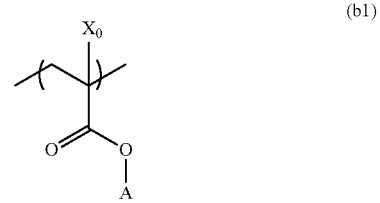

in the formula, A represents an alicyclic hydrocarbon group including no oxygen atoms, and $X_0$ represents a hydrogen atom or an alkyl group, wherein the alicyclic hydrocarbon group has a polycyclic structure and consists of carbon atoms and hydrogen atoms.

12. The actinic ray-sensitive or radiation-sensitive resin composition according to claim 11, wherein the actinic ray-sensitive or radiation-sensitive resin composition further comprises a nitrogen-containing organic compound having a group detached by the action of acid, and wherein the nitrogen-containing organic compound is represented by the following General Formula (F):

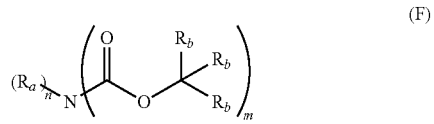

in the General Formula (F), n represents an integer from 0 to 2, m represents an integer from 1 to 3, respectively, and n+m=3, $R_a$'s, independently, represent a hydrogen atom, an alkyl group, a cycloalkyl group, an aryl group, or an aralkyl group; when n=2, the two $R_a$'s may be the same as or different from each other, and two $R_a$'s may be bonded to each other to form a divalent heterocyclic hydrocarbon group or a derivative thereof, $R_b$'s independently represent a hydrogen atom, an alkyl group, a cycloalkyl group, an aryl group, and an aralkyl group; in —C($R_b$)($R_b$)($R_b$), when one or more of $R_b$'s are hydrogen atoms, at least one of the remaining $R_b$'s is a cyclopropyl group or a 1-alkoxyalkyl group; at least two $R_b$'s may be bonded to each other to form an alicyclic hydrocarbon group, an aromatic hydrocarbon group, a heterocyclic hydrocarbon group, or a derivative thereof.

13. An actinic ray-sensitive or radiation-sensitive film formed using the actinic ray-sensitive or radiation-sensitive resin composition according to claim 11.

14. A manufacturing method of an electronic device including the pattern forming method according to claim 1.

15. The pattern forming method according to claim 1,
wherein the alicyclic hydrocarbon group has a polycyclic structure and consists of carbon atoms and hydrogen atoms.

16. The pattern forming method according to claim 1,
wherein the actinic ray-sensitive or radiation-sensitive resin composition further comprises a nitrogen-containing organic compound having a group detached by the action of acid, and
wherein the nitrogen-containing organic compound is represented by the following General Formula (F):

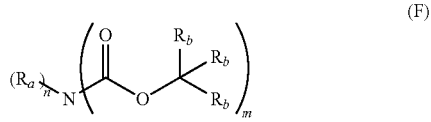

in the General Formula (F), n represents an integer from 0 to 2, m represents an integer from 1 to 3, respectively, and n+m=3, $R_a$'s, independently, represent a hydrogen atom, an alkyl group, a cycloalkyl group, an aryl group, or an aralkyl group; when n=2, the two $R_a$'s may be the same as or different from each other, and two $R_a$'s may be bonded to each other to form a divalent heterocyclic hydrocarbon group or a derivative thereof, $R_b$'s independently represent a hydrogen atom, an alkyl group, a cycloalkyl group, an aryl group, and an aralkyl group; in $-C(R_b)(R_b)(R_b)$, when one or more of $R_b$'s are hydrogen atoms, at least one of the remaining $R_b$'s is a cyclopropyl group or a 1-alkoxyalkyl group; at least two $R_b$'s may be bonded to each other to form an alicyclic hydrocarbon group, an aromatic hydrocarbon group, a heterocyclic hydrocarbon group, or a derivative thereof.

17. A pattern forming method comprising:
(i) a process of forming a film using an actinic ray-sensitive or radiation-sensitive resin composition containing
 a Resin (P) including a non-acid-decomposable Repeating Unit (b1) represented by the following General Formula (b1) and 60 mol % or more of a repeating unit including a group capable of being decomposed by acid and generating a polar group, and
 a Compound (B) capable of generating an acid through irradiation of actinic rays or irradiation;
(ii) a process of exposing the film using actinic rays or radiation with a wavelength of equal to or less than 200 nm; and
(iii) a process of developing the exposed film using a developer including an organic solvent containing a hetero atom and having 7 or more carbon atoms to form a negative tone pattern:

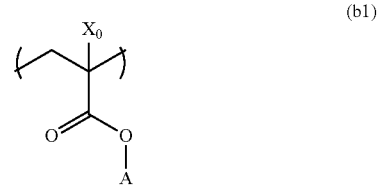

in the formula, A represents an alicyclic hydrocarbon group including no oxygen atoms, and $X_0$ represents a hydrogen atom or an alkyl group.

18. The pattern forming method according to claim 17,
wherein in the Repeating Unit (b1), A is an alicyclic hydrocarbon group consisting of carbon atoms and hydrogen atoms or an alicyclic hydrocarbon group consisting of carbon atoms, hydrogen atoms, and nitrogen atoms.

19. The pattern forming method according to claim 17,
wherein in the Repeating Unit (b1), A is an alicyclic hydrocarbon group consisting of carbon atoms and hydrogen atoms.

20. The pattern forming method according to claim 17,
wherein the Repeating Unit (b1) satisfies 0<X<3.5 when numbers of each atom included in the unit are substituted into the following formula:

X=(total of the number of atoms configuring the Repeating Unit (b1)/{(number of carbon atoms)−(number of atoms that are neither carbon atoms nor hydrogen atoms)}.

21. The pattern forming method according to claim 17,
wherein the Compound (B) is a compound capable of generating an organic acid represented by the following General Formulae (III) or (IV) through irradiation of actinic rays or radiation:

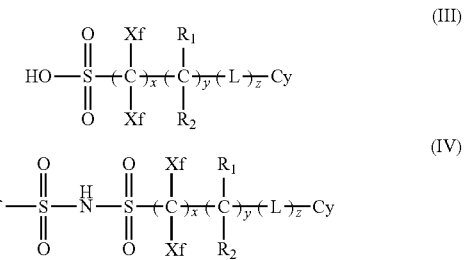

in General Formulae (III) and (IV),

Xf's respectively independently represent a fluorine atom or an alkyl group substituted with at least one fluorine atom, $R_1$ and $R_2$ respectively independently represent a hydrogen atom, a fluorine atom, or an alkyl group, and in a case where y≥2, each of $R_1$ and $R_2$ may be same as or different from one another, L's respectively independently represent a divalent linking group, and in a case where z≥2, each L may be the same as or different from one another, Cy represents a cyclic organic group, Rf is a group including a fluorine atom, x represents an integer from 1 to 20, y represents an integer from 0 to 10, and z represents an integer from 0 to 10.

22. The pattern forming method according to claim 17,
wherein the actinic ray-sensitive or radiation-sensitive resin composition further contains a basic compound in which basicity decreases through the irradiation of actinic rays or radiation or an ammonium salt compound in which the basicity decreases through the irradiation of actinic rays or radiation.

23. The pattern forming method according to claim 17, wherein the actinic ray-sensitive or radiation-sensitive resin composition further contains a hydrophobic resin containing at least either of a fluorine atom or a silicon atom.

24. The pattern forming method according to claim 17, wherein the moisture content of the developer is less than 10% by mass.

25. An actinic ray-sensitive or radiation-sensitive resin composition used for the pattern forming method according to claim 17 comprising:
   a Resin (P) including a non-acid-decomposable Repeating Unit (b1) represented by a following General Formula (b1) and 60 mol % or more of a repeating unit including a group capable of being decomposed by acid and generating a polar group, and a repeating unit having a lactone structure in an amount of from greater than 0 mol % to 10 mol % or less with respect to all the repeating units within the Resin (P); and
   a Compound (B) capable of generating an acid through irradiation of actinic rays or irradiation:

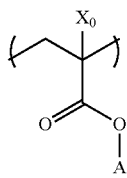

(b1)

in the formula, A represents an alicyclic hydrocarbon group including no oxygen atoms, and $X_0$ represents a hydrogen atom or an alkyl group.

26. An actinic ray-sensitive or radiation-sensitive film formed using the actinic ray-sensitive or radiation-sensitive resin composition according to claim 25.

27. A manufacturing method of an electronic device including the pattern forming method according to claim 17.

28. The pattern forming method according to claim 17, wherein the Resin (P) includes 20 mol % or more of the non-acid-decomposable Repeating Unit (b1).

29. The pattern forming method according to claim 17, wherein the actinic ray-sensitive or radiation-sensitive resin composition further comprises a nitrogen-containing organic compound having a group detached by the action of acid, and
wherein the nitrogen-containing organic compound is represented by the following General Formula (F):

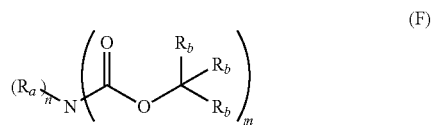

(F)

in the General Formula (F),
n represents an integer from 0 to 2, m represents an integer from 1 to 3, respectively, and n+m=3,
$R_a$'s, independently, represent a hydrogen atom, an alkyl group, a cycloalkyl group, an aryl group, or an aralkyl group; when n=2, the two $R_a$'s may be the same as or different from each other, and two $R_a$'s may be bonded to each other to form a divalent heterocyclic hydrocarbon group or a derivative thereof,
$R_b$'s independently represent a hydrogen atom, an alkyl group, a cycloalkyl group, an aryl group, and an aralkyl group; in —C($R_b$)($R_b$)($R_b$), when one or more of $R_b$'s are hydrogen atoms, at least one of the remaining $R_b$'s is a cyclopropyl group or a 1-alkoxyalkyl group; at least two $R_b$'s may be bonded to each other to form an alicyclic hydrocarbon group, an aromatic hydrocarbon group, a heterocyclic hydrocarbon group, or a derivative thereof.

* * * * *